US010672996B2

(12) United States Patent
Ma et al.

(10) Patent No.: US 10,672,996 B2
(45) Date of Patent: Jun. 2, 2020

(54) ORGANIC ELECTROLUMINESCENT MATERIALS AND DEVICES

(71) Applicant: Universal Display Corporation, Ewing, NJ (US)

(72) Inventors: Bin Ma, Plainsboro, NJ (US); Vadim Adamovich, Yardley, PA (US); Edward Barron, Hamilton, NJ (US); Jui-Yi Tsai, Newtown, PA (US); Mingjuan Su, Ewing, NJ (US); Lech Michalski, Pennington, NJ (US); Chuanjun Xia, Lawrenceville, NJ (US); Michael S. Weaver, Princeton, NJ (US); Walter Yeager, Yardley, PA (US); Bert Alleyne, Newtown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 167 days.

(21) Appl. No.: 15/239,961

(22) Filed: Aug. 18, 2016

(65) Prior Publication Data

US 2017/0077425 A1 Mar. 16, 2017

Related U.S. Application Data

(60) Provisional application No. 62/213,757, filed on Sep. 3, 2015, provisional application No. 62/232,194, filed (Continued)

(51) Int. Cl.
*H01L 51/50* (2006.01)
*H01L 51/00* (2006.01)
(Continued)

(52) U.S. Cl.
CPC ...... *H01L 51/0085* (2013.01); *C07F 15/0033* (2013.01); *C09K 11/025* (2013.01);
(Continued)

(58) Field of Classification Search
None
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 102292409 12/2011
CN 104053664 9/2014
(Continued)

OTHER PUBLICATIONS

Schmidt, T. D., et al., "Supplementary Information: Extracting the emitter orientation in organic light-emitting diodes from external quantum efficiency measurements" Jul. 22, 2014, pp. 1-6.

(Continued)

*Primary Examiner* — Gregory D Clark
(74) *Attorney, Agent, or Firm* — Duane Morris LLP

(57) ABSTRACT

The present invention relates to organometallic complexes for use as emitters where a molecule of the compound has an orientation factor greater than 0.67, and devices, such as organic light emitting diodes, including the same.

15 Claims, 10 Drawing Sheets

Related U.S. Application Data on Sep. 24, 2015, provisional application No. 62/291,960, filed on Feb. 5, 2016, provisional application No. 62/322,510, filed on Apr. 14, 2016, provisional application No. 62/330,412, filed on May 2, 2016.

(51) Int. Cl.
*C07F 15/00* (2006.01)
*C09K 11/06* (2006.01)
*C09K 11/02* (2006.01)

(52) U.S. Cl.
CPC .......... *C09K 11/06* (2013.01); *H01L 51/0067* (2013.01); *H01L 51/0074* (2013.01); *C09K 2211/1029* (2013.01); *C09K 2211/185* (2013.01); *H01L 51/5012* (2013.01); *H01L 51/5016* (2013.01)

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
8,519,384 B2 8/2013 Xia et al.
8,946,697 B1 2/2015 Ma et al.
9,076,973 B2 7/2015 Xia et al.
9,799,837 B2 10/2017 Nagayama et al.
9,935,276 B2 4/2018 Alleyne et al.
10,079,349 B2* 9/2018 Tsai et al. ........... H01L 51/0085
10,158,089 B2* 12/2018 Ma et al. ............ C07F 15/0033
10,236,456 B2* 3/2019 Tsai et al. ........... C07F 15/0033
2002/0034656 A1 3/2002 Thompson et al.
2002/0134984 A1 9/2002 Igarashi
2002/0158242 A1 10/2002 Son et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0102370 A1* 4/2009 Taka et al. ........... C07D 233/58 313/504
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2012/0299468 A1* 11/2012 Tsai ....................... H05B 33/14 313/504
2013/0328038 A1* 12/2013 Taneda et al. ......... C09K 11/06 257/40
2013/0341609 A1 12/2013 Ma et al.
2014/0014931 A1* 1/2014 Riegel et al. ......... H01L 51/001 257/40
2014/0054564 A1 2/2014 Kim et al.
2014/0131676 A1 5/2014 Beers et al.
2014/0231755 A1* 8/2014 Xia et al. ............ H01L 51/0085 257/40
2015/0188061 A1 7/2015 Xia et al.
2015/0243913 A1 8/2015 Takizawa et al.
2016/0233444 A1 8/2016 Hayer et al.
2017/0040542 A1* 2/2017 Sasada et al. ...... C07F 15/0033

FOREIGN PATENT DOCUMENTS

EP 0650955 5/1995
EP 1725079 11/2006
EP 2034538 3/2009
EP 2100896 9/2009
EP 2883880 6/2015
JP 200511610 1/2005
JP 2007123392 5/2007
JP 2007254297 10/2007
JP 2008074939 4/2008
JP 4551480 9/2010
JP 2012-502046 1/2012
JP 2013149880 8/2013
JP 2013-539206 10/2013
JP 2014-162796 9/2014
JP 2015173199 10/2015
KR 20150052913 5/2015
TW 201311703 3/2013
WO 01/39234 5/2001
WO 02/02714 1/2002
WO 02/15654 2/2002
WO 03040257 5/2003
WO 03060956 7/2003
WO 2004093207 10/2004
WO 2004107822 12/2004
WO 2005014551 2/2005
WO 2005019373 3/2005
WO 2005030900 4/2005
WO 2005089025 9/2005
WO 2005123873 12/2005
WO 2006009024 1/2006

(56) References Cited

FOREIGN PATENT DOCUMENTS

| | | |
|---|---|---|
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2010/068876 | 6/2010 |
| WO | 2012121189 | 9/2012 |
| WO | 2012/166608 | 12/2012 |
| WO | 2013142634 | 9/2013 |
| WO | 2015008851 | 1/2015 |
| WO | 2015039723 | 3/2015 |
| WO | 2015/084114 | 6/2015 |
| WO | 2015104045 | 7/2015 |
| WO | 2015112561 | 7/2015 |
| WO | 2015117718 | 8/2015 |
| WO | WO 2015/159744 A1 * | 10/2015 |

OTHER PUBLICATIONS

Kim, Sei-Yong et al., "Organic Light-Emitting Diodes with 30% External Quantum Efficiency Based on a Horizontally Oriented Emitter" Adv. Funct. Mater. 2013, pp. 1-5.

Aubert, Vincent et al., "Linear and Nonlinear Optical Properties of Cationic Bipyridyl Iridium (III) Complexes: Tunable and Photoswitchable?" Inorg. Chem. 2011, 50, pp. 5027-5038.

Schmidt, Tobias D. et al., "Extracting the emitter orientation in organic light-emitting diodes from external quantu.m efficiency measurements" Applied Physics Letters 105,043302 (2014).

Kozhevnikov, Valery N. et al., "Cyclometalated Ir(III) Complexes for High-Efficiency Solution-Processable Blue PhOLEDs" Chem. Mater. 2013, 25, pp. 2352-2358.

Frischeisen, Jorg et al., "Determination of molecular dipole orientation in doped fluorescent organic thin films by photoluminescence measurements" Applied Physics Letters 96, 073302 (2010); doi: 10.1063/1.3309705.

Flammich, Michael,"Optical Characterization of OLED Emitter Properties by Radiation Pattern Analyses" Dissertation. pp. 1-105 (2011).

Kim, Kwon-Hyeon et al., "Phosphorescent dye-based supramolecules for high-efficiency organic light-emitting diodes" Nature Communications 5:4769; doi:10.1038/ncomms5769, pp. 1-8 (2014).

Moon, Chang-Ki et al., "Influence of Host Molecules on Emitting Dipole Orientation of Phosphorescent Iridium Complexes" Chem. Mater. 2015, vol. 27, Issue 8, pp. 2767-2769.

Lu, Jianping et al., "New triscyclometalated iridium complexes for applications in phosphorescent light-emitting diodes" Synthetic Metals 158 (2008) 95-103.

McDonald, Aidan R., "Probing the mer- to fac-lsomerization of Tris-Cyclometallated Homo- and Heteroleptic (C,N)3 Iridium(III) Complexes" Inorg. Chem. 2008, 47, 6681-6691.

Tamayo, Arnold B., "Synthesis and Characterization of Facial and Meridional Tris-cyclometalated Iridium(III) Complexes" J. Am. Chem. Soc. 2003, 125, 7377-7387.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1—183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)indium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1—123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

(56) References Cited

OTHER PUBLICATIONS

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylbory1)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1—063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N∧C∧N-Coordinating Tridentate Ligand," Appl. Phys. Lett., 86:153505-1—153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1—263503-3 (2007).
T. Östergård et al., "Langmuir-Blodgett Light-Emitting Diodes Of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Notice of Reasons for Rejection dated Dec. 10, 2019 for corresponding Japanese Patent Application No. JP 2016-171524.
Office Action and Search Report dated Oct. 2, 2019 for corresponding Taiwanese Patent Application No. 105128541 (Search Report provided in English).
Francesco Nastasi et al: "A luminescent multicomponent species made of fullerene and Ir(iii) cyclometallated subunits",Chemical Communications, No. 34, Jan. 1, 2007 (Jan. 1, 2007), p. 3556, XP55001542, ISSN: 1359-7345, DOI: 10.1 039/b705296k.
Communication pursuant to Article 94(3) EPC issued on May 22, 2019 in corresponding European Patent Application No. 16186500.1.
Chinese Office Action dated Sep. 30, 2019 for Corresponding Chinese Application No. 201610843457.8.

* cited by examiner

Device Example 2 containing Comp $(L_{A147})_2Ir(L_{B184})$ as the emitter

ORGANIC ELECTROLUMINESCENT MATERIALS AND DEVICES

CROSS-REFERENCE TO RELATED APPLICATIONS

This application claims priority under 35 U.S.C. § 119(e)(1) from U.S. Provisional Application Ser. No. 62/330,412, filed May 2, 2016, U.S. Provisional Application Ser. No. 62/322,510, filed Apr. 14, 2016, U.S. Provisional Application Ser. No. 62/291,960, filed Feb. 5, 2016, U.S. Provisional Application Ser. No. 62/232,194, filed Sep. 24, 2015, U.S. Provisional Application Ser. No. 62/213,757, filed Sep. 3, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

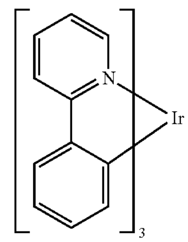

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, a compound having a formula $M(L_A)_x(L_B)_y(L_C)_z$ is provided wherein the ligand $L_A$, $L_B$, and $L_C$ are each independently selected from the group consisting of:

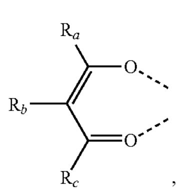
,
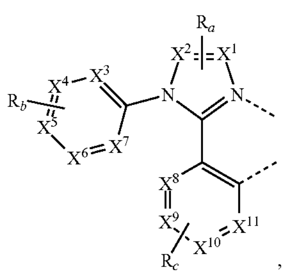
,
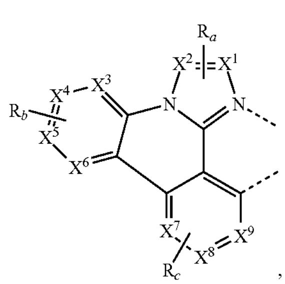
,

-continued

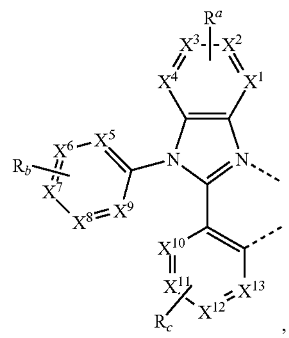
,
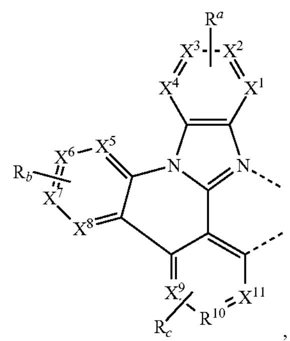
,
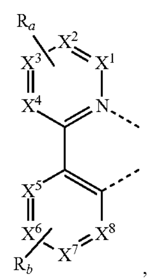
,
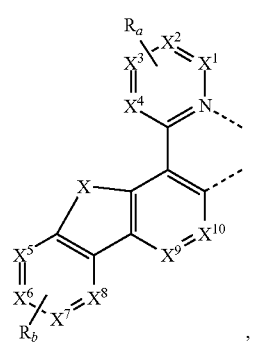
,
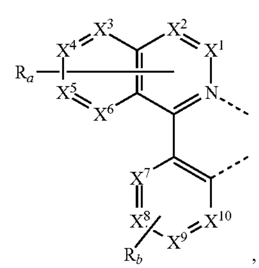
,
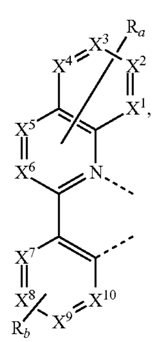
,
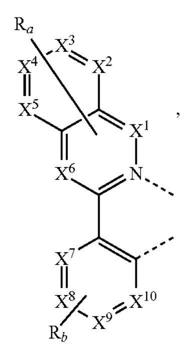
,
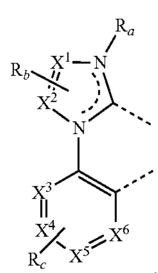
,
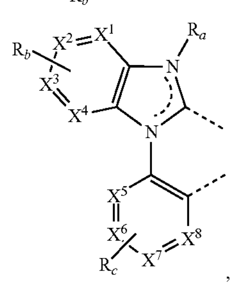
, -continued

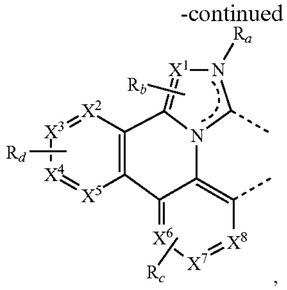

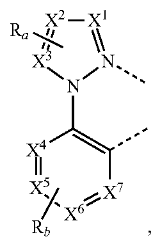

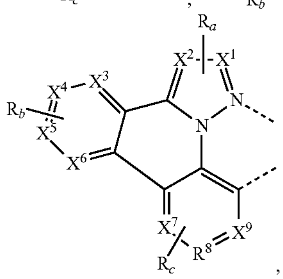

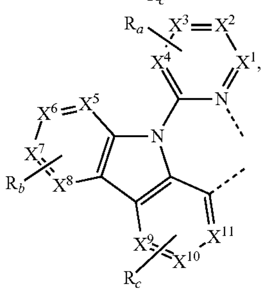

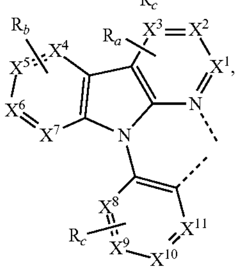

and

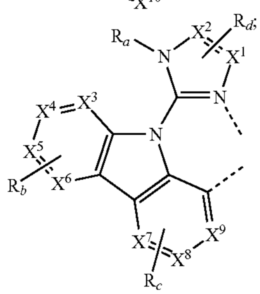

wherein each $X^1$ to $X^{13}$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M; and wherein a molecule of the compound has an orientation factor value greater than 0.67.

According to another embodiment, a compound having a formula $(L_A)_mIr(L_B)_{3-m}$ having a structure selected from the group consisting of:

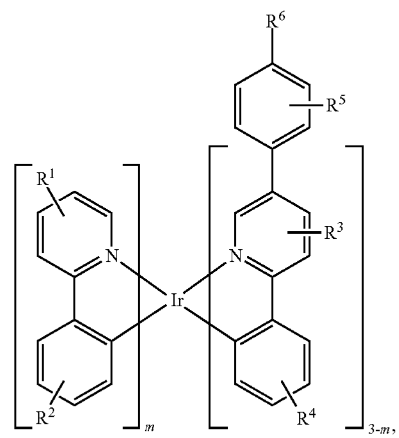

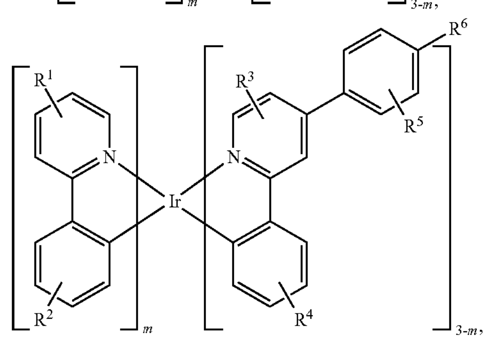

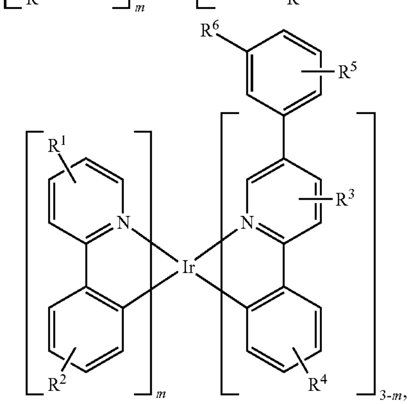

and

-continued

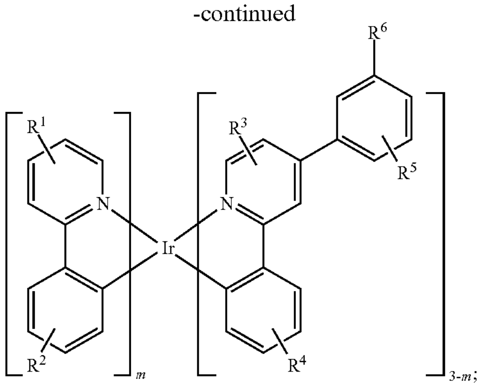

wherein m is 1 or 2;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof is disclosed.

According to another embodiment, an organic light emitting diode/device (OLED) is also disclosed. The OLED can include an anode, a cathode, and an organic layer, disposed between the anode and the cathode. The organic layer can comprise a compound having a formula selected from the group consisting of $M(L_A)_x(L_B)_y(L_C)_z$,

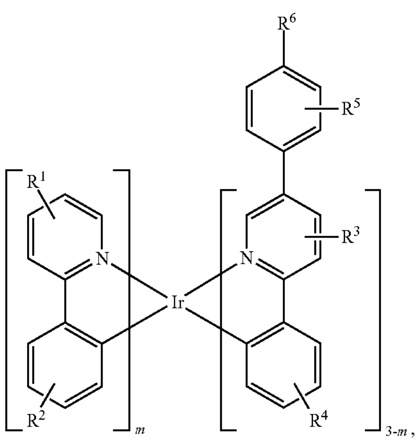

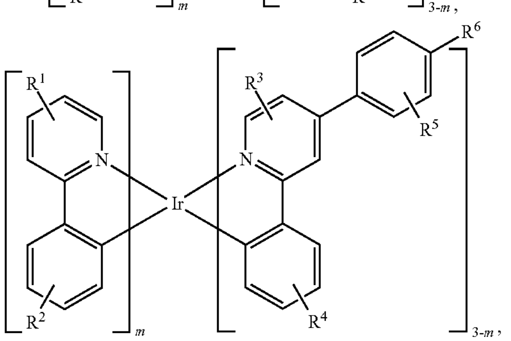

-continued

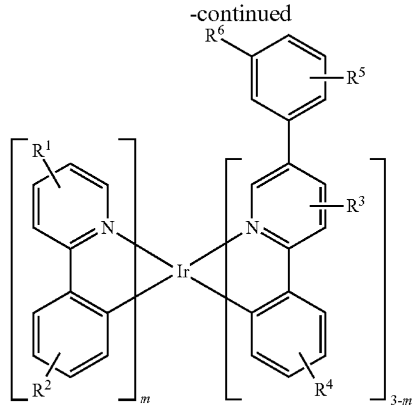

and

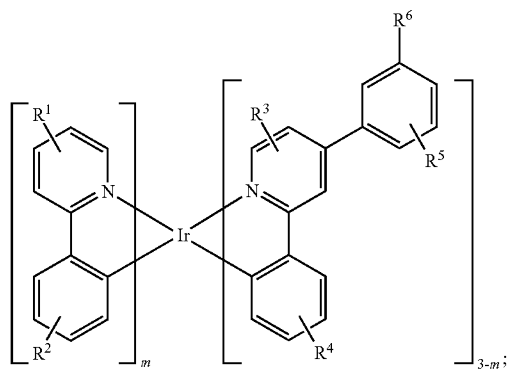

wherein m is 1 or 2;

wherein the ligand $L_A$, $L_B$, and $L_C$ are each independently selected from the group consisting of:

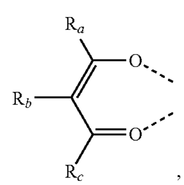

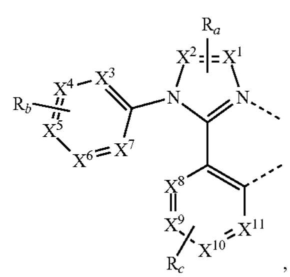

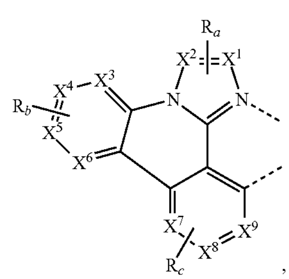

-continued

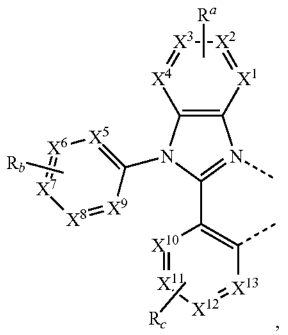

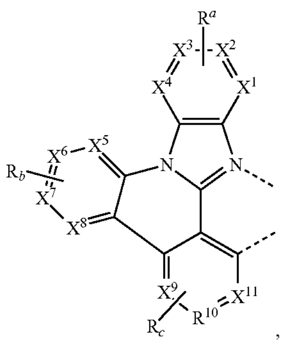

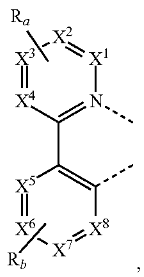

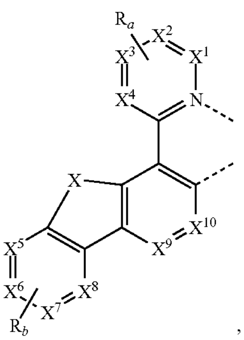

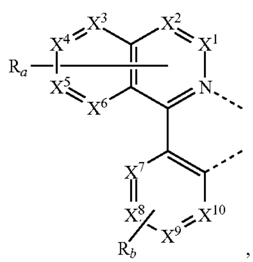

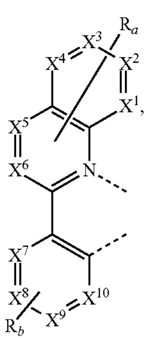

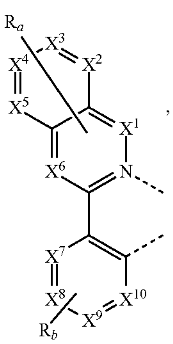

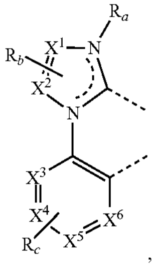

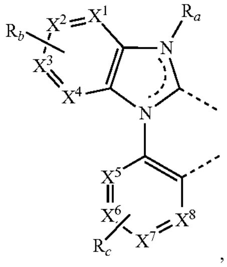

-continued

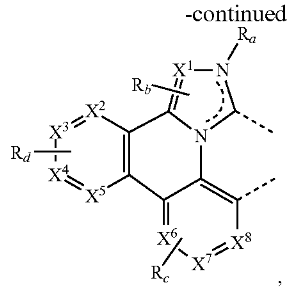

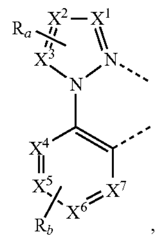

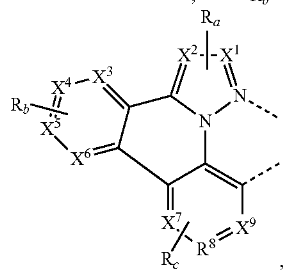

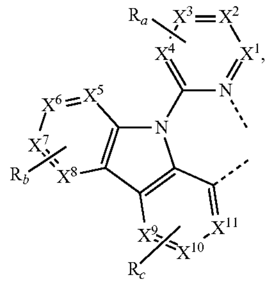

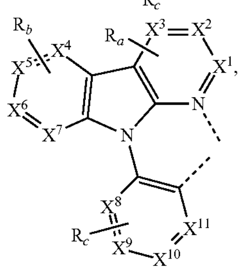

and

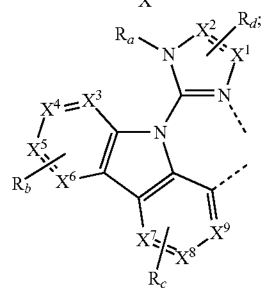

wherein each $X^1$ to $X^n$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M;

wherein a molecule of the compound, has an orientation factor value greater than 0.67;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof.

According to yet another embodiment, a formulation is disclosed wherein the formulation contains a compound having a formula selected from the group consisting of $$M(L_A)_x(L_b)_y(L_c)_z,$$

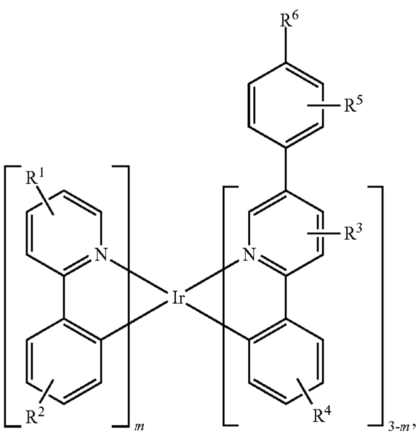

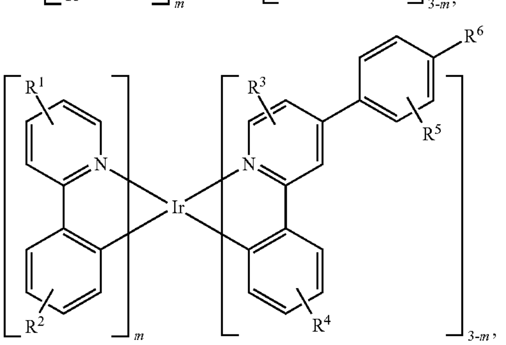

-continued

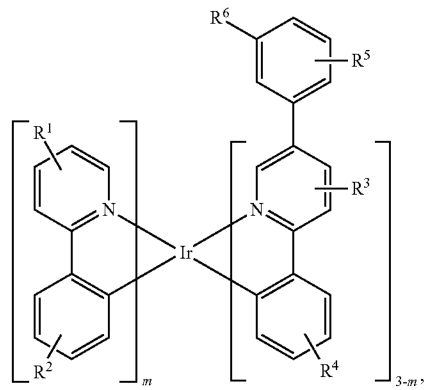

and

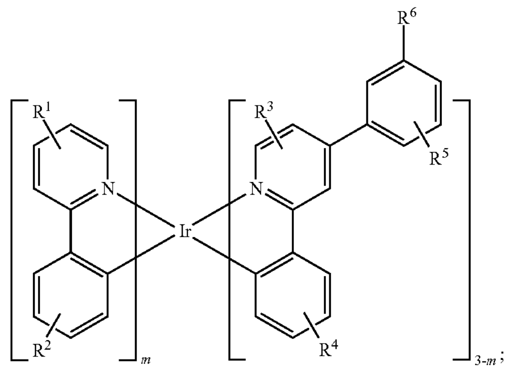

wherein m is 1 or 2;

wherein the ligand $L_A$, $L_B$, and $L_C$ are each independently selected from the group consisting of:

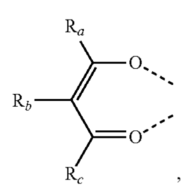

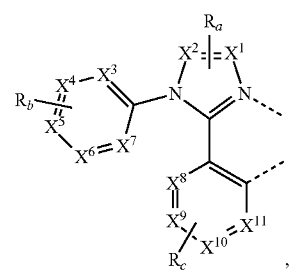

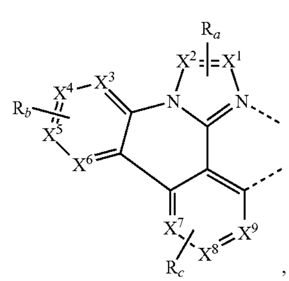

-continued

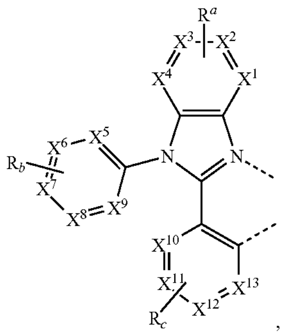

,

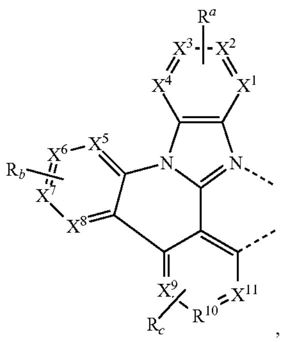

,

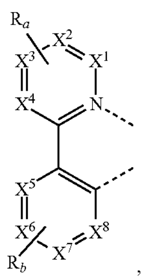

,

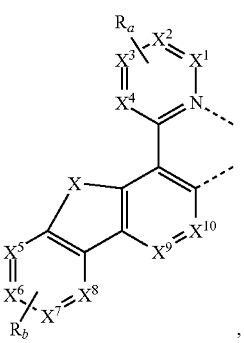

,

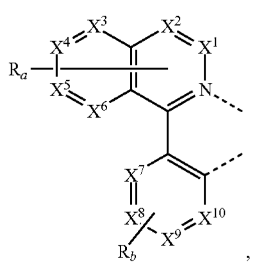

,

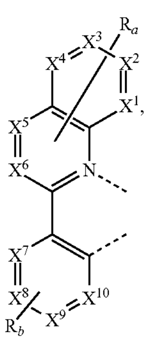

,

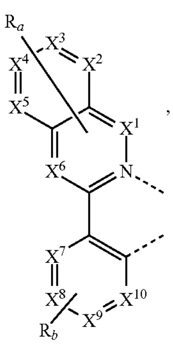

,

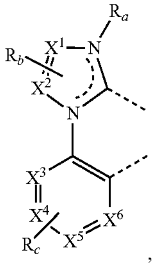

,

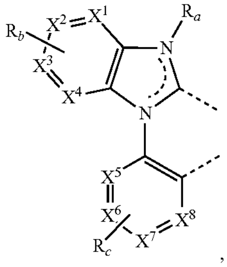

,

-continued

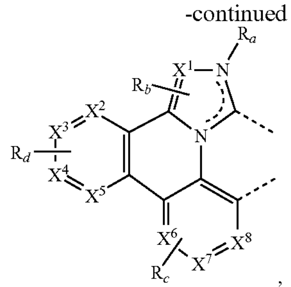

,

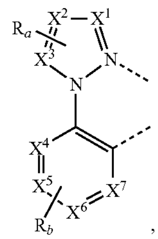

,

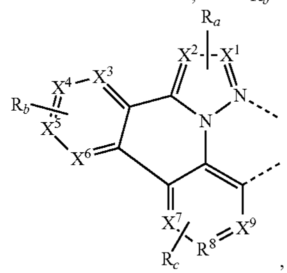

,

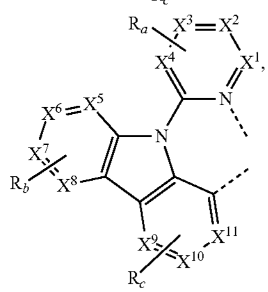

,

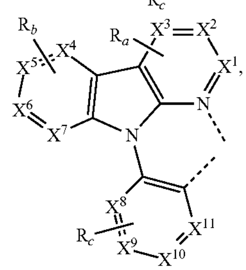

and

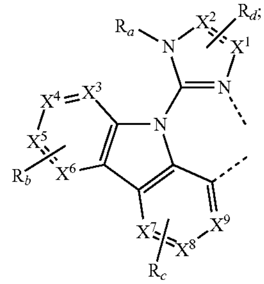

;

wherein each $X^1$ to $X^n$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M;

wherein a molecule of $M(L_A)x(L_B)_y(L_C)_z$ has an orientation factor value greater than 0.67;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof is disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
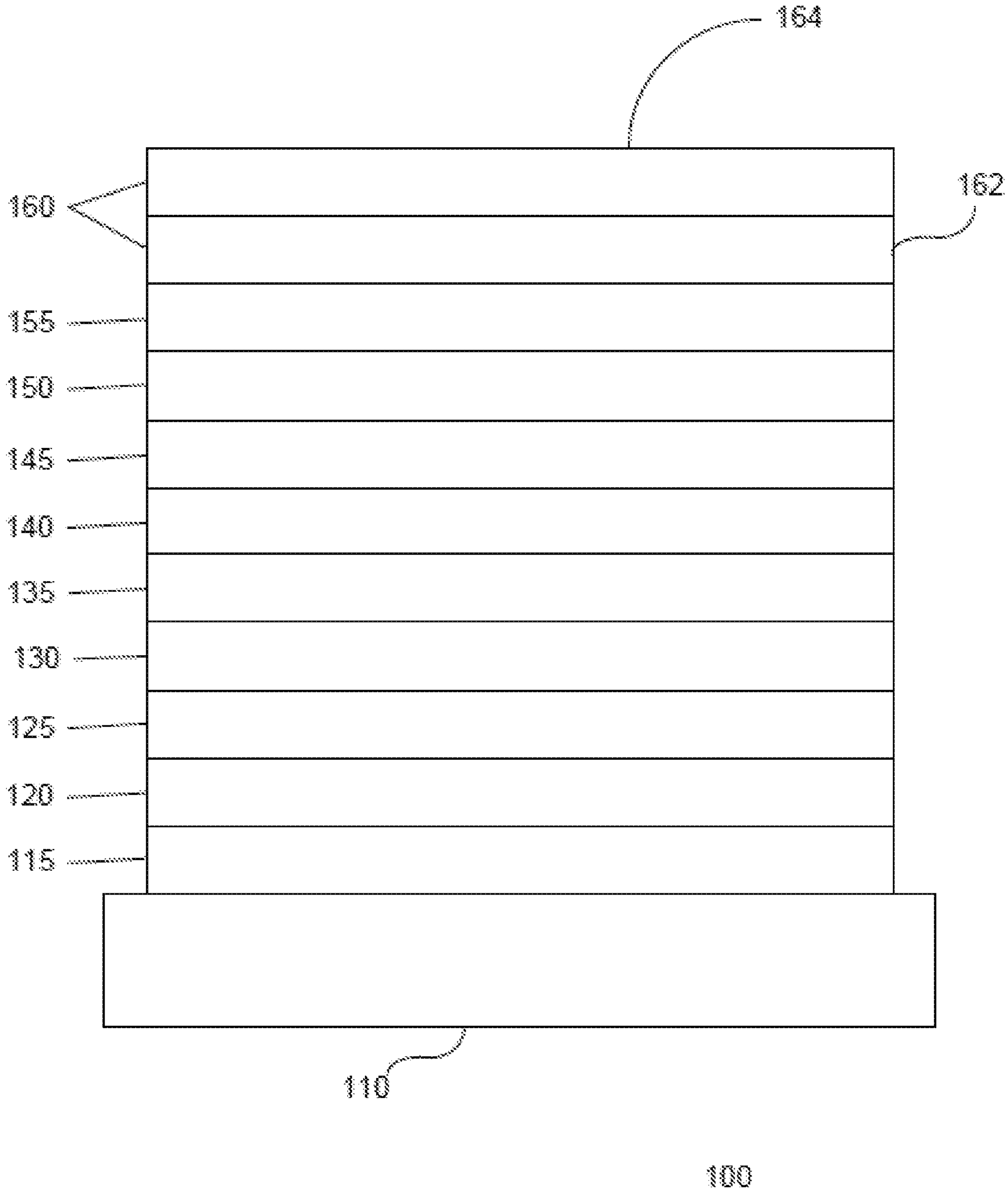
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
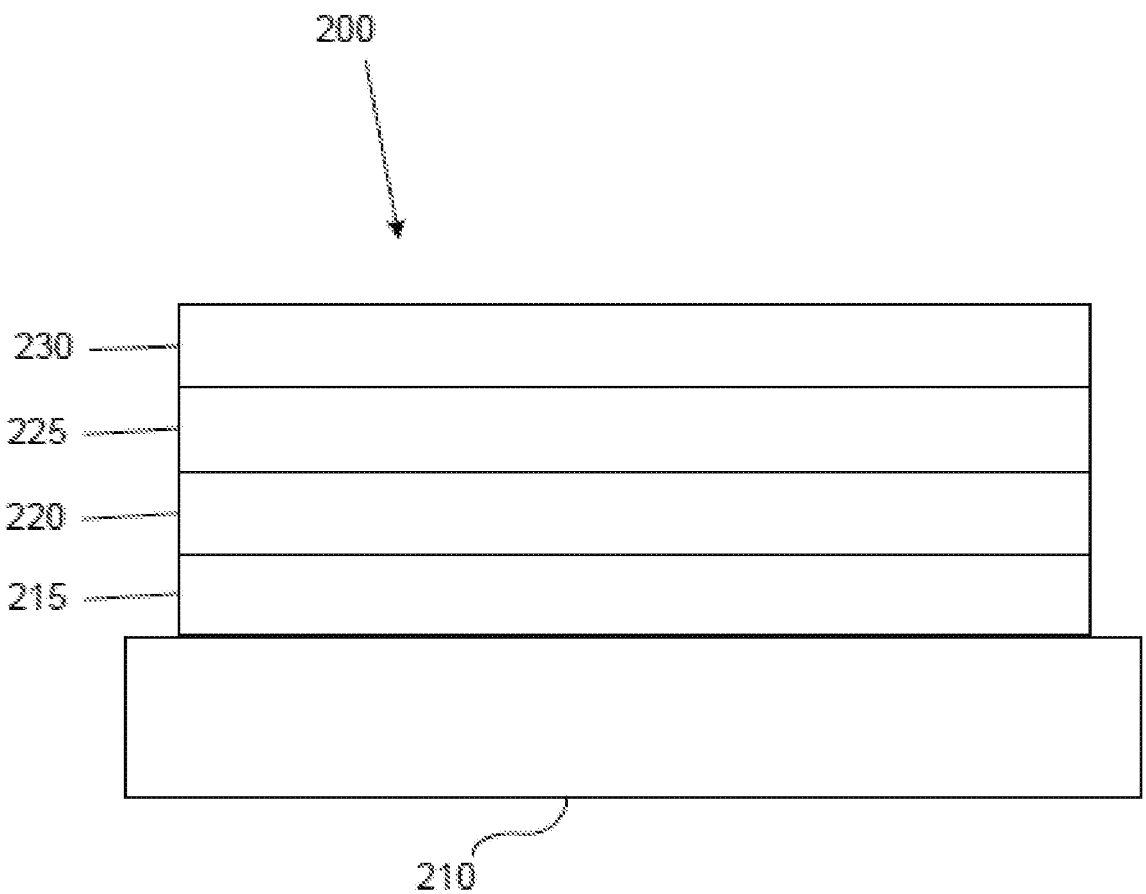
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order.

Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable device, laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperdino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[fh]quinoxaline and dibenzo[fh]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Iridium complexes containing simple alkyl substituted phenylpyridine ligands have been widely used as emitters in phosphorescent OLEDs. In some embodiments, the present disclosure discloses iridium complexes comprising a substituted phenylpyridine ligand with specific substitution patterns or specific novel substitutions that form bulky groups on the Ir compex. Bulky groups on Pt complex ligands also have shown higher EQE and less excimer formation. These substitutions unexpectedly improve the device efficiency and lifetime. These substitutions also orient the metal complexes so that their transition dipole moments are parallel to the OLED substrate that enhances the external quantum efficiency of emitters. The parallel orientation of the transition dipole moments of the emitter metal complexes enhances the amount of light extracted from the OLED because the light emission is perpendicular to the transition dipole of the emitter compounds.

Determination of Emitter Transition Dipole Moment Orientation—

The orientation of transition dipole moments of the emitters in OLEDs has received much attention as one of the significant factors limiting external quantum efficiency. A number of different methods of measuring the orientation has been used and reported in recent literature. The reported methods include: angular photoluminescence profile measurements followed by optical simulation; integrating sphere EQE measurements of EL devices with and without outcoupling lenses using devices with a range of ETL thicknesses; and monochromatic electroluminescence far-field angular patterns measurements. All of these methods use the commercial optical simulation software for data calculations and interpretation.

The method described below was designed for evaluating the orientation factor of a large number of OLED emitters used in devices with standard material sets. Normally, the subject materials are used in devices with structures optimized for maximum efficiency. The method requires modified structures with changed thicknesses of the layers in order to enhance the sensitivity of the measured emission to the emitter's dipole orientation.

Device Structure Selection—

The key element in studying the dipole orientation of OLED emitters is the tuning of the sample device's structure to enhance the optical characteristics of the emission which are the most sensitive to the dipole orientation. In a bottom-emitting device, the distance of the location of the emitters from the reflecting cathode becomes the dominating parameter if it is tuned to the maximum wavelength of the emission spectrum to create the cavity effect. The cavity effects activated this way are best visible in angular measurements of polarized emission.

The structure has to provide the matrix to hold the emitters in a well-defined location and the way to activate the emitter's electroluminescence. Even though the structure constitutes a complex optical system with many interfaces and includes materials with different optical properties, it can be designed to make the distance between the emitting sites and the reflecting cathode the primary element defining the far field pattern in air.

TABLE 1

An example of a proposed device structure for determining the orientation factor of a yellow emitter.

| Layer | Thickness [nm] |
|---|---|
| Substrate | ITO 750Å_5mm$^2$ |
| HIL | 100 |
| HTL | 700 |
| EBL* | 50 |
| EML doped with Emitter 12%*** | 100 |
| HBL* | 50 |
| ETL** | 1550 |
| EIL | 10 |
| Al cathode | 1000 |

TABLE 2

An example of a proposed device structure for determinning the orientation factor of a green emitter.

| Layer | Thickness [nm] |
|---|---|
| Substrate | ITO 750Å_5mm$^2$ |
| HIL | 100 |
| HTL | 650 |
| EBL* | 50 |
| EML doped with Emitter 12%*** | 100 |
| HBL* | 50 |
| ETL** | 1350 |
| EIL | 10 |
| Al cathode | 1000 |

*Carrier blocking layers to confine the emission sources in a thin EML.
**Thick ETL which along with HBL and part of EML resonates with yellow or green emission.
***Thin 100Å EML to confine the recombination zone (RZ) in the narrow region.

The example of the device structure that can be used for determining the orientation factor of a yellow emitter compound is shown in Table 1. The layer thicknesses provided in Table 1 are designed for yellow emitter orientation factor measurements. The example of the device structure for determining the orientation factor of a green emitter is shown in Table 2. The layer thicknesses can be adjusted for red, green, or blue emitters according to their emission wavelength. The general rule is to tune the distances between RZ in the EML, the reflective electrode and the transparent electrode, by adjusting the thickness of the appropriate layers, to maximize light output by means of constructive interference of outgoing light from the RZ and reflected light from the reflective electrode. Distance is tuned by device layer thicknesses, is proportional to the emission wavelength. The organic emitters are placed in the 100 Å-thick EML. The emission of the organic emitters is usually not strictly monochromatic. Different parts of the spectrum will interact differently with light reflected by the cathode, modifying the original spectrum. Because of that the spectrum seen by the far field instruments may be different from the original PL spectrum of the emitter.

Examples of the materials for the different components in the example device structures for the yellow and green emitter orientation factor determination are as follows:

Anode: ITO;

HIL: HATCN;

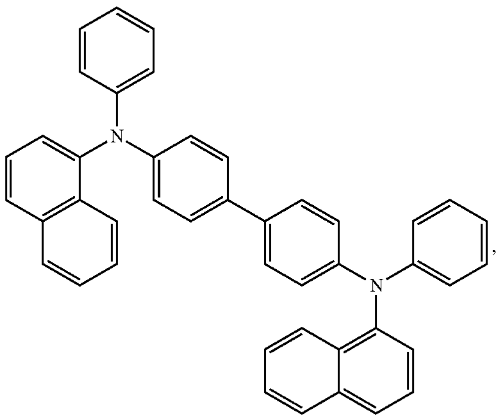
, or
NPD
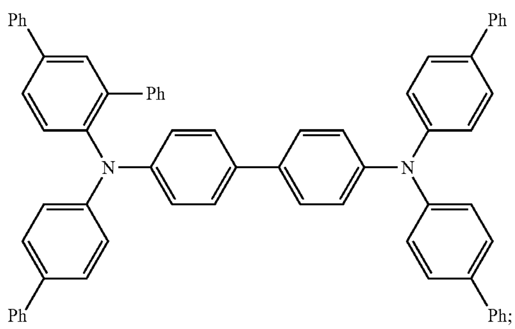
HTL
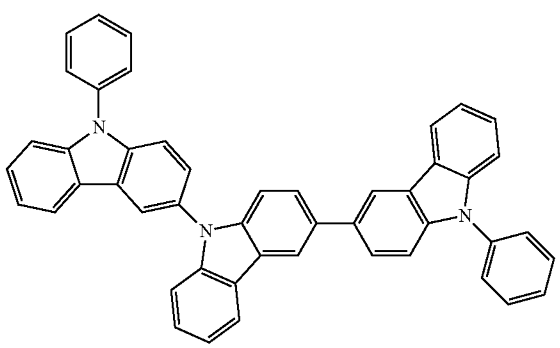
EBL
EML consists of the following two hosts:
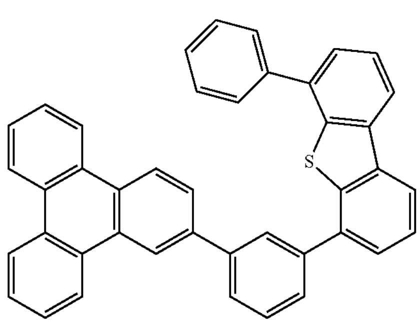
and
-continued
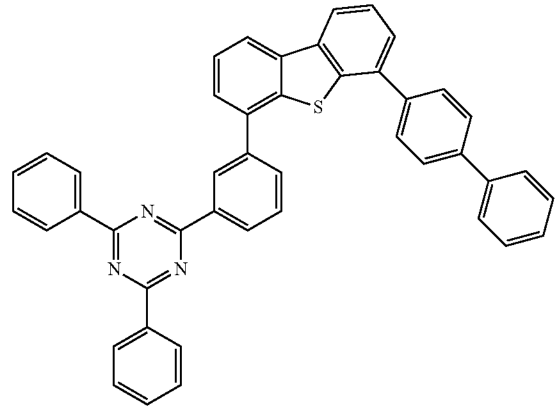
and an emitter;
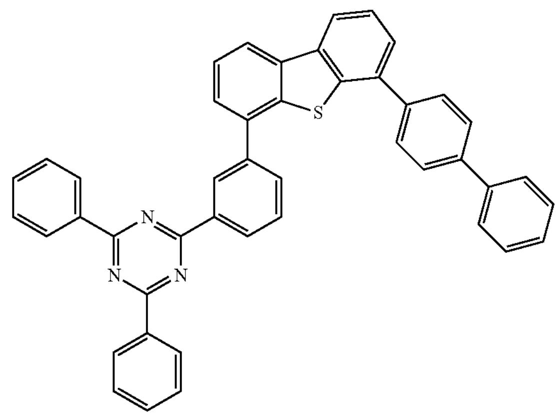
HBL
ETL: Mixed ETL consisting of Liq and
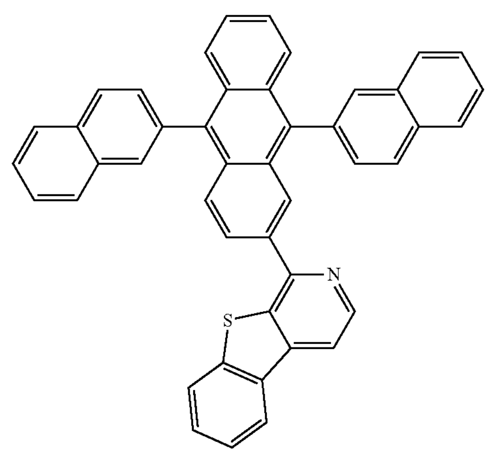
EIL: LiF or Liq; and
Cathode: Al.
This material set should be adjusted accordingly for red, green, or blue emitters. One of ordinary skill in the art would know how to adjust the material set for red, green, or blue emitters. The relatively large device pixel area of 5 $mm^2$ was selected for the convenience of angular spectra measurements.

The testing:

The procedure for determining the orientation factor for the emitter Example 2, Comp $(L_{A147})_2Ir(L_{B184})$, in Table 3 is now described. The spectral measurements of the device structure in Table 1 are performed using a calibrated spectrophotometer model PR740. Since the instrument uses the image of a dot projected on the shutter with the small aperture, a small parallax effect is expected as the object is viewed at an angle. This needs to be corrected by using a simple geometry. At the angles over 50° there is an additional effect of the instrument looking at reflections of light from the back glass cover of the device. For that reason, the data taken at angles wider than 50° is only used to show the trends, but the calculations are only based on data taken at angles between 30-50°. For most of the samples the effects analyzed at 40° angle are strong enough to provide reliable data, so there is no need to quantify the data obtained at wider angles.

Comparing measured and simulated spectral data is the most sensitive measure of the quality of the match between the simulated data and the real emission. Since the simulation software methodology is based on optical properties of the light source, the agreement between observed and simulated data confirms the validity of using the simulation to calibrate the performance of an emitter in terms of calculated dipole orientation. The ratio of p- to s-emission measured at 30-50° range strongly correlates with the orientation factor. Using the ratio of p to s radiance eliminates potential problems with absolute calibration of the radiance measurements coming from imperfections of the optical system.

Figure 3:
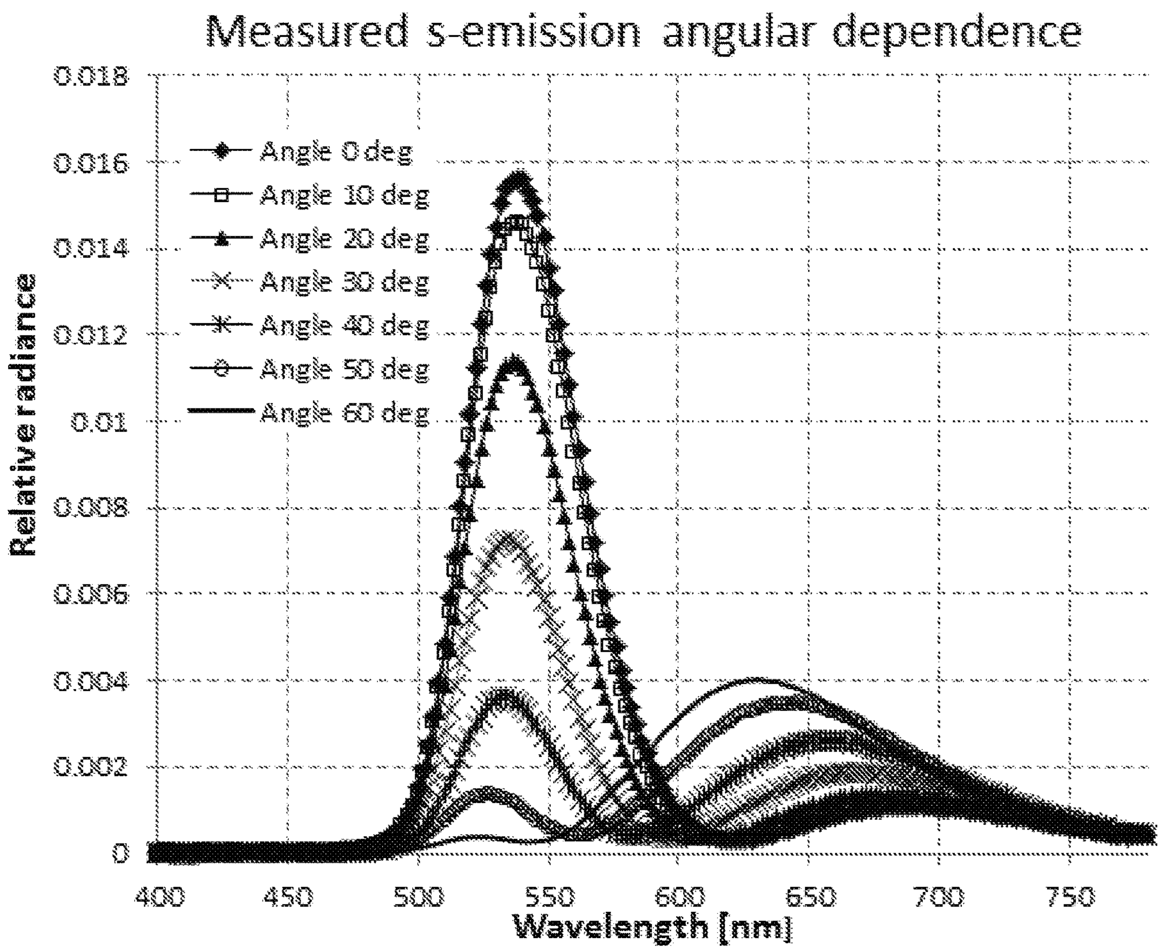
FIG. 3 shows spectra measured through a polarizer at angles from 0 to 60° for the emitter from device Example 2 with the device structure defined in Table 1.
Figure 4:
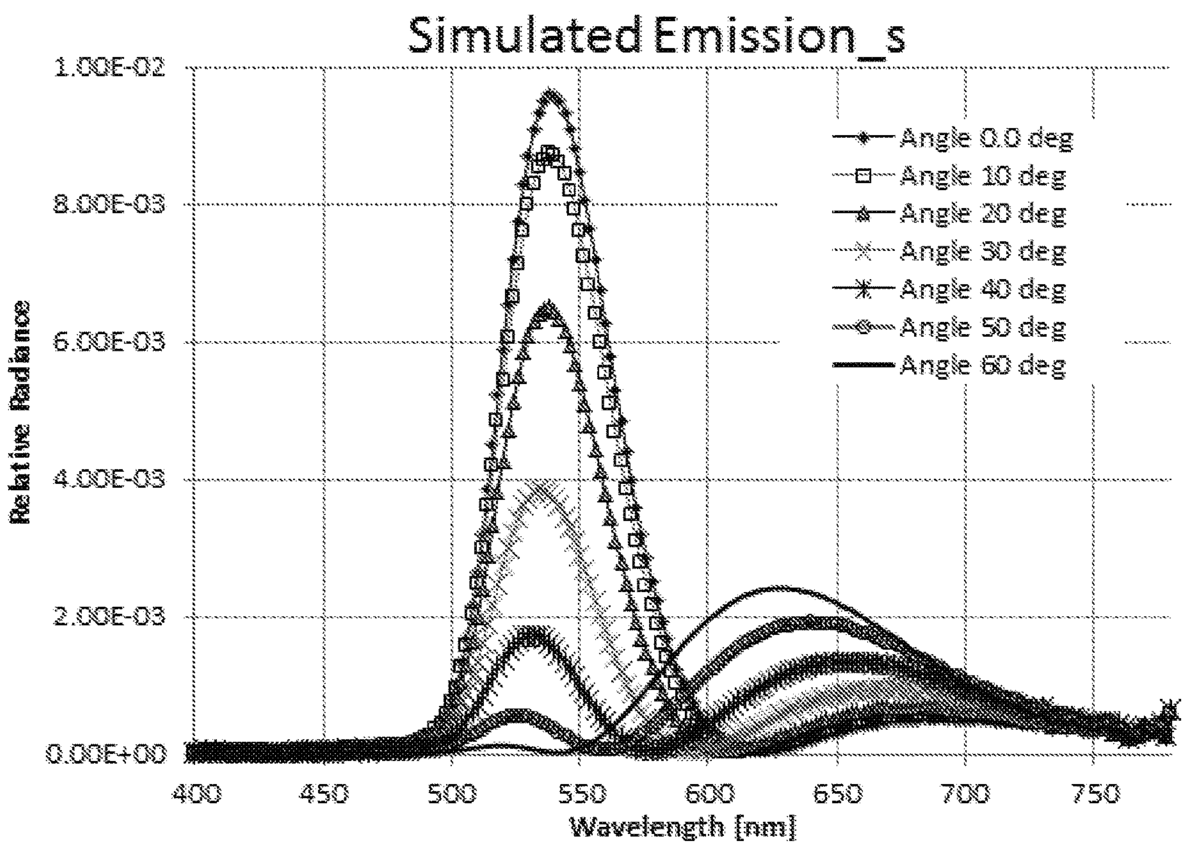
FIG. 4 shows corresponding spectra generated by SETFOS-4.1.

The spectra:

FIG. 3 shows the EL spectra of the device for emitter Example 2 in the structure shown in Table 1 taken at various angles from 0 to 60° through an s-polarizer. FIG. 4 is simulated angular dependent s-EL spectra of the same device structure using the program SETFOS-4.1 by Fluxim. The experimental and simulated spectra should match.

Figure 5:
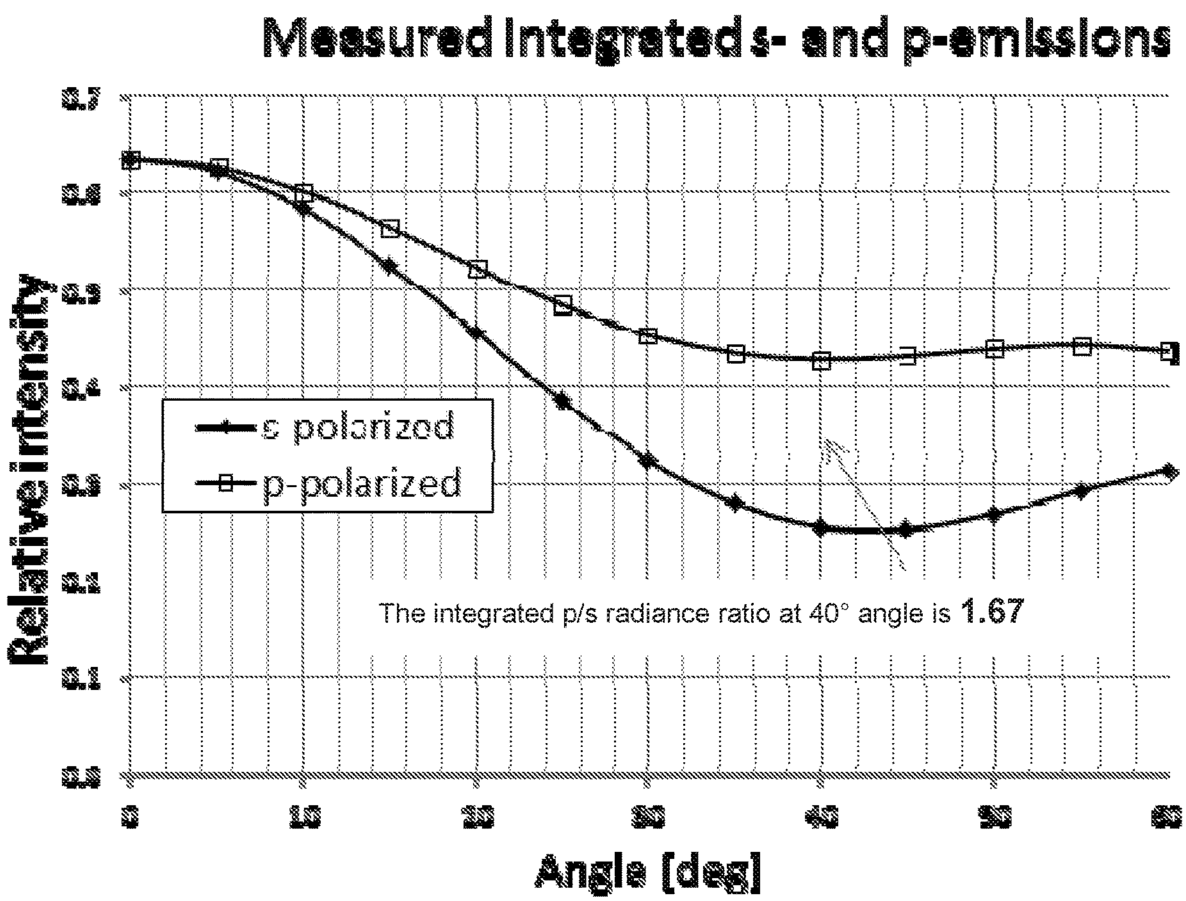
FIG. 5 illustrates experimental angular dependence of integrated radiance normalized to 0° numbers. The integrated p/s radiance ratio at 40° angle is 1.67.
Figure 6:
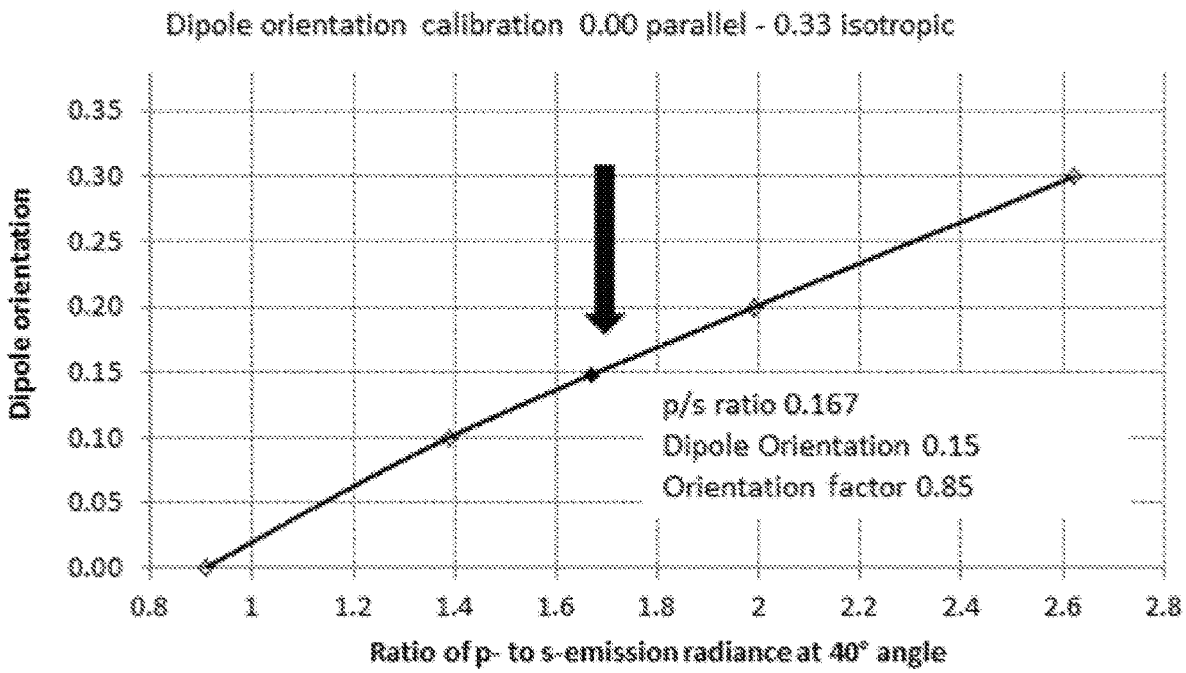
FIG. 6 illustrates dipole orientation calibration vs. p/s emission ratio simulated by SETFOS-4.1 program. For this specific example, the integrated p/s radiance ratio at 40° angle is 1.67 corresponding to dipole orientation (DO) of 0.15.
Figure 7:
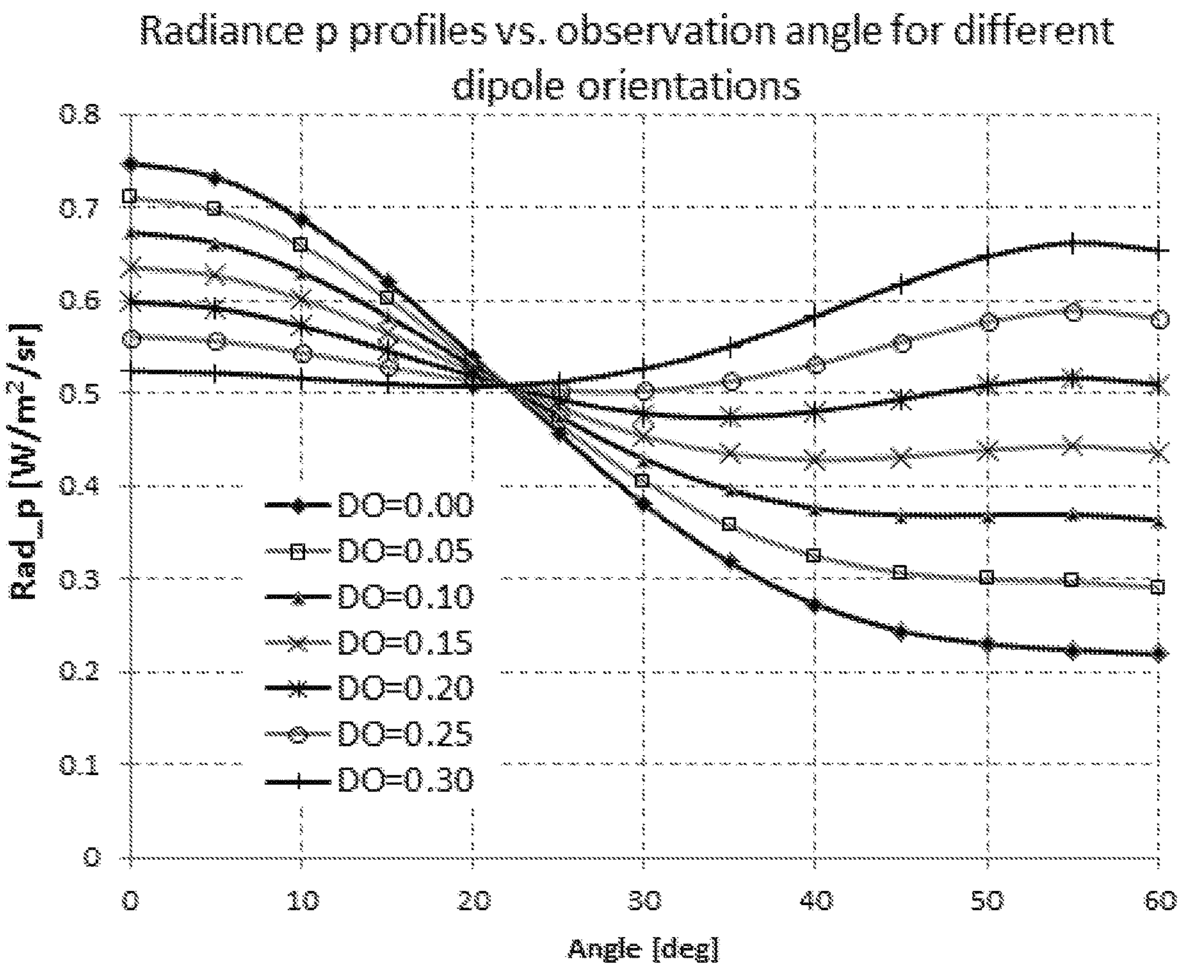
FIG. 7 illustrates radiance-p profiles vs. observation angle for different DOs.
Figure 8:
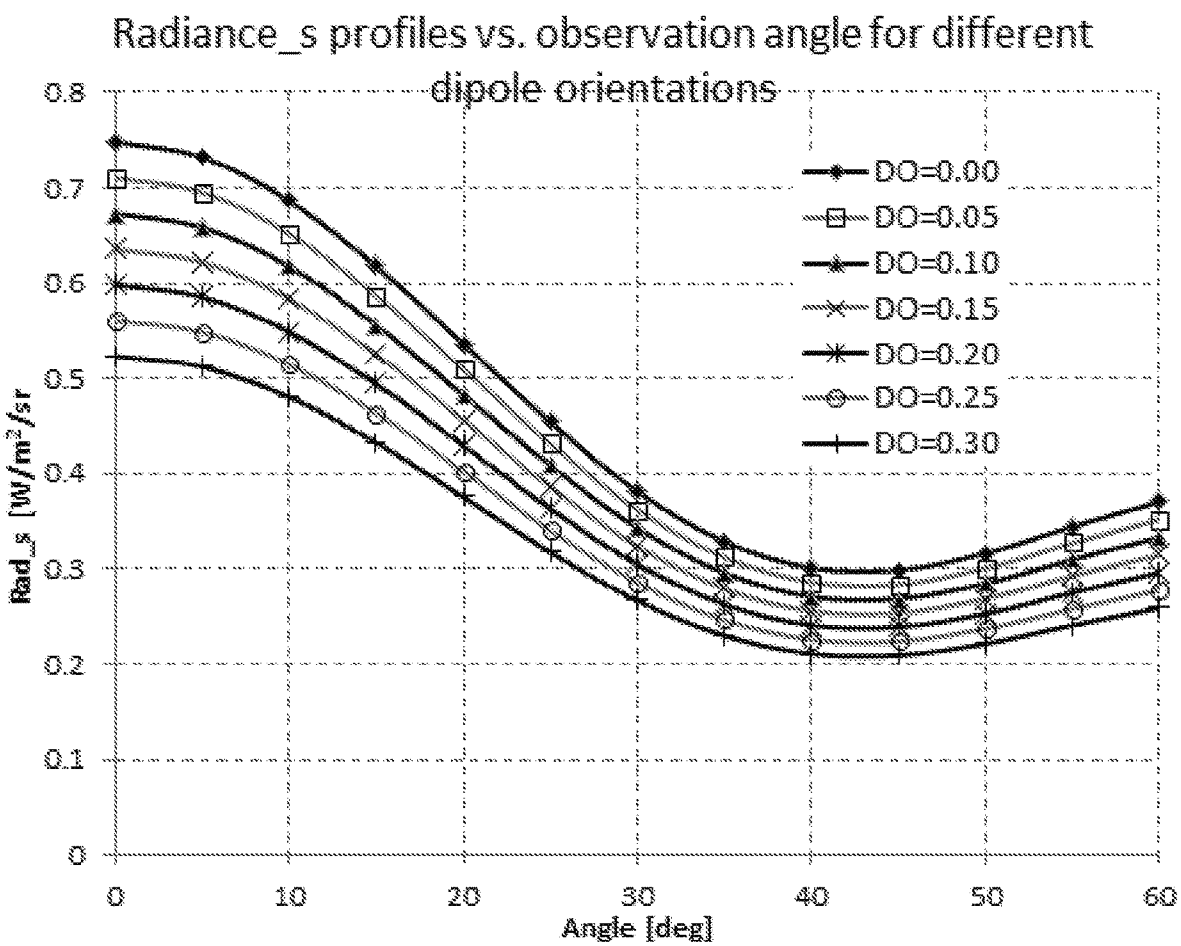
FIG. 8 illustrates radiance-s profiles vs. observation angle for different DOs.

Results and Interpretation:

The details of the dependence of the estimated dipole orientation number on the angular data for a given spectrum and device structure is explained below. The graph in FIG. 5 is based on data generated by the simulation software for the sample with the structure shown in Table 1 and the spectra matched as shown in FIGS. 3-4. For this specific example, the integrated p/s radiance ratio at 40° angle is 1.67 and corresponding dipole orientation (DO) is 0.15 (FIG. 6). The DO numbers generated by the simulation software represent the statistical distribution of vertical versus horizontal orientations. The vertical and horizontal directions are with respect to the substrate and vertical refers to the direction orthogonal to the substrate surface and horizontal refers to the direction parallel to the substrate surface. With one vertical and two horizontal directions, the DO number scale is 0 (parallel or horizontal) to 0.33 (isotropic). The corresponding scale of 1 to 0.67 represents the percentage of the original EQE after losses due to dipole orientation This value defined as $\Theta$=1-DO is called emitter orientation factor (in our example $\Theta$=1−0.15=0.85, or 85% of max EQE) is used further in the experimental data. It represents the % of emitter dipoles aligned parallel to the substrate. The graphs in FIGS. 7 and 8 show the angular response to dipole orientation at angles 30-50° to be much stronger for p-emission than that of s-emission. Also the p-radiance value goes up while the s-radiance gets smaller as the dipole orientation number increases. The resulting p/s ratio shows very high sensitivity to the dipole orientation starting from 30° observation angles. 40° in current measurements gives the biggest difference between s and p emission and the highest sensitivity and thus 40° angle is selected.

Material has a preferred orientation ('orientation factor') meaning that in a thin solid state film it has an anisotropic horizontal to vertical dipole ratio, i.e. the horizontal to vertical dipole ratio is greater than 0.67:0.33 (isotropic case) e.g. of 0.77:0.23. To describe this another way, the orientation factor $\Theta$, the ratio of the horizontal dipoles to total dipoles, is greater than 0.67.

Figure 9:
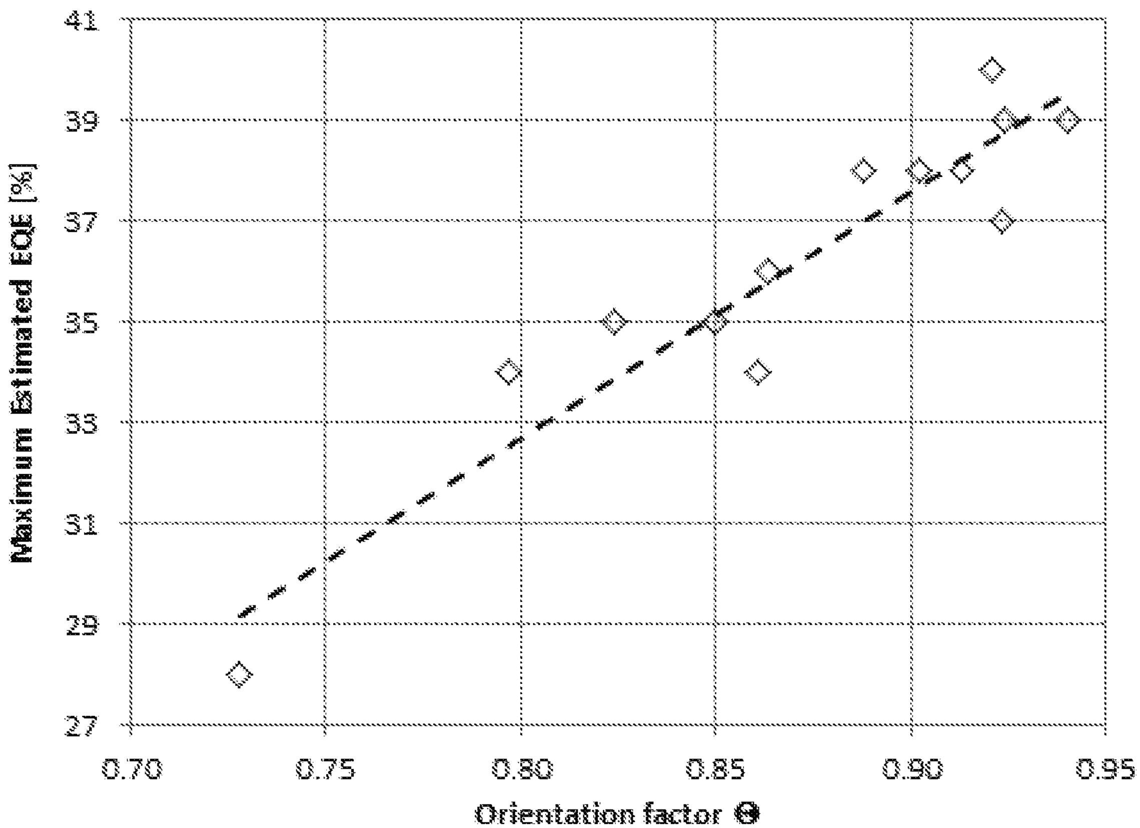
FIG. 9 shows a correlation of Maximum estimated EQE in the device with an emitter orientation factor.

FIG. 9 shows the obtained correlation between estimated maximum EQE vs. orientation factor. Obvious EQE increase with increasing orientation factor is observed. The closer the orientation factor is to 1 the more emitter molecules are aligned parallel to the substrate which is favorable for improved device efficiency.

Procedure for emitter photoluminescence quantum yield (PLQY) measurement in PMMA is described here. General preparation and experimental for solid state samples: PMMA and emitter (various wt %) are weighed out and dissolved in toluene. The solution is filtered through a 2 micron filter and drop cast onto a precleaned quartz substrate. PL quantum efficiency measurements were carried out on a Hamamatsu C9920 system equipped with a xenon lamp, integrating sphere and a model C10027 photonic multi-channel analyzer.

TABLE 3

Correlation of Estimated EQE in the device with Emitter PLQY and orientation factor.

| Example | # | Emitter | Estimated Max EQE [%] | PLQY [%] 5% in PMMA | Emitter Orientation factor $\Theta$ |
|---|---|---|---|---|---|
| CE | 1 | Comp $Ir(L_{B184})_3$ | 28 | 90 | 0.73 |
| CE | 2 | Comp $(L_{A1})_2Ir(L_{B182})$ | 34 | 91 | 0.80 |
| Example | 1 | Comp $(L_{A1})_2Ir(L_{B196})$ | 35 | 98 | 0.82 |
| Example | 2 | Comp $(L_{A147})_2Ir(L_{B184})$ | 36 | 95 | 0.85 |
| Example | 3 | Comp $(L_{A163})_2Ir(L_{B184})$ | 34 | 89 | 0.86 |
| Example | 4 | Comp $(L_{A153})_2Ir(L_{B227})$ | 38 | 96 | 0.89 |
| Example | 5 | Comp $(L_{A147})_2Ir(L_{B225})$ | 38 | 95 | 0.90 |
| Example | 6 | Comp $(L_{A147})_2Ir(L_{B112})$ | 38 | 95 | 0.91 |
| Example | 7 | Comp $(L_{A147})_2Ir(L_{B86})$ | 40 | 98 | 0.92 |
| Example | 8 | Comp $(L_{A153})_2Ir(L_{B86})$ | 37 | 89 | 0.92 |
| Example | 9 | Comp $(L_{A147})_2Ir(L_{B109})$ | 39 | 94 | 0.92 |
| Example | 10 | Comp $(L_{A147})_2Ir(L_{B88})$ | 39 | 92 | 0.94 |

As seen by the emitter orientation factor, emitter orientation is more parallel with increasing bulkiness of group on 4phenyl ring of 2,4-diphenylpyridineligand. It has been reported that estimated EQE is in direct correlation with emitter orientation.

TABLE 4

Correlation of PLQY with emitter concentration for some emitters

| Example | Emitter | Emitter % in PMMA | PLQY [%] |
|---|---|---|---|
| CE2 | Comp $(L_{A1})_2Ir(L_{B182})$ | 1 | 93 |
| CE2 | Comp $(L_{A1})_2Ir(L_{B182})$ | 5 | 91 |
| CE2 | Comp $(L_{A1})_2Ir(L_{B182})$ | 10 | 90 |
| CE2 | Comp $(L_{A1})_2Ir(L_{B182})$ | 15 | 80 |
| CE2 | Comp $(L_{A1})_2Ir(L_{B182})$ | 20 | 72 |
| Example 2 | Comp $(L_{A147})_2Ir(L_{B184})$ | 1 | 96 |
| Example 2 | Comp $(L_{A147})_2Ir(L_{B184})$ | 5 | 95 |
| Example 2 | Comp $(L_{A147})_2Ir(L_{B184})$ | 10 | 89 |
| Example 2 | Comp $(L_{A147})_2Ir(L_{B184})$ | 15 | 87 |
| Example 2 | Comp $(L_{A147})_2Ir(L_{B184})$ | 20 | 84 |
| Example 9 | Comp $(L_{A147})_2Ir(L_{B109})$ | 1 | 96 |
| Example 9 | Comp $(L_{A147})_2Ir(L_{B109})$ | 5 | 94 |
| Example 9 | Comp $(L_{A147})_2Ir(L_{B109})$ | 10 | 91 |
| Example 9 | Comp $(L_{A147})_2Ir(L_{B109})$ | 15 | 90 |
| Example 9 | Comp $(L_{A147})_2Ir(L_{B109})$ | 20 | 87 |

Figure 10:
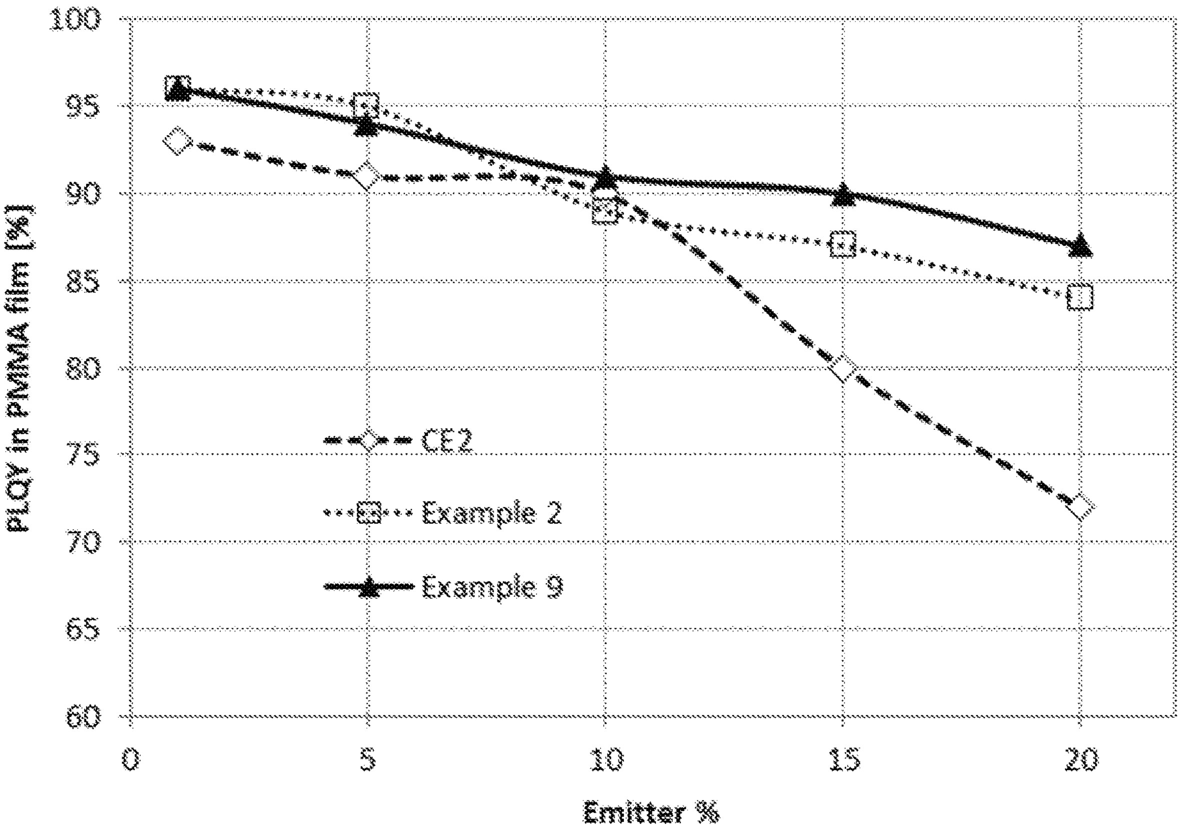
FIG. 10 shows a correlation of PLQY with emitter concentration for some emitters. The steric bulk of emitters prevents self-quenching at high doping %.

FIG. 10 shows the correlation of Emitter PLQY in the thin film as a function of emitter concentration. For non-bulky emitters like Comp $(L_{A1})_2Ir(L_{B182})$ used in device CE2, PLQY drops significantly with increasing emitter concentration over 10%. However for more bulky emitters (e.g., the emitters used in devices Example 2 and Example 9) PLQY does not decrease quickly with emitter concentration increase. Hence, steric bulk of emitter molecules prevents self-quenching at high emitter %.

From the above-determined emitter orientation and PLQY measurements, it follows that emitters with more steric bulk in certain direction on the molecule will provide more parallel (to the substrate of the OLED) orientation and therefore exhibit higher EQE in the device. Examples of these emitters are shown below and listed in Tables 3 and 4.

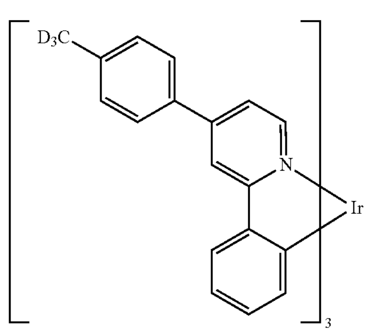

Comp $Ir(L_{B184})_3$

-continued

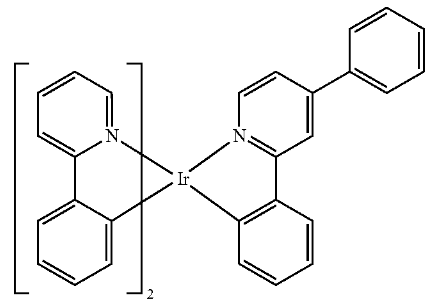

Comp $(L_{A1})_2Ir(L_{B182})$

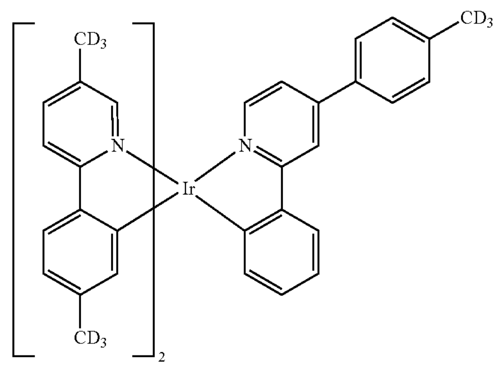

Comp $(L_{A147})_2Ir(L_{B184})$

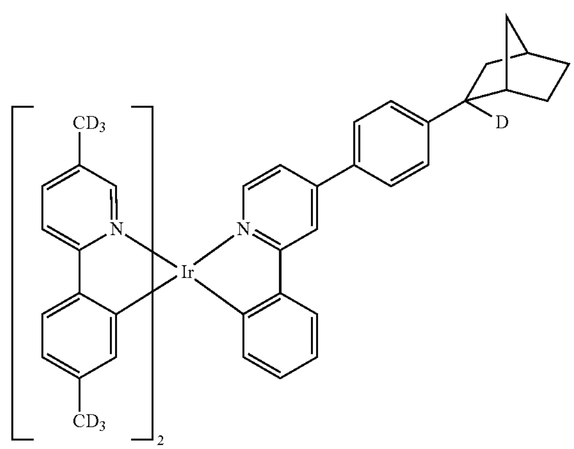

Comp $(L_{A147})_2Ir(L_{B86})$

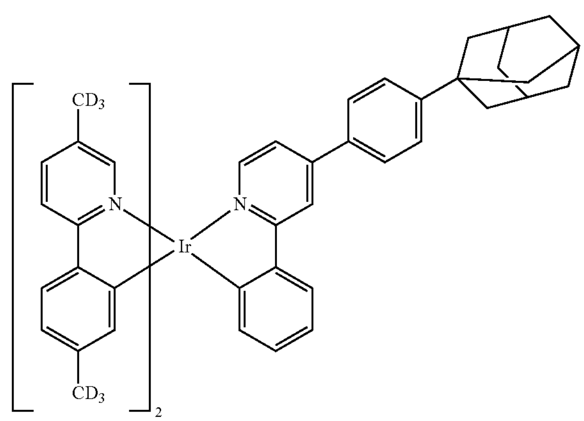

Comp $(L_{A147})_2Ir(L_{B109})$

-continued
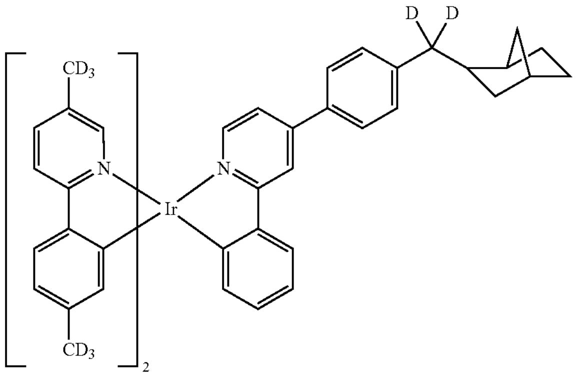
Comp $(L_{A147})_2Ir(L_{B88})$
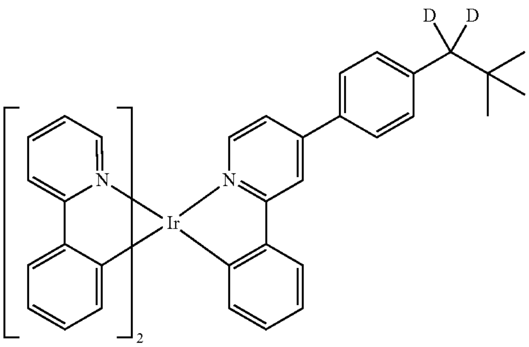
Comp $(L_{A1})_2Ir(L_{B196})$
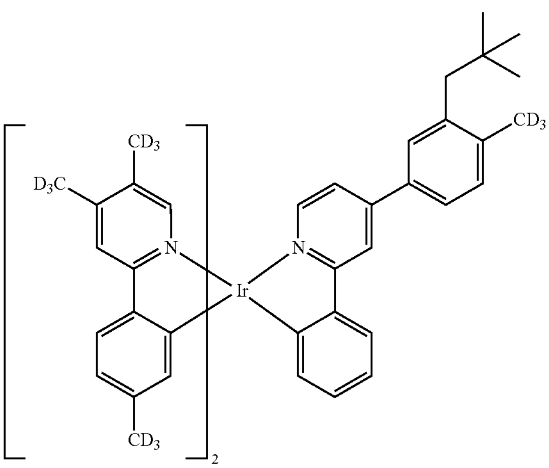
Comp $(L_{A153})_2Ir(L_{B227})$
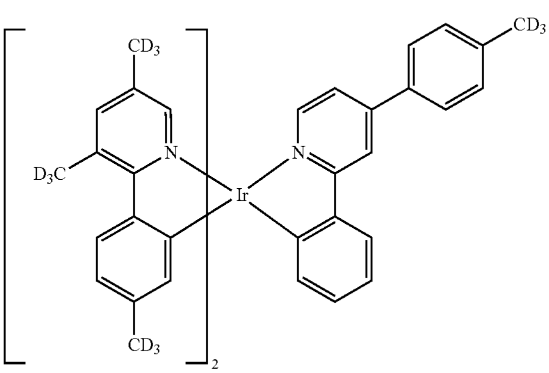
Comp $(L_{A163})_2Ir(L_{B184})$
-continued
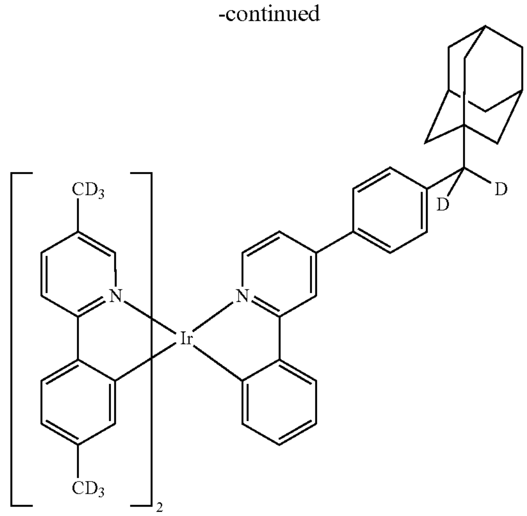
Comp $(L_{A147})_2Ir(L_{B112})$
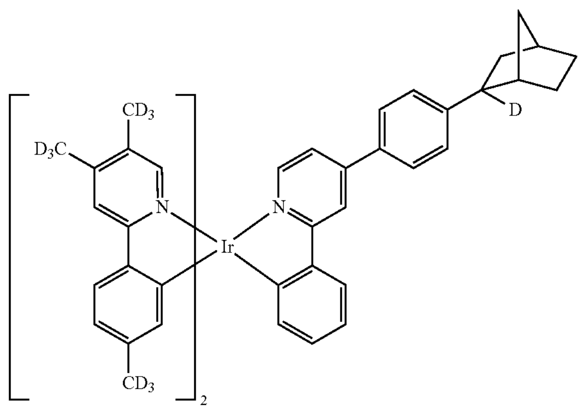
Comp $(L_{A153})_2Ir(L_{B86})$
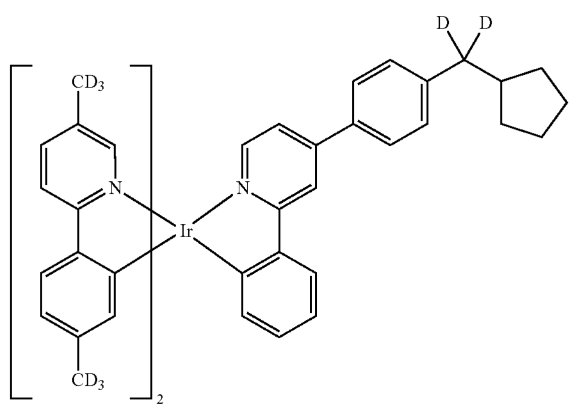
Comp $(L_{A147})_2Ir(L_{B225})$
According to some embodiments of the present disclosure, a compound having a formula $M(L_A)_x(L_B)_y(L_C)_z$ is disclosed wherein the ligand $L_A$, $L_B$, and $L_C$ are each independently selected from the group consisting of:

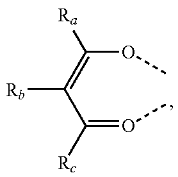
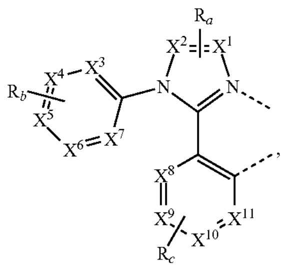
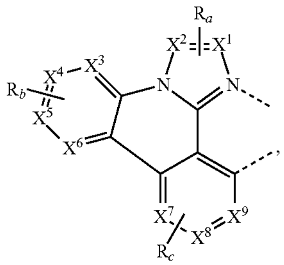
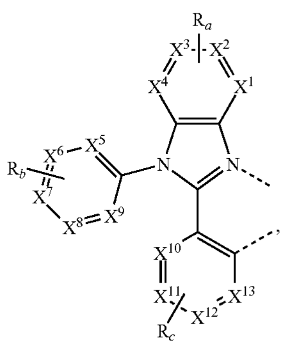
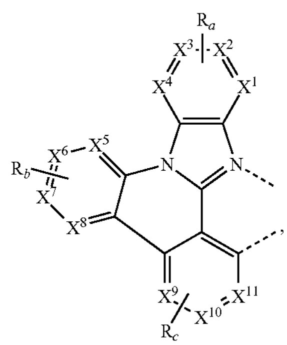
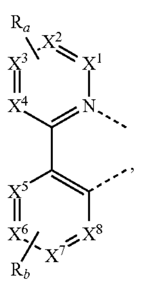
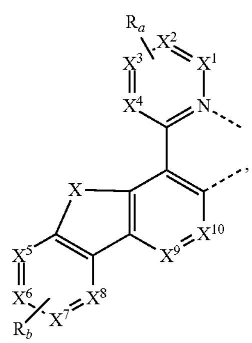
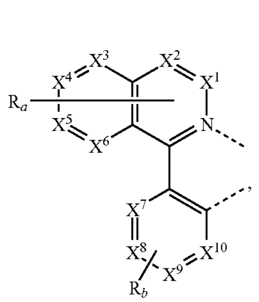
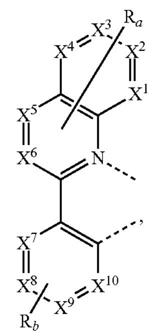

-continued

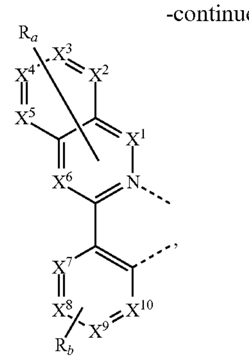
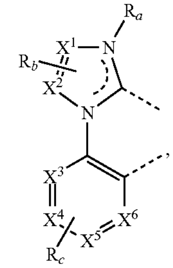
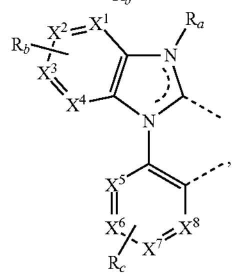
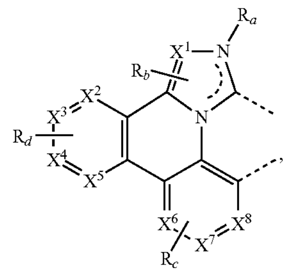
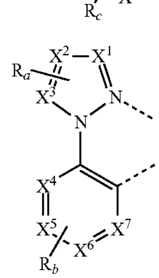
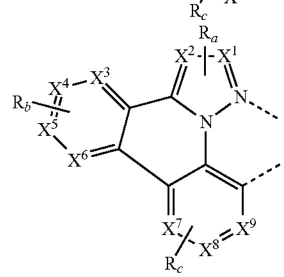
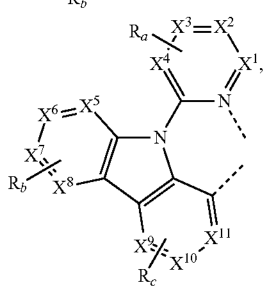
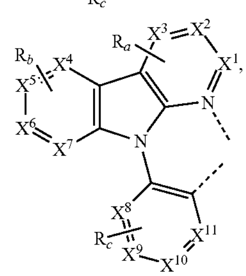

and

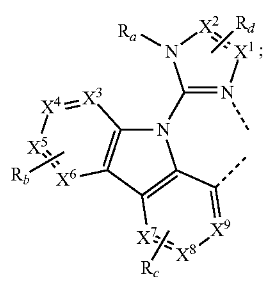

wherein each $X^1$ to $X^n$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R'', $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M; and wherein a molecule of $M(L_A)_x(L_B)_y(L_C)_z$ has an orientation factor value greater than 0.67.

In some embodiments of the compound having the formula $M(L_A)_x(L_B)y(L_C)_z$, M is selected from the group consisting of Ir, Rh, Re, Ru, Os, Pt, Au, and Cu. In another embodiment, M is Ir or Pt.

In some embodiments, the molecule of the compound has an orientation factor Θ value of at least 0.75. In other embodiments, the molecule has an orientation factor value of at least 0.80. In other embodiments, the molecule has an orientation factor value of at least 0.85. In other embodiments, the molecule has an orientation factor value of at least 0.91. In other embodiments, the molecule has an orientation factor value of at least 0.92. In other embodiments, the molecule has an orientation factor value of at least 0.93. In some embodiments, the molecule has an orientation factor value of at least 0.94.

In some embodiments of the compound having the formula $M(L_A)_x(L_B)_y(L_C)_z$, one of $R_a$, $R_b$, $R_c$, and $R_d$ is a mono substituent having at least thirteen carbon atoms, and all the rest of $R_a$, $R_b$, $R_c$, and $R_d$ has maximum carbon number of six.

In some embodiments of the compound having the formula $M(L_A)_x(L_B)_y(L_C)_z$, each $X^1$ to $X^{13}$ are carbon.

In some embodiments of the compound having the formula $M(L_A)_x(L_B)_y(L_C)_z$, the compound has the formula $Ir(L_A)_2(L_B)$.

In some embodiments of the compound having the formula $Ir(L_A)_2(L_B)$, $L_A$ has the formula selected from the group consisting of:

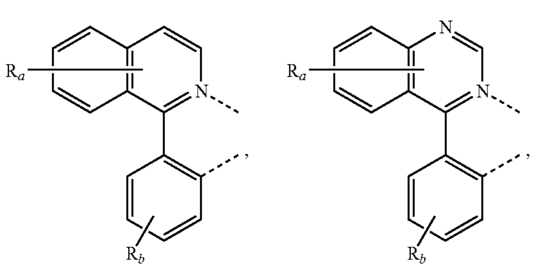

-continued

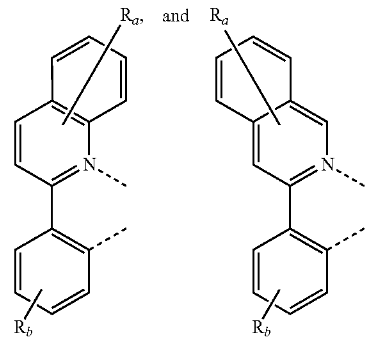

wherein $L_B$ has the formula:

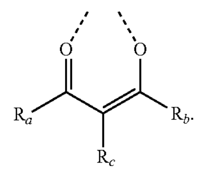

In some other embodiments, $L_B$ has the formula

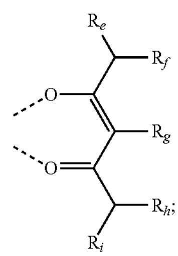

wherein $R_e$, $R_f$, $R_h$, and $R_i$ are independently selected from group consisting of alkyl, cycloalkyl, aryl, and heteroaryl; wherein at least one of $R_e$, $R_f$, $R_h$, and $R_i$ has at least two carbon atoms; wherein $R_g$ is selected from group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In some embodiments of the compound having the formula $Ir(L_A)_2(L_B)$, $L_A$ and $L_B$ are different and each independently selected from the group consisting of:

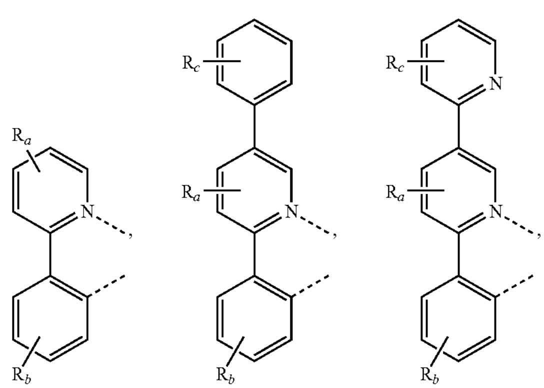

-continued
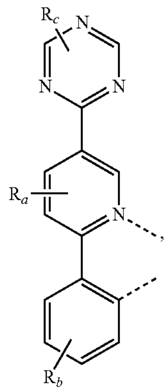
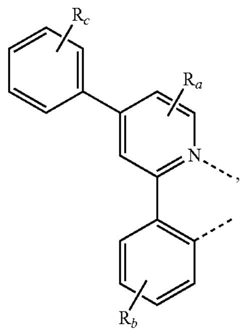
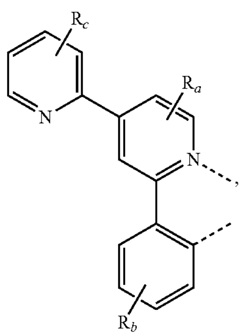
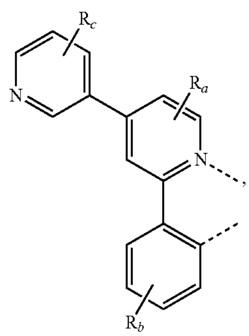
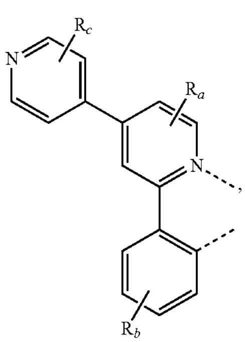
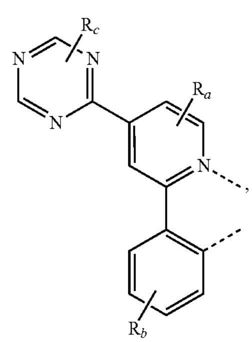
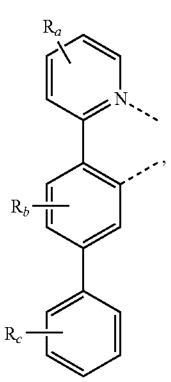
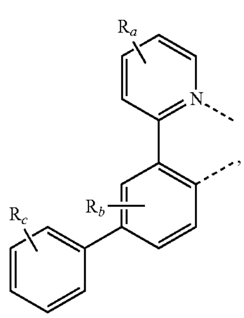
-continued
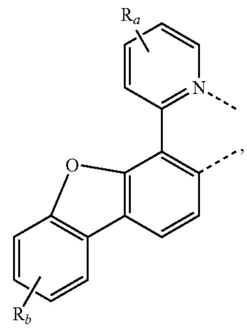
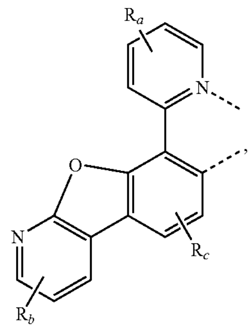
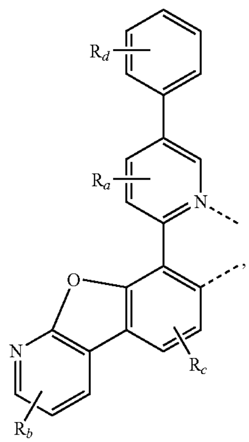
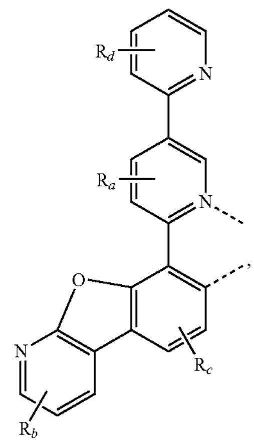
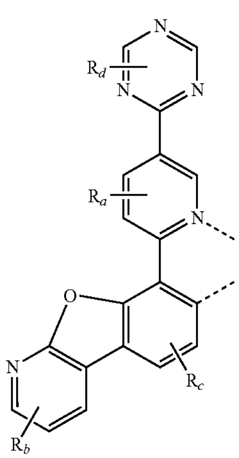
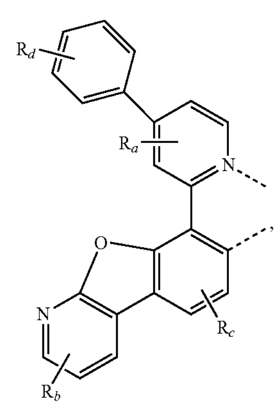
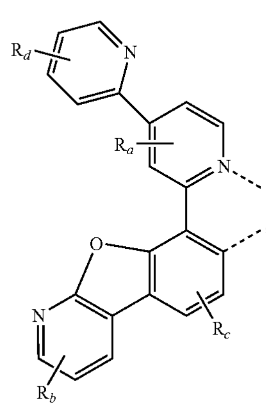
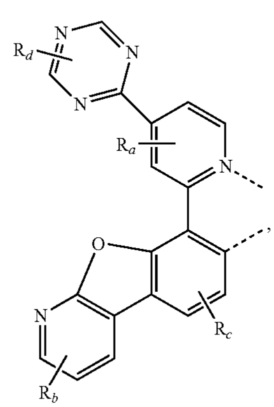

-continued

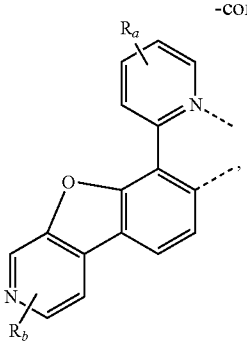

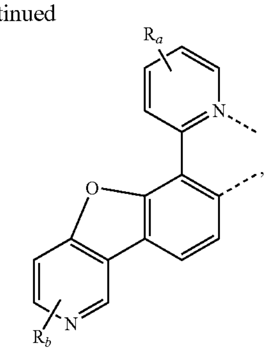

and

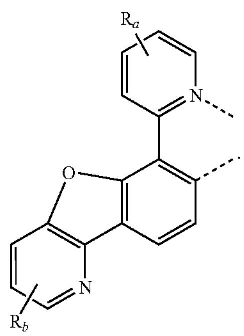

In some embodiments of the compound having the formula $Ir(L_A)_2(L_B)$, $L_A$ and $L_B$ are each independently selected from the group consisting of:

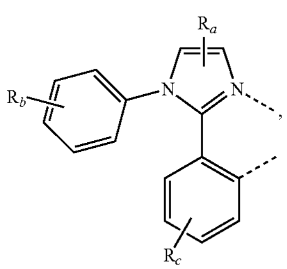

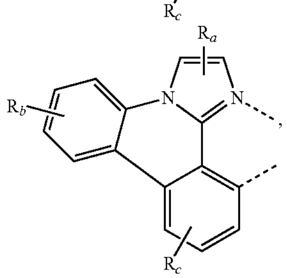

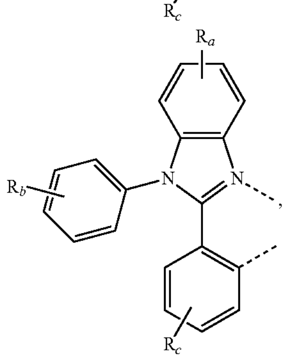

-continued

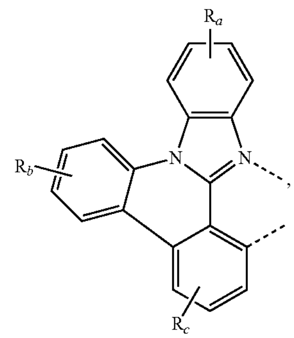

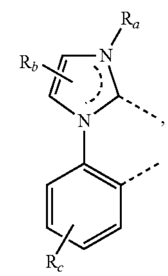

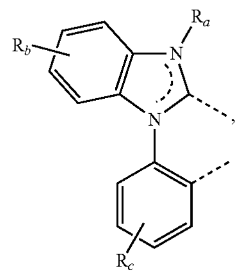

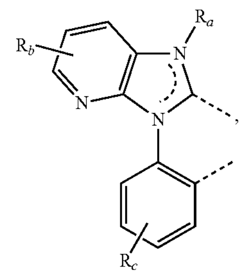

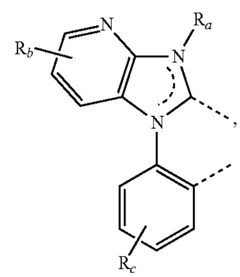

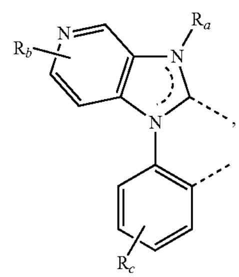

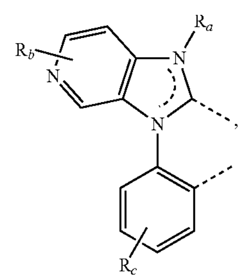

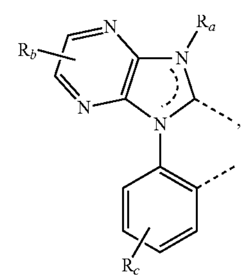

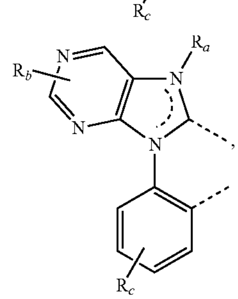

and

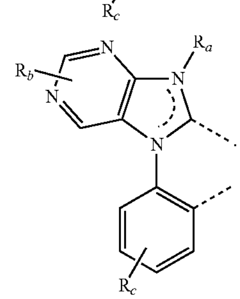

In some embodiments of the compound having the formula $M(L_A)_x(L_B)_y(L_C)_z$, the compound has the formula $Pt(L_A)(L_B)$ wherein $L_A$ and $L_B$ are different. In some embodiments of the compound, $L_A$ is connected to $L_B$ to form a tetradentate ligand.

In some embodiments of the compound having the formula $M(L_A)_x(L_B)_y(L_C)_z$, the compound has a formula $(L_A)_m Ir(L_B)_{3-m}$ having a structure selected from the group, Group 1, consisting of

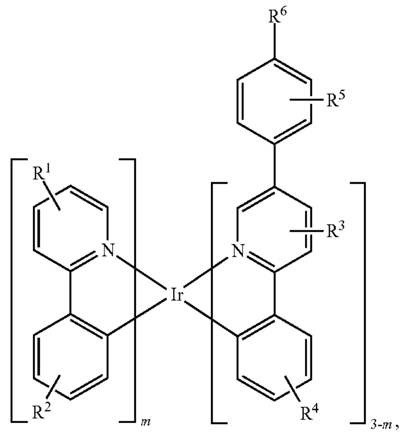

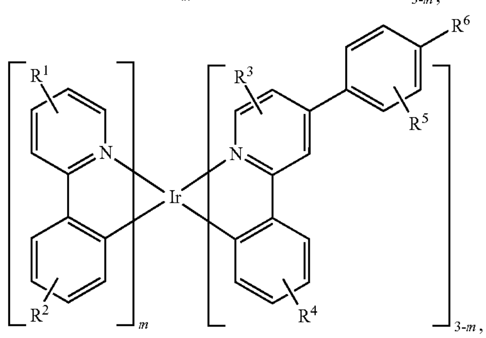

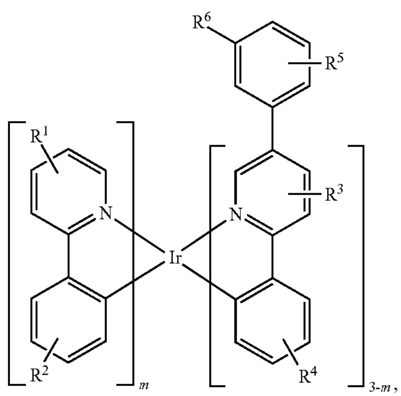

and

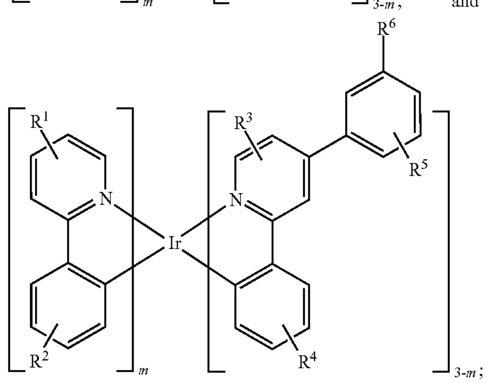

wherein m is 1 or 2; wherein $R^1$, $R^2$, $R^4$, and $R^5$ each independently represent mono, di, tri, or tetra substitution, or no substitution; wherein $R^3$ represents mono, di, or tri substitution, or no substitution; wherein $R^1$, $R^2$, $R^3$, $R^4$, and $R^5$ are each independently selected from the group consisting of hydrogen, deuterium, C1 to C6 alkyl, C1 to C6 cycloalkyl, and partially or fully deuterated or fluorinated variants thereof wherein $R^6$ is selected from the group consisting of alkyl having at least seven carbon atoms, cycloalkyl having at least seven carbon atoms, alkyl-cycloalkyl having at least seven carbon atoms, and partially or fully deuterated or fluorinated variants thereof. In some embodiments of the compound m is 2.

In some embodiments of the compound having the formula $M(L_A)_x(L_B)_y(L_C)_z$, the compound has a formula $(L_A)_mIr(L_B)_{3-m}$ having a structure selected from the group consisting of:

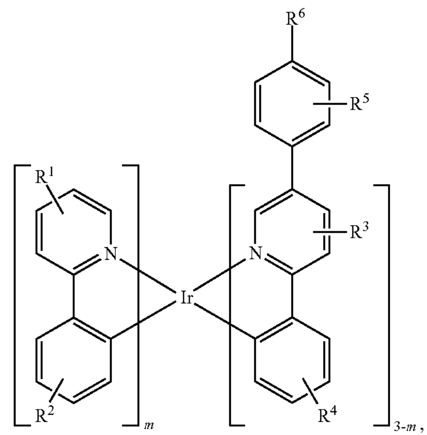

and

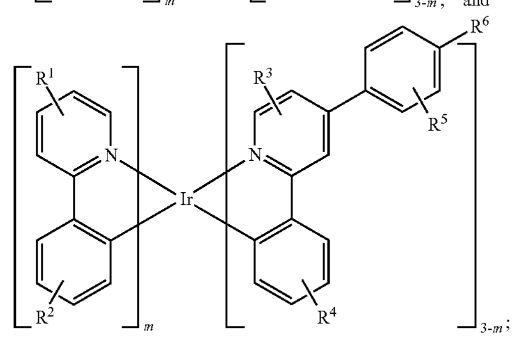

wherein m is 1 or 2.

In some embodiments of the compound having the formula $M(L_A)_x(L_B)_y(L_C)_z$, the compound has a formula $(L_A)_mIr(L_B)_{3-m}$ having a structure selected from Group 1, wherein m is 1 or 2; wherein $R^2$, $R^3$, $R^4$, and $R^5$ are each independently selected from the group consisting of hydrogen, deuterium, methyl, ethyl, propyl, isopropyl, and combinations thereof.

In some embodiments of the compound having the formula $M(L_A)_x(L_B)_y(L_C)_z$, the compound has a formula $(L_A)_mIr(L_B)_{3-m}$ having a structure selected from Group 1; wherein m is 1 or 2; wherein $R^6$ is selected from the group consisting of alkyl having at least eight carbon atoms, cycloalkyl having at least eight carbon atoms, alkyl-cycloalkyl having at least eight carbon atoms, and partially or fully deuterated or fluorinated variants thereof.

In some embodiments of the compound having the formula $M(L_A)_x(L_B)_y(L_C)_z$, the compound has a formula $(L_A)_mIr(L_B)_{3-m}$ having a structure selected from Group 1; wherein m is 1 or 2; wherein $R^3$, $R^4$, and $R^5$ are each a hydrogen.

In some embodiments of the compound having the formula $M(L_A)_x(L_B)_y(L_C)_z$, the compound has a formula $(L_A)_mIr(L_B)_{3-m}$; wherein m is 1 or 2; wherein $L_A$ is selected from the group consisting of:

-continued
$L_{A1}$
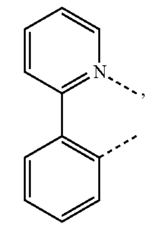
$L_{A2}$
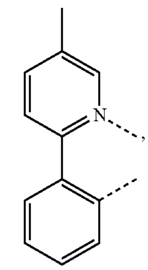
$L_{A3}$
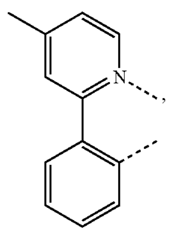
$L_{A4}$
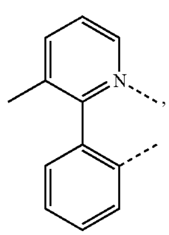
$L_{A5}$
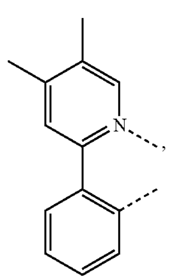
$L_{A6}$
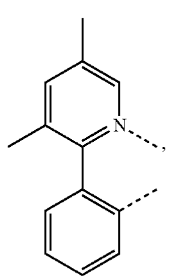
$L_{A7}$
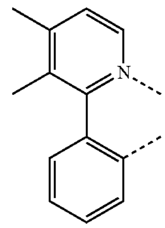
$L_{A8}$
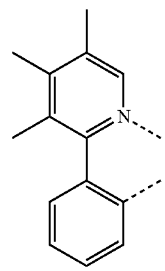
$L_{A9}$
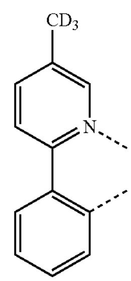
$L_{A10}$
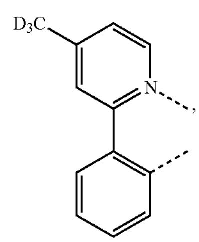
$L_{A11}$
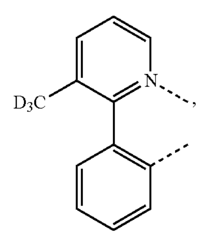
$L_{A12}$
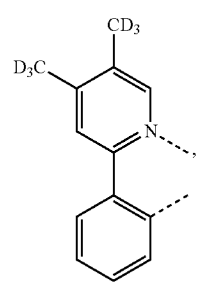

-continued
$L_{A13}$
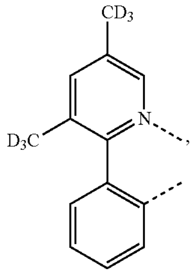
$L_{A14}$
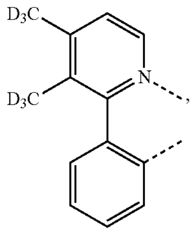
$L_{A15}$
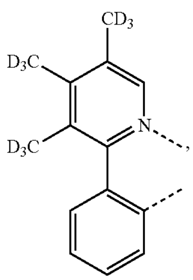
$L_{A16}$
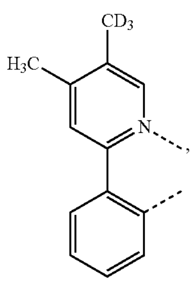
$L_{A17}$
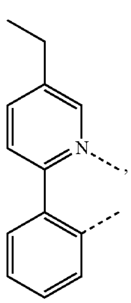
-continued
$L_{A18}$
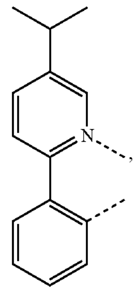
$L_{A19}$
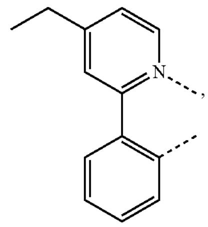
$L_{A20}$
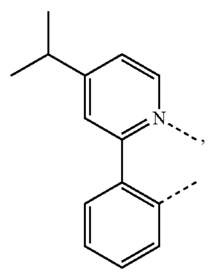
$L_{A21}$
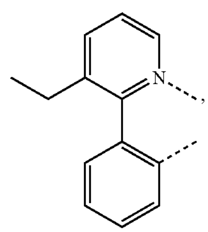
$L_{A22}$
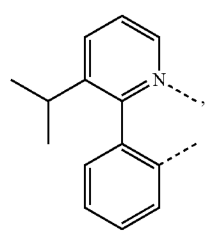
$L_{A23}$
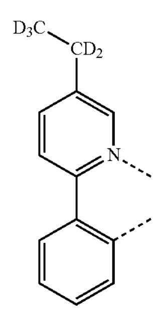

-continued
$L_{A24}$
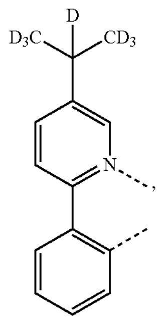
$L_{A25}$
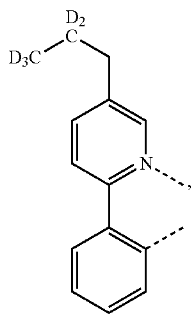
$L_{A26}$
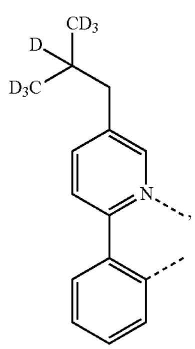
$L_{A27}$
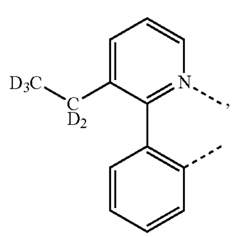
$L_{A28}$
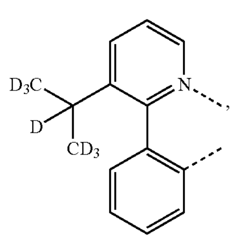
-continued
$L_{A29}$
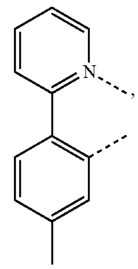
$L_{A30}$
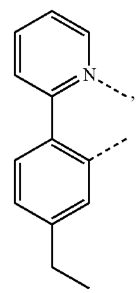
$L_{A31}$
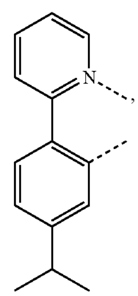
$L_{A32}$
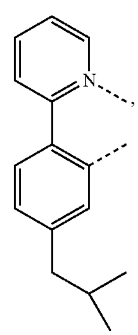
$L_{A33}$
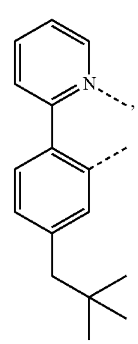

-continued
$L_{A34}$
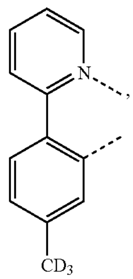
$L_{A35}$
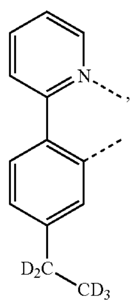
$L_{A36}$
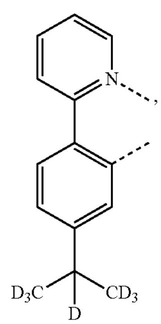
$L_{A37}$
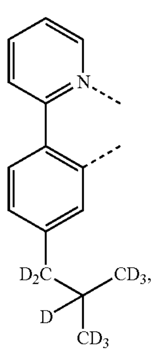
$L_{A38}$
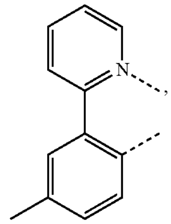
-continued
$L_{A39}$
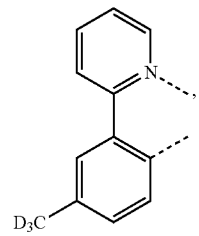
$L_{A40}$
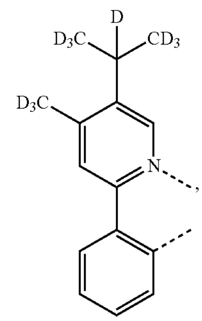
$L_{A41}$
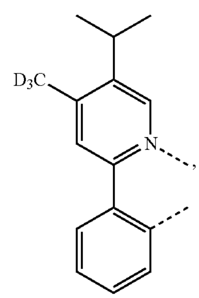
$L_{A42}$
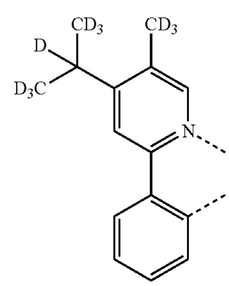
$L_{A43}$
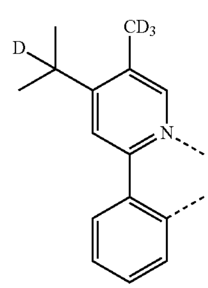

-continued
$L_{A44}$
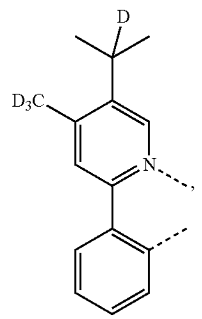
$L_{A45}$
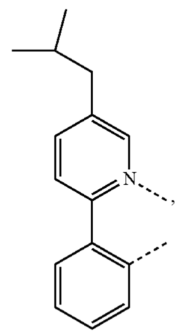
$L_{A46}$
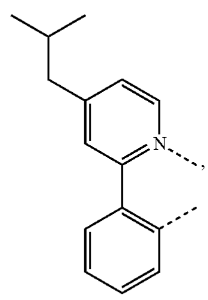
$L_{A47}$
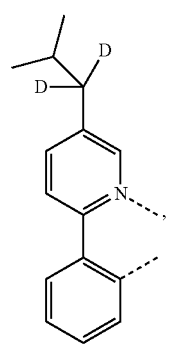
$L_{A48}$
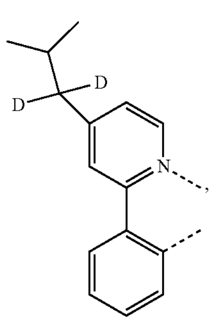
-continued
$L_{A49}$
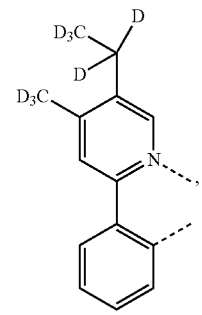
$L_{A50}$
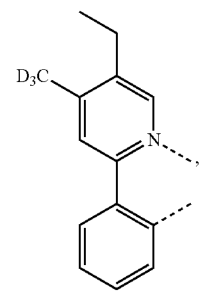
$L_{A51}$
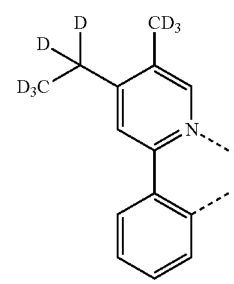
$L_{A52}$
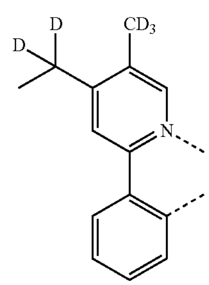
$L_{A53}$
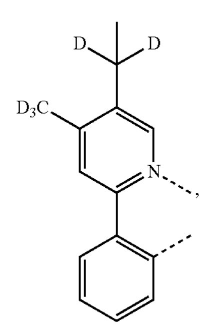

-continued
$L_{A54}$
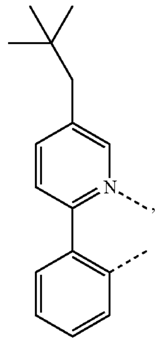
$L_{A55}$
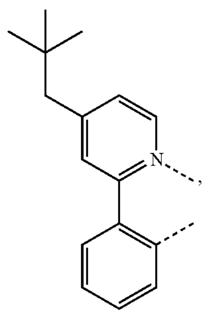
$L_{A56}$
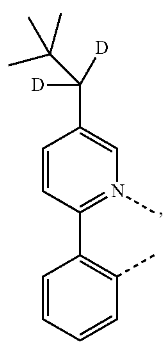
$L_{A57}$
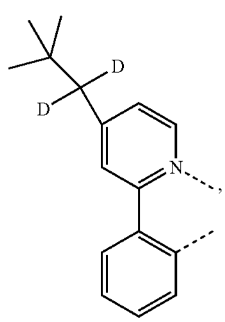
$L_{A58}$
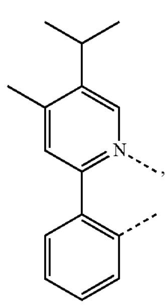
-continued
$L_{A59}$
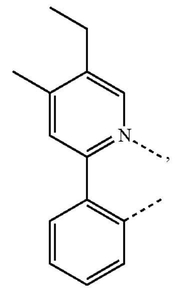
$L_{A60}$
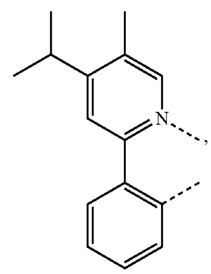
$L_{A61}$
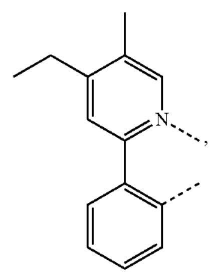
$L_{A62}$
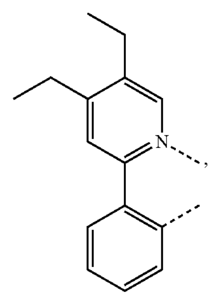
$L_{A63}$
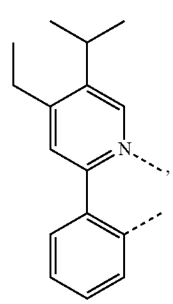

-continued
$L_{A64}$
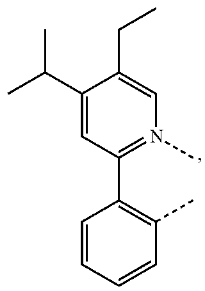
$L_{A65}$
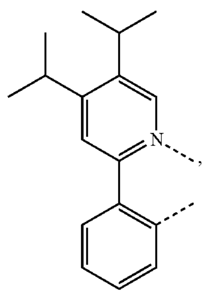
$L_{A66}$
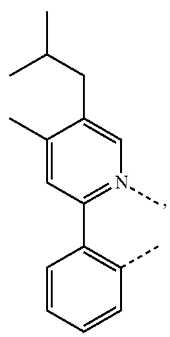
$L_{A67}$
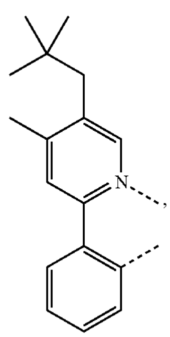
$L_{A68}$
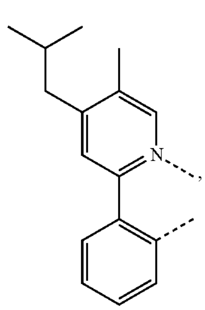
-continued
$L_{A69}$
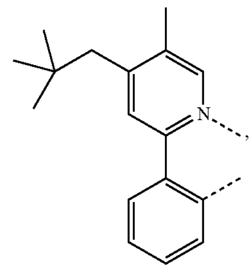
$L_{A70}$
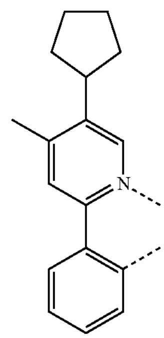
$L_{A71}$
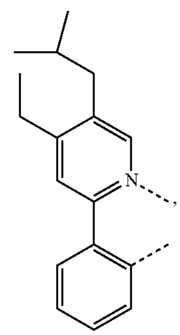
$L_{A72}$
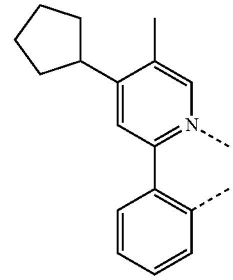
$L_{A73}$
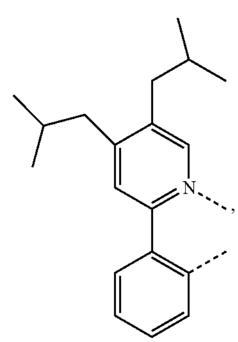

$L_{A74}$
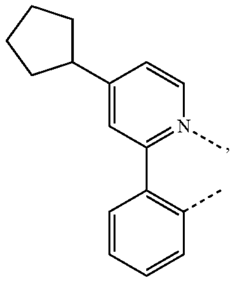
$L_{A75}$
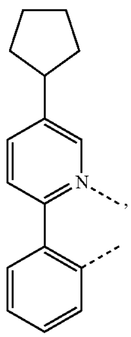
$L_{A76}$
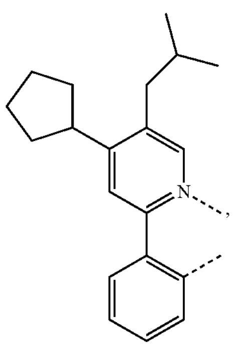
$L_{A77}$
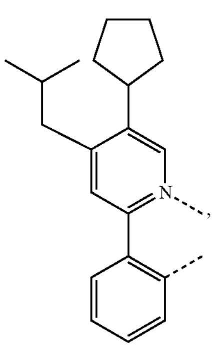
$L_{A78}$
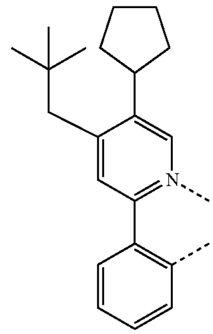
$L_{A79}$
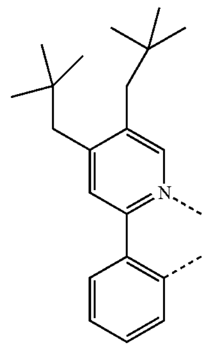
$L_{A80}$
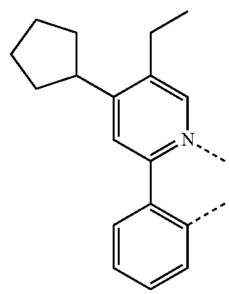
$L_{A81}$
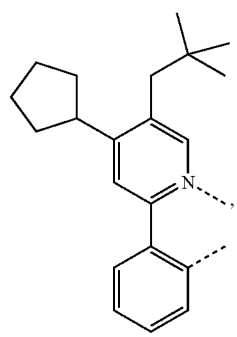
$L_{A82}$
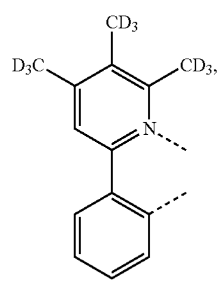

-continued
$L_{A83}$
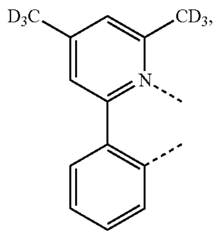
$L_{A84}$
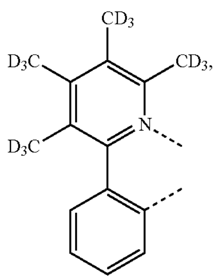
$L_{A85}$
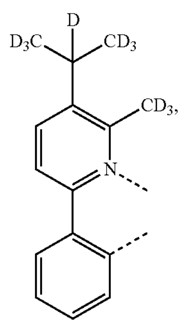
$L_{A86}$
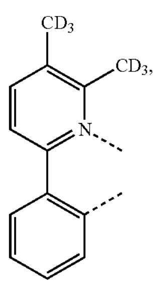
$L_{A87}$
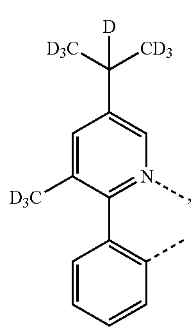
-continued
$L_{A88}$
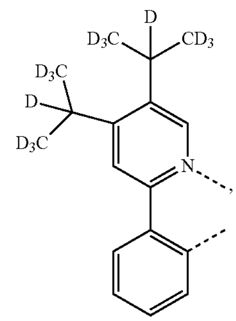
$L_{A89}$
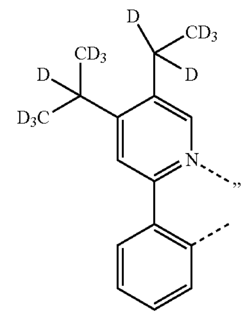
$L_{A90}$
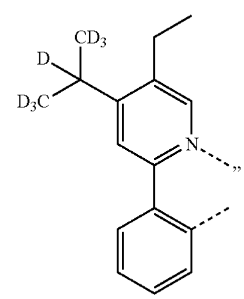
$L_{A91}$
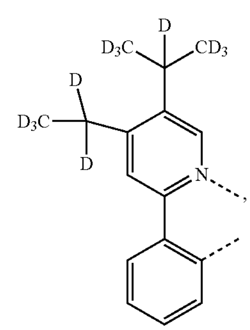
$L_{A92}$
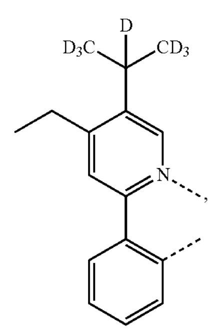

L$_{A93}$
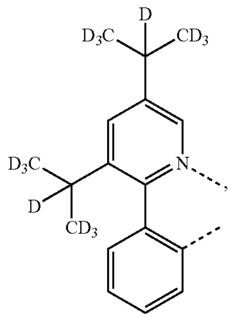
L$_{A98}$
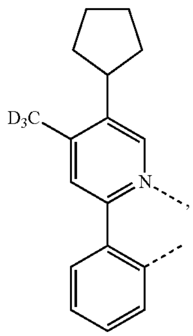
L$_{A99}$
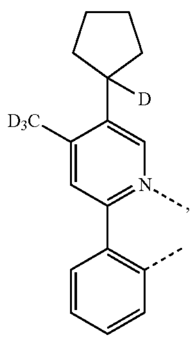
L$_{A100}$
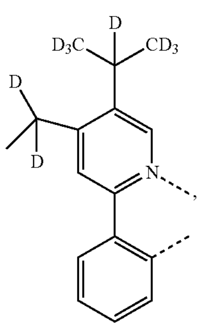
L$_{A101}$
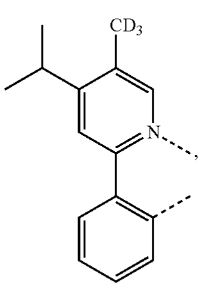
L$_{A102}$
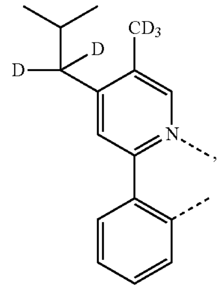
L$_{A103}$
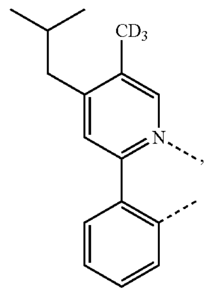
L$_{A104}$
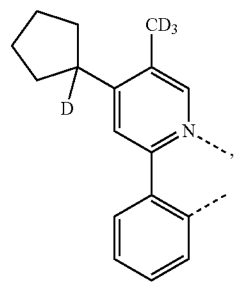
L$_{A105}$
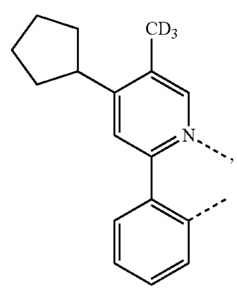
L$_{A106}$
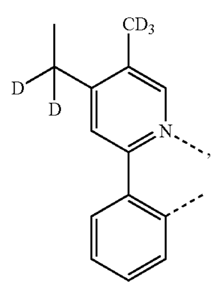

$L_{A107}$
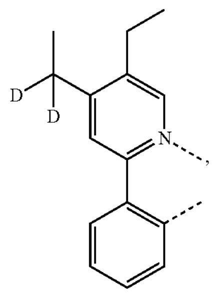
$L_{A108}$
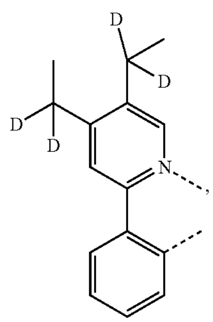
$L_{A109}$
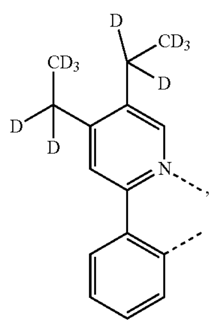
$L_{A110}$
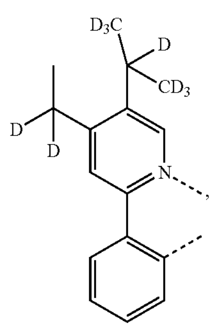
$L_{A111}$
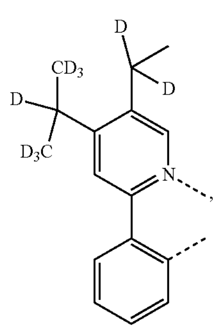
$L_{A112}$
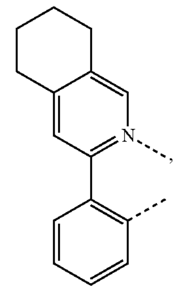
$L_{A113}$
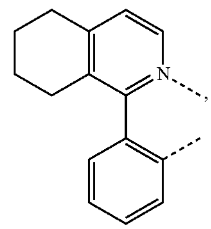
$L_{A114}$
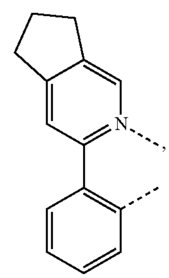
$L_{A115}$
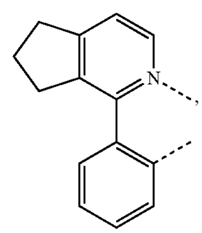
$L_{A116}$
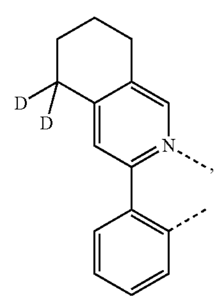
$L_{A117}$
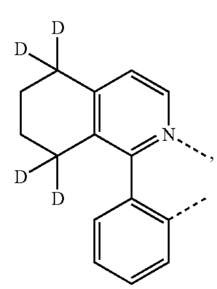

-continued
$L_{A118}$
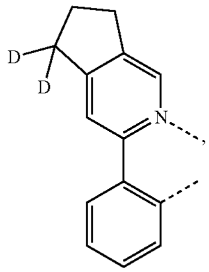
$L_{A119}$
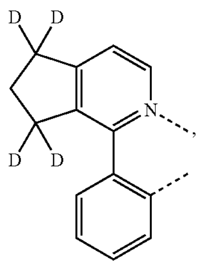
$L_{A120}$
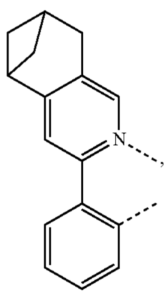
$L_{A121}$
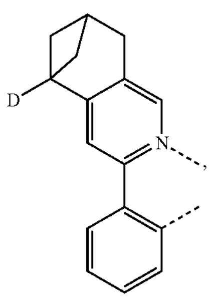
$L_{A122}$
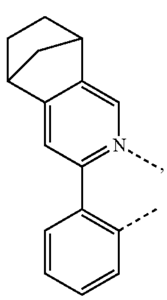
-continued
$L_{A123}$
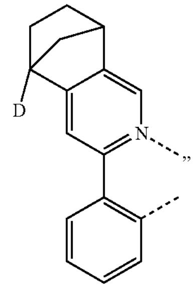
$L_{A124}$
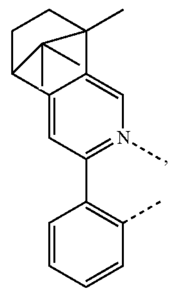
$L_{A125}$
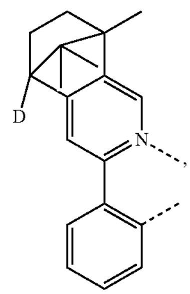
$L_{A126}$
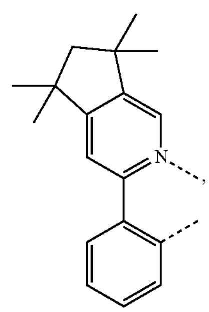
$L_{A127}$
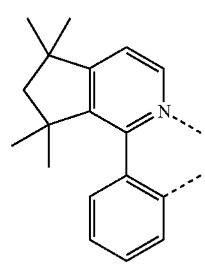

-continued
$L_{A128}$
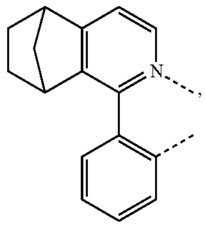
$L_{A129}$
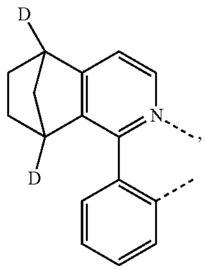
$L_{A130}$
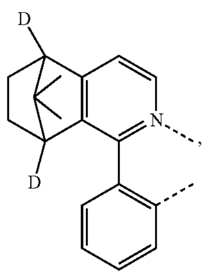
$L_{A131}$
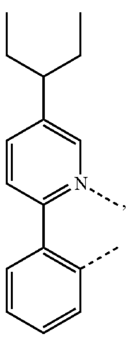
$L_{A132}$
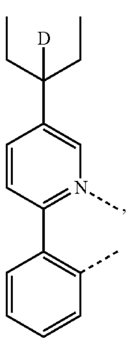
-continued
$L_{A133}$
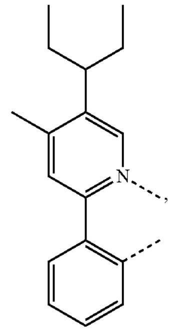
$L_{A134}$
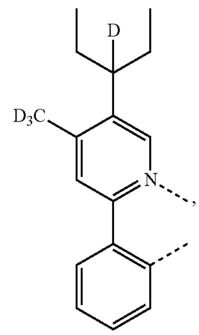
$L_{A135}$
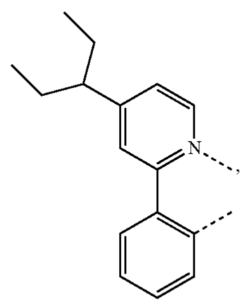
$L_{A136}$
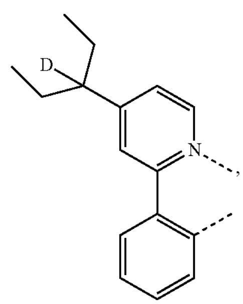
$L_{A137}$
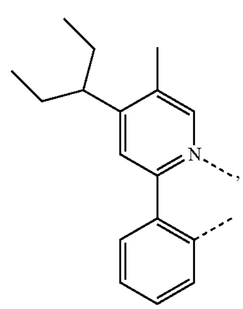

-continued
$L_{A138}$
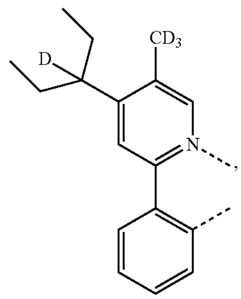
$L_{A139}$
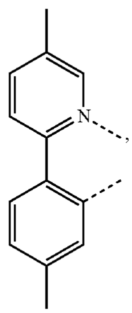
$L_{A140}$
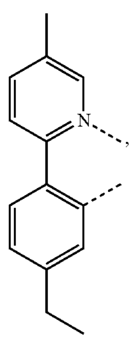
$L_{A141}$
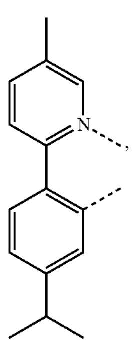
$L_{A142}$
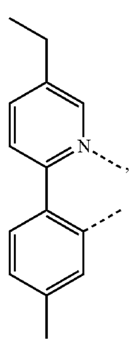
-continued
$L_{A143}$
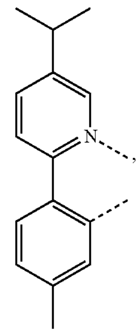
$L_{A144}$
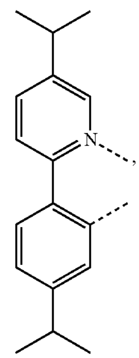
$L_{A145}$
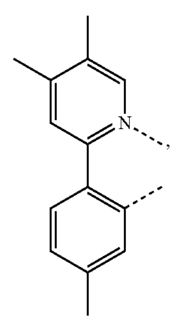
$L_{A146}$
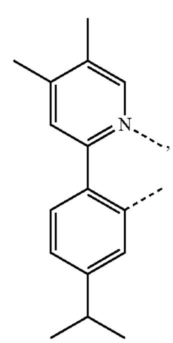

-continued
$L_{A147}$
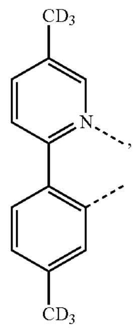
$L_{A148}$
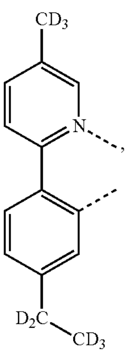
$L_{A149}$
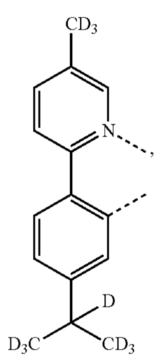
$L_{A150}$
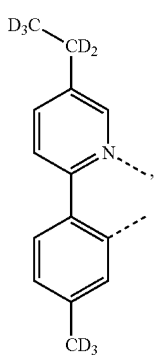
-continued
$L_{A151}$
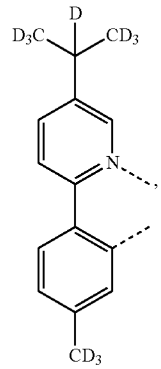
$L_{A152}$
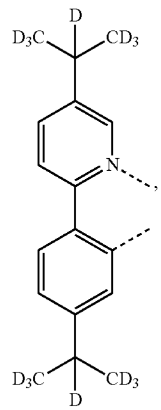
$L_{A153}$
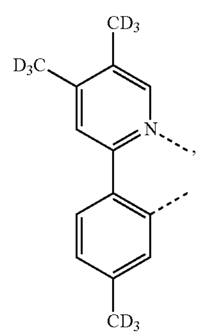
$L_{A154}$
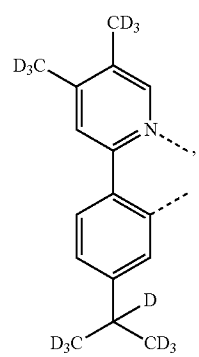

-continued
$L_{A155}$
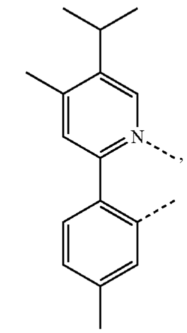
$L_{A156}$
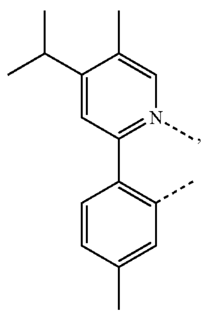
$L_{A157}$
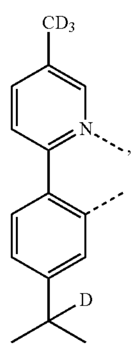
$L_{A158}$
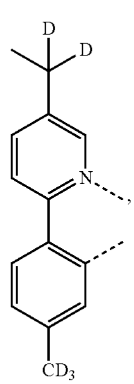
-continued
$L_{A159}$
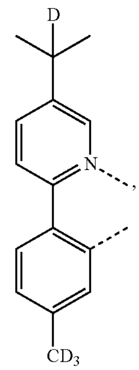
$L_{A160}$
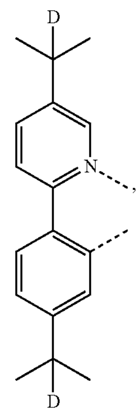
$L_{A161}$
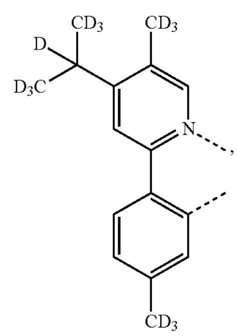
$L_{A162}$
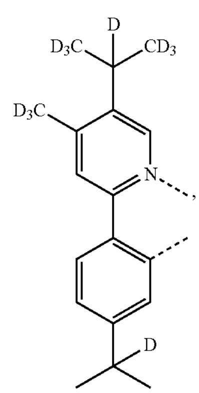

-continued
$L_{A163}$
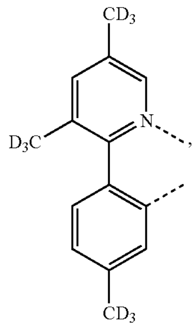
$L_{A164}$
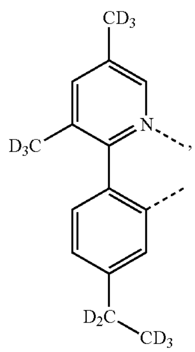
$L_{A165}$
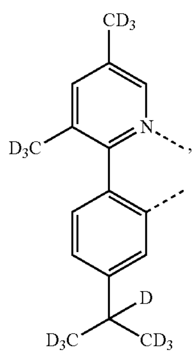
$L_{A166}$
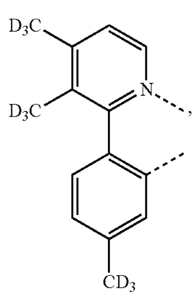
$L_{A167}$
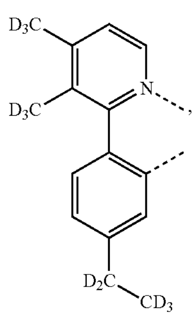
-continued
$L_{A168}$
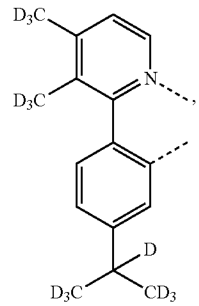
$L_{B169}$
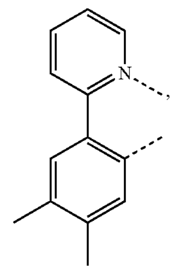
$L_{B170}$
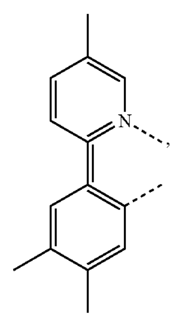
$L_{B171}$
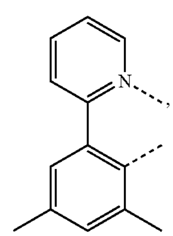
$L_{B172}$
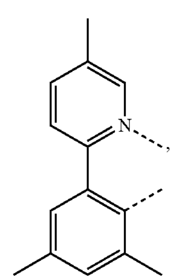

-continued
$L_{B173}$
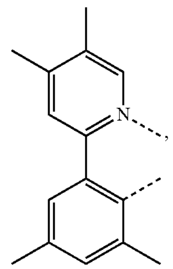
$L_{A174}$
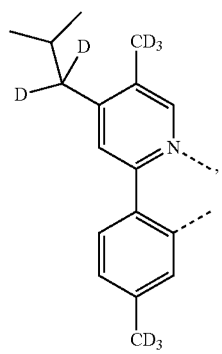
$L_{A175}$
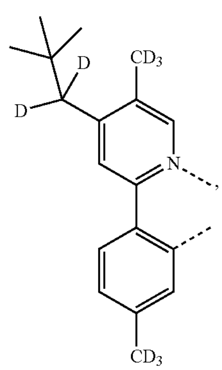
$L_{A176}$
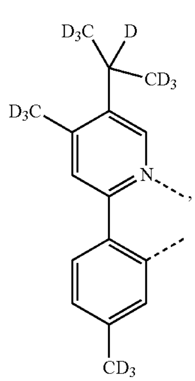
-continued
$L_{A177}$
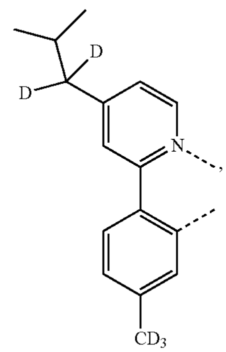
$L_{A178}$
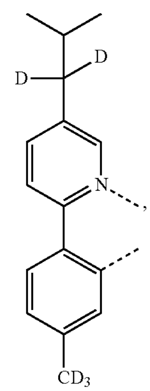
$L_{A179}$
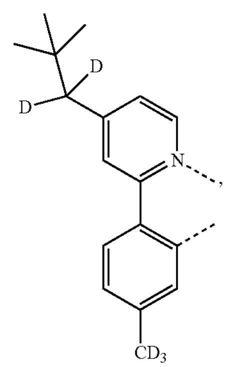
$L_{A180}$
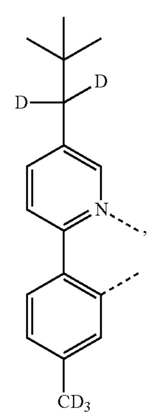

-continued
$L_{A181}$
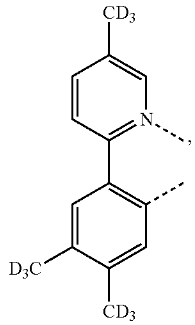
$L_{A182}$
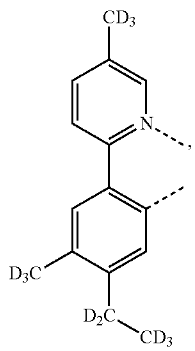
$L_{A183}$
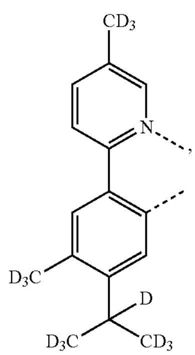
$L_{A184}$
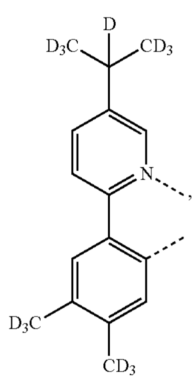
-continued
$L_{A185}$
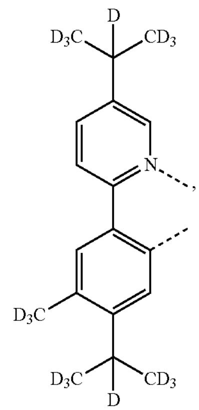
$L_{A186}$
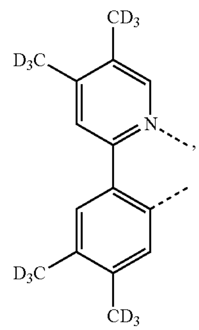
$L_{A187}$
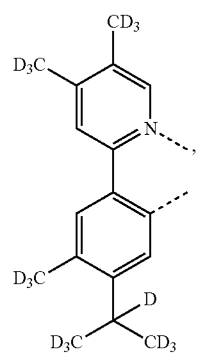
$L_{A188}$
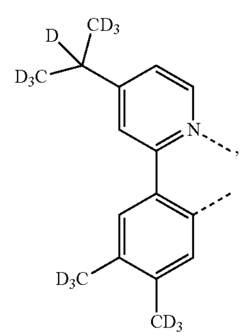

$L_{A189}$
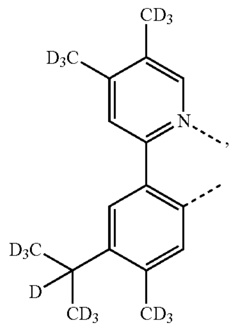
$L_{A190}$
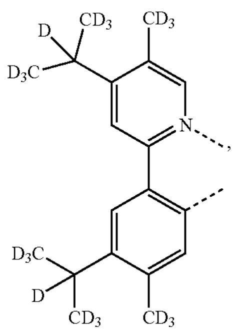
$L_{A191}$
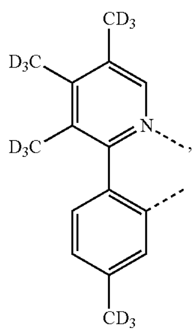
$L_{A192}$
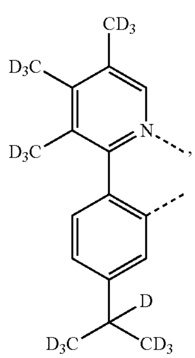
$L_{A193}$
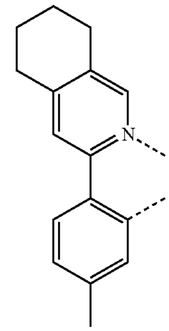
$L_{A194}$
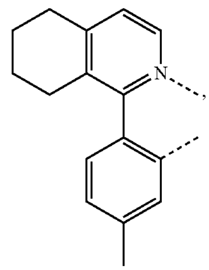
$L_{A195}$
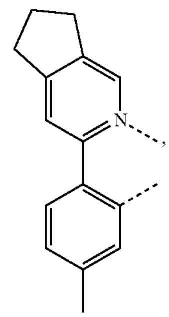
$L_{A196}$
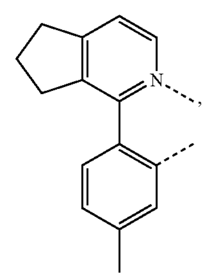
$L_{A197}$
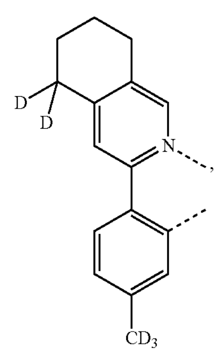

-continued
$L_{A198}$
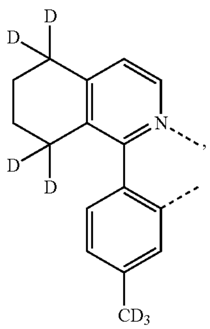
$L_{A199}$
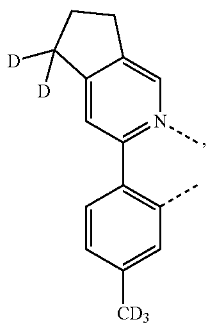
$L_{A200}$
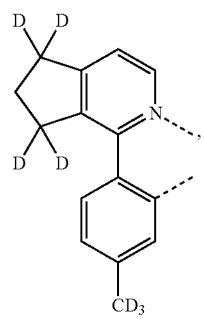
$L_{A201}$
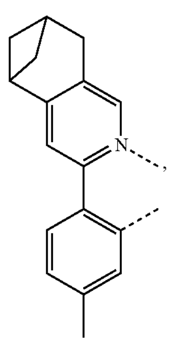
-continued
$L_{A202}$
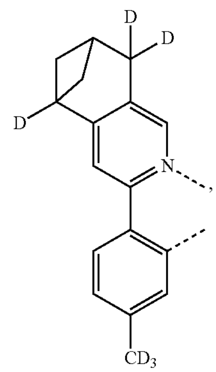
$L_{A203}$
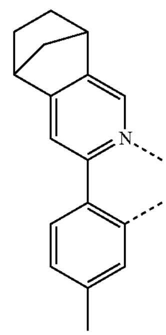
$L_{A204}$
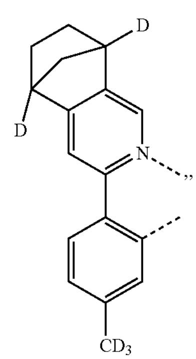
$L_{A205}$
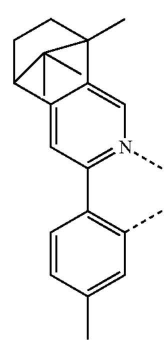

-continued
$L_{A206}$
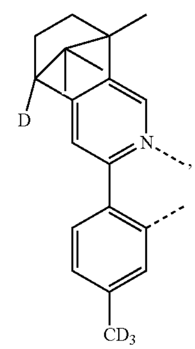
$L_{A207}$
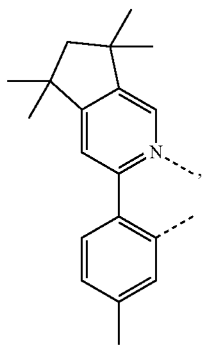
$L_{A208}$
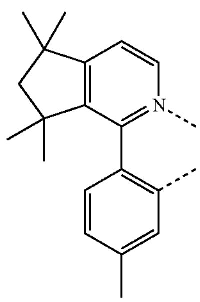
$L_{A209}$
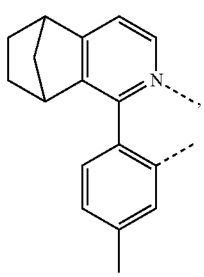
$L_{A210}$
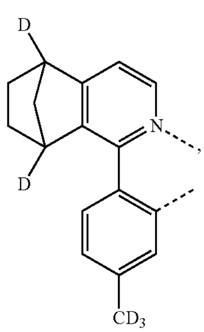
-continued
$L_{A211}$
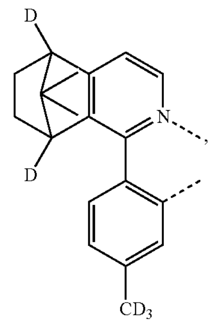
$L_{A212}$
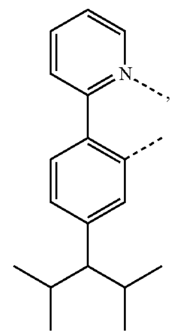
$L_{A213}$
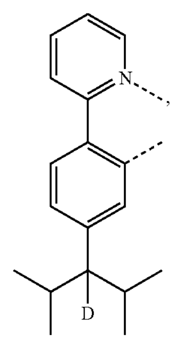
$L_{A214}$
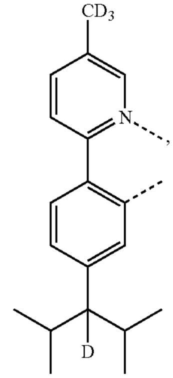

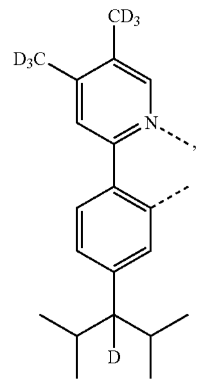
$L_{A215}$
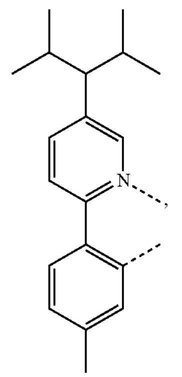
$L_{A216}$
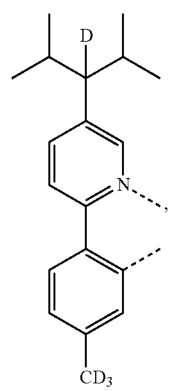
$L_{A217}$
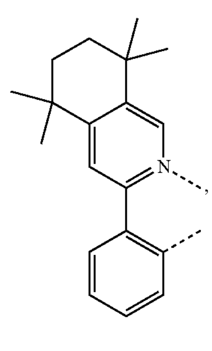
$L_{A218}$
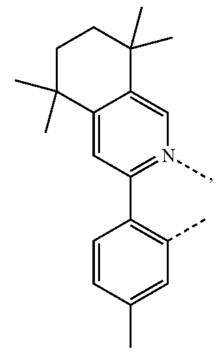
$L_{A219}$
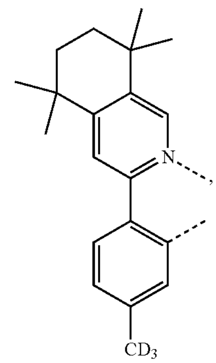
$L_{A220}$
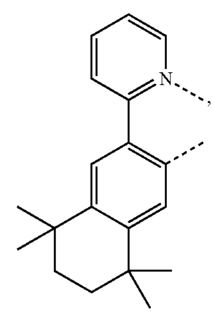
$L_{A221}$
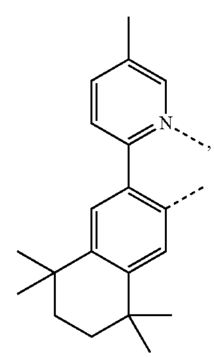
$L_{A222}$ -continued
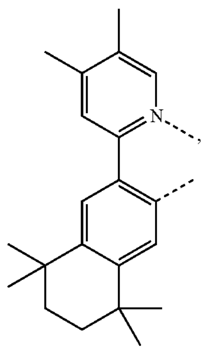
$L_{A223}$
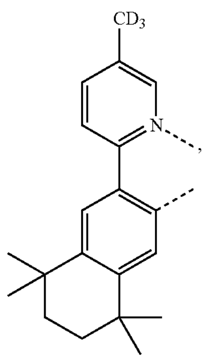
$L_{A224}$
and
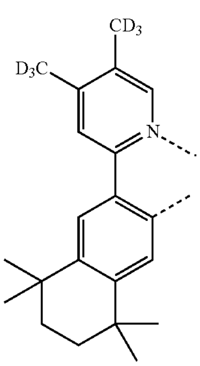
$L_{A225}$
In some embodiments of the compound having the formula $M(L_A)_x(L_B)_y(L_C)_z$, the compound has a formula $(L_A)_mIr(L_B)_{3-m}$; wherein m is 1 or 2; wherein $L_B$ is selected from the group consisting of $L_{B1}$ to $L_{B227}$ shown below:
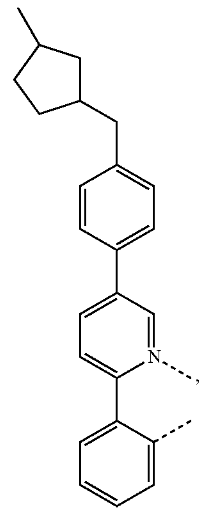
$L_{B1}$
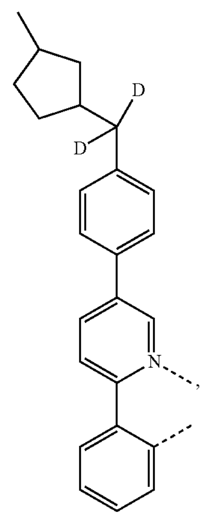
$L_{B2}$
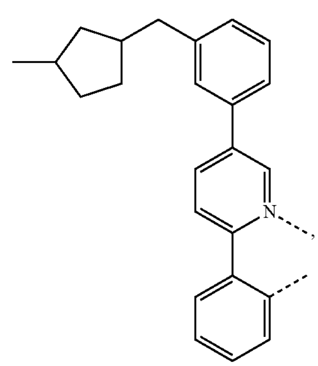
$L_{B3}$

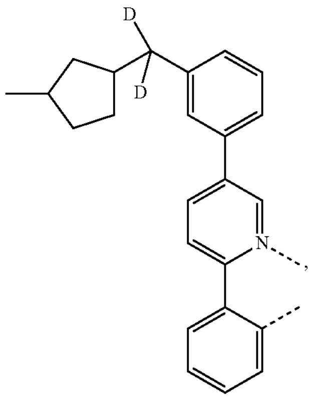
$L_{B4}$
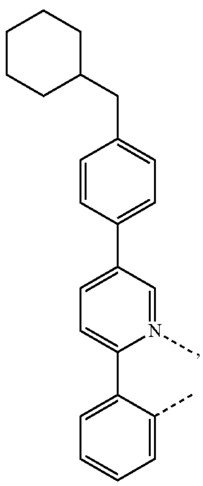
$L_{B5}$
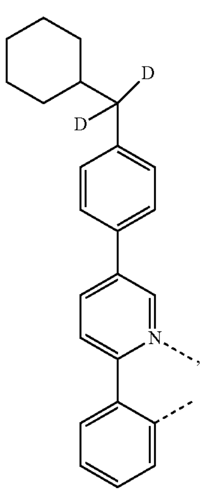
$L_{B6}$
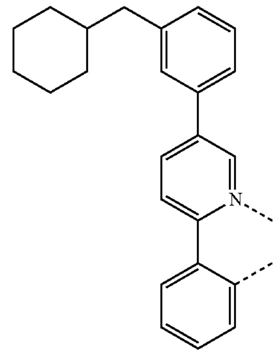
$L_{B7}$
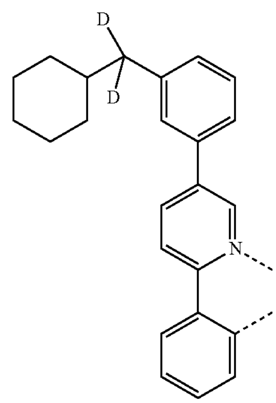
$L_{B8}$
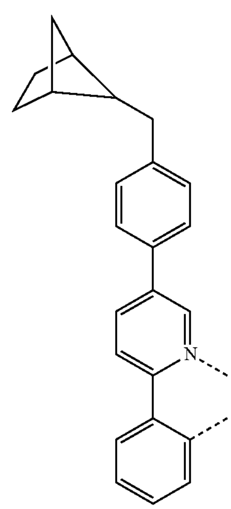
$L_{B9}$ -continued
$L_{B10}$
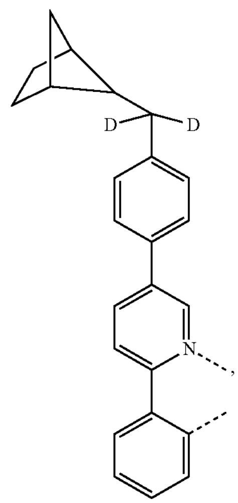
$L_{B11}$
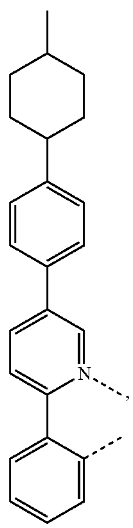
$L_{B12}$
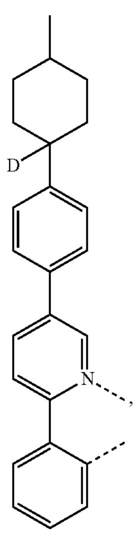
-continued
$L_{B13}$
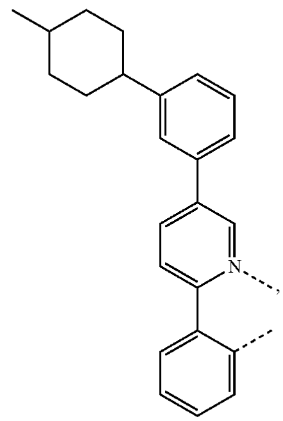
$L_{B14}$
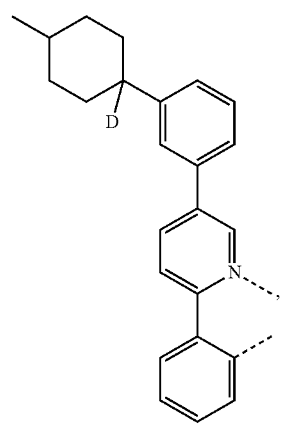
$L_{B15}$
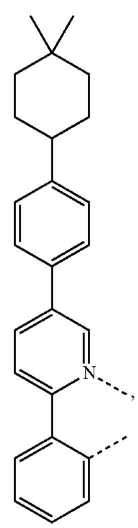

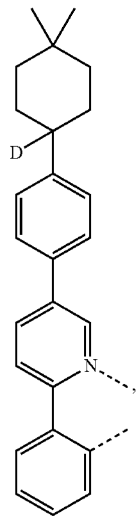
$L_{B16}$
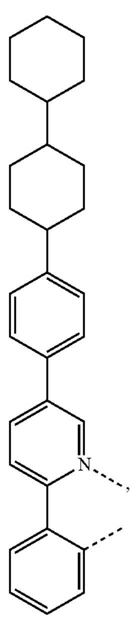
$L_{B17}$
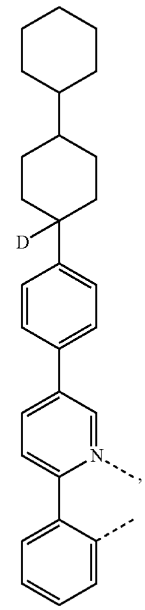
$L_{B18}$
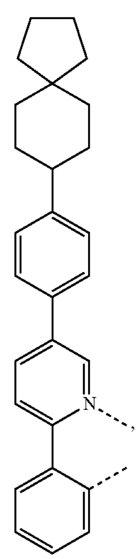
$L_{B19}$ -continued
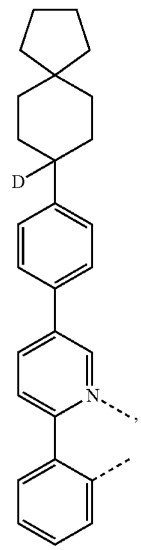
$L_{B20}$
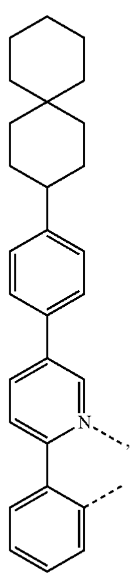
$L_{B21}$
-continued
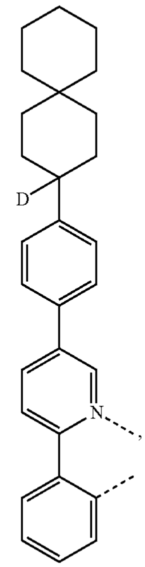
$L_{B22}$
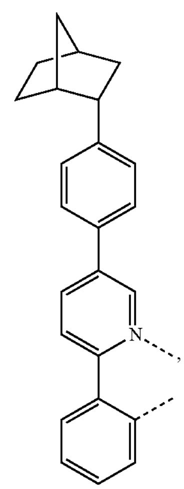
$L_{B23}$
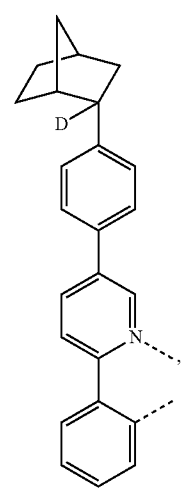
$L_{B24}$

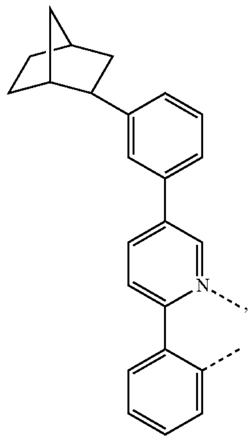
$L_{B25}$
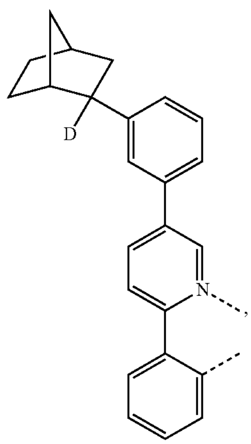
$L_{B26}$
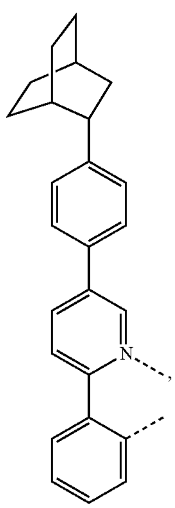
$L_{B27}$
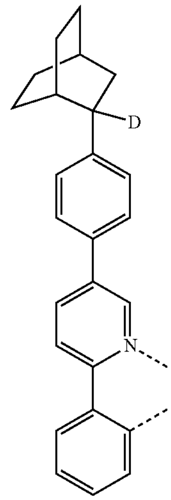
$L_{B28}$
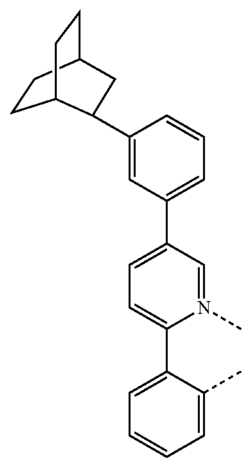
$L_{B29}$
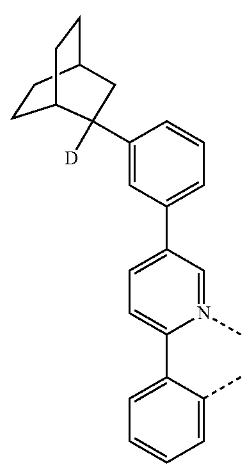
$L_{B30}$

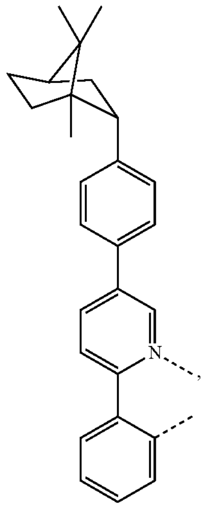
$L_{B31}$
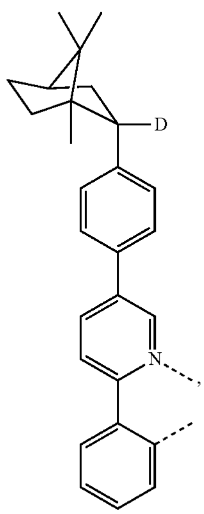
$L_{B32}$
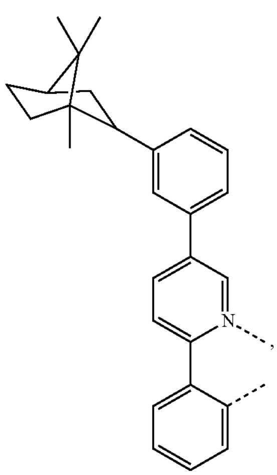
$L_{B33}$
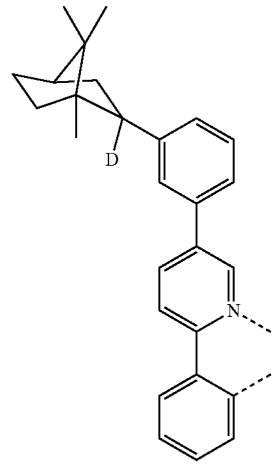
$L_{B34}$
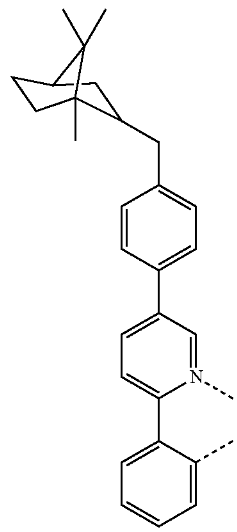
$L_{B35}$
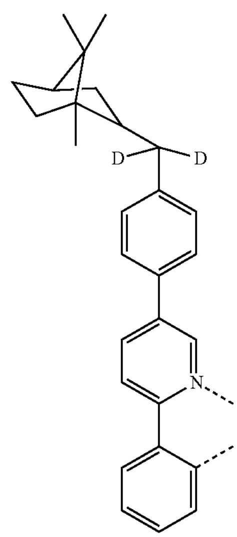
$L_{B36}$ -continued
L$_{B37}$
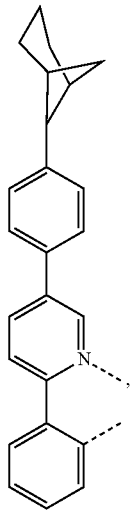
L$_{B38}$
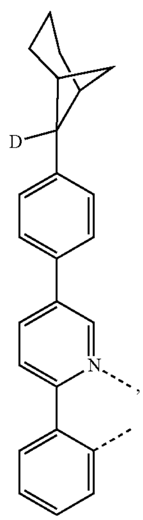
L$_{B39}$
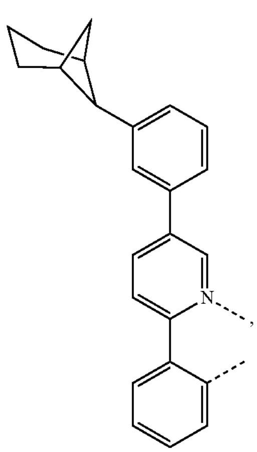
-continued
L$_{B40}$
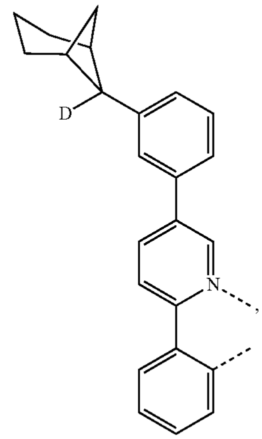
L$_{B41}$
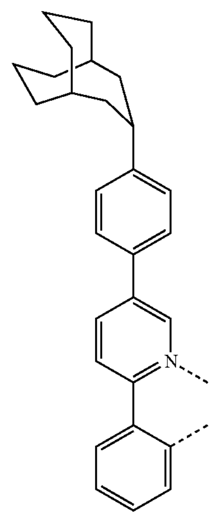
L$_{B42}$
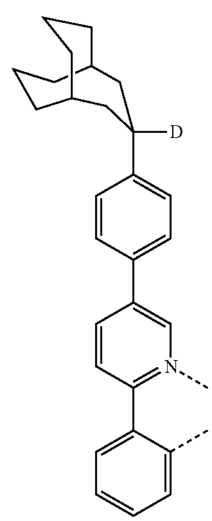

-continued
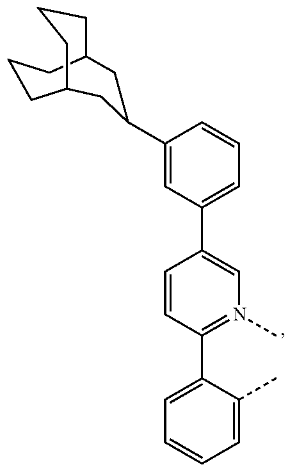
$L_{B43}$
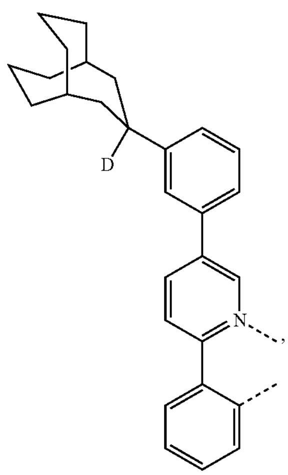
$L_{B44}$
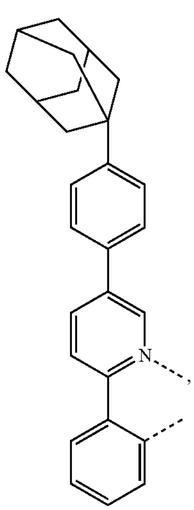
$L_{B45}$
-continued
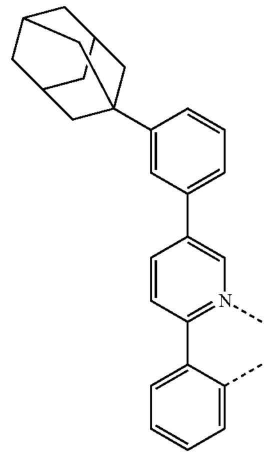
$L_{B46}$
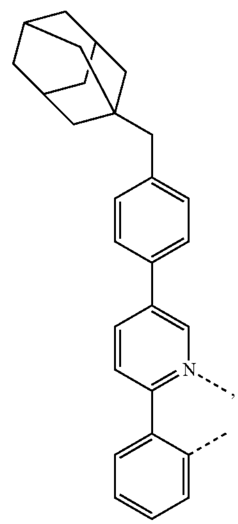
$L_{B47}$
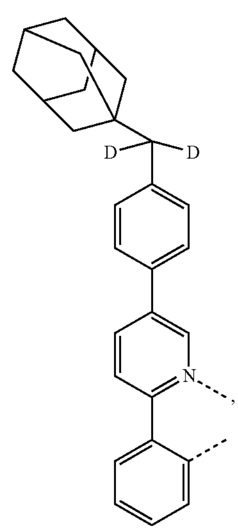
$L_{B48}$ L$_{B49}$
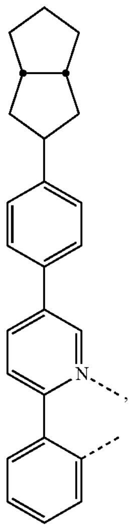
L$_{B50}$
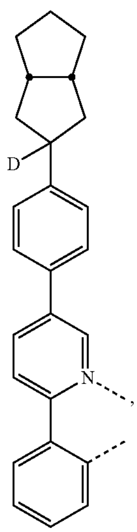
L$_{B51}$
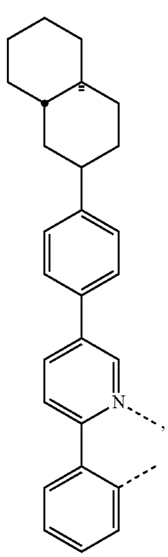
L$_{B52}$
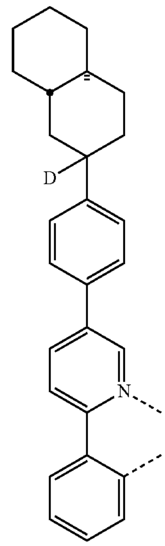
L$_{B53}$
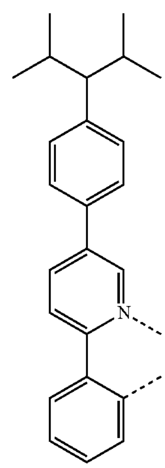
L$_{B54}$
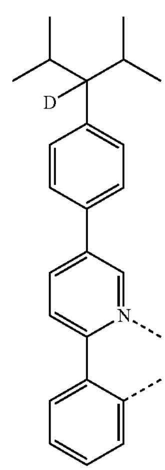

$L_{B55}$
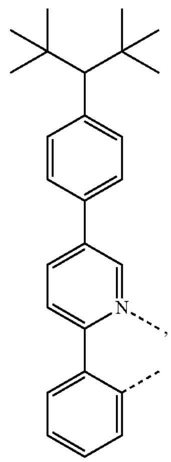
$L_{B56}$
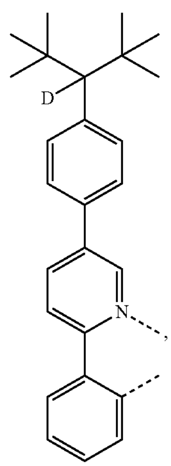
$L_{B57}$
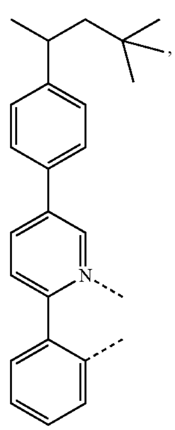
$L_{B58}$
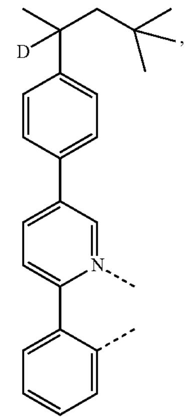
$L_{B59}$
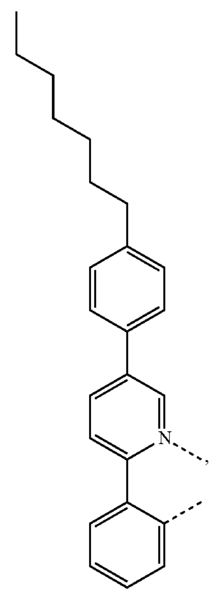
$L_{B60}$
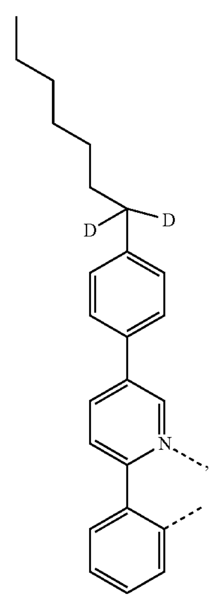

L$_{B61}$
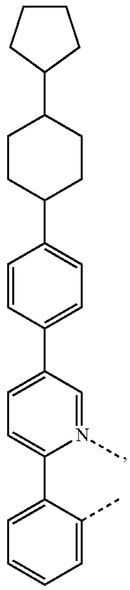
L$_{B63}$
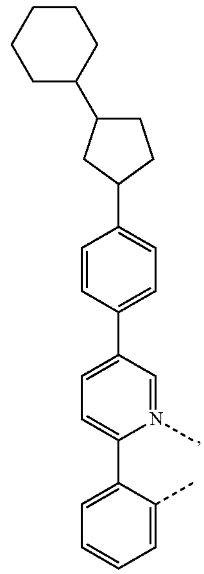
L$_{B62}$
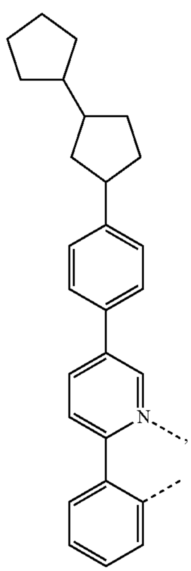
L$_{B64}$
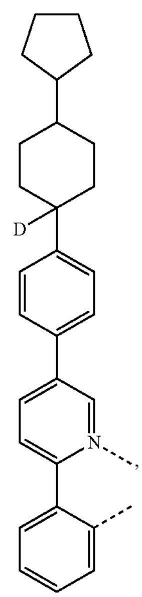

-continued
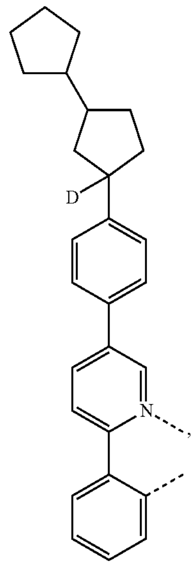
$L_{B65}$
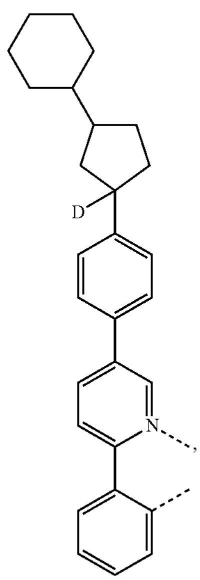
$L_{B66}$
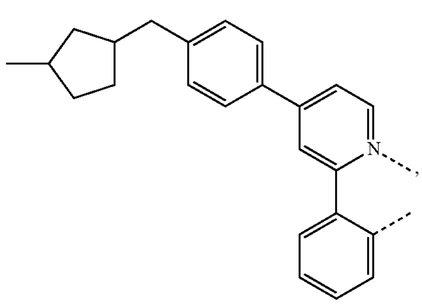
$L_{B67}$
-continued
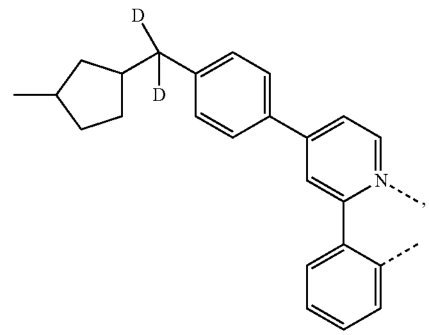
$L_{B68}$
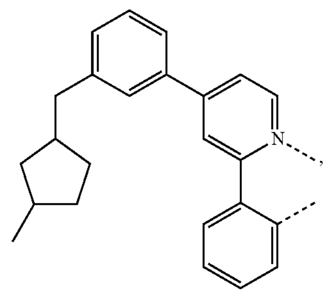
$L_{B69}$
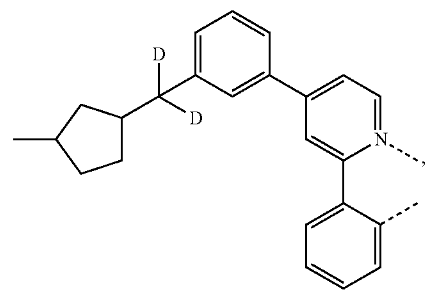
$L_{B70}$
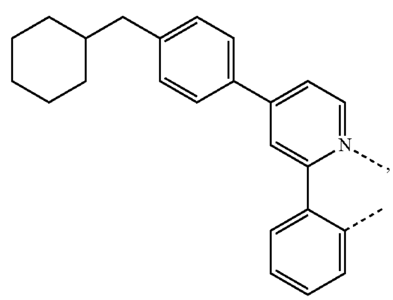
$L_{B71}$
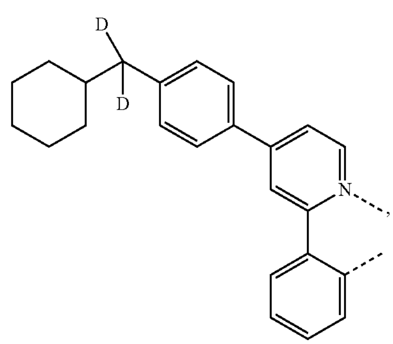
$L_{B72}$ $L_{B73}$
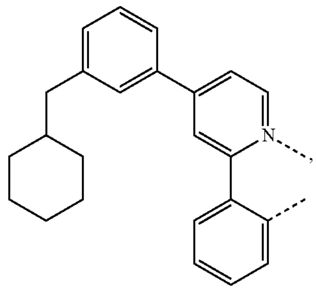
$L_{B74}$
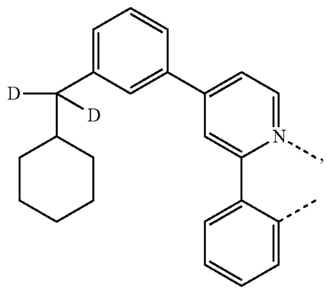
$L_{B75}$
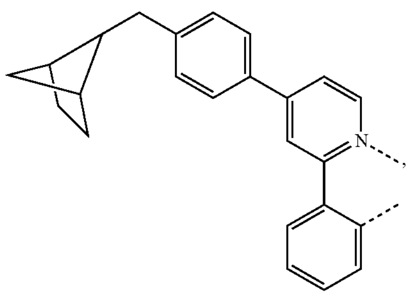
$L_{B76}$
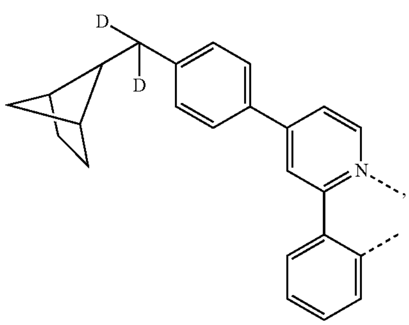
$L_{B77}$
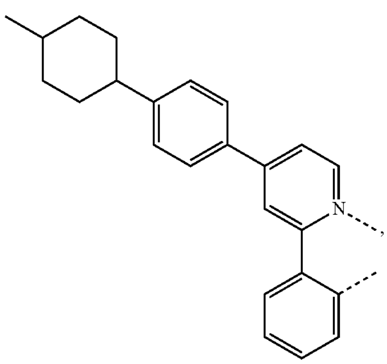
$L_{B78}$
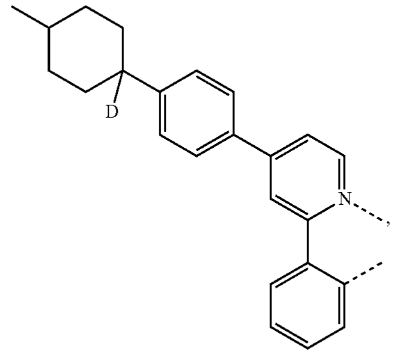
$L_{B79}$
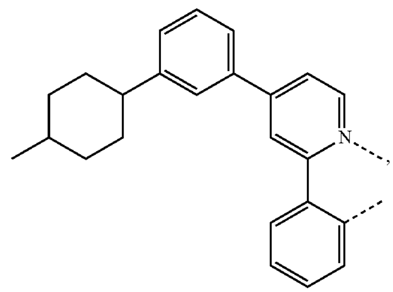
$L_{B80}$
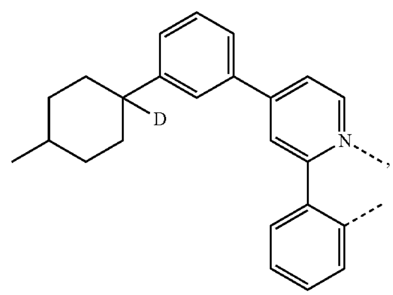
$L_{B81}$
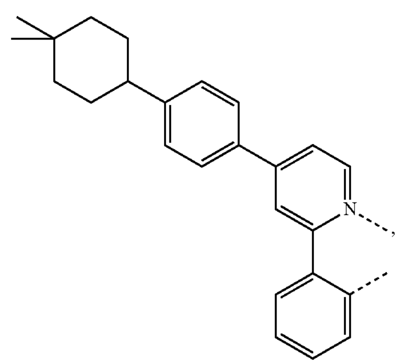

$L_{B82}$
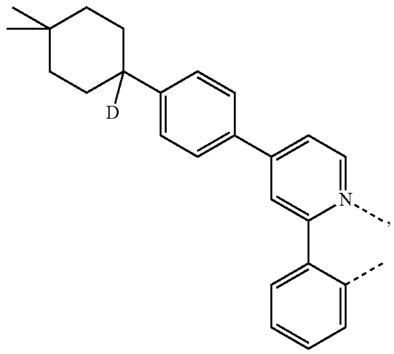
$L_{B83}$
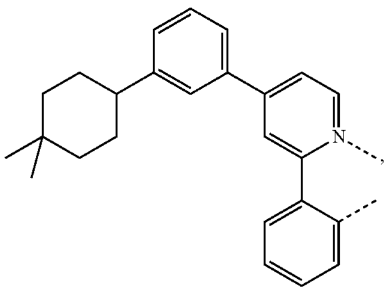
$L_{B84}$
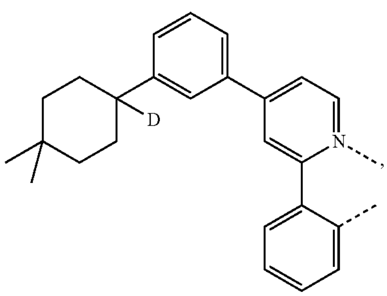
$L_{B85}$
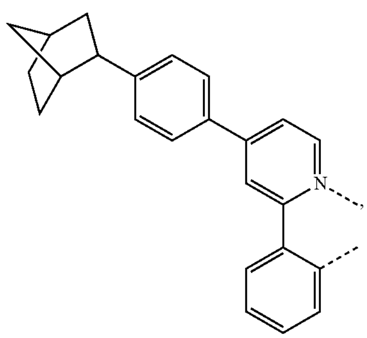
$L_{B86}$
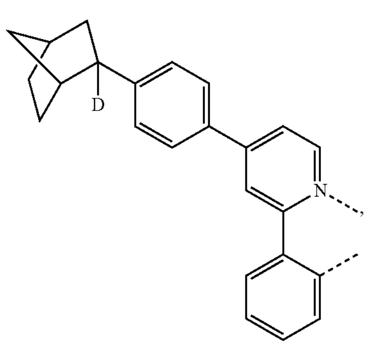
$L_{B87}$
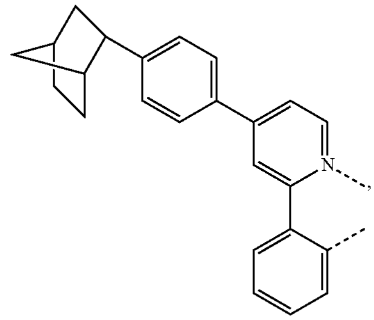
$L_{B88}$
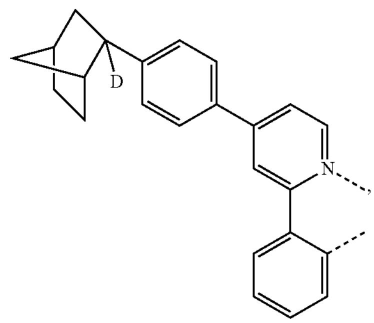
$L_{B89}$
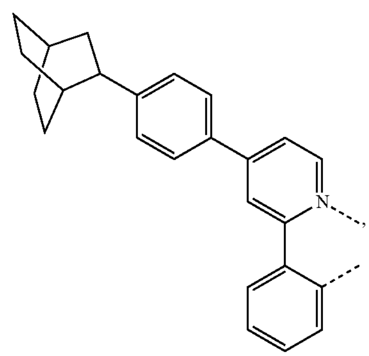
$L_{B90}$
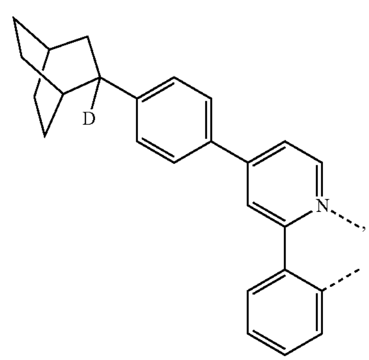

-continued
$L_{B91}$
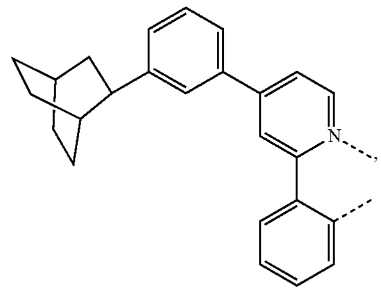
$L_{B92}$
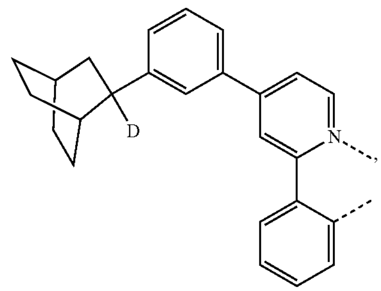
$L_{B93}$
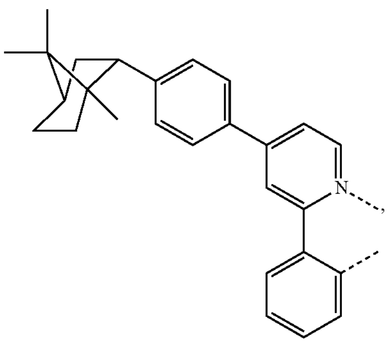
$L_{B94}$
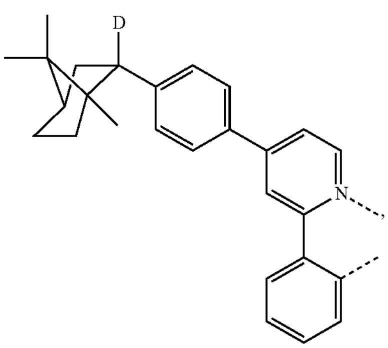
$L_{B95}$
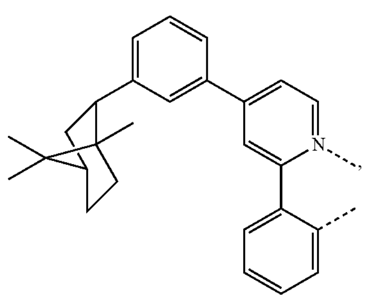
-continued
$L_{B96}$
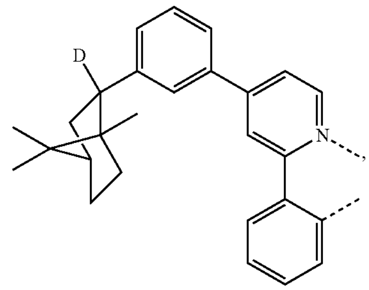
$L_{B97}$
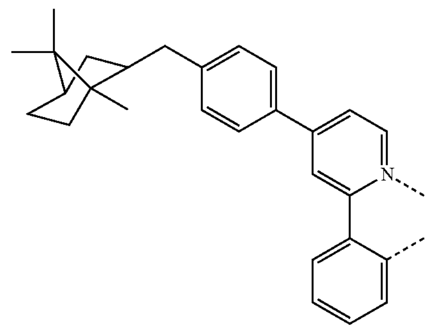
$L_{B98}$
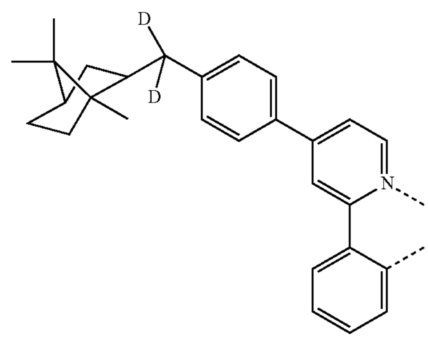
$L_{B99}$
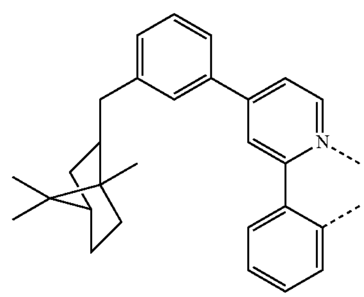
$L_{B100}$
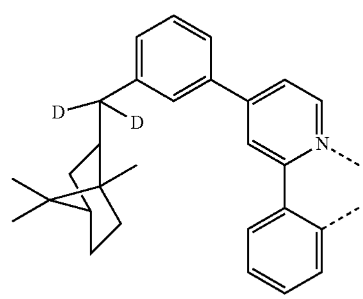

-continued
$L_{B101}$
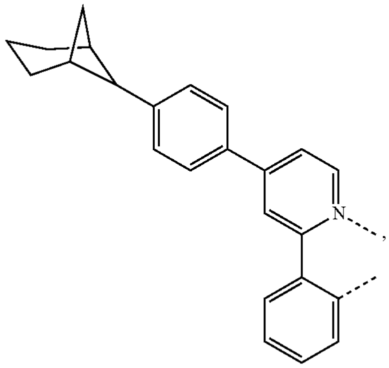
$L_{B102}$
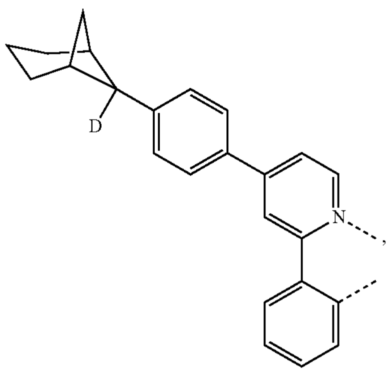
$L_{B103}$
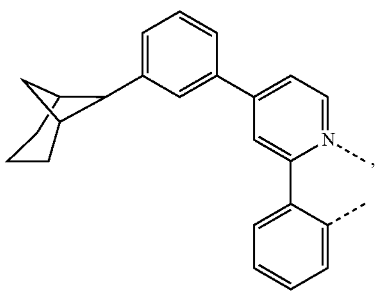
$L_{B104}$
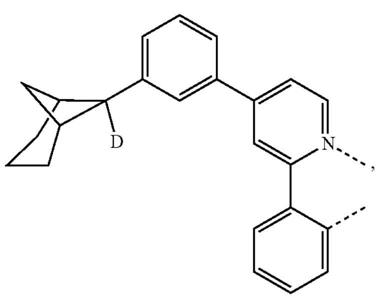
$L_{B105}$
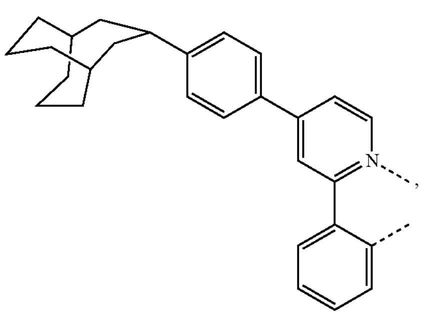
-continued
$L_{B106}$
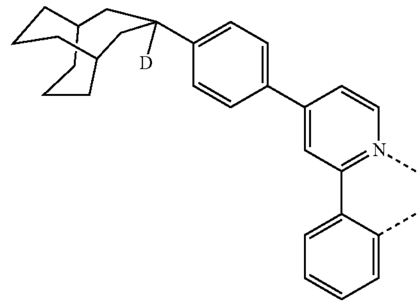
$L_{B107}$
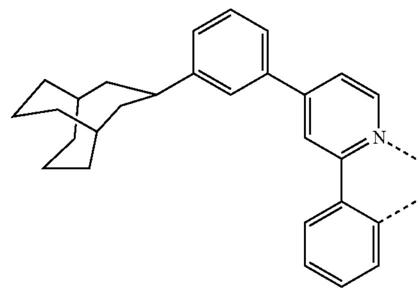
$L_{B108}$
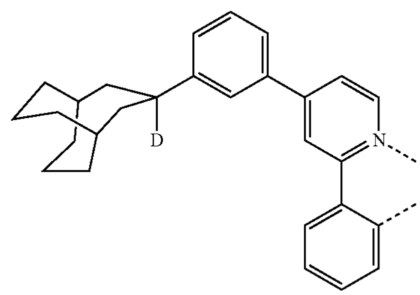
$L_{B109}$
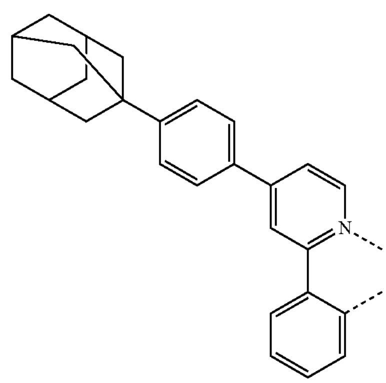
$L_{B110}$
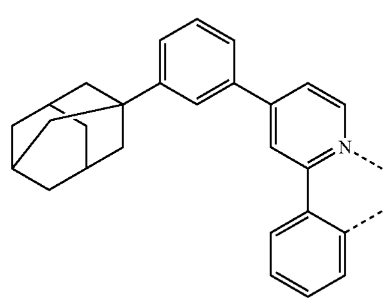

-continued
$L_{B111}$
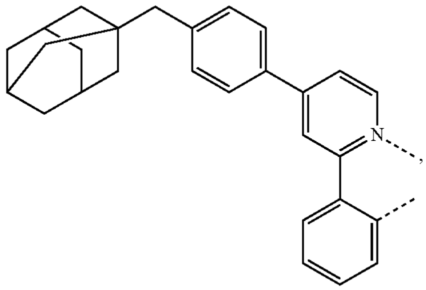
$L_{B112}$
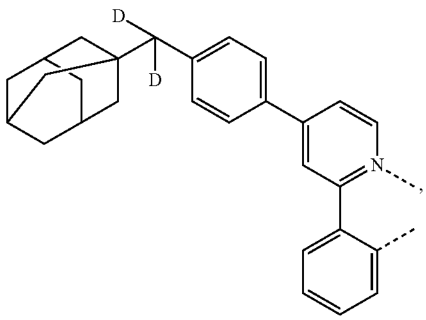
$L_{B113}$
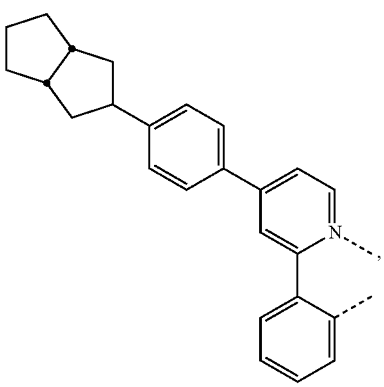
$L_{B114}$
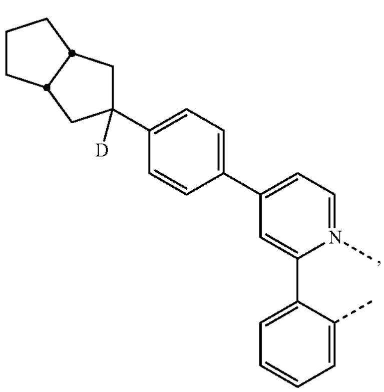
-continued
$L_{B115}$
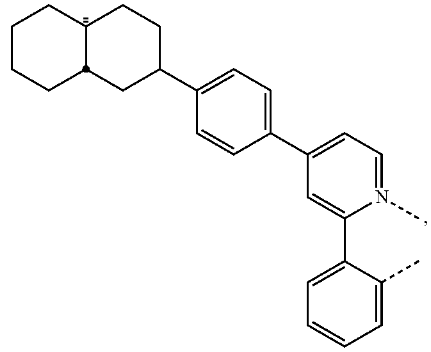
$L_{B116}$
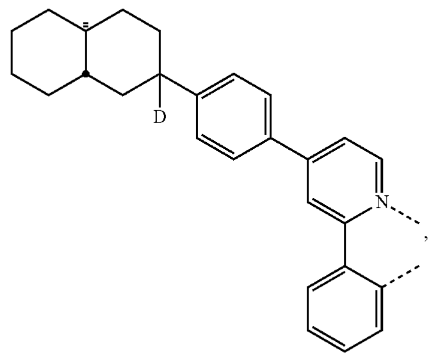
$L_{B117}$
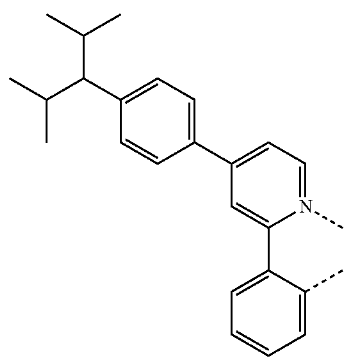
$L_{B118}$
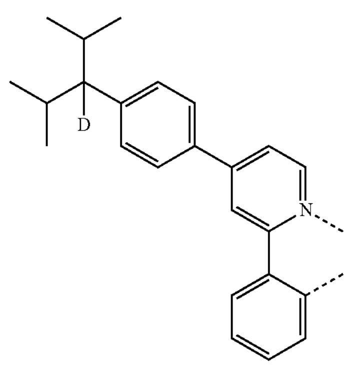

-continued
$L_{B119}$
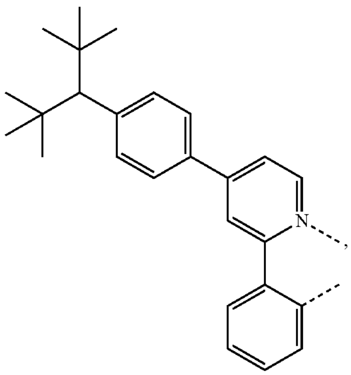
$L_{B120}$
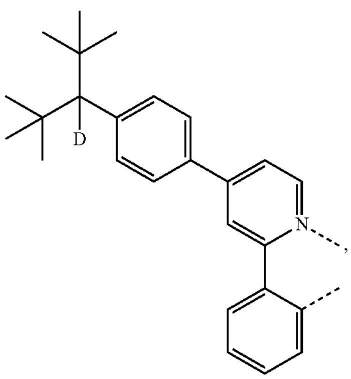
$L_{B121}$
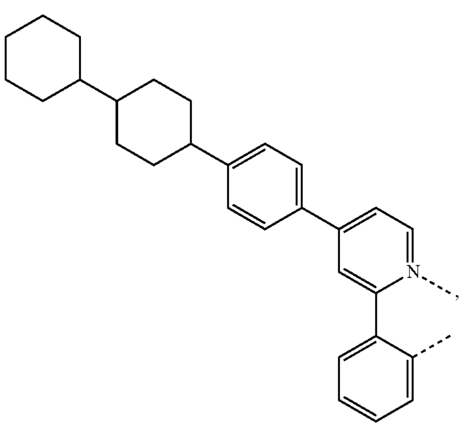
$L_{B122}$
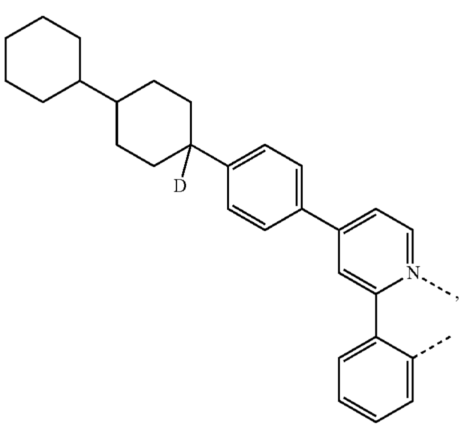
-continued
$L_{B123}$
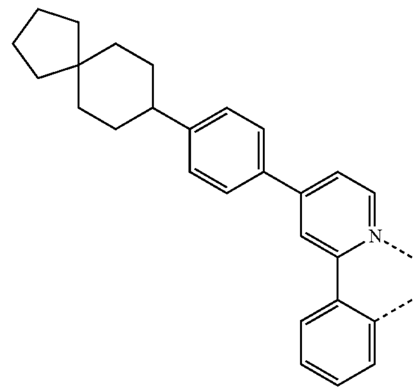
$L_{B124}$
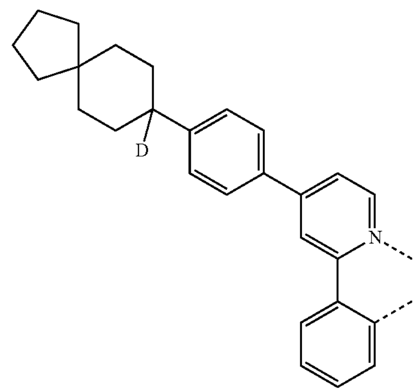
$L_{B125}$
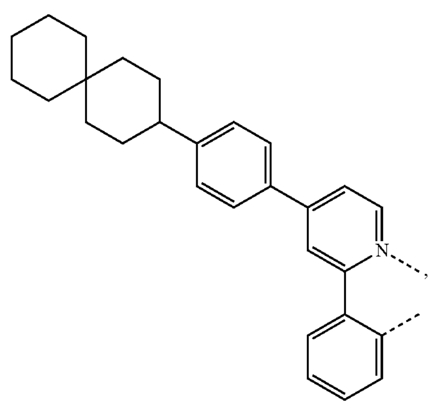
$L_{B126}$
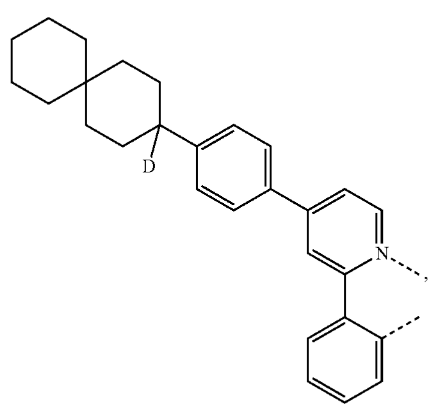

$L_{B127}$
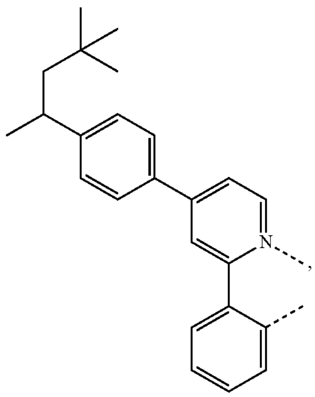
$L_{B128}$
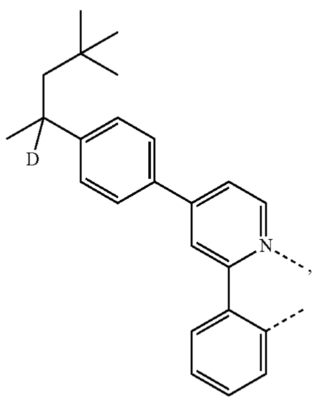
$L_{B129}$
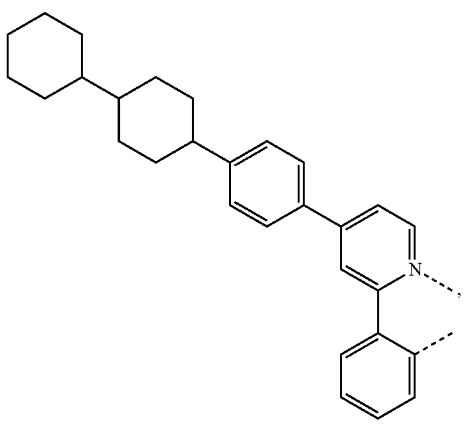
$L_{B130}$
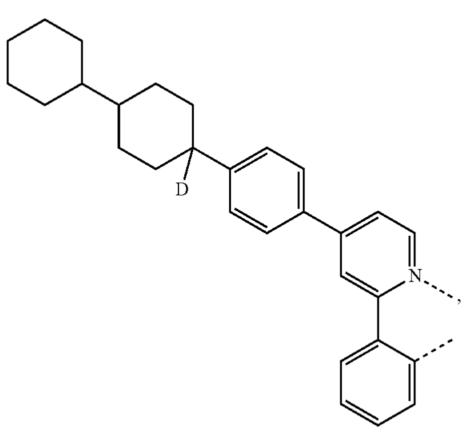
$L_{B131}$
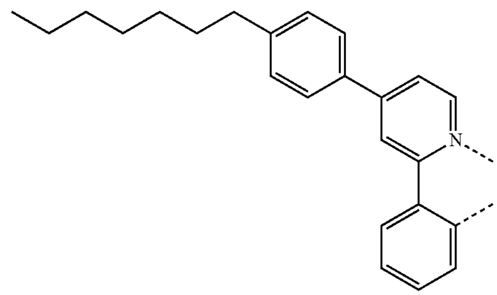
$L_{B132}$
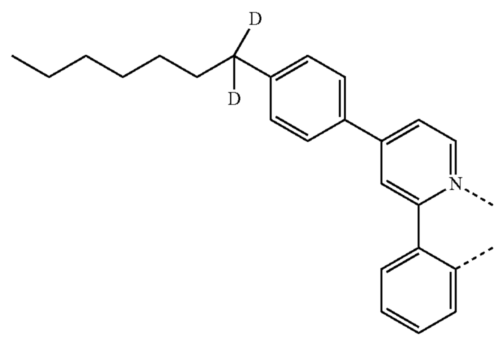
$L_{B133}$
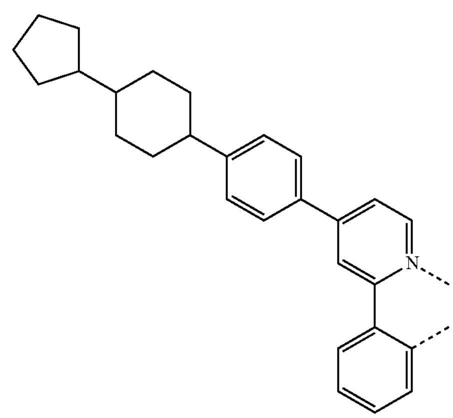
$L_{B134}$
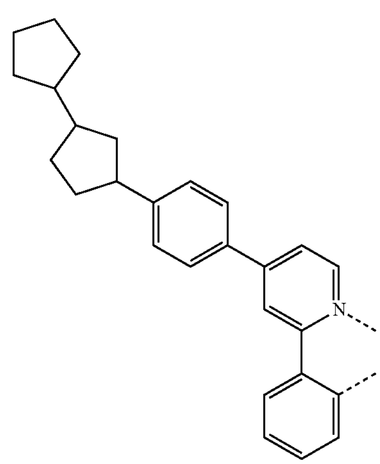

-continued
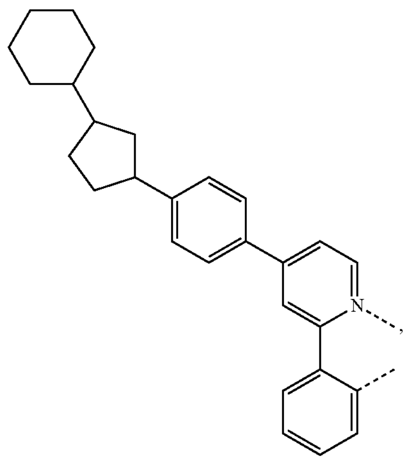
$L_{B135}$
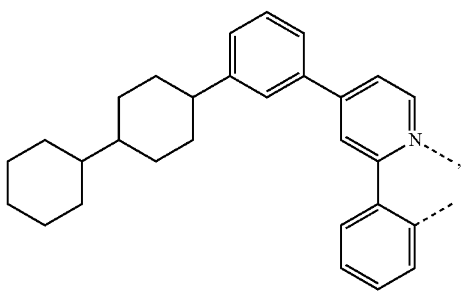
$L_{B136}$
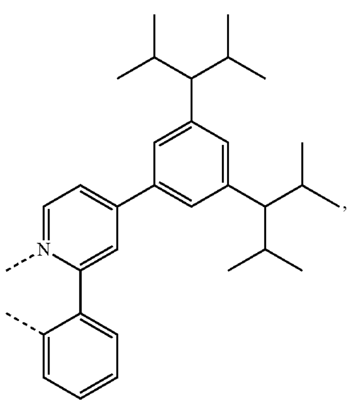
$L_{B137}$
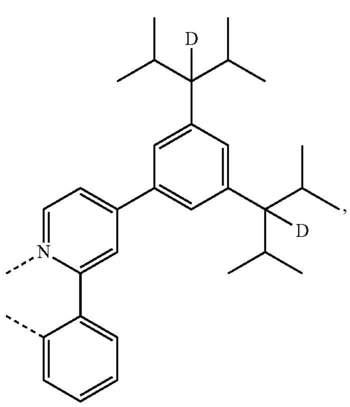
$L_{B138}$
-continued
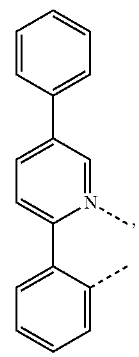
$L_{B139}$
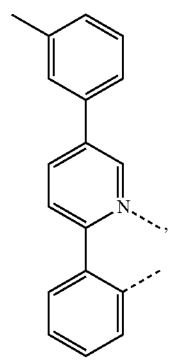
$L_{B140}$
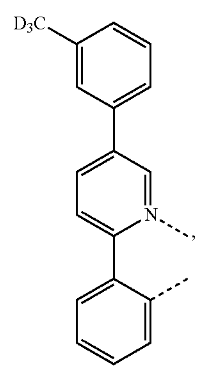
$L_{B141}$
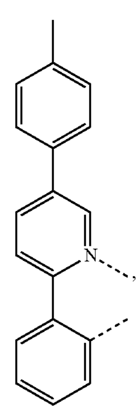
$L_{B142}$ -continued
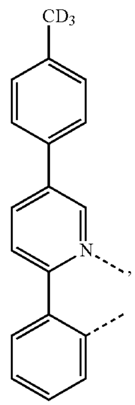
$L_{B143}$
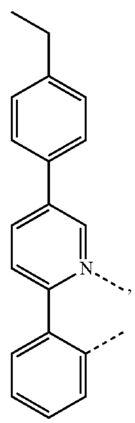
$L_{B144}$
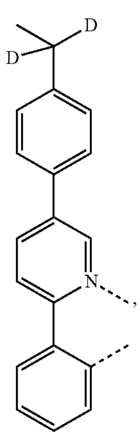
$L_{B145}$
-continued
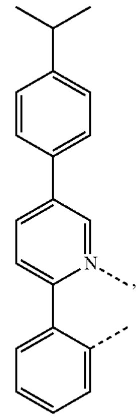
$L_{B146}$
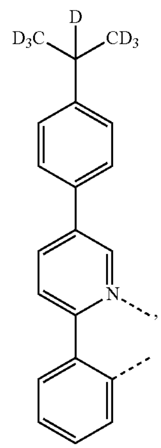
$L_{B147}$
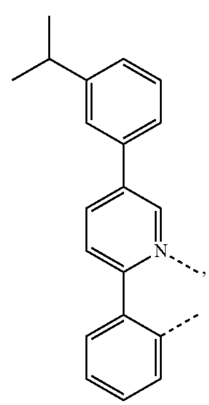
$L_{B148}$

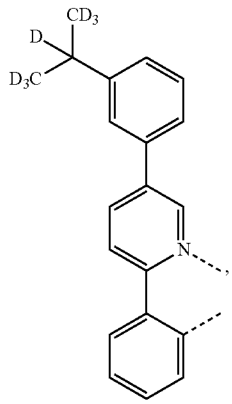
$L_{B149}$
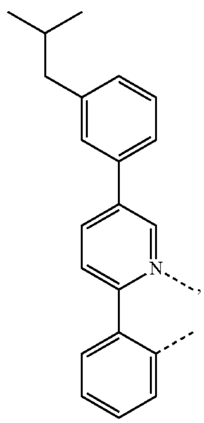
$L_{B150}$
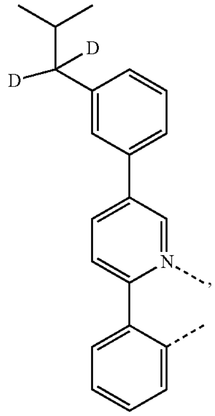
$L_{B151}$
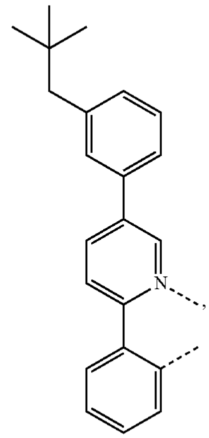
$L_{B152}$
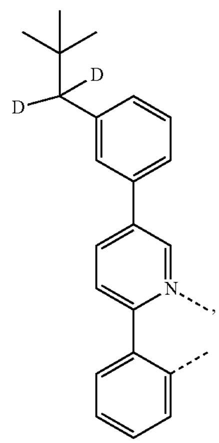
$L_{B153}$
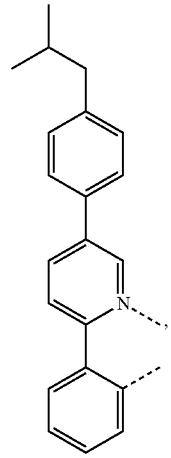
$L_{B154}$ -continued
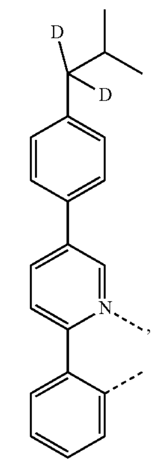
$L_{B155}$
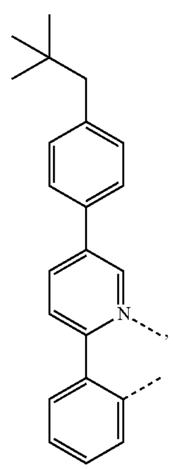
$L_{B156}$
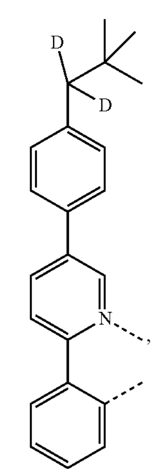
$L_{B157}$
-continued
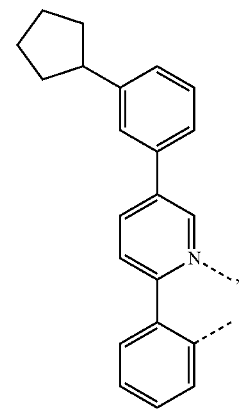
$L_{B158}$
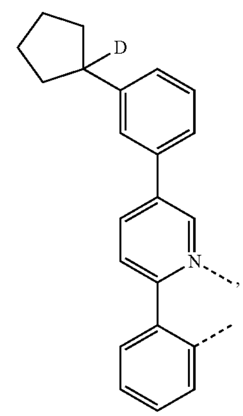
$L_{B159}$
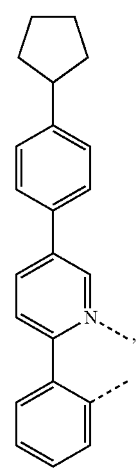
$L_{B160}$ L$_{B161}$
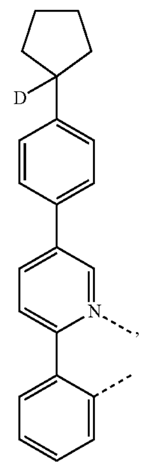
L$_{B162}$
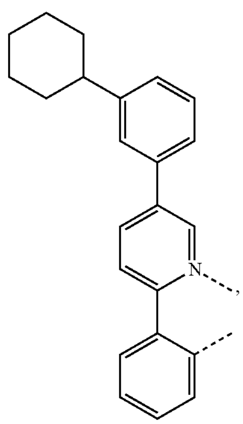
L$_{B163}$
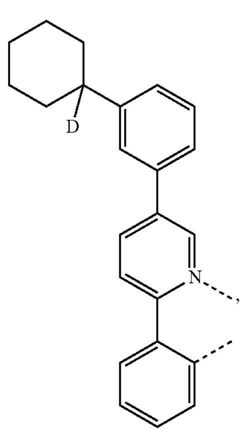
L$_{B164}$
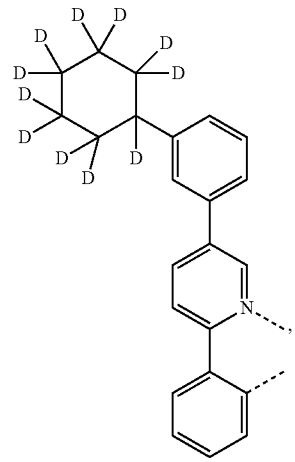
L$_{B165}$
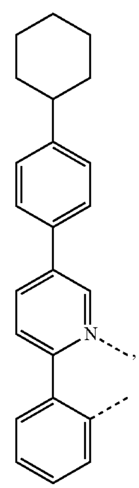
L$_{B166}$
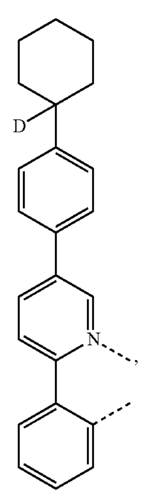

-continued
$L_{B167}$
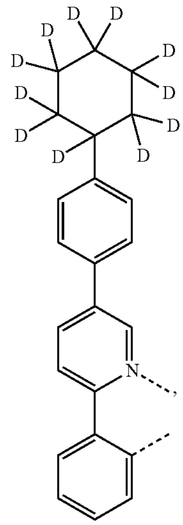
$L_{B168}$
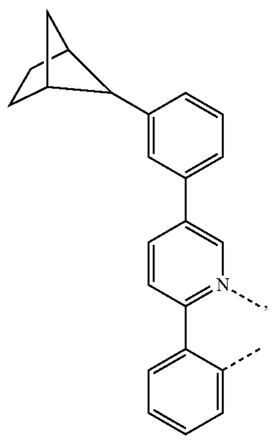
$L_{B169}$
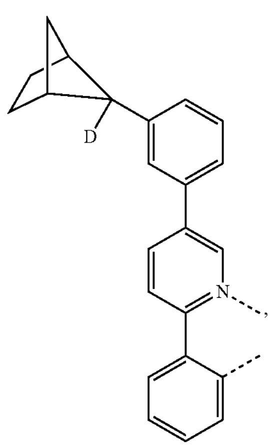
-continued
$L_{B170}$
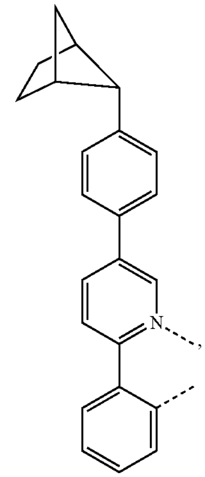
$L_{B171}$
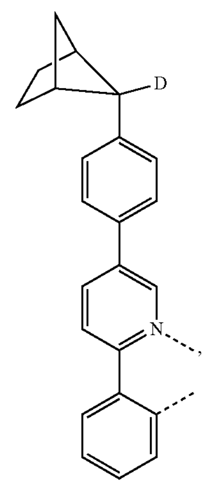
$L_{B172}$
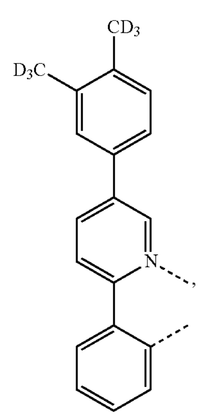

-continued
$L_{B173}$
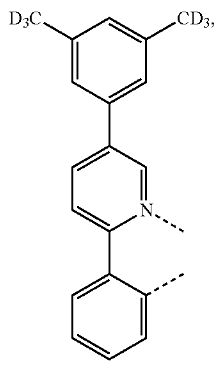
$L_{B174}$
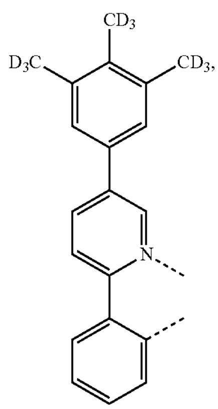
$L_{B175}$
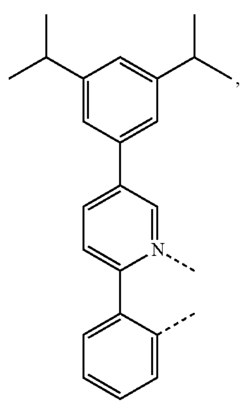
$L_{B176}$
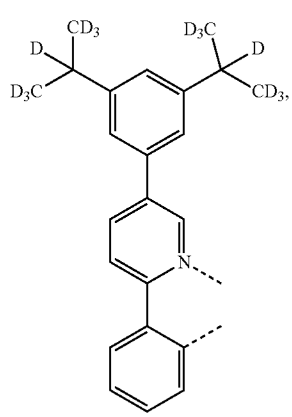
-continued
$L_{B177}$
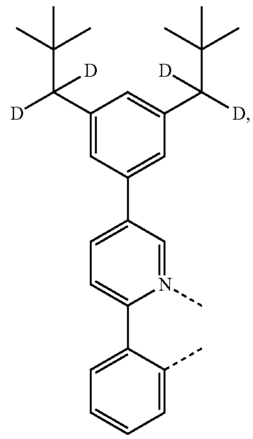
$L_{B178}$
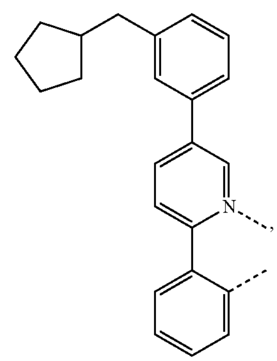
$L_{B179}$
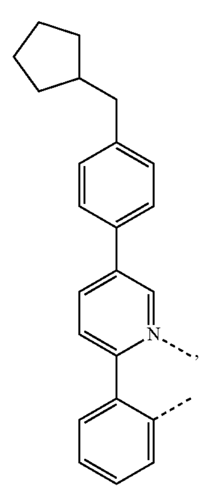

-continued
$L_{B180}$
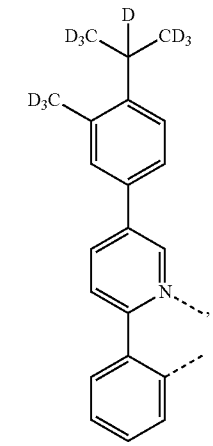
$L_{B181}$
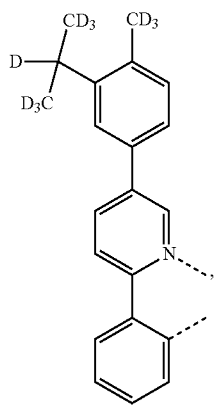
$L_{B182}$
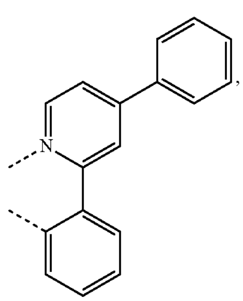
$L_{B183}$
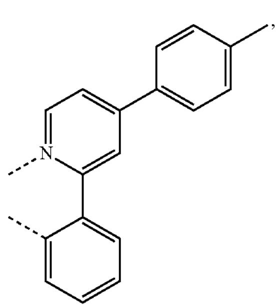
-continued
$L_{B184}$
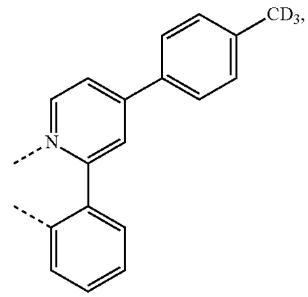
$L_{B185}$
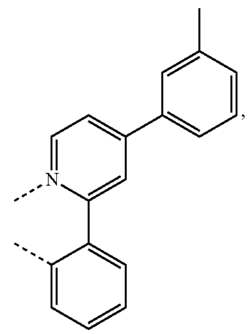
$L_{B186}$
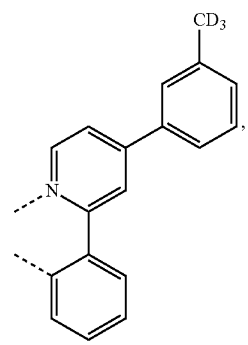
$L_{B187}$
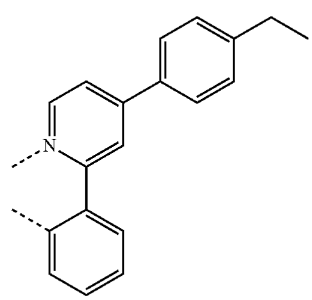
$L_{B188}$
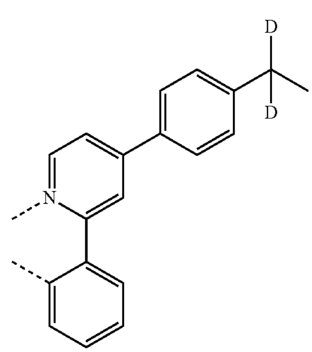

-continued
$L_{B189}$
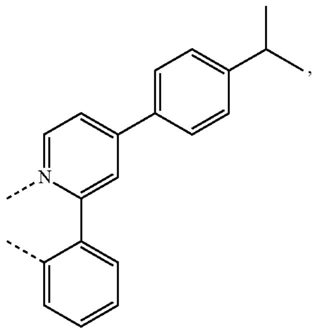
$L_{B190}$
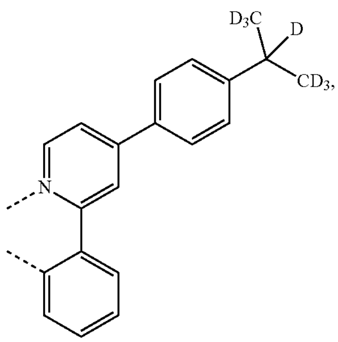
$L_{B191}$
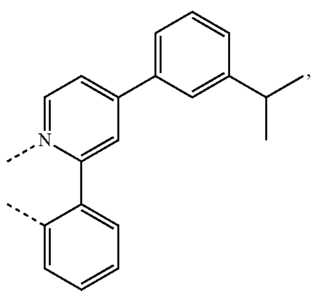
$L_{B192}$
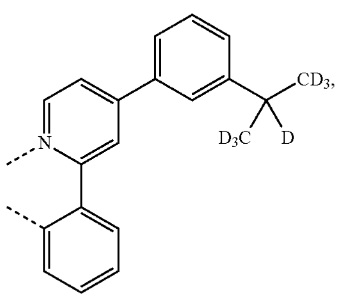
$L_{B193}$
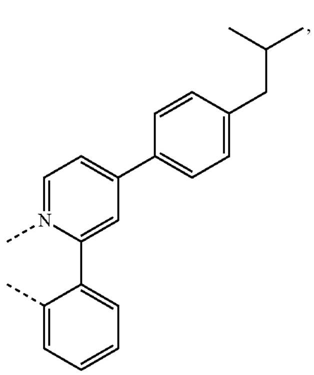
-continued
$L_{B194}$
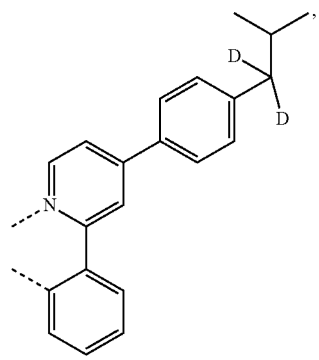
$L_{B195}$
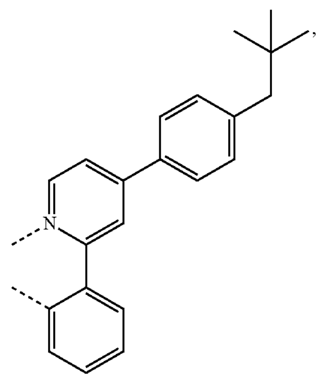
$L_{B196}$
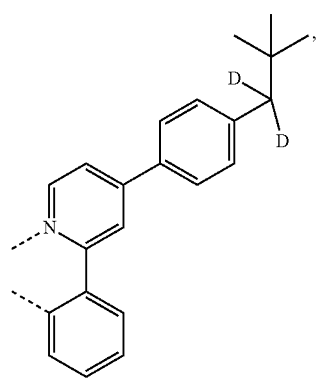
$L_{B197}$
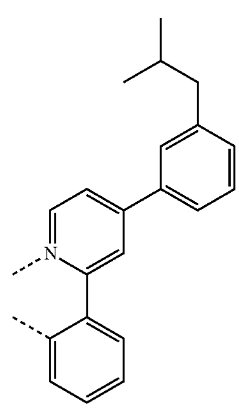

-continued
$L_{B198}$
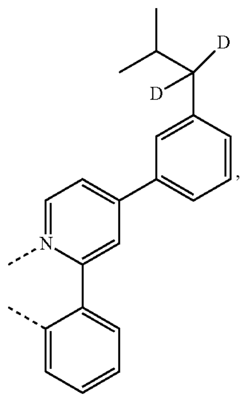
$L_{B199}$
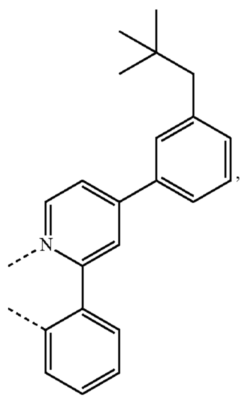
$L_{B200}$
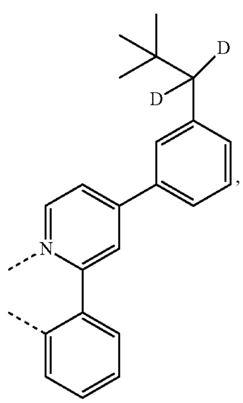
$L_{B201}$
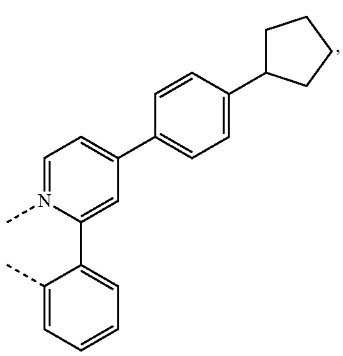
-continued
$L_{B202}$
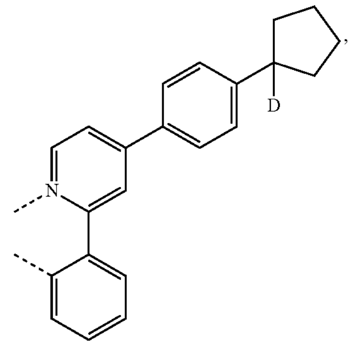
$L_{B203}$
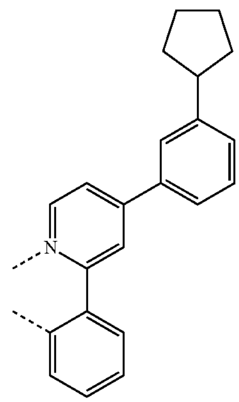
$L_{B204}$
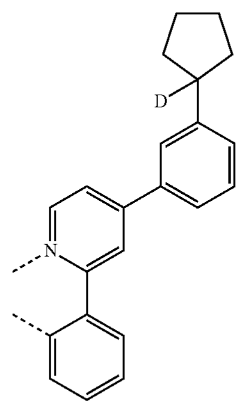
$L_{B205}$
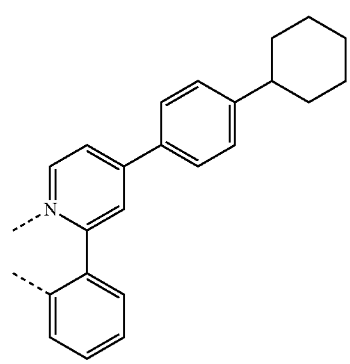

-continued
$L_{B206}$
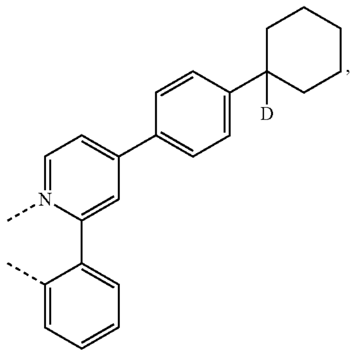
$L_{B207}$
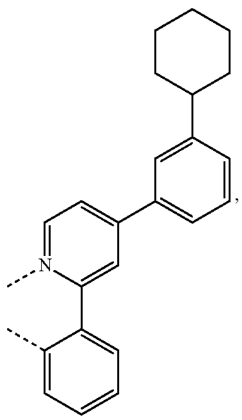
$L_{B208}$
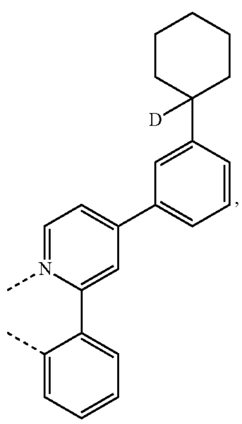
$L_{B209}$
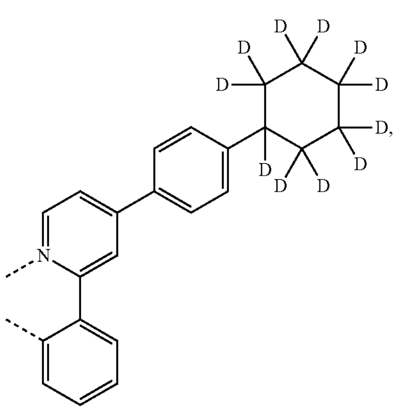
-continued
$L_{B210}$
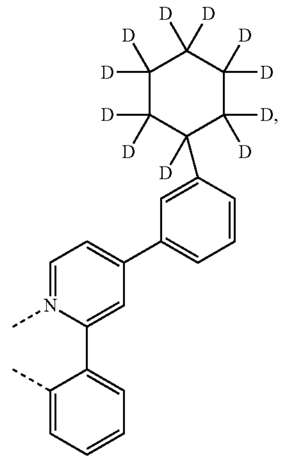
$L_{B211}$
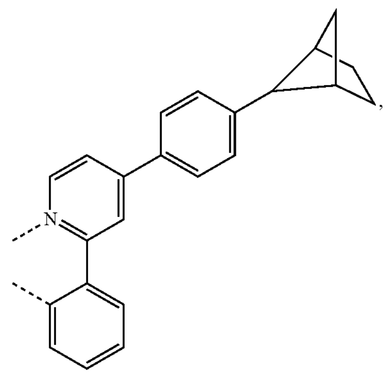
$L_{B212}$
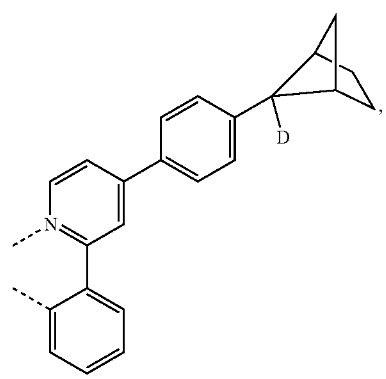
$L_{B213}$
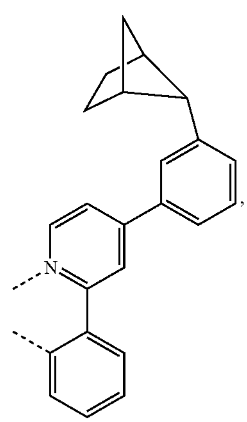

-continued
$L_{B214}$
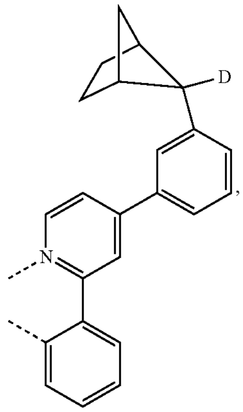
$L_{B215}$
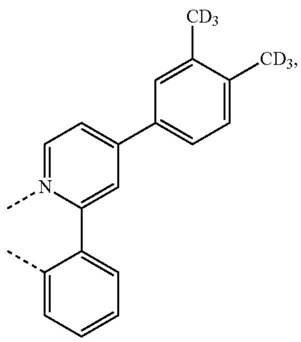
$L_{B216}$
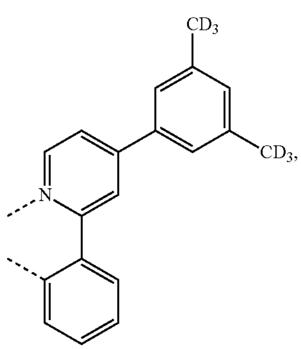
$L_{B217}$
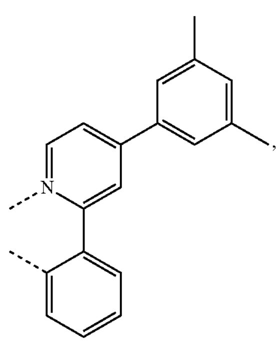
-continued
$L_{B218}$
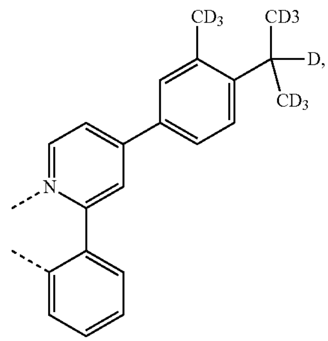
$L_{B219}$
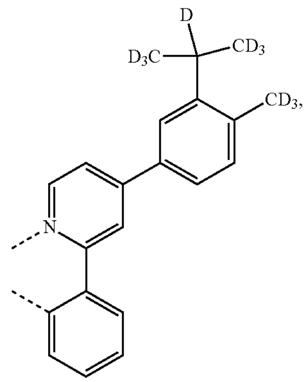
$L_{B220}$
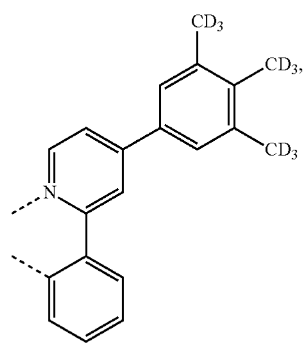
$L_{B221}$
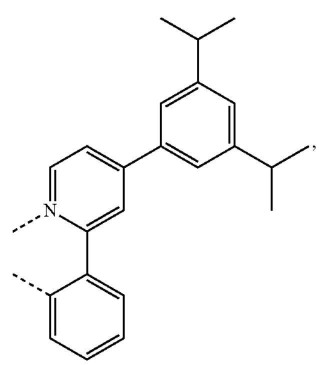

-continued $L_{B222}$

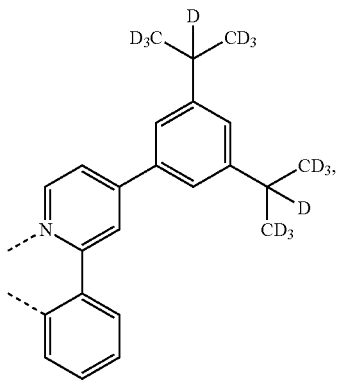

$L_{B223}$

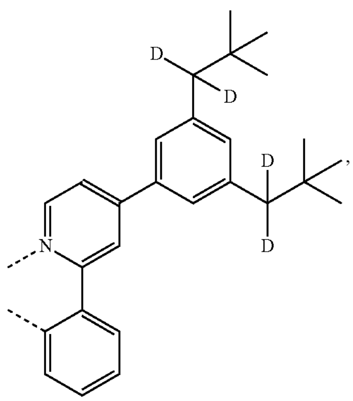

$L_{B224}$

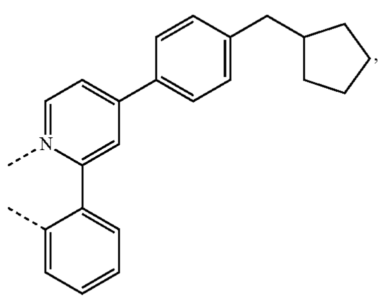

$L_{B225}$

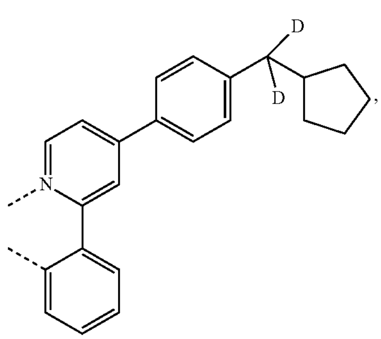

-continued $L_{B226}$

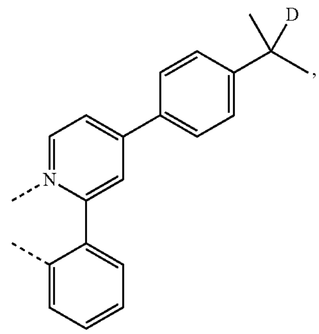

and $L_{B227}$

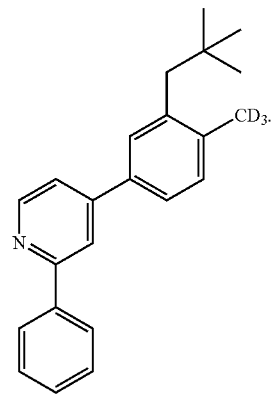

In some embodiments of the compound of formula $(L_A)_m Ir(L_B)_{3-m}$ having a structure selected from Group 1 and wherein $L_A$ is one of $L_{A1}$ to $L_{A225}$, the compound is Compound x having the formula $Ir(L_{Af})_2(L_{Bk})$; wherein x=227j+k−227, j is an integer from 1 to 225, and k is an integer from 1 to 227;

In some embodiments of the compound of formula $(L_A)Pt(L_B)$ having a structure selected from Group 1 and wherein $L_A$ is one of $L_{A1}$ to $L_{A225}$, the compound is Compound y having the formula $Pt(L_{Af})(L_{Bk})$; wherein y=227j+k−227, j is an integer from 1 to 225, and k is an integer from 1 to 227. $L_{B1}$ to $L_{B227}$ have the structures as defined above.

According to another aspect of the present disclosure, a compound having a formula $(L_A)_m Ir(L_B)_{3-m}$ is disclosed wherein the compound has a structure selected from the group, Group 2, consisting of:

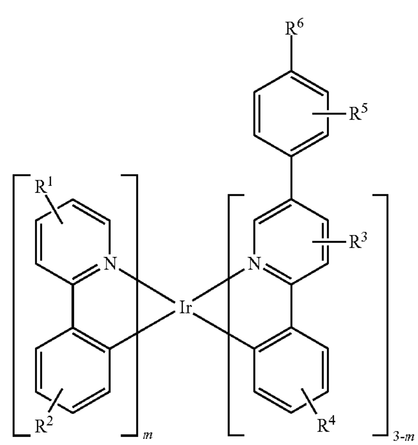

-continued

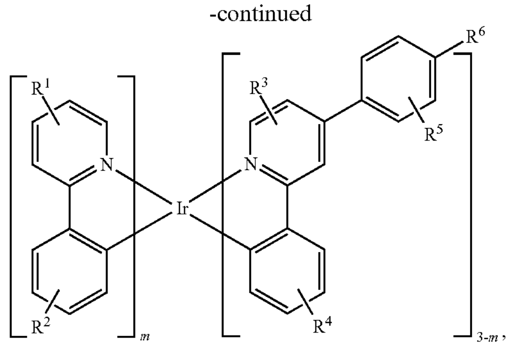

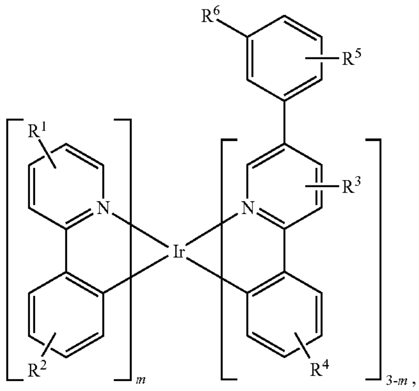

and

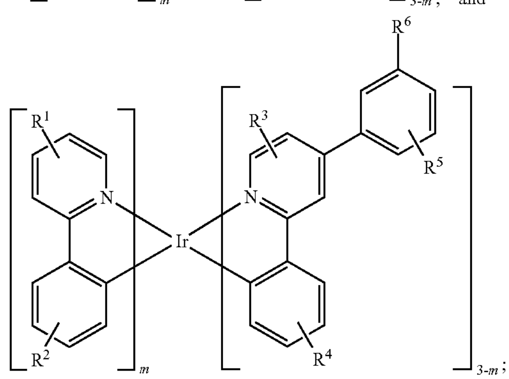

wherein m is 1 or 2;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof.

In some embodiments of the compound having a structure selected from Group 2, $R^1$, $R^2$, $R^3$, $R^4$, and $R^5$ are each independently selected from the group consisting of hydrogen, deuterium, C1 to C6 alkyl, C1 to C6 cycloalkyl, and partially or fully deuterated or fluorinated variants thereof; and wherein $R^6$ is selected from the group consisting of alkyl having at least seven carbon atoms, cycloalkyl having at least seven carbon atoms, alkyl-cycloalkyl having at least seven carbon atoms, and partially or fully deuterated or fluorinated variants thereof.

In some embodiments of the compound having a structure selected from Group 2, m is 2.

In some embodiments of the compound having a structure selected from Group 2, $R^1$, $R^2$, $R^3$, $R^4$, and $R^5$ are each independently selected from the group consisting of hydrogen, deuterium, methyl, ethyl, propyl, isopropyl, and combinations thereof.

In some embodiments of the compound having a structure selected from Group 2, $R^6$ is selected from the group consisting of alkyl having at least seven carbon atoms, cycloalkyl having at least seven carbon atoms, alkyl-cycloalkyl having at least seven carbon atoms, and partially or fully deuterated or fluorinated variants thereof.

In some embodiments of the compound having a structure selected from Group 2, $R^3$, $R^4$, and $R^5$ are each a hydrogen.

In some embodiments of the compound having a structure selected from Group 2, $L_A$ is selected from the group consisting of $L_{A1}$ to $L_{A225}$ listed above.

In some embodiments of the compound having a structure selected from Group 2, $L_B$ is selected from the group consisting of $L_{B1}$ to $L_{B227}$. The structures of $L_{B1}$ to $L_{B227}$ are shown above.

According to another aspect of the present disclosure, an OLED is disclosed that comprises: an anode; a cathode; and an organic layer, disposed between the anode and the cathode, wherein the organic layer comprises a compound having a formula selected from the group consisting of $M(L_A)_x(L_B)_y(L_C)_z$,

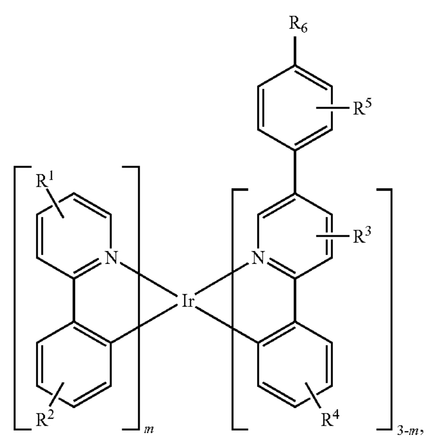

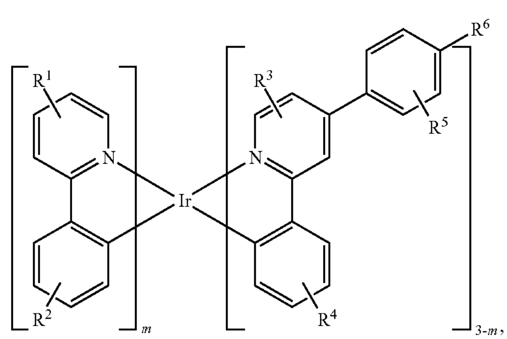

-continued
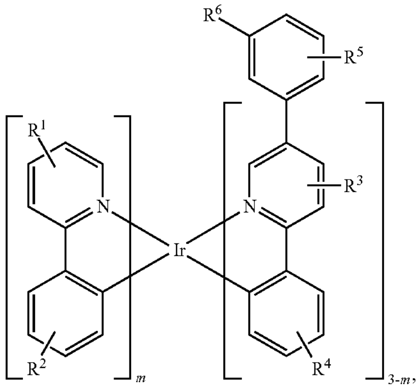
and
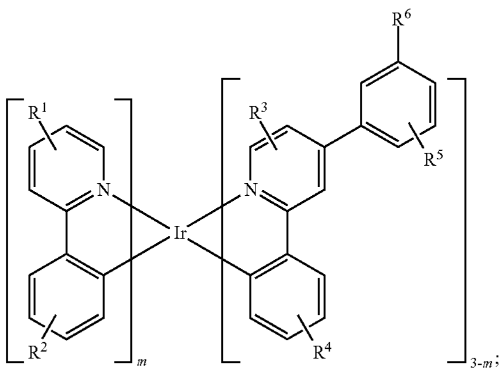
wherein m is 1 or 2;
wherein the ligand $L_A$, $L_B$, and $L_C$ are each independently selected from the group consisting of:
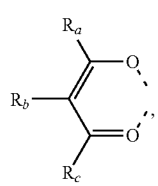
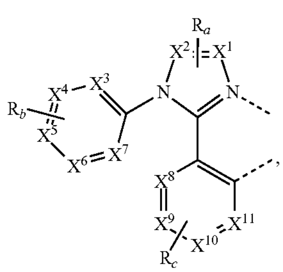
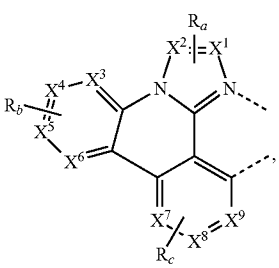
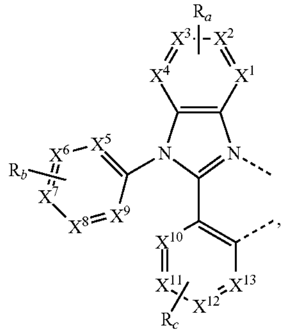
-continued
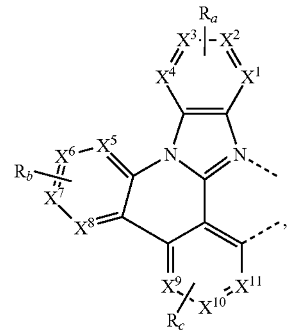
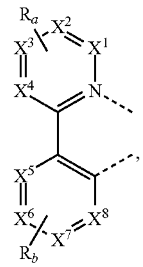
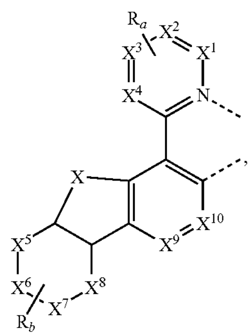
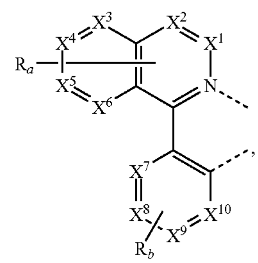
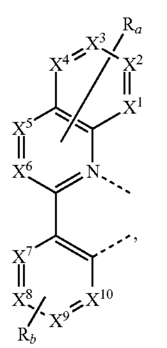
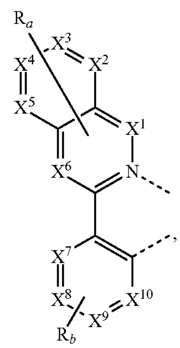
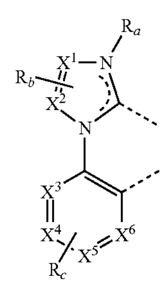
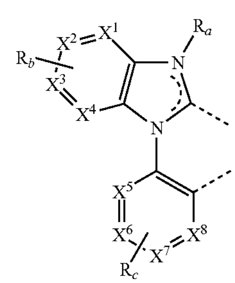
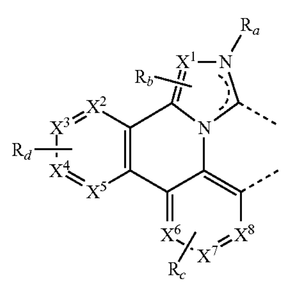
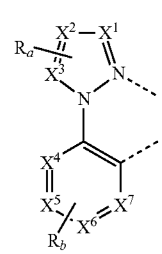

-continued

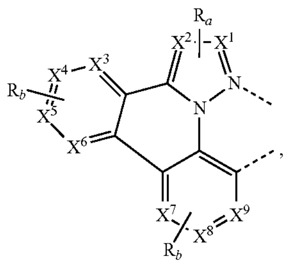

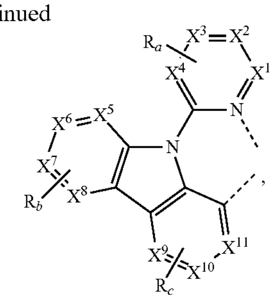

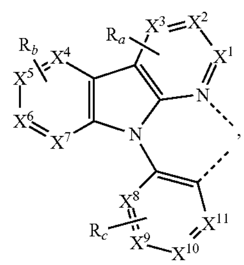

, and

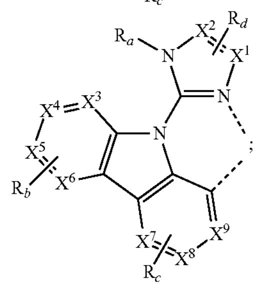

wherein each $X^1$ to $X^n$ are independently selected from the group consisting of carbon and nitrogen;

wherein X is selected from the group consisting of BR', NR', PR', O, S, Se, C═O, S═O, $SO_2$, CR'R'', SiR'R'', and GeR'R'';

wherein R' and R'' are optionally fused or joined to form a ring;

wherein each $R_a$, $R_b$, $R_c$, and $R_d$ may represent from mono substitution to the possible maximum number of substitution, or no substitution;

wherein R', R'', $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M;

wherein a molecule of the compound $M(L_A)_x(L_B)_y(L_C)_z$ has an orientation factor value greater than 0.67;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof.

In some embodiments, the OLED is incorporated into a device selected from the group consisting of a consumer product, an electronic component module, and a lighting panel.

In some embodiments of the OLED, the organic layer is an emissive layer and the compound can be an emissive dopant or a non-emissive dopant.

As discussed in conjunction with the device structure shown in FIG. 1, there can be other functional layers of the OLED provided between the organic layer and the anode and/or the organic layer and the cathode. Therefore depending on the particular embodiment, the organic layer containing the novel compound of the present disclosure can be directly deposited directly on the electrode substrate or on an intervening layer.

In some embodiments of the OLED, the organic layer further comprises a host, wherein the host comprises a triphenylene containing benzo-fused thiophene or benzo-fused furan; wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, CH═CH—$C_nH_{2n+1}$, C≡C$C_nH_{2n+1}$, $Ar_1$, $Ar_1$—$Ar_2$, $C_nH_{2n}$—$Ar_1$, or no substitution; wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the OLED, the organic layer further comprises a host, wherein host comprises at least one chemical group selected from the group consisting of triphenylene, carbazole, dibenzothiphene, dibenzofuran, dibenzoselenophene, azatriphenylene, azacarbazole, aza-dibenzothiophene, aza-dibenzofuran, and aza-dibenzoselenophene.

In some embodiments of the OLED, the organic layer further comprises a host, wherein the host is selected from the group consisting of:

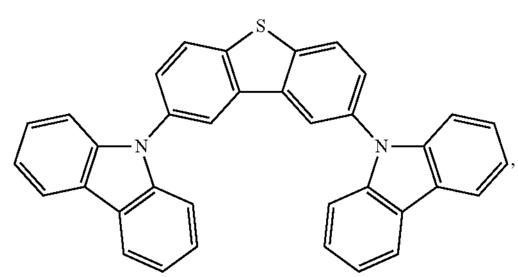

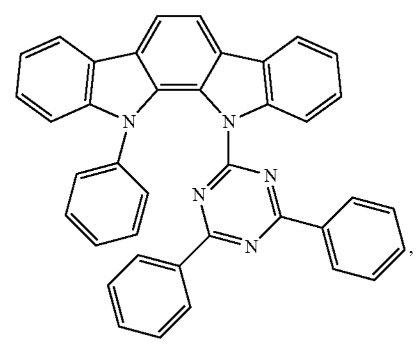

-continued
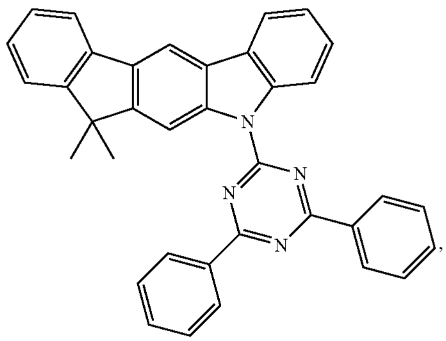
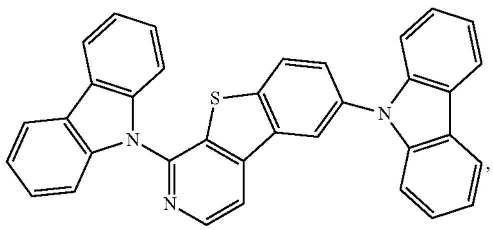
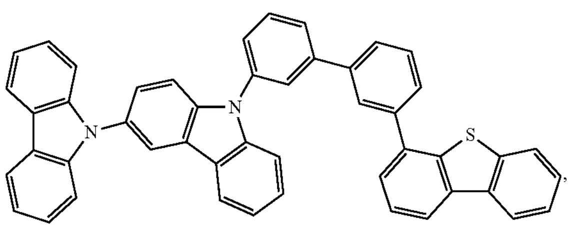
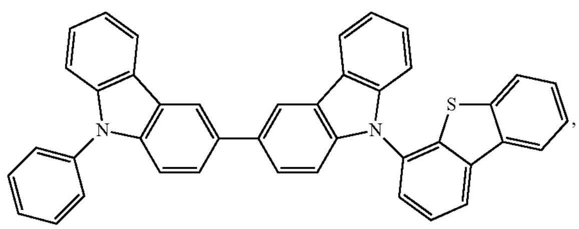
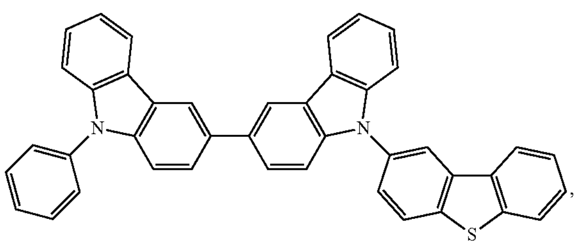
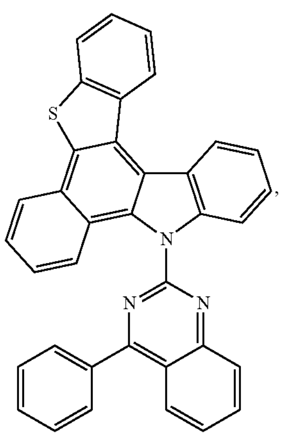
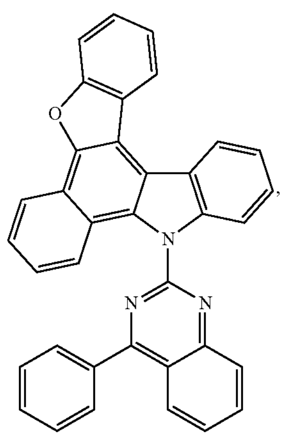
-continued
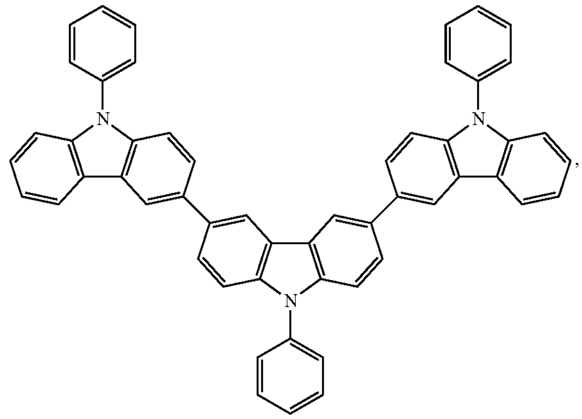
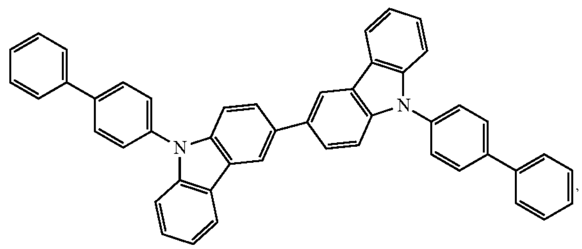
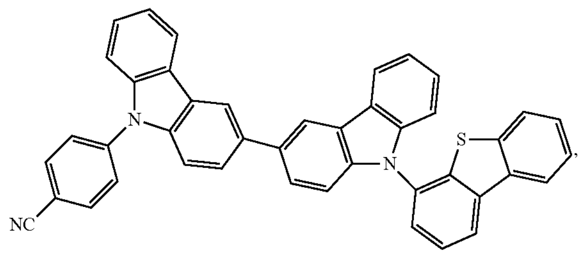
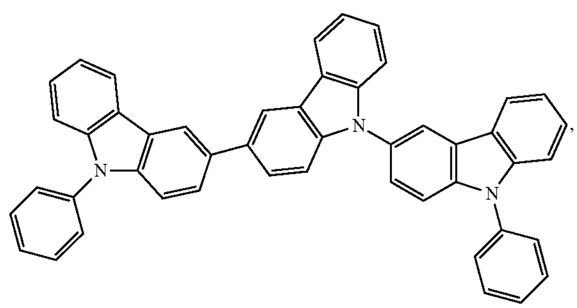
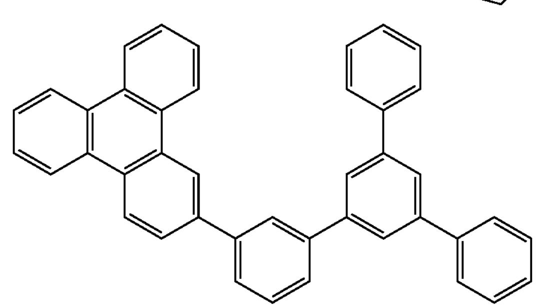

-continued

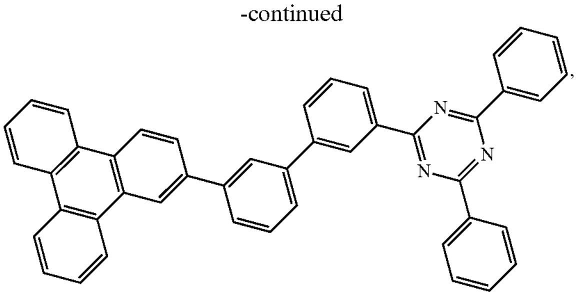

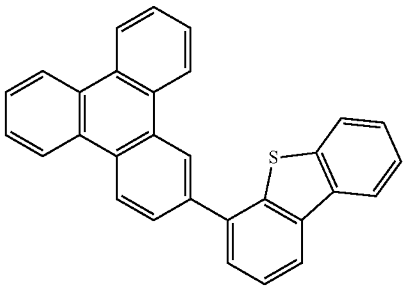

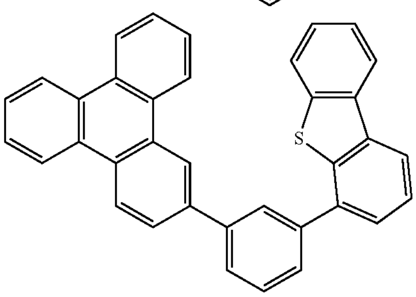

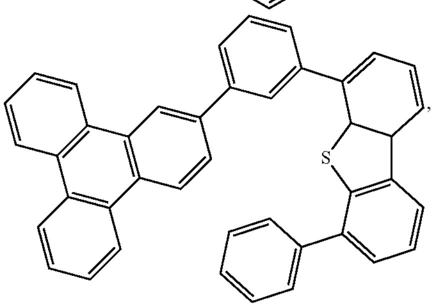

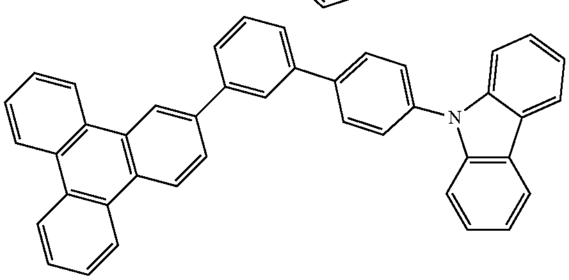

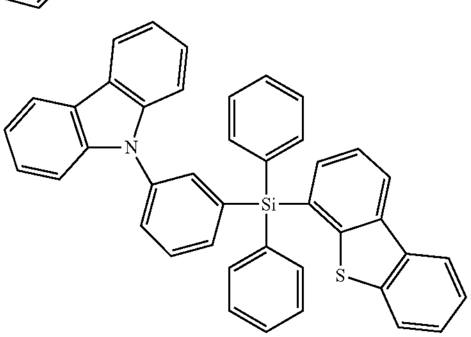

-continued

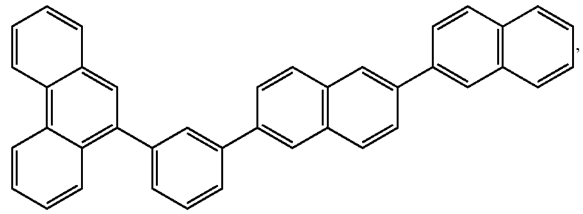

and combinations thereof.

In some embodiments of the OLED, the organic layer further comprises a host, wherein the host comprises a metal complex.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

According to another aspect, a formulation is disclosed wherein the formulation comprises a compound having a formula selected from the group consisting of $M(L_A)_x(L_B)_y(L_C)_z$,

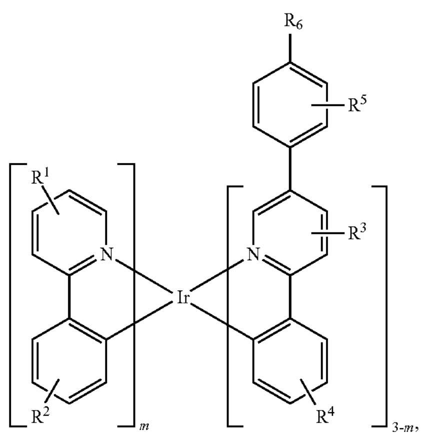

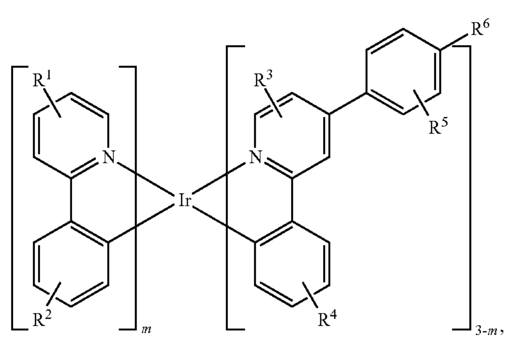

-continued
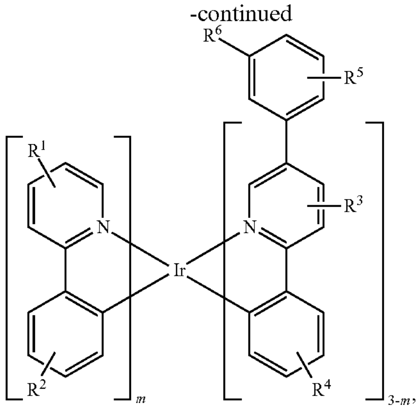
and
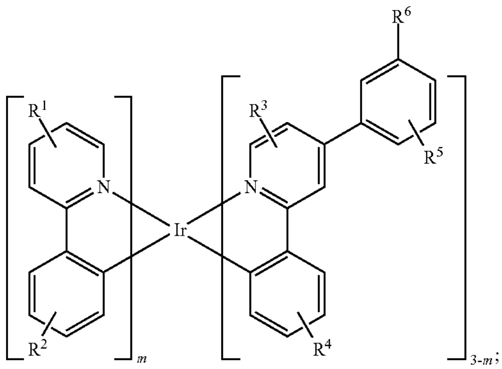
wherein m is 1 or 2;
wherein the ligand $L_A$, $L_B$, and $L_C$ are each independently selected from the group consisting of:
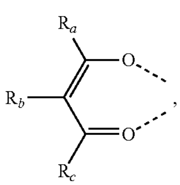
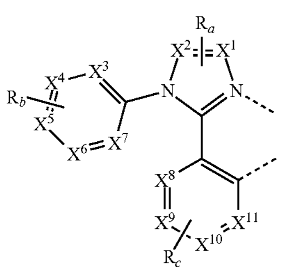
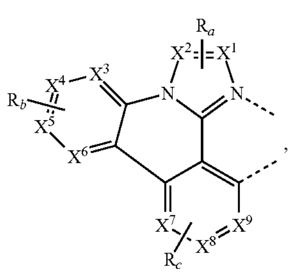
-continued
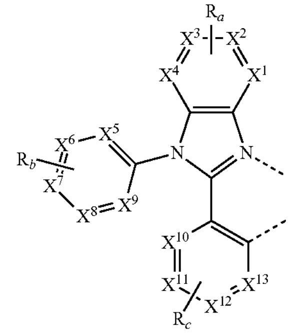
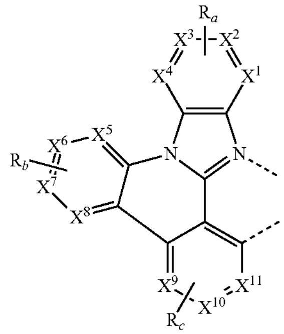
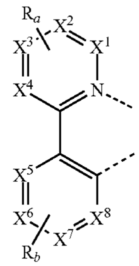
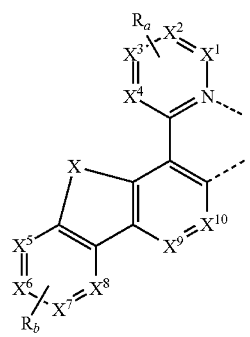
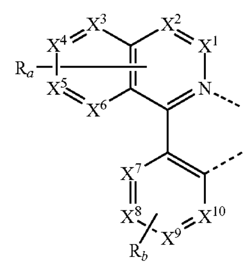
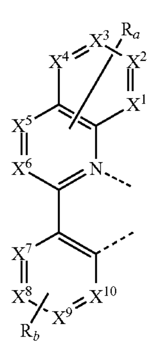
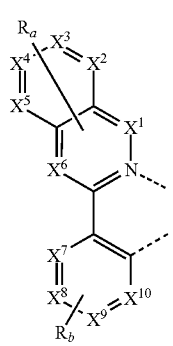
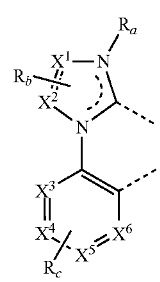
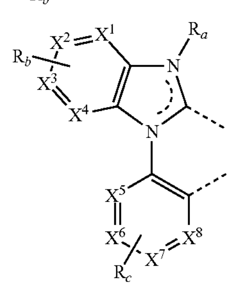
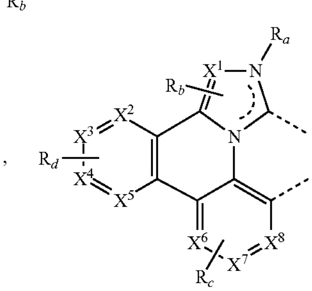

-continued

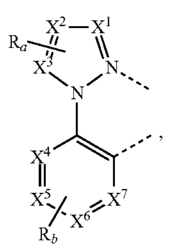

,

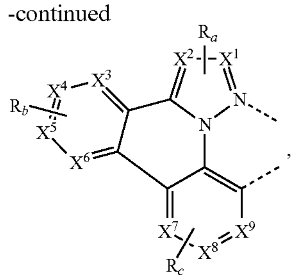

,

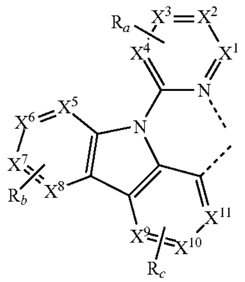

,

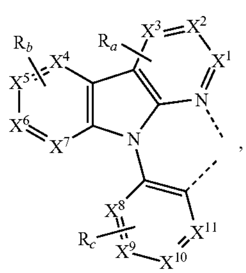

, and

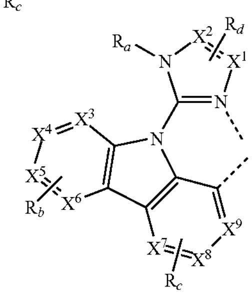

, wherein each $X^1$ to $X^{13}$ are independently selected from the group consisting of carbon and nitrogen;

wherein X is selected from the group consisting of BR', NR', PR', O, S, Se, C═O, S═O, $SO_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substitutents of $R_a$, $R_b$, $R_c$, and $R_d$ are optionally fused or joined to form a ring or form a multidentate ligand;

wherein M is a metal having an atomic mass greater than 40;

wherein x is 1 or 2;

wherein y is 0, 1, or 2;

wherein z is 0, 1, or 2;

wherein x+y+z is the oxidation state of the metal M;

wherein a molecule of the compound $M(L_A)_x(L_B)_y(L_C)_z$ has an orientation factor value greater than 0.67;

wherein $R^1$, $R^2$, $R^4$, and $R^5$ each independently represent mono, di, tri, or tetra substitution, or no substitution;

wherein $R^3$ represents mono, di, or tri substitution, or no substitution;

wherein $R^6$ represents mono substitution, or no substitution; and wherein $R^1$, $R^2$, $R^3$, $R^4$, $R^5$, and $R^6$ are each independently selected from the group consisting of hydrogen, deuterium, alkyl, cycloalkyl, partially or fully deuterated or fluorinated variants thereof, and combinations thereof.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, CH═CH—$C_nH_{2n+1}$, C≡C—$C_nH_{2n+1}$, $Ar_1$, $Ar_1$—$Ar_2$, and $C_nH_{2n}$—$Ar_1$, or the host has no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

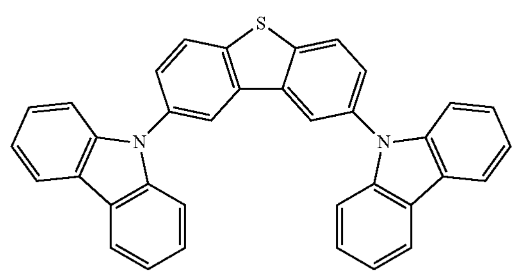

,

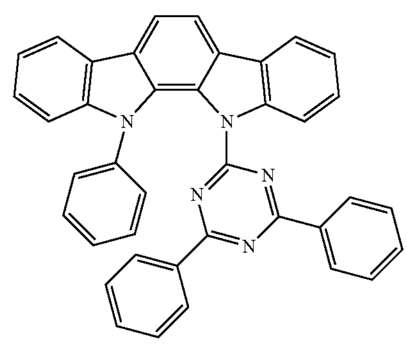

,

-continued
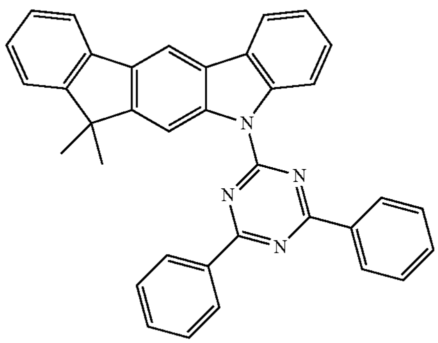
,
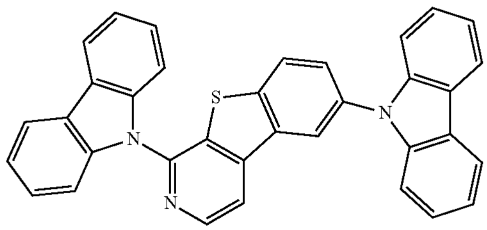
,
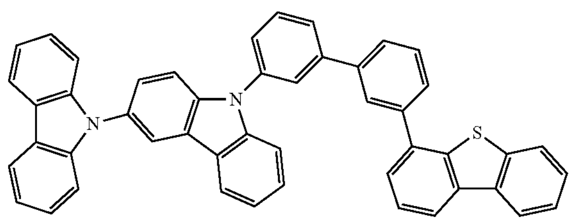
,
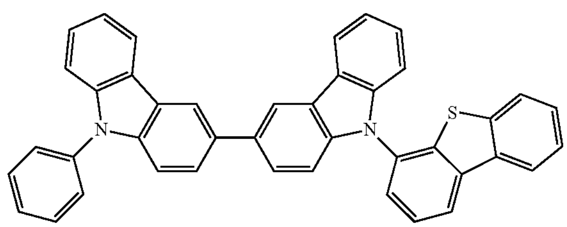
,
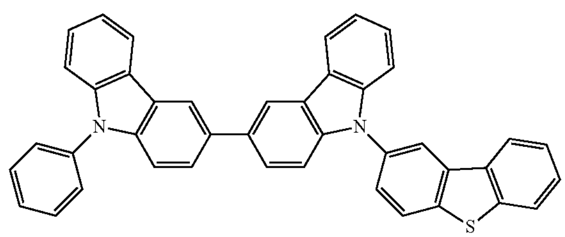
,
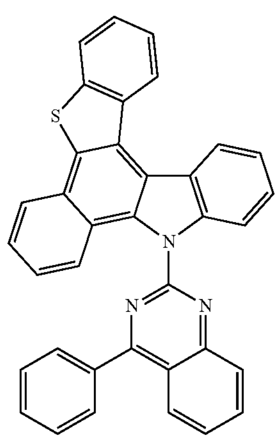
,
-continued
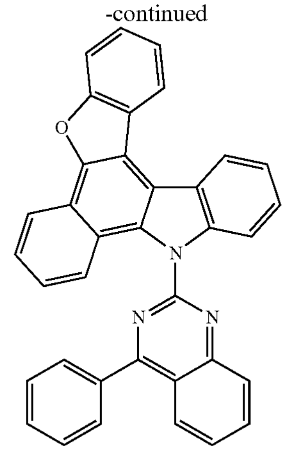
,
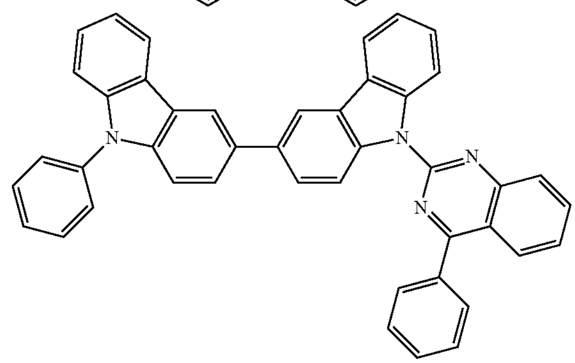
,
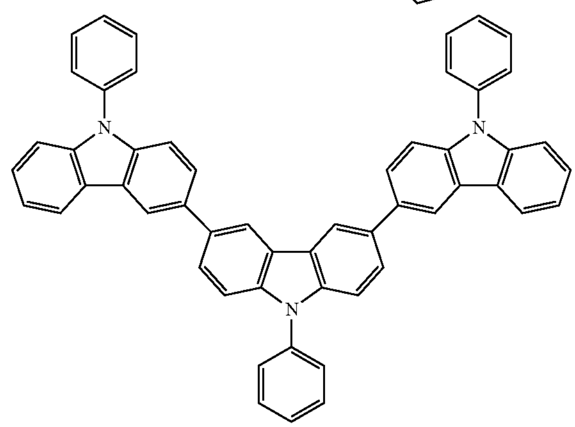
,
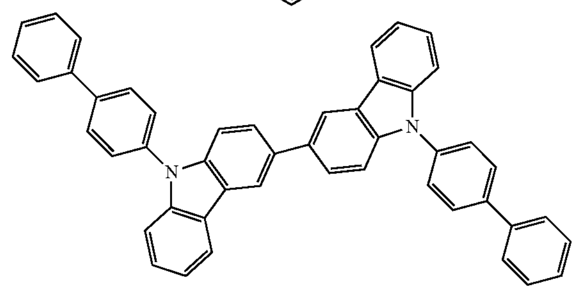
,
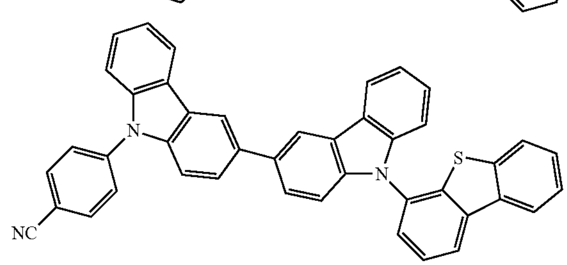
, -continued

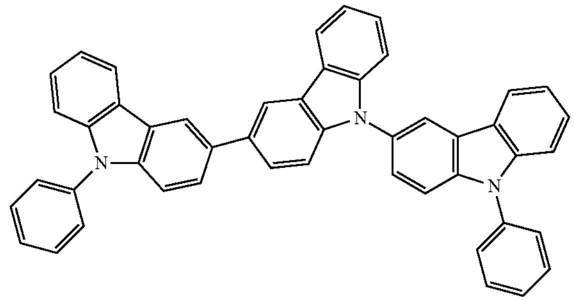

,

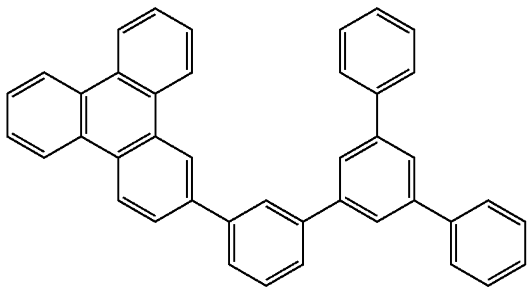

,

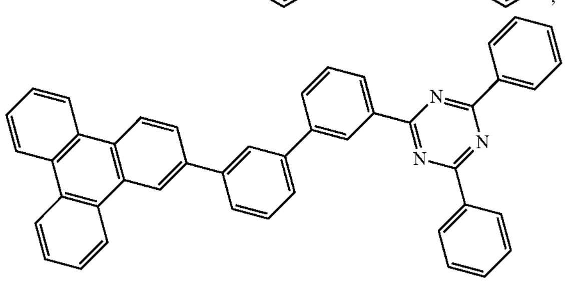

,

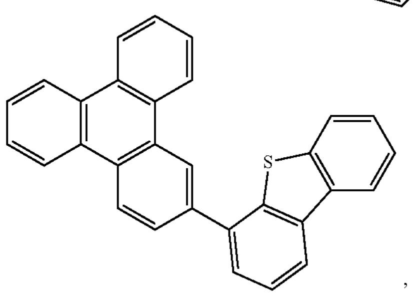

,

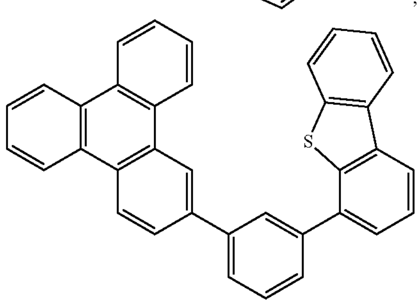

,

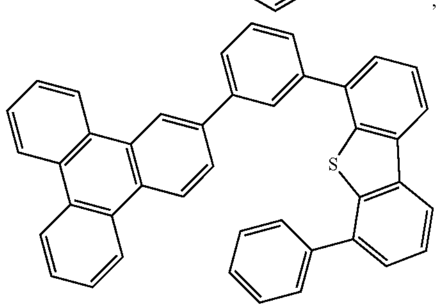

,

-continued

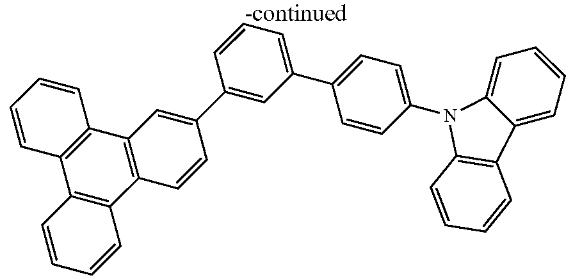

,

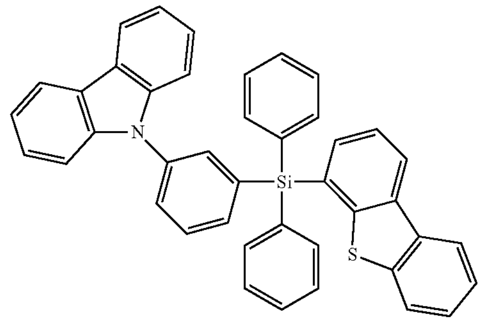

,

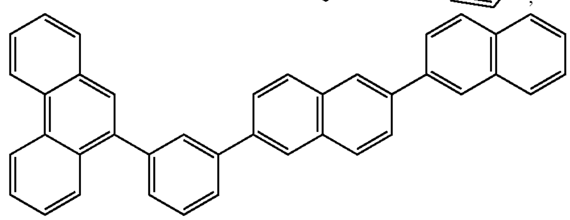

, and combinations thereof.

Additional information on possible hosts is provided below.

In yet another aspect of the present disclosure, a formulation that comprises a compound according to Formula I is described. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.
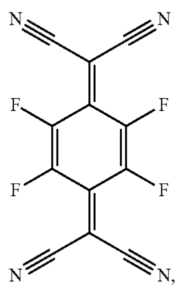
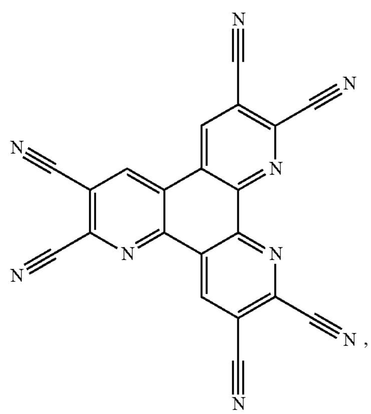
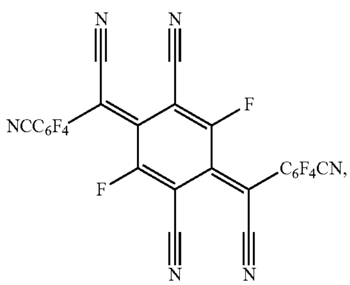
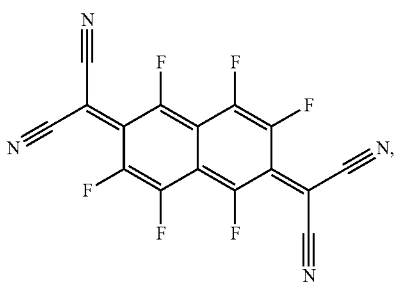
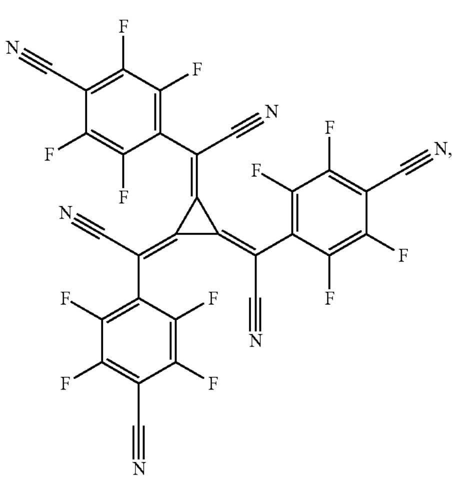
-continued
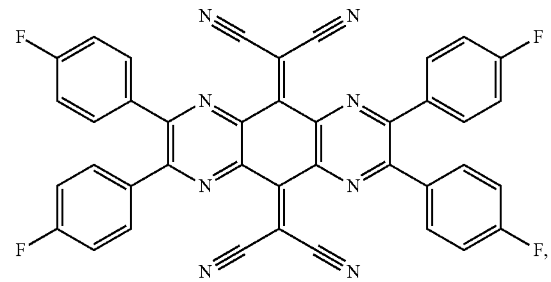
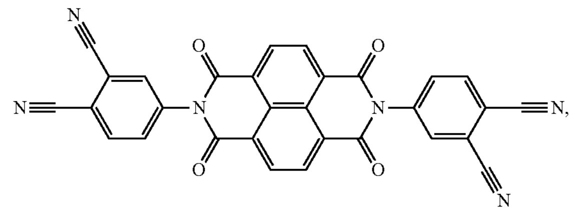
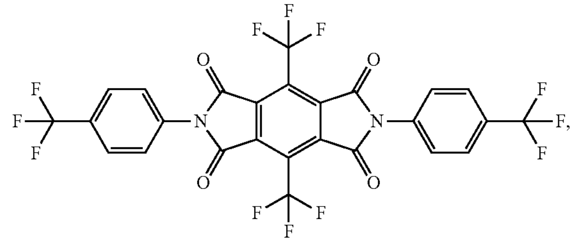
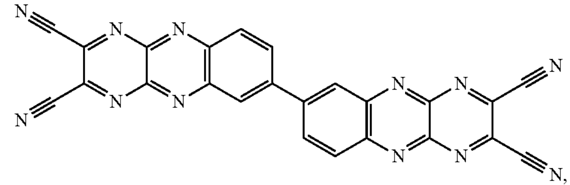
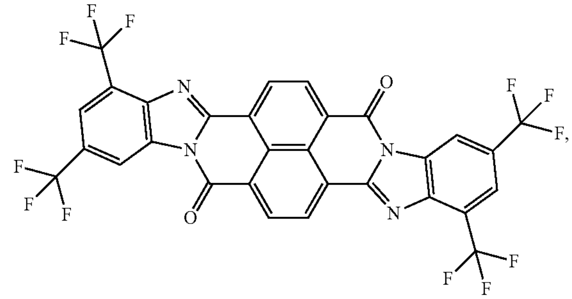
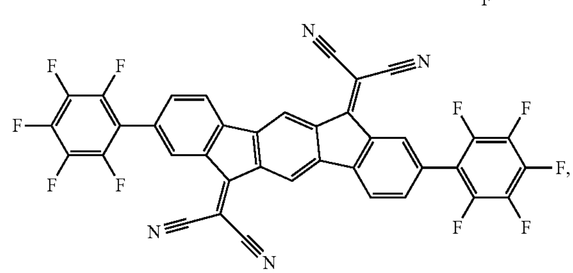
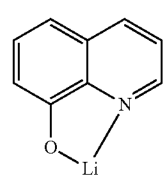
and
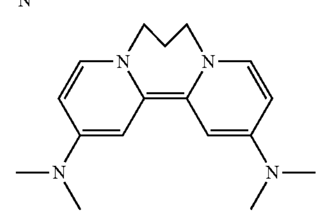

-continued

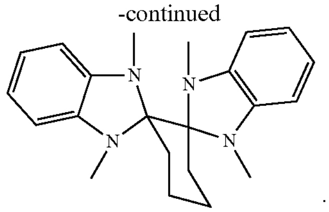

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

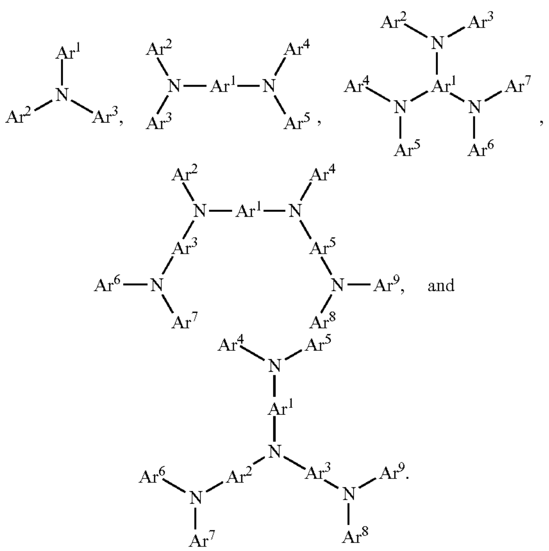

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

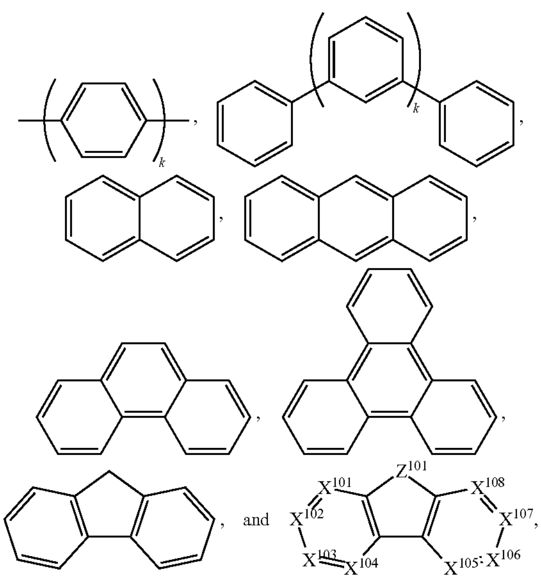

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

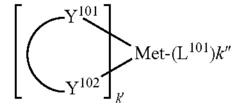

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

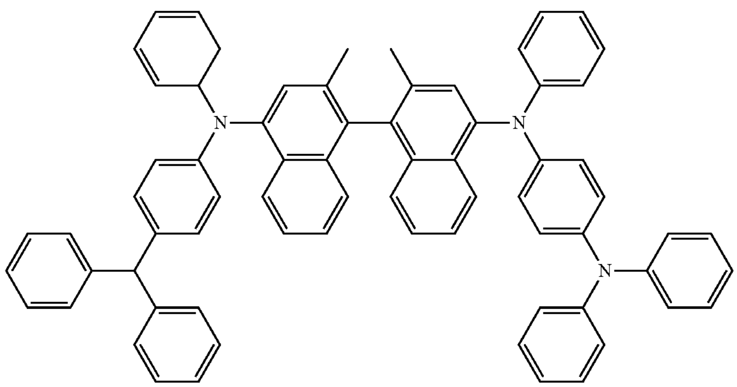

,

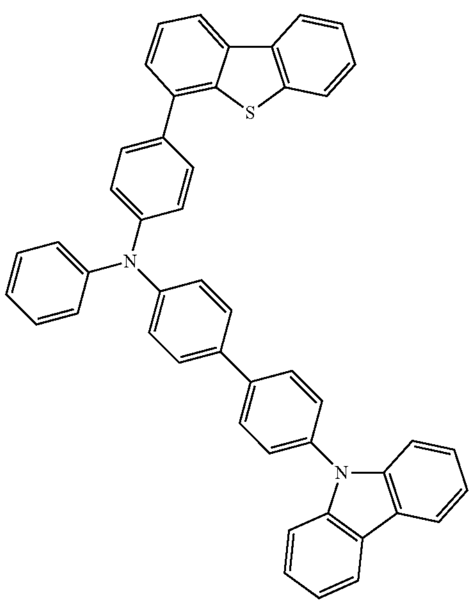

,

-continued
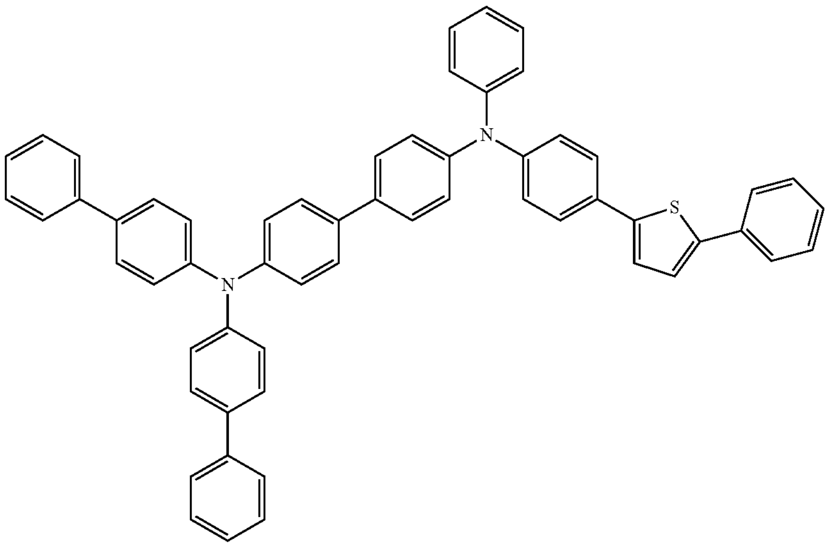
,
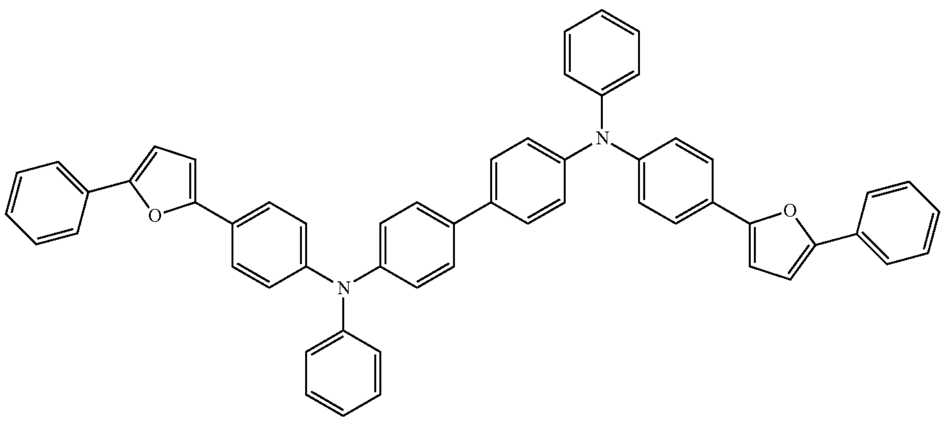
,
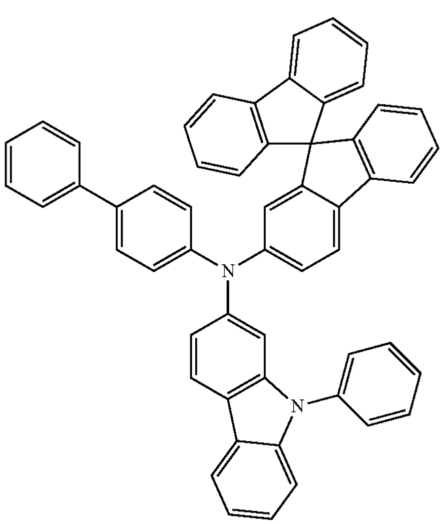
,

-continued
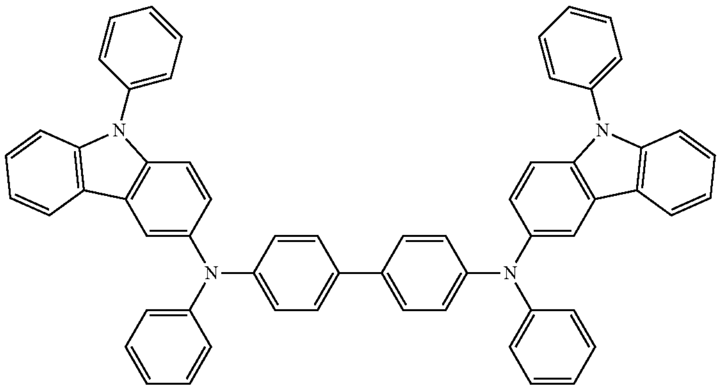
,
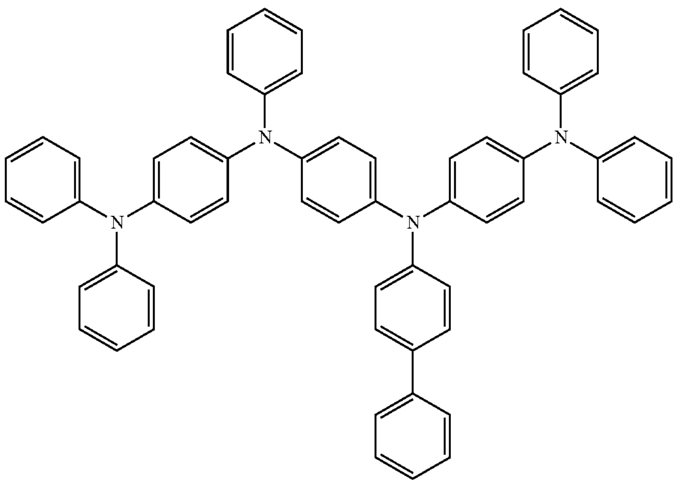
,
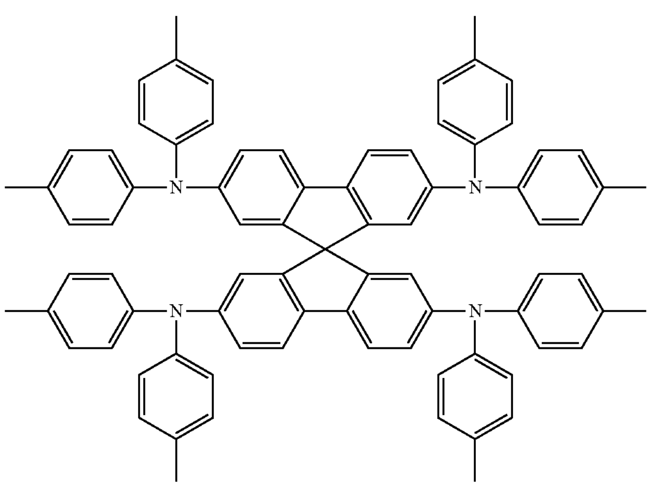
,

-continued
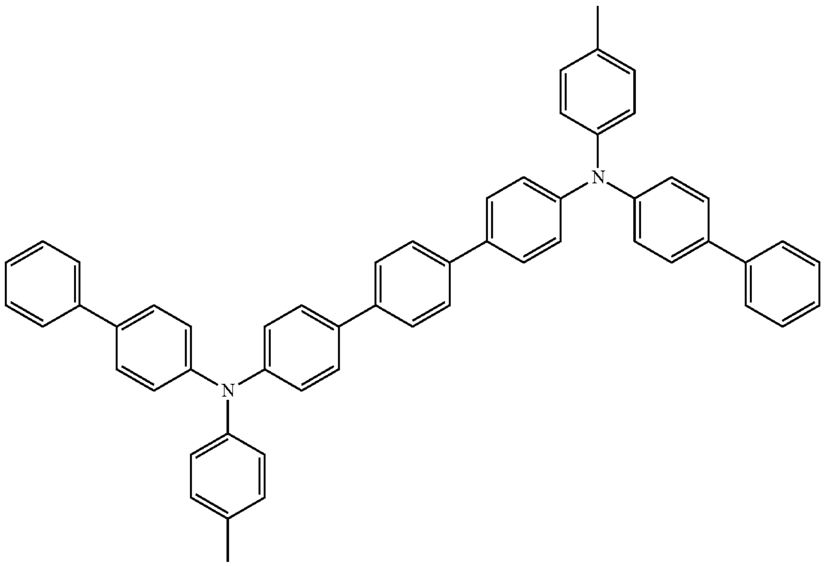
,
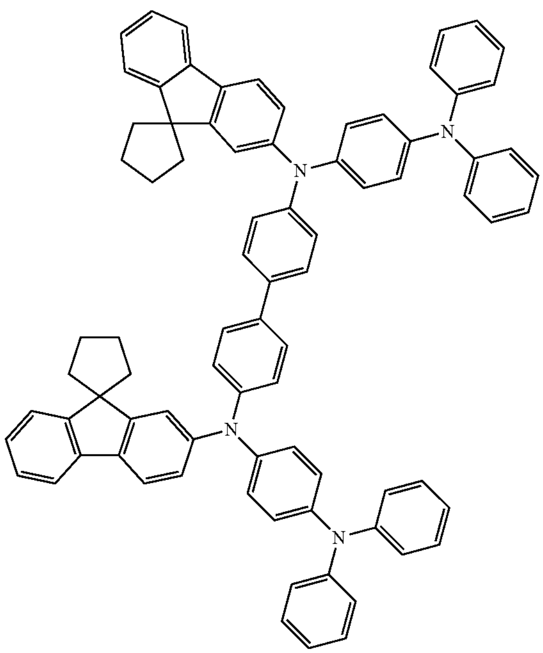
,
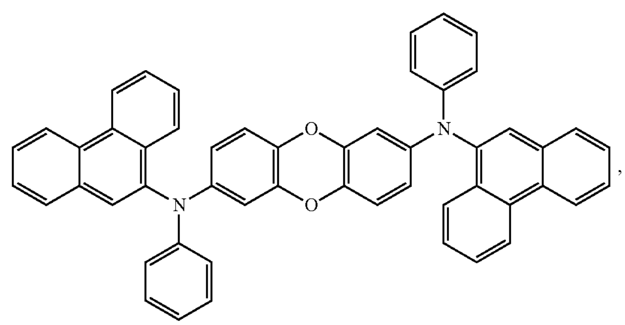
,
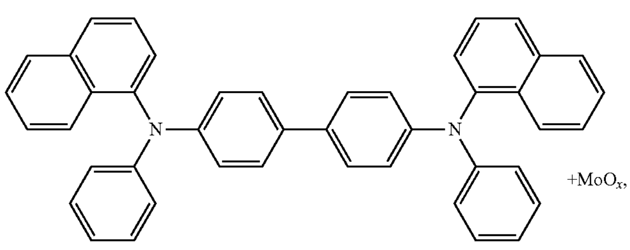
$+MoO_x$,

-continued
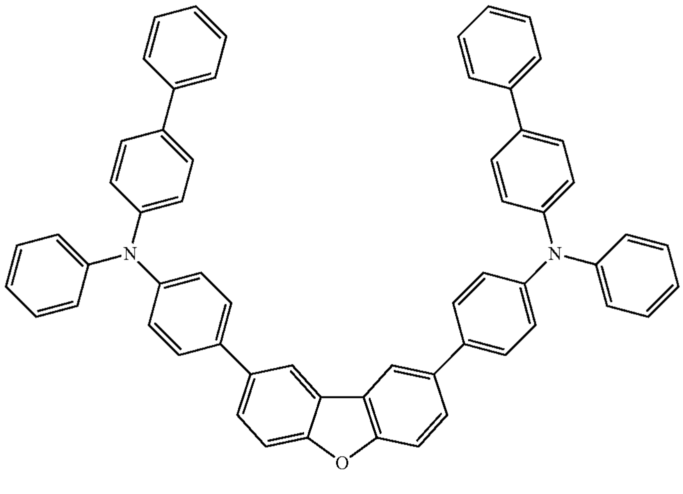
,
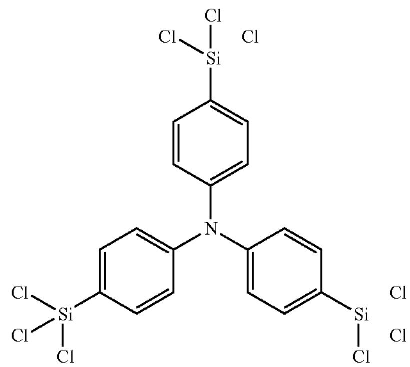
,
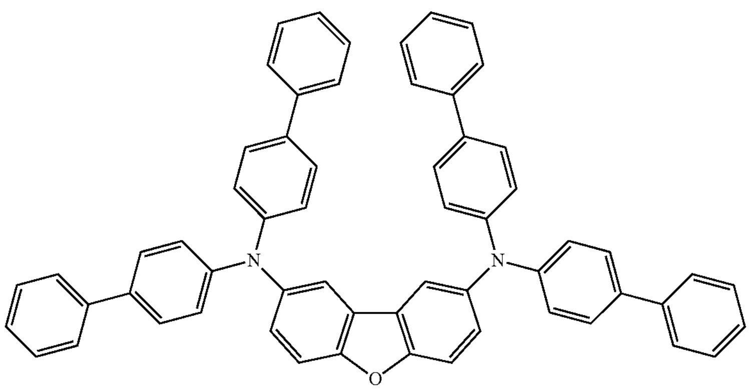
,
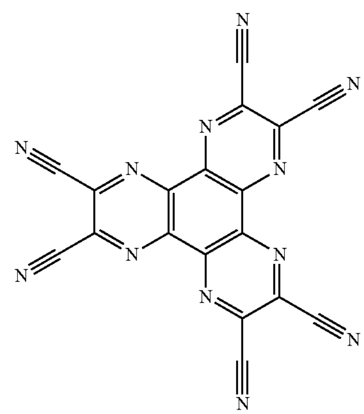
,
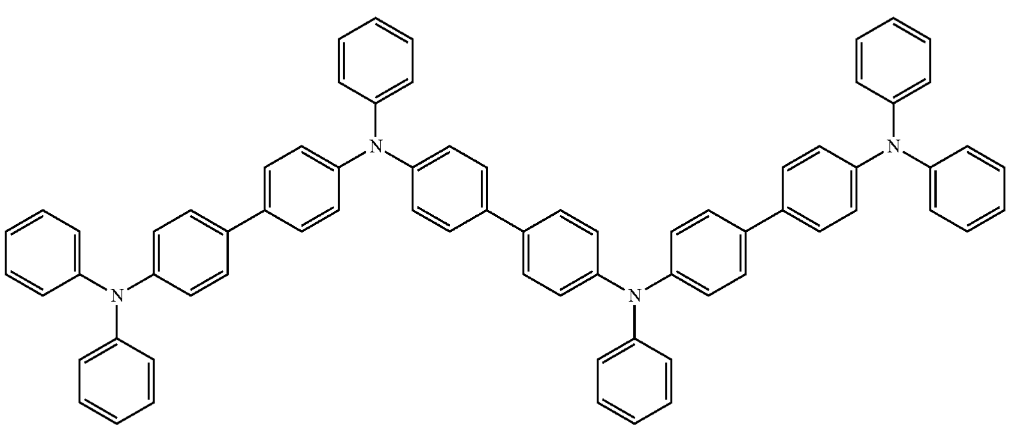
, -continued
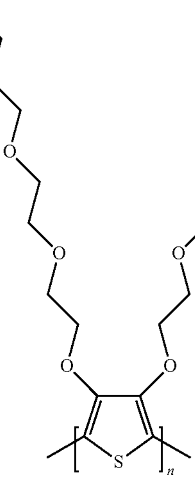
,
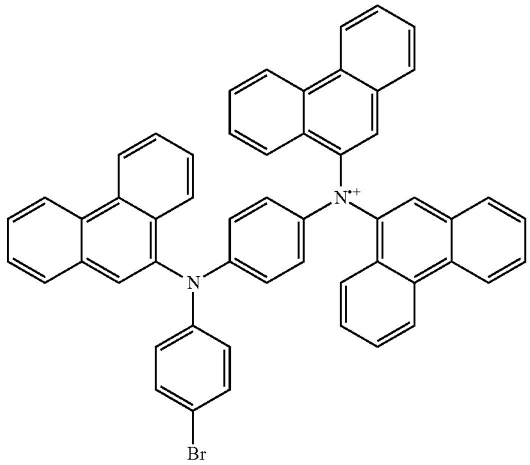
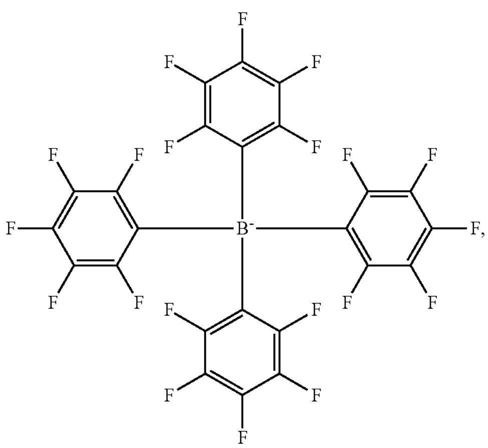
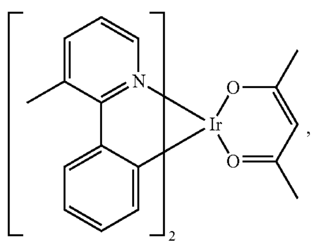
,
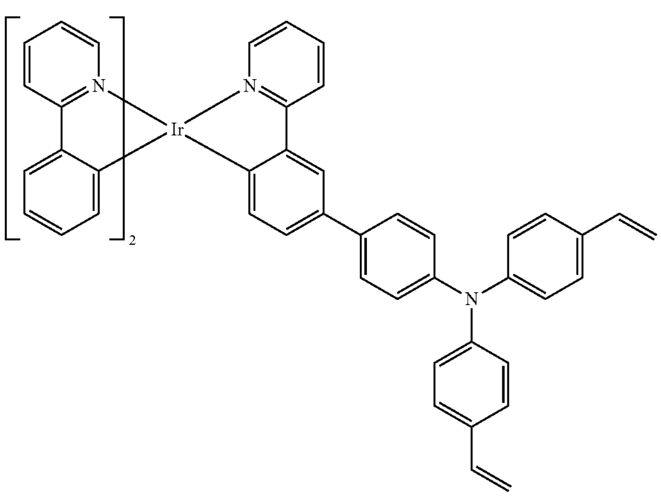
, -continued
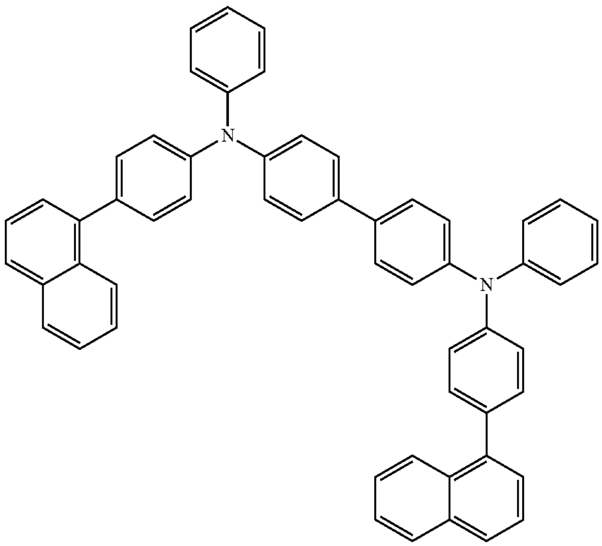
,
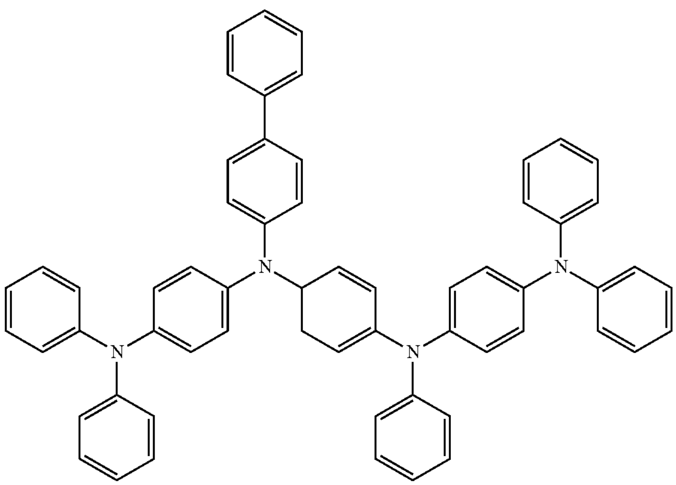
,
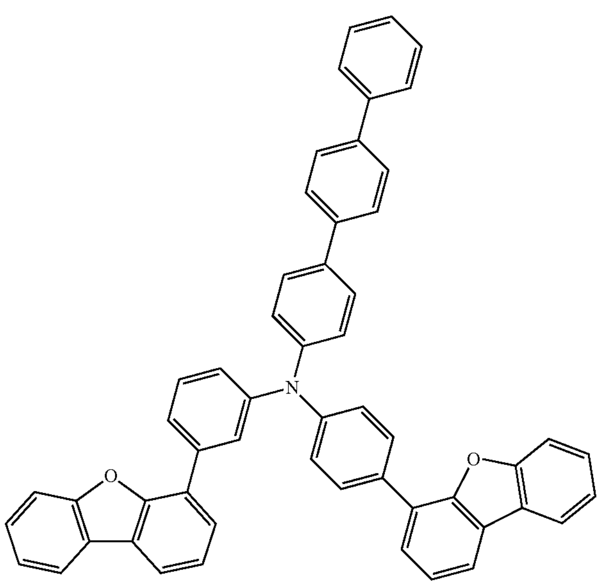
, -continued
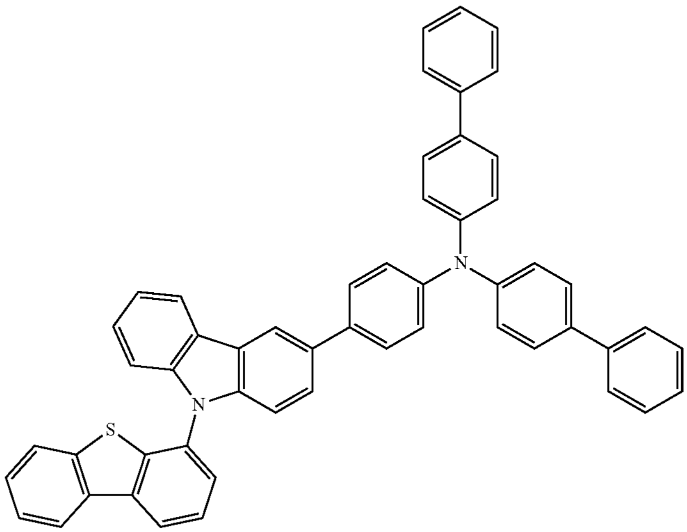
,
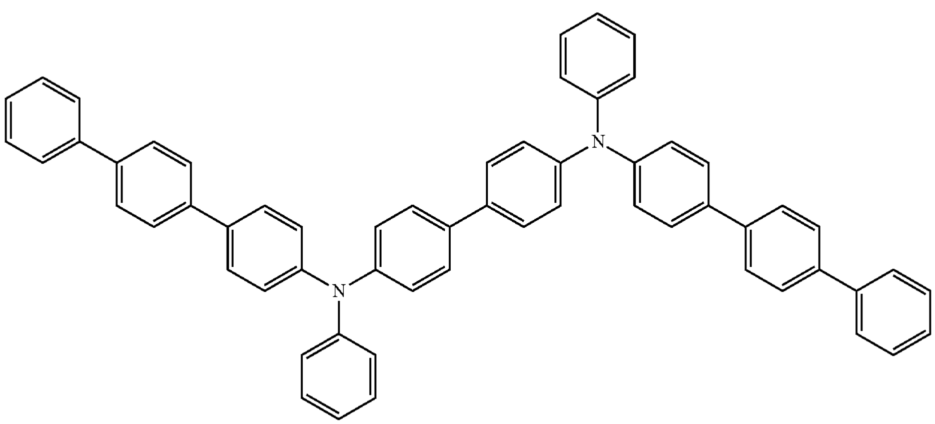
,
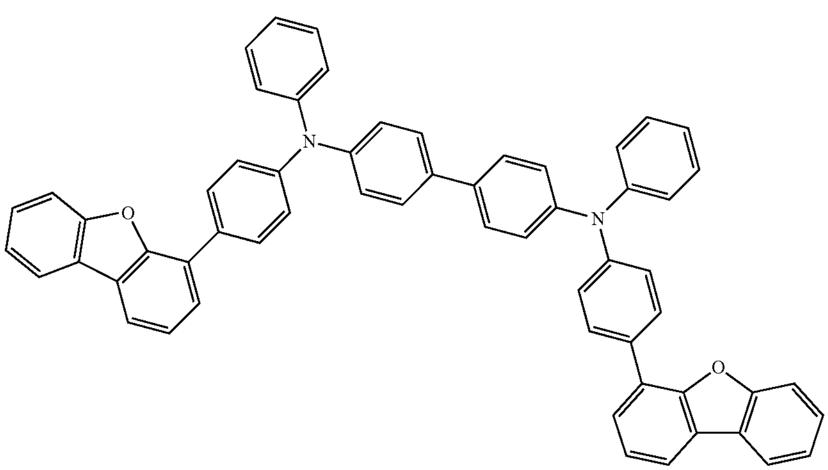
, -continued
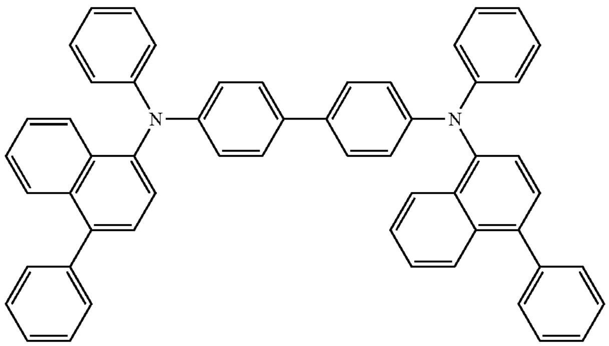
,
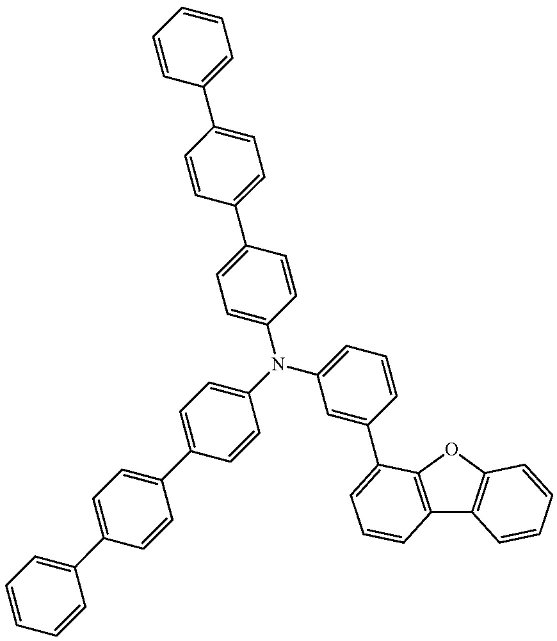
,
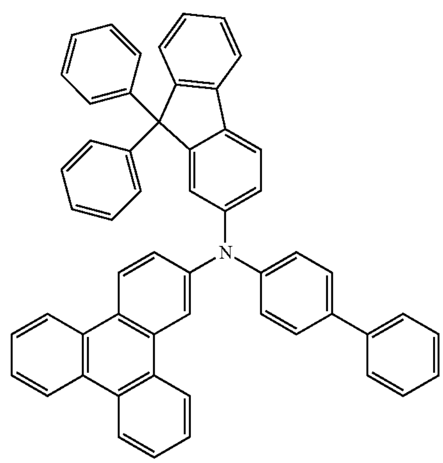
,
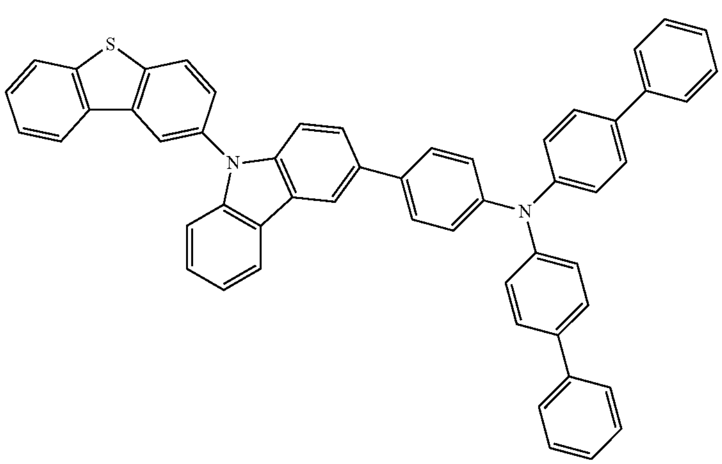
, -continued
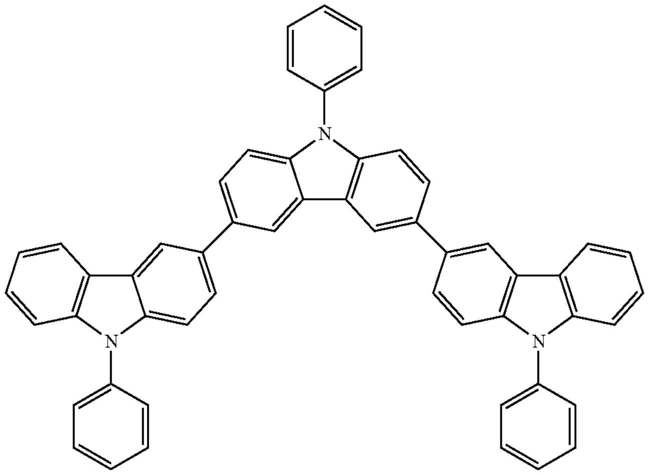
,
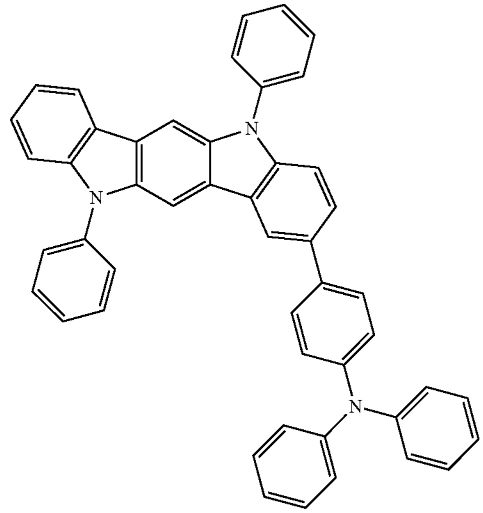
,
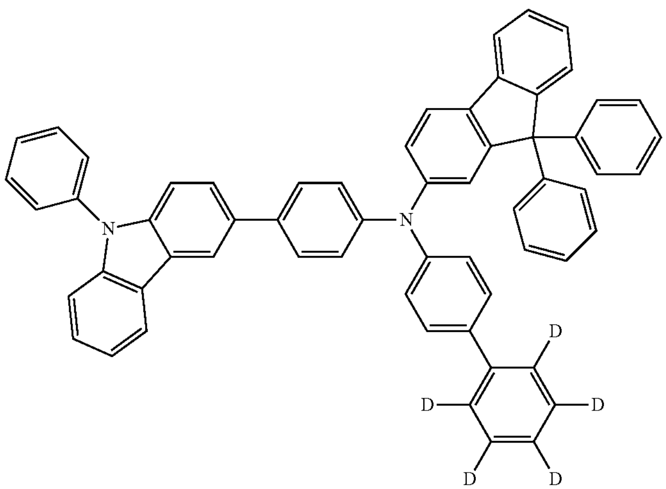
,
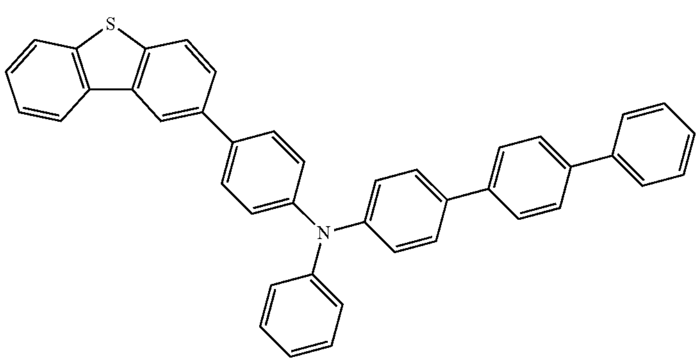
, -continued
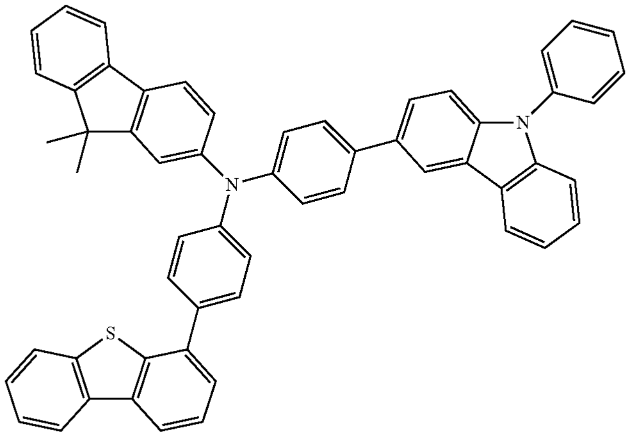
,
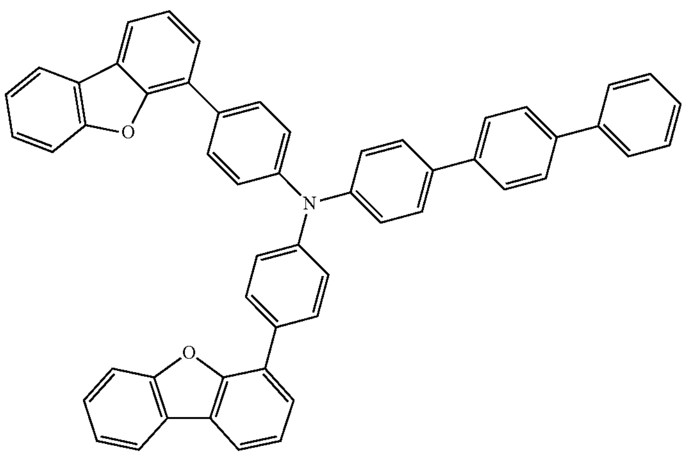
,
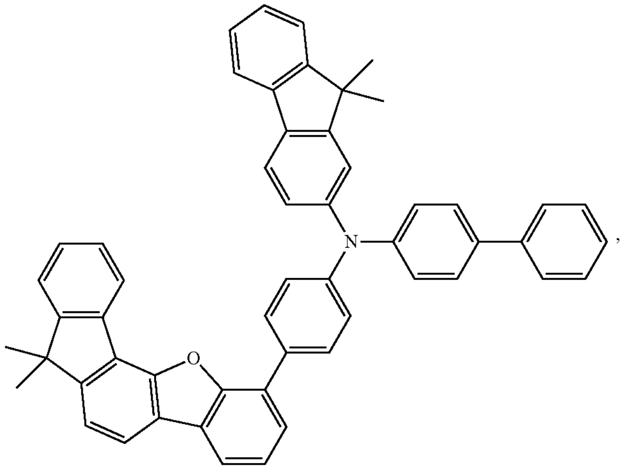
,
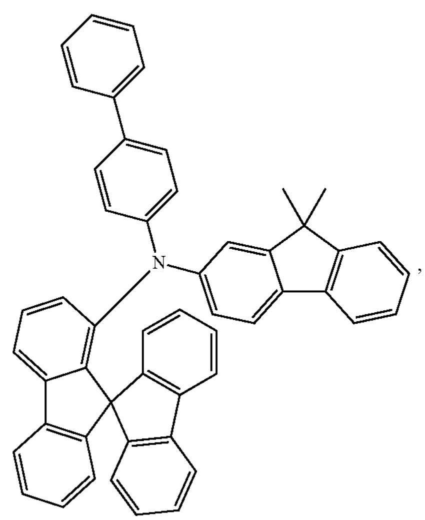
, -continued
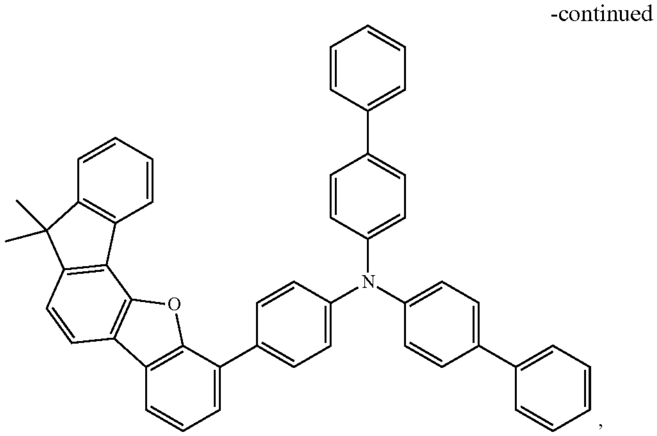
,
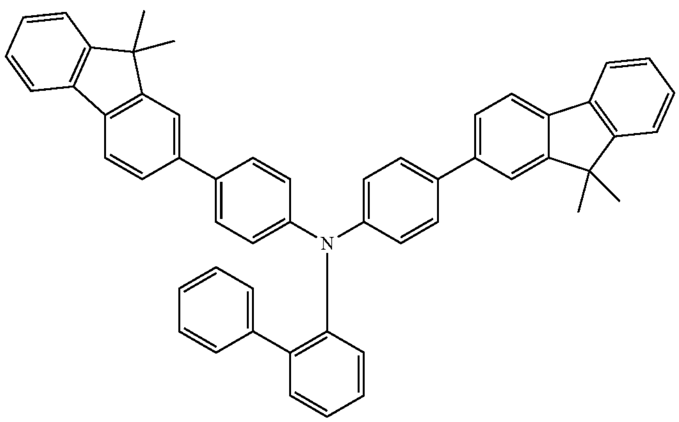
,
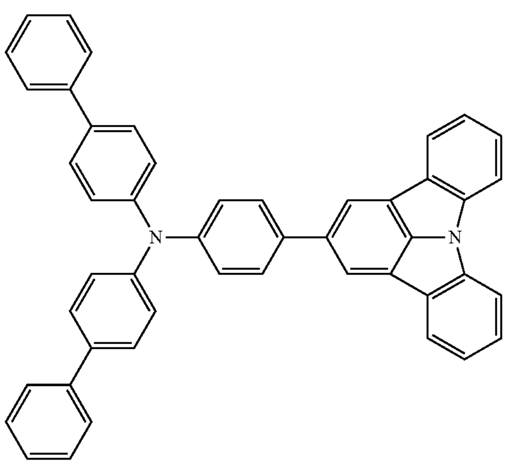
, -continued
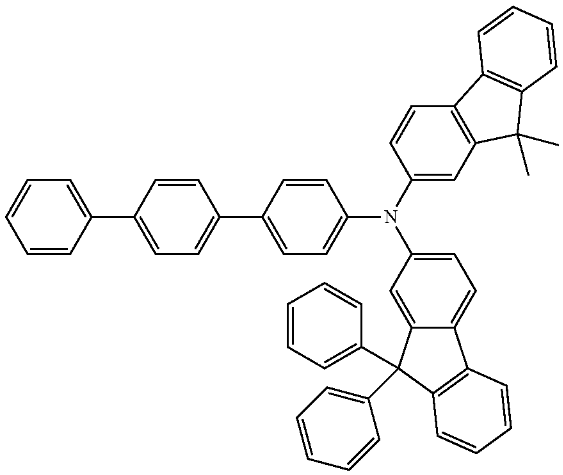
,
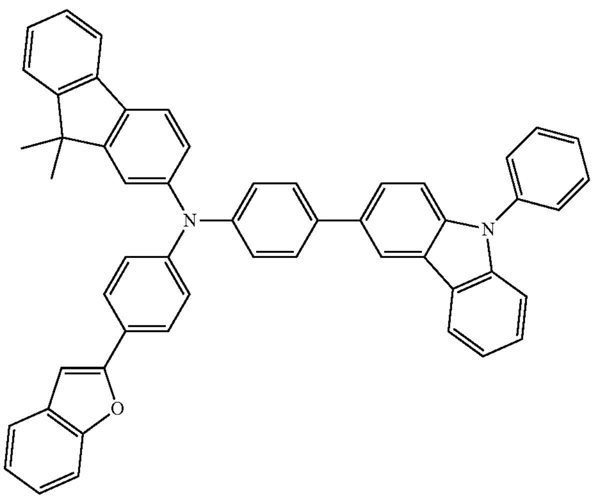
,
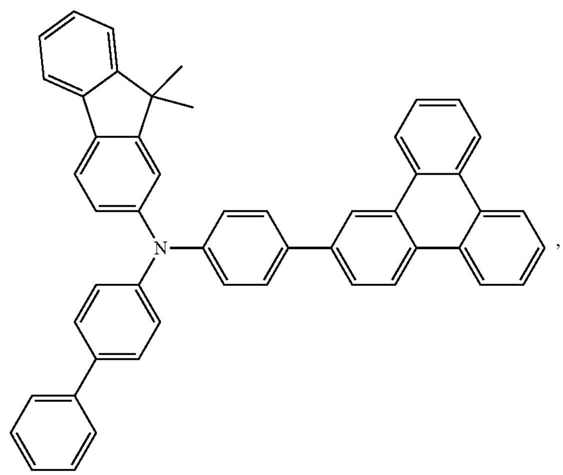
,
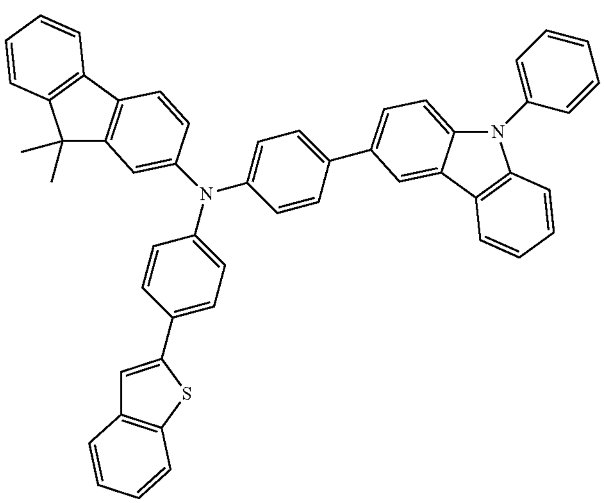
, -continued
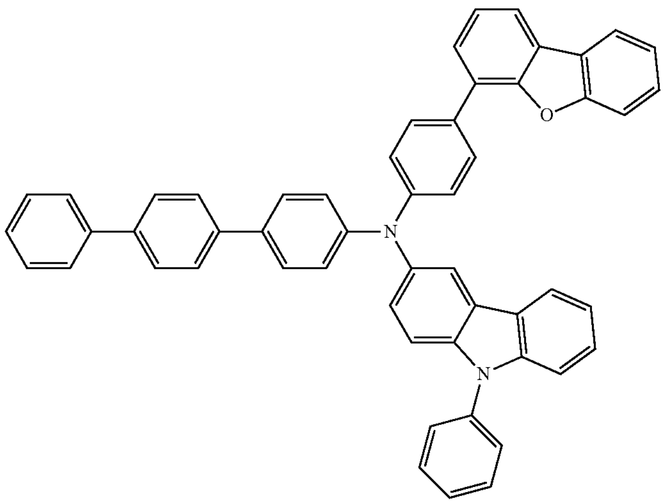
,
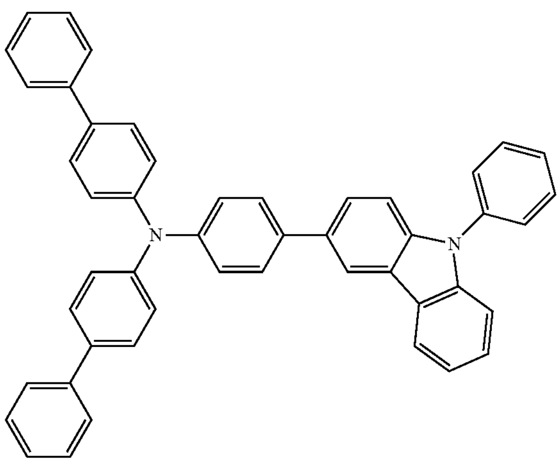
,
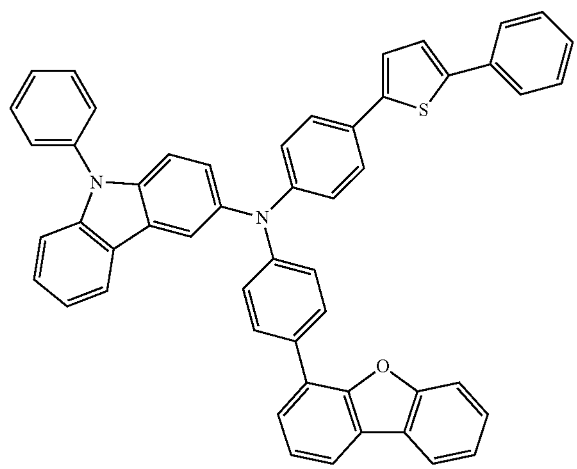
,
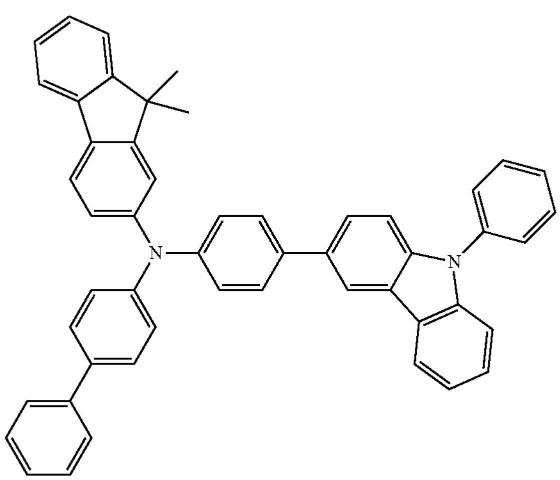
,
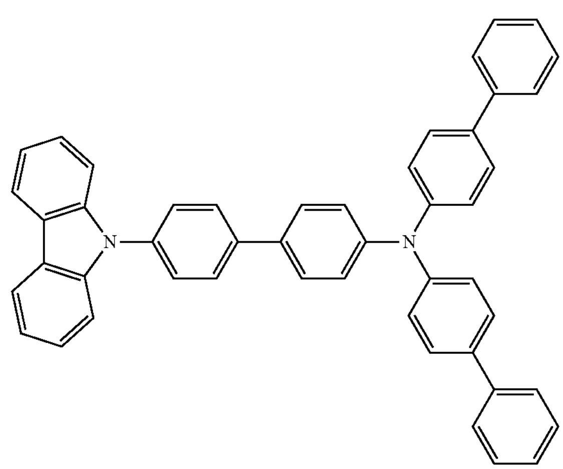
, -continued
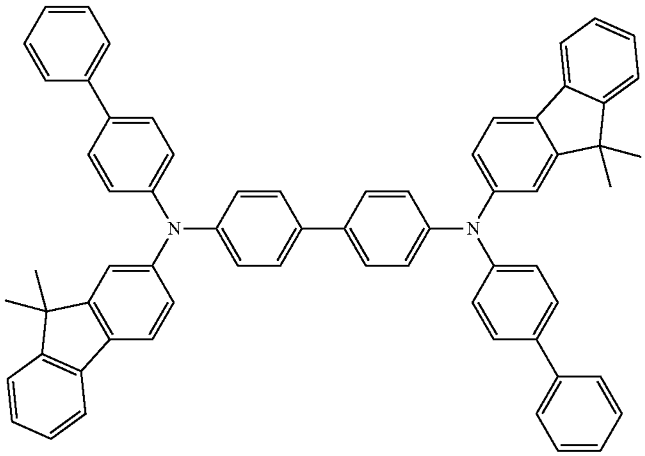
,
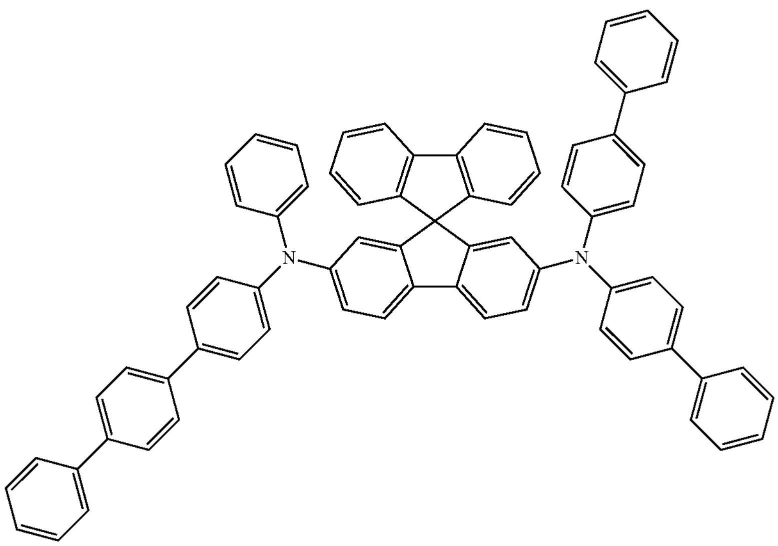
,
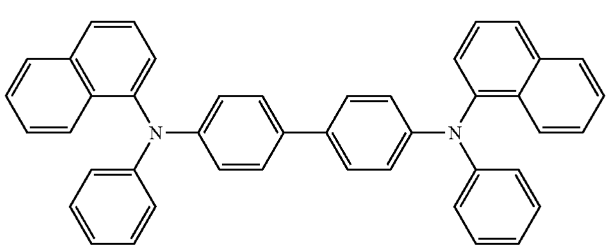
,
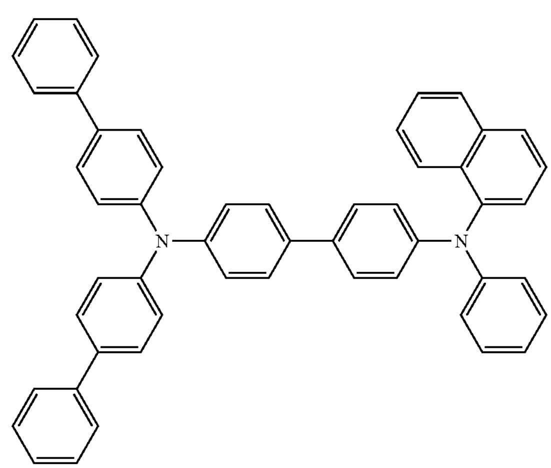
, -continued
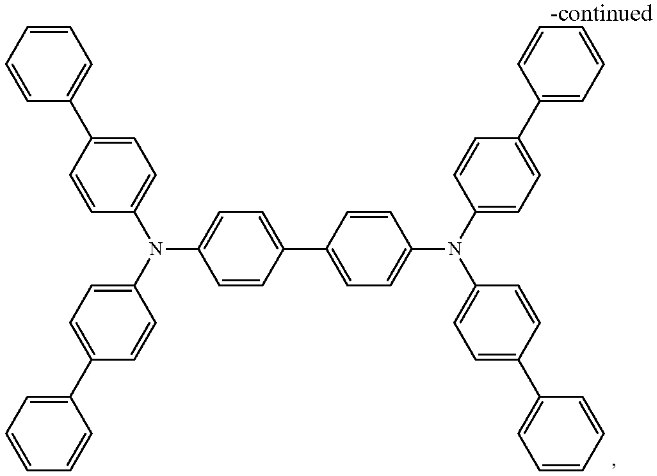
,
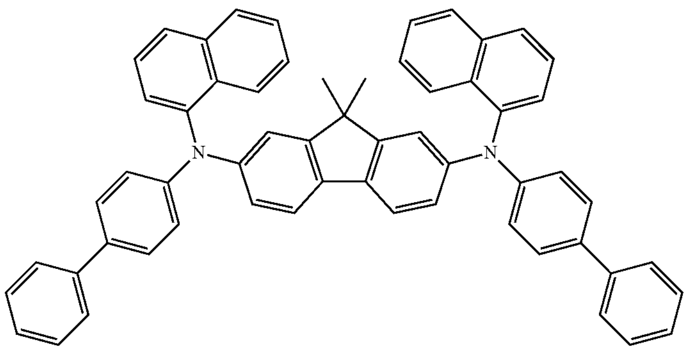
,
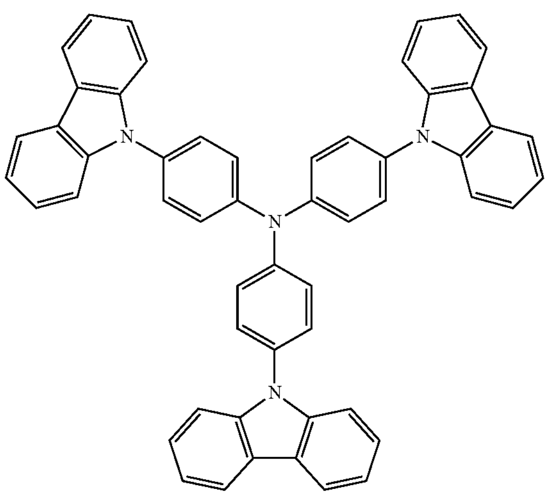
,
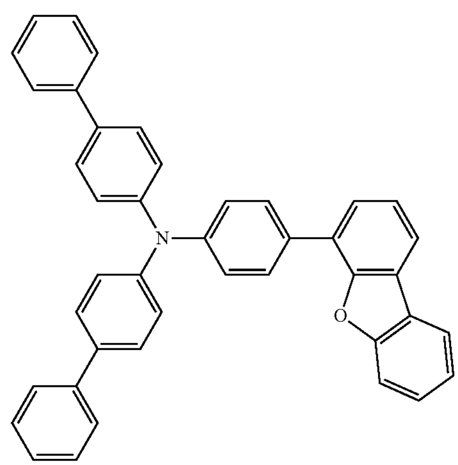
, -continued

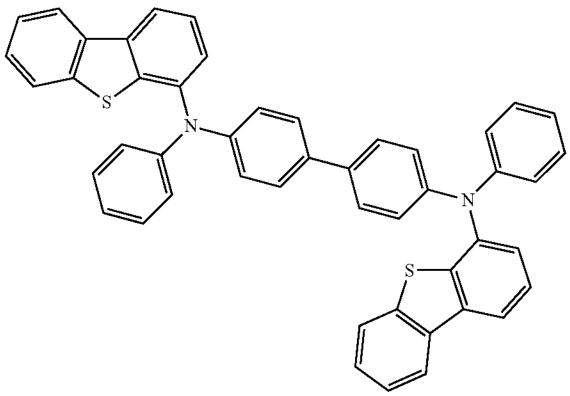

,

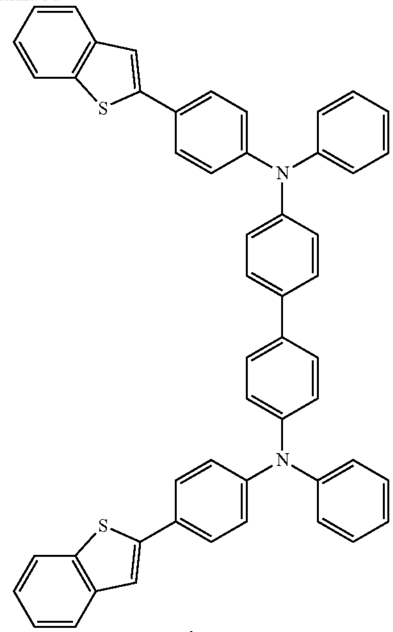

, and

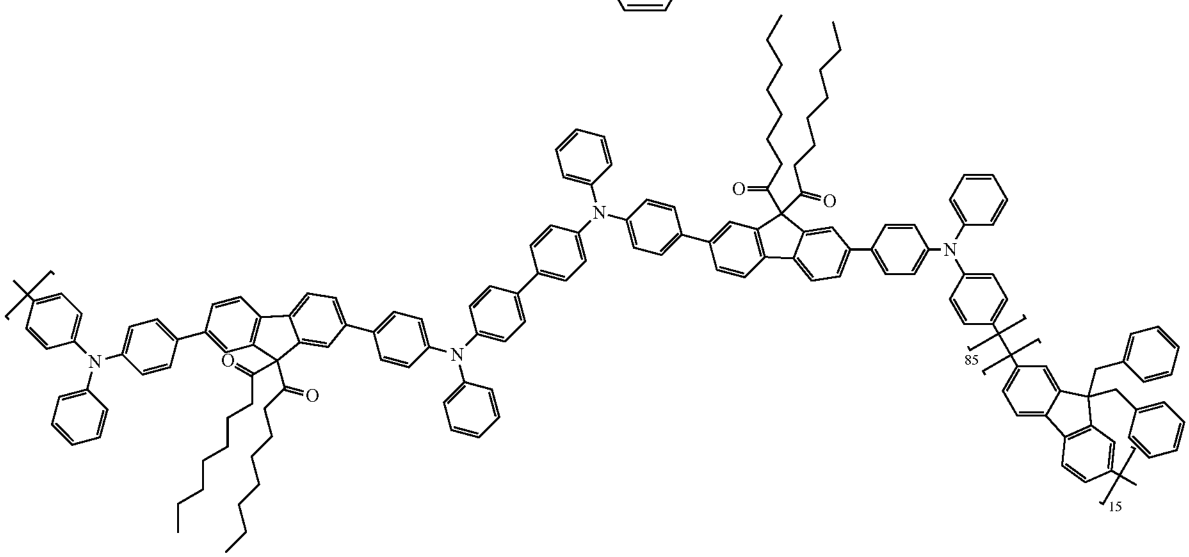

.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

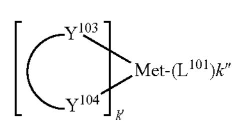

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

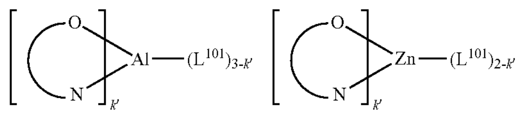

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

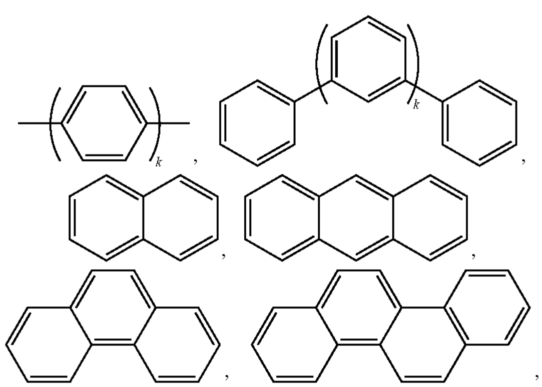

-continued

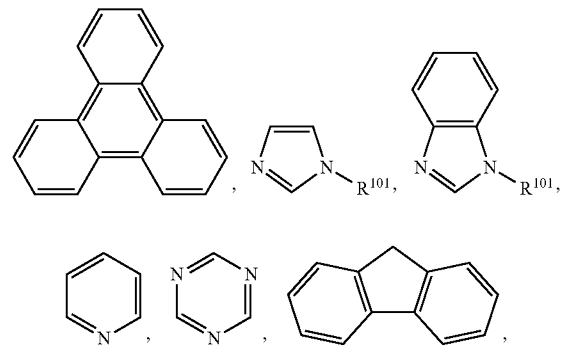

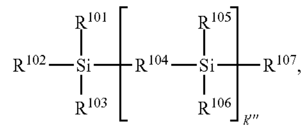

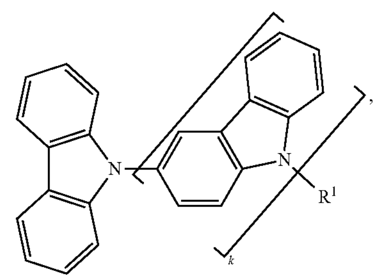

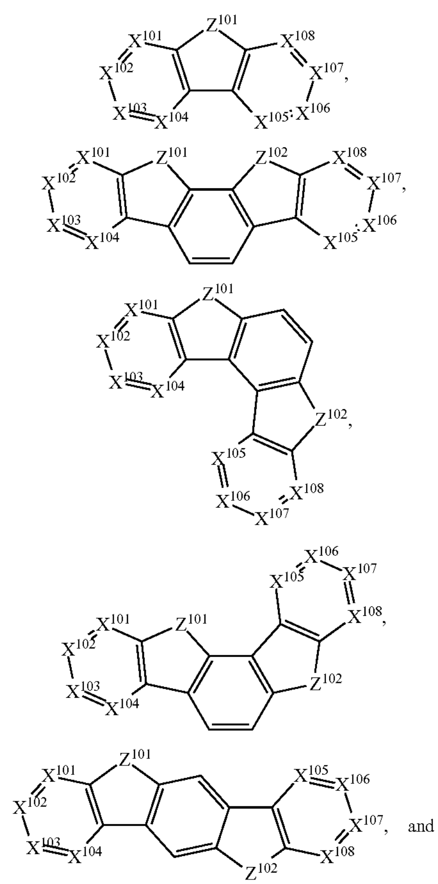

and

-continued

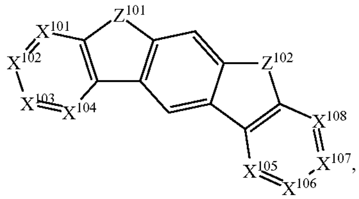

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N.

$Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

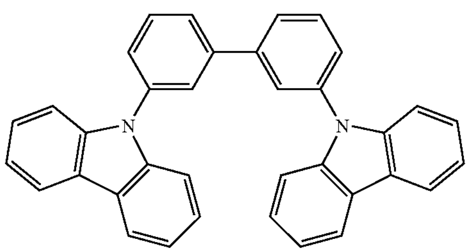

,

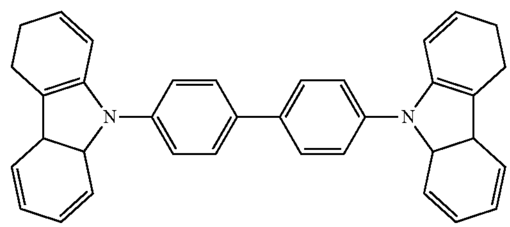

,

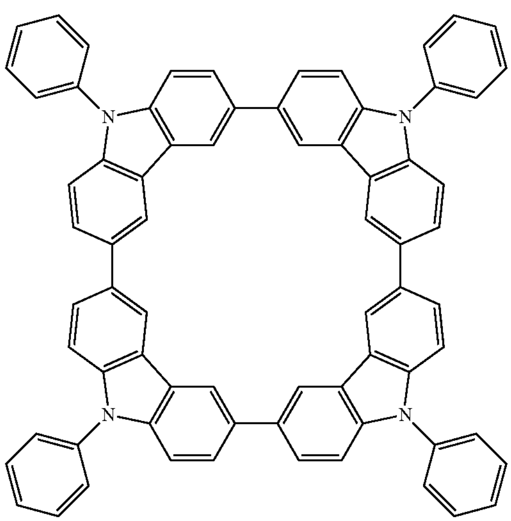

,

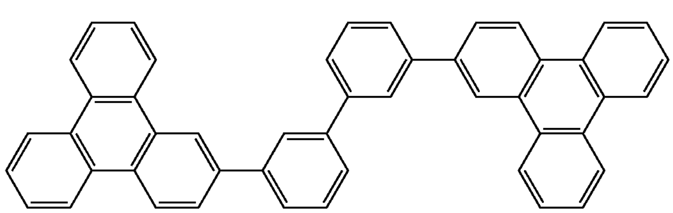

,

-continued
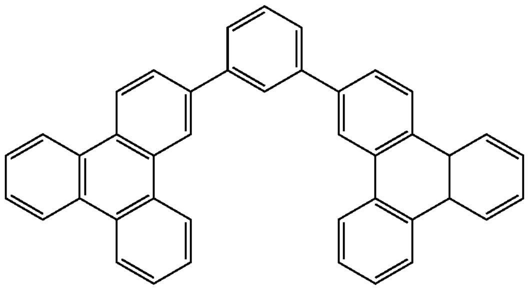
,
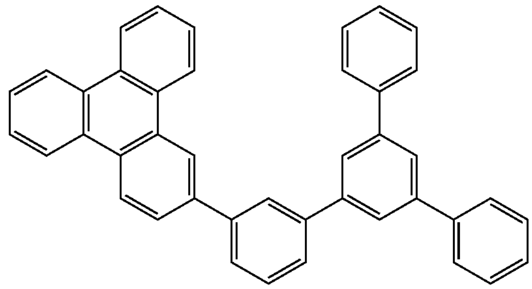
,
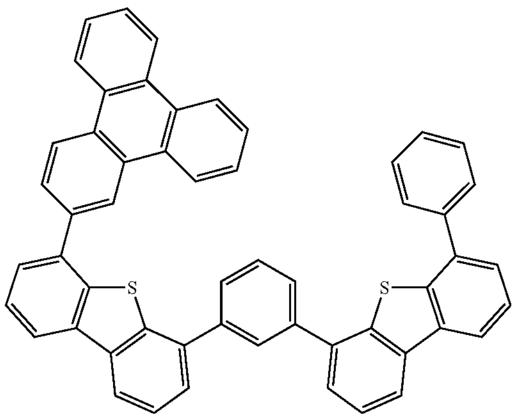
,
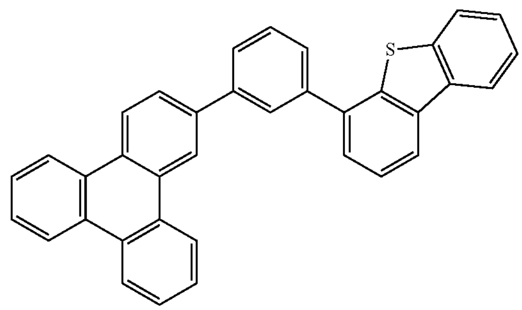
,
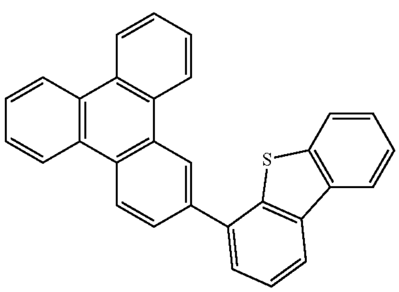
,
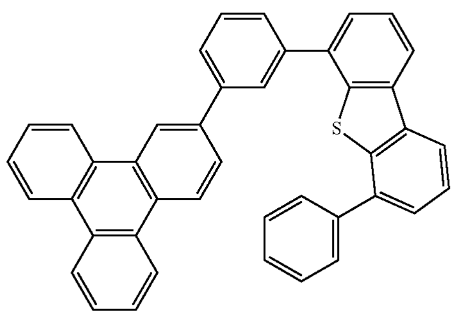
,
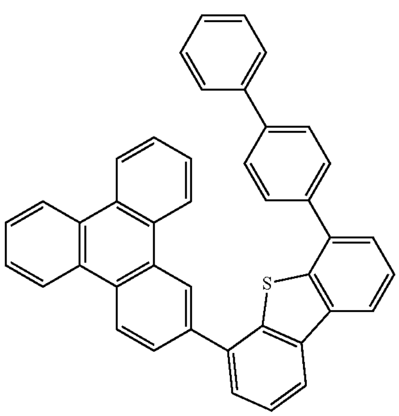
,
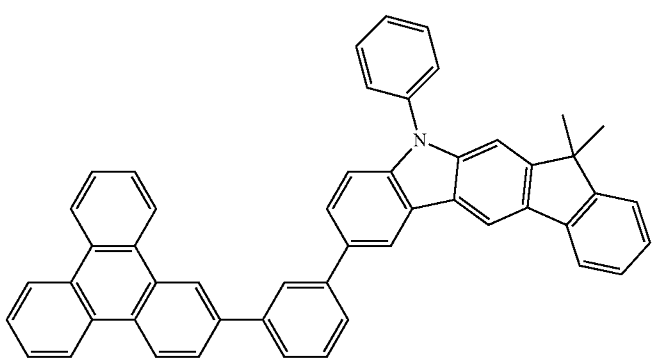
, -continued
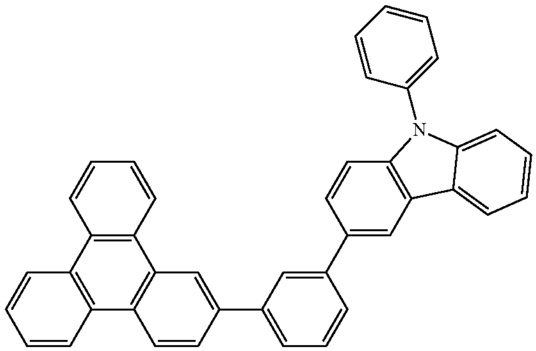
,
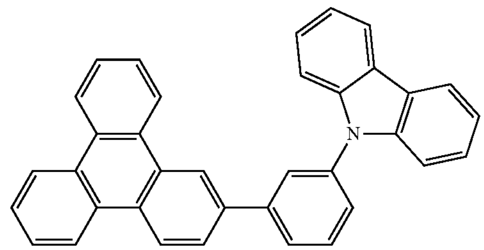
,
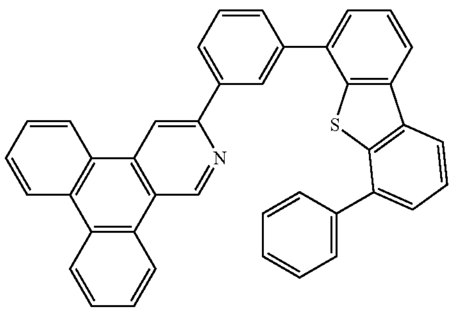
,
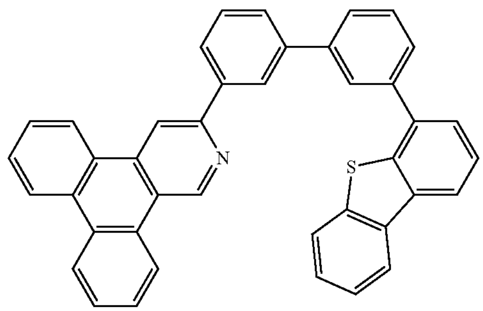
,
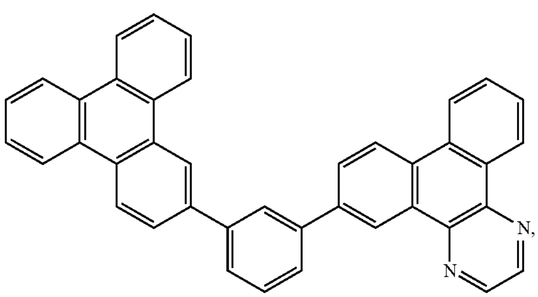
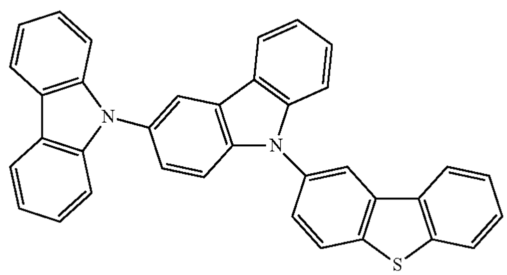
,
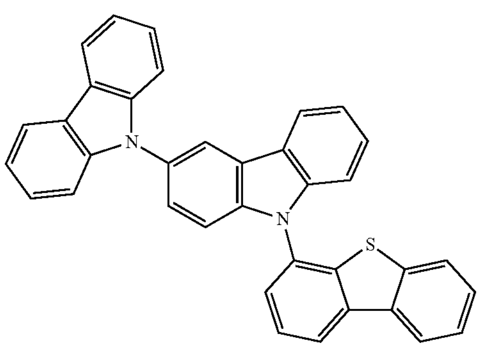
,
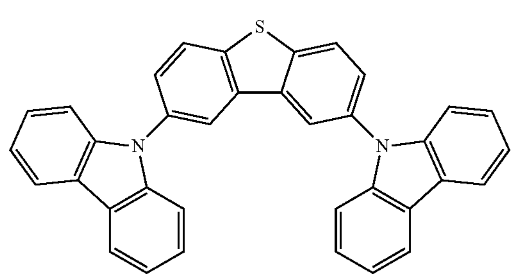
,
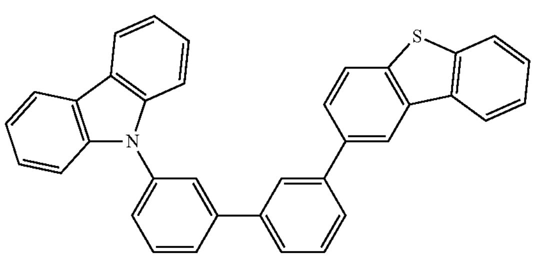
,
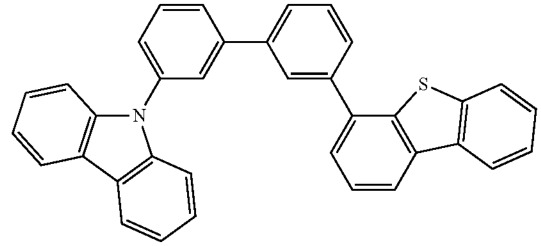
, -continued
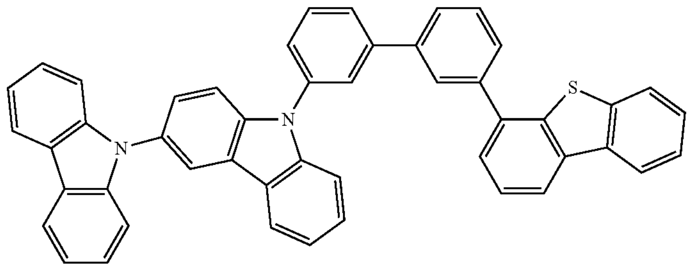
,
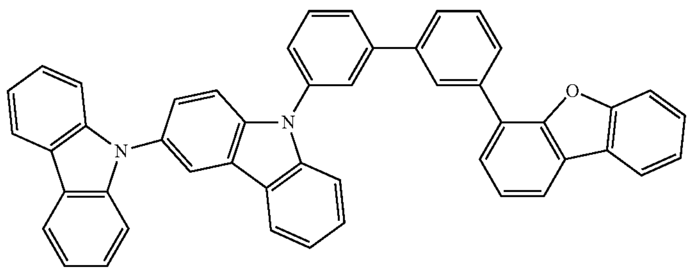
,
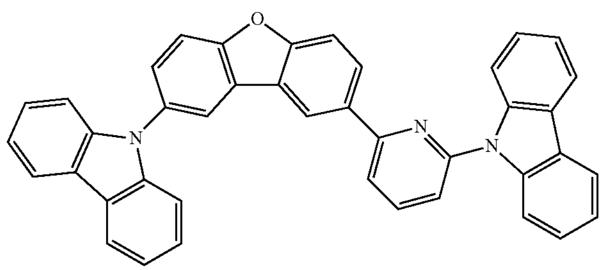
,
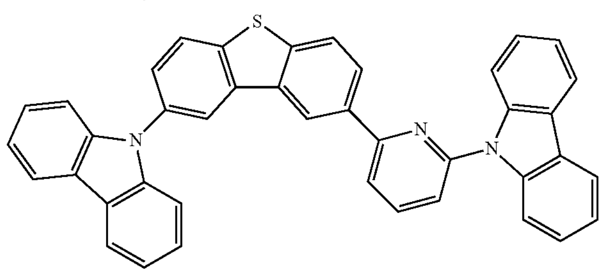
,
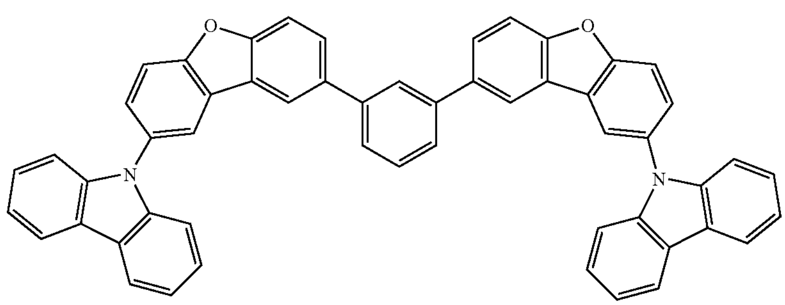
,
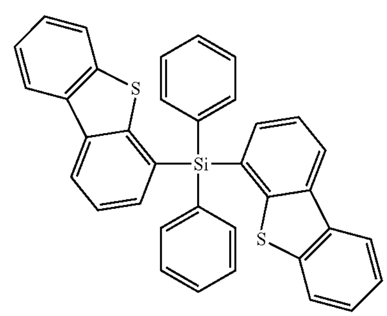
,
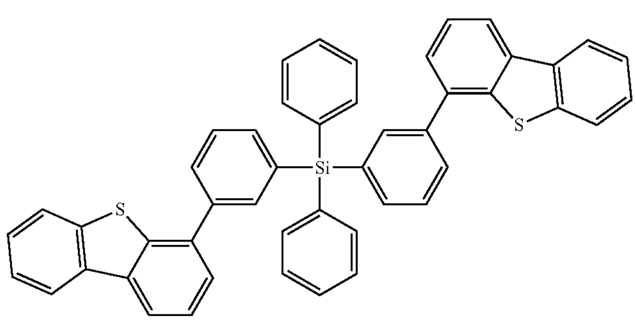
, -continued
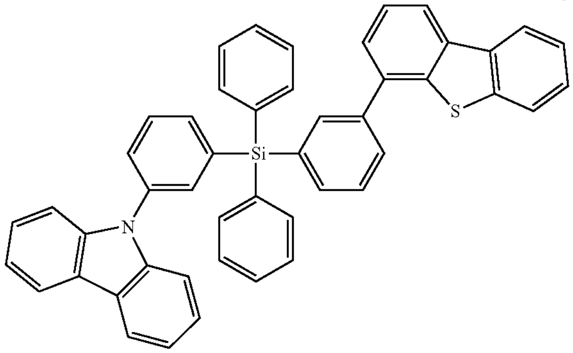
,
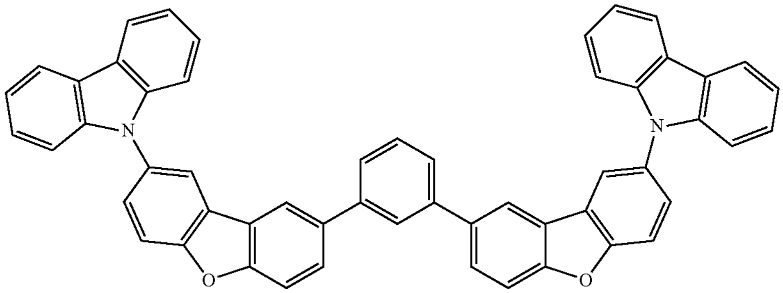
,
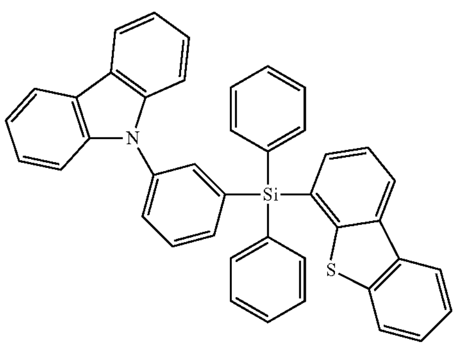
,
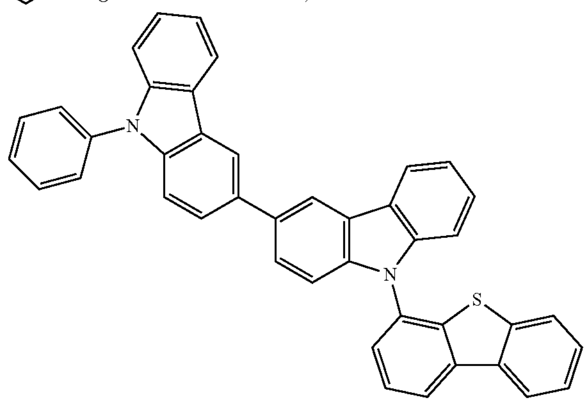
,
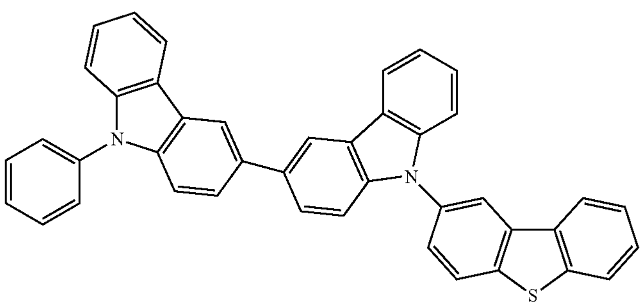
,
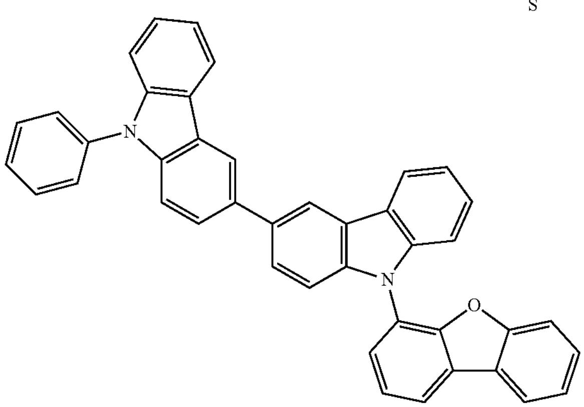
, -continued
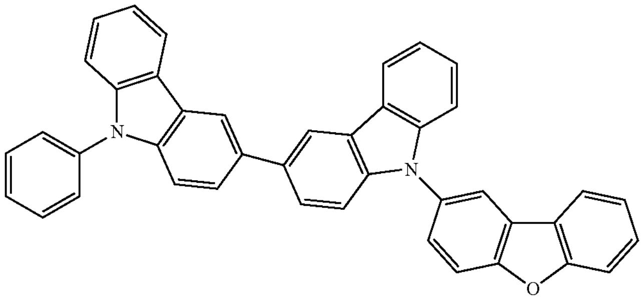
,
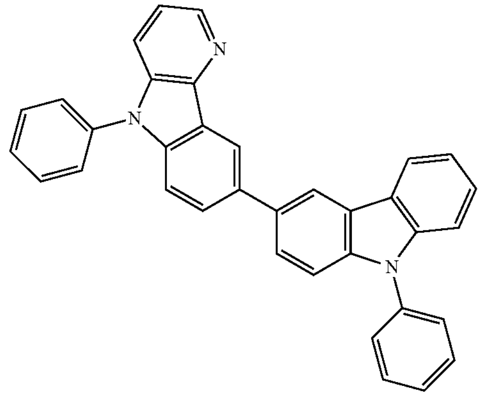
,
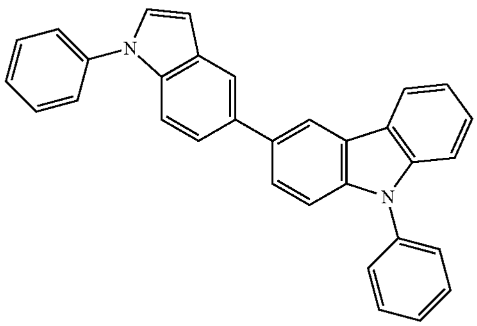
,
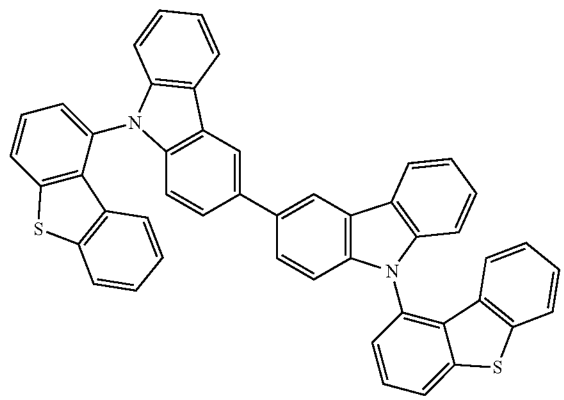
,
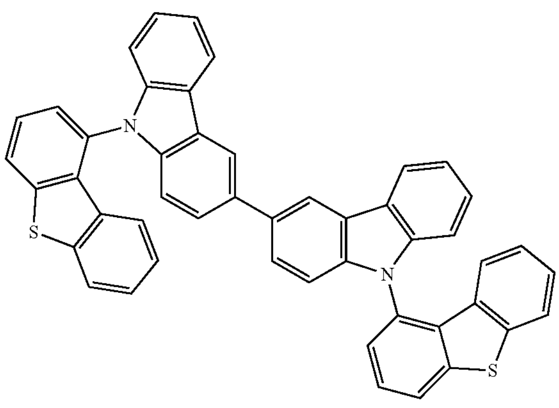
,
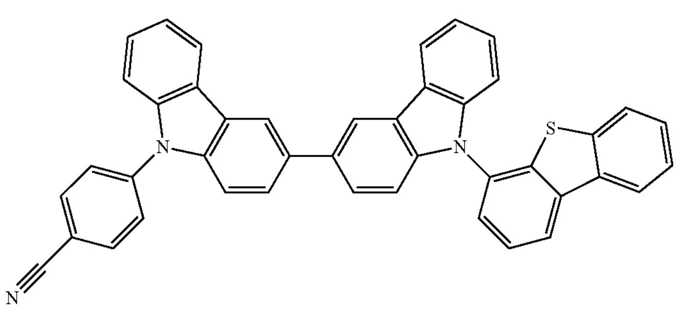
, -continued
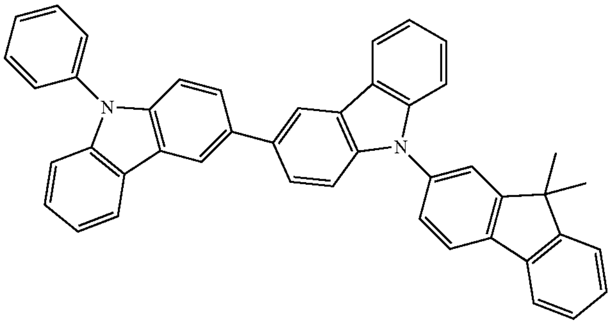
,
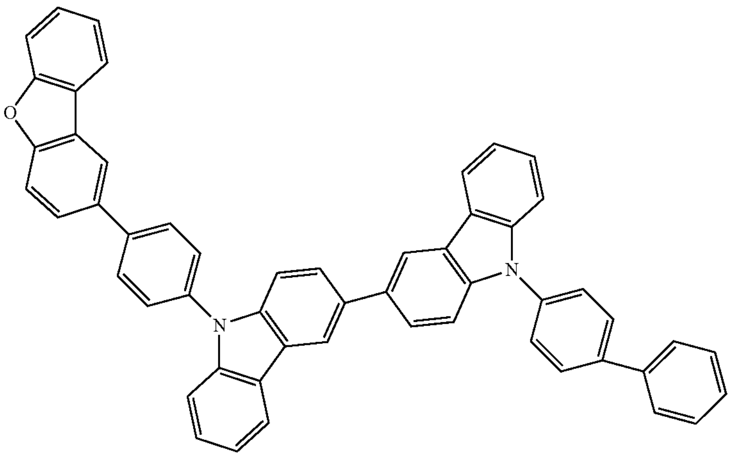
,
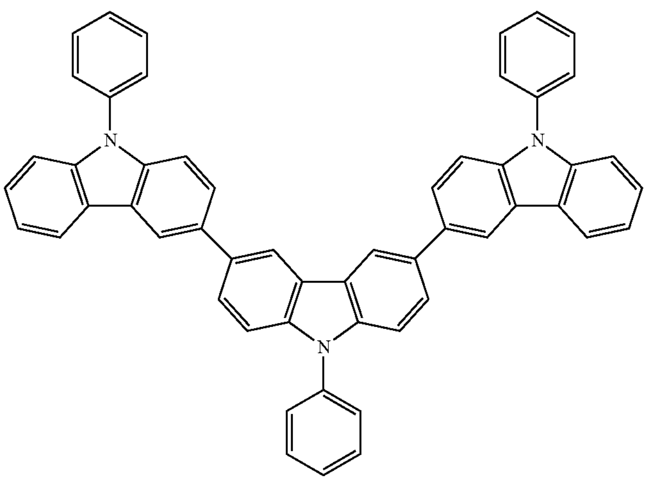
,
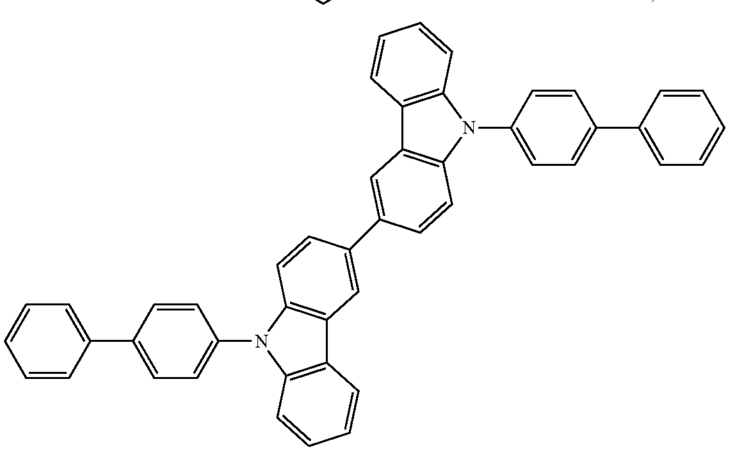
,
, -continued
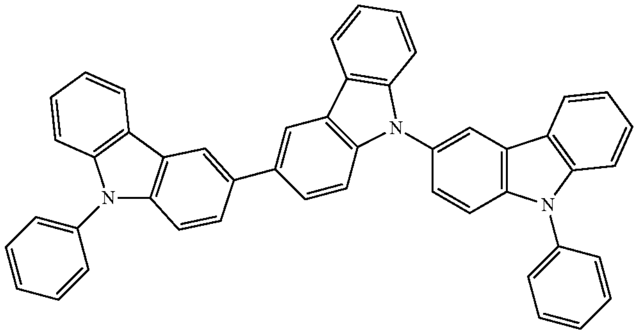
,
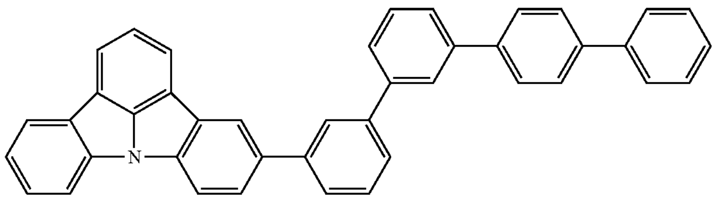
,
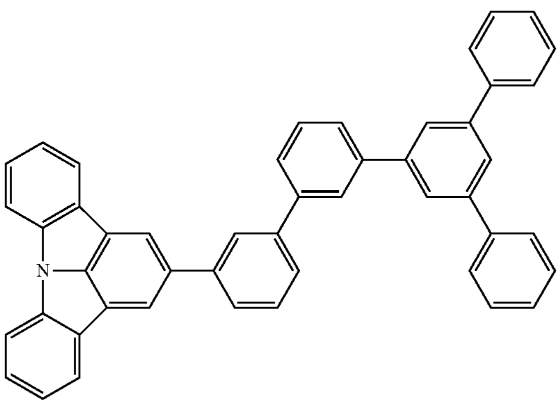
,
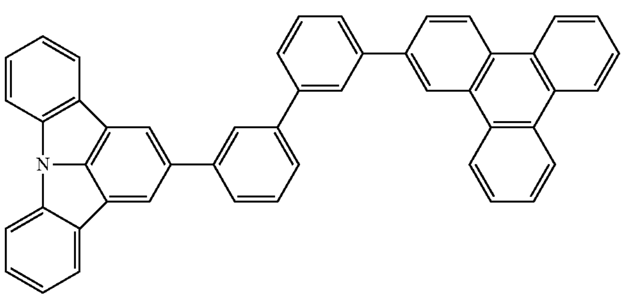
,
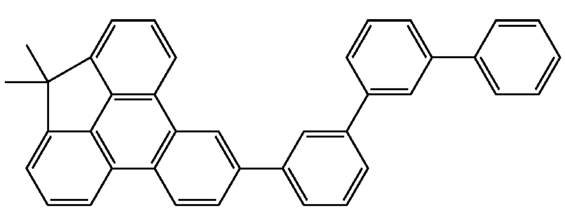
,
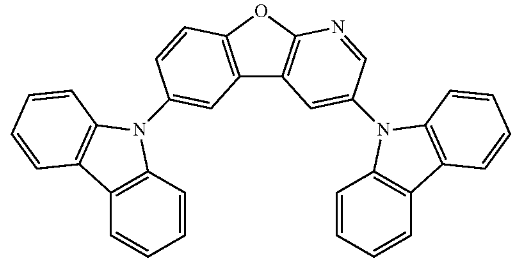
, -continued
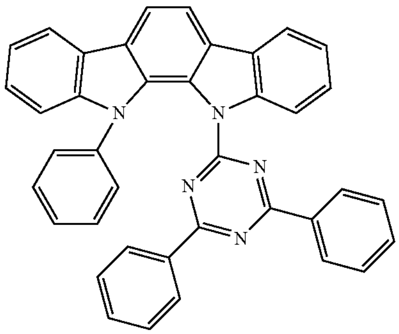
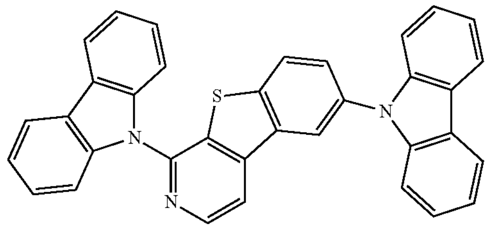
,
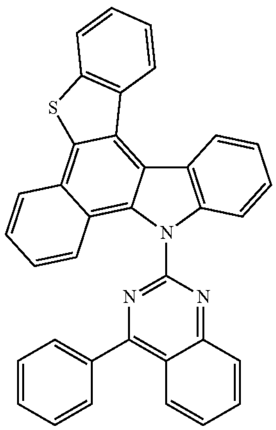
,
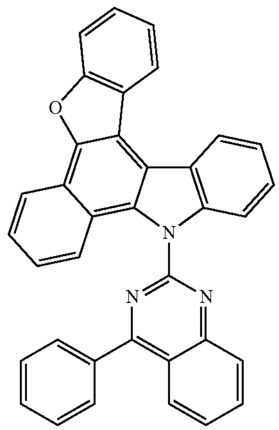
,
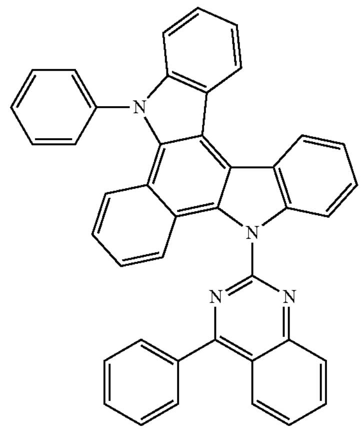
,
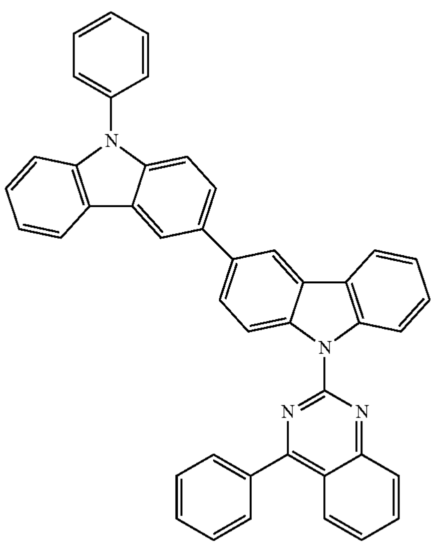
,
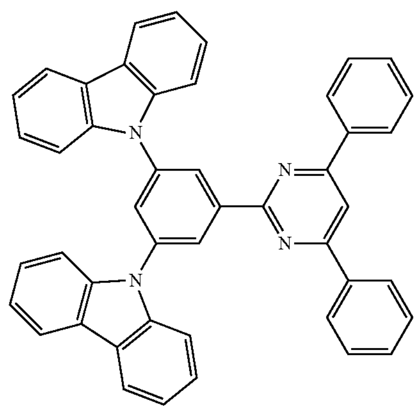
,
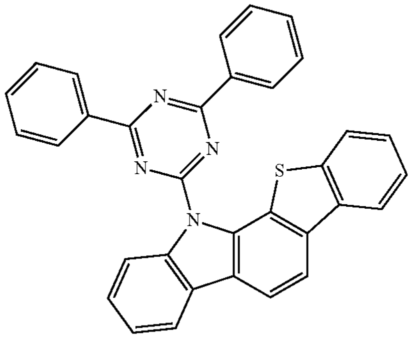
,
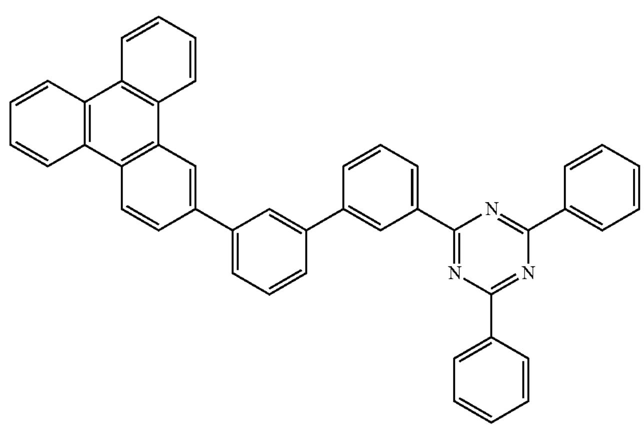
, -continued
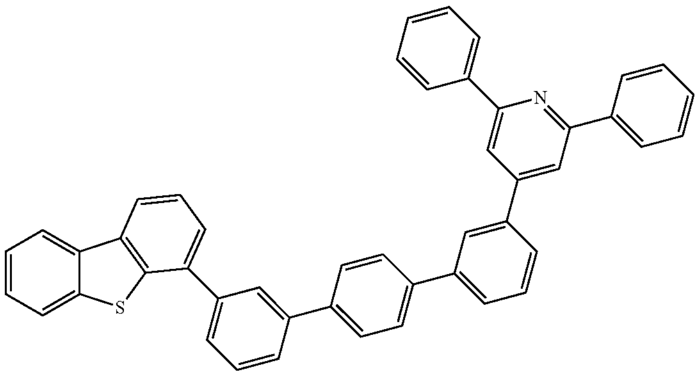
,
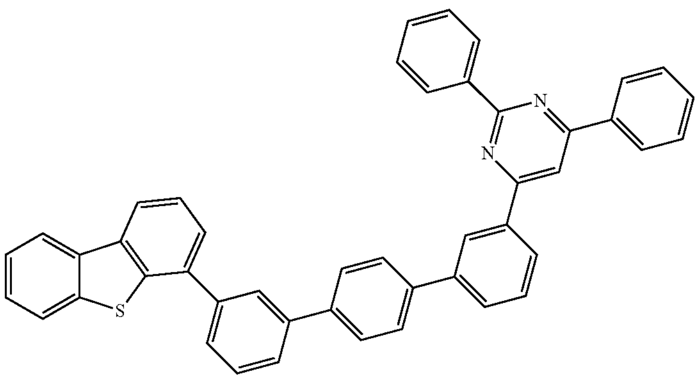
,
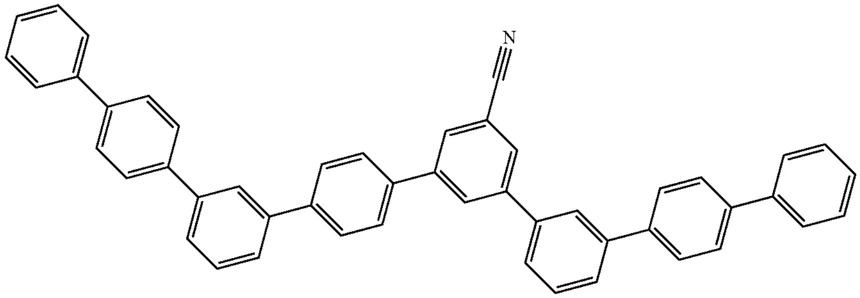
,
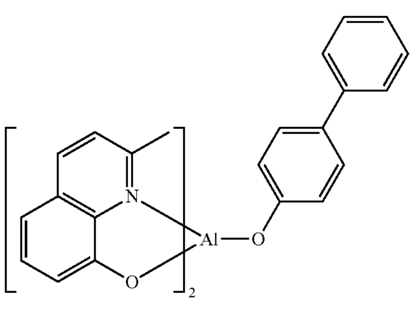
,
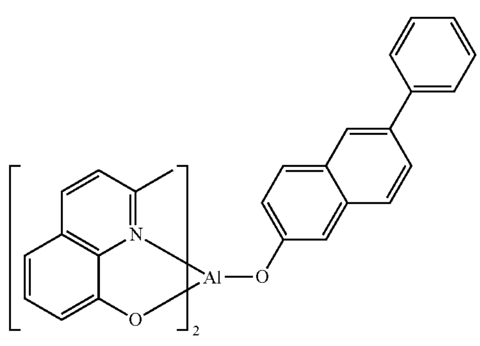
,
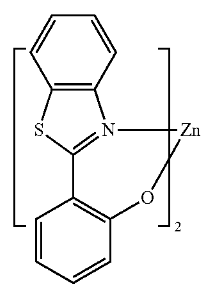
,
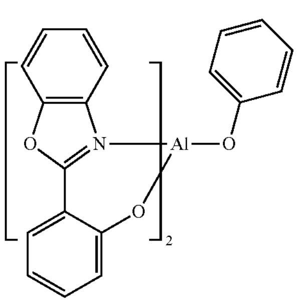
,
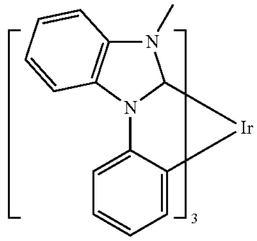
,
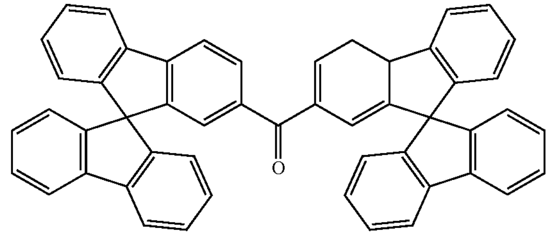
, -continued

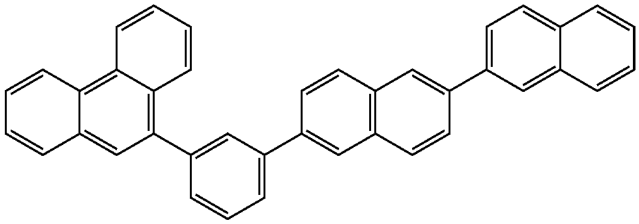

,

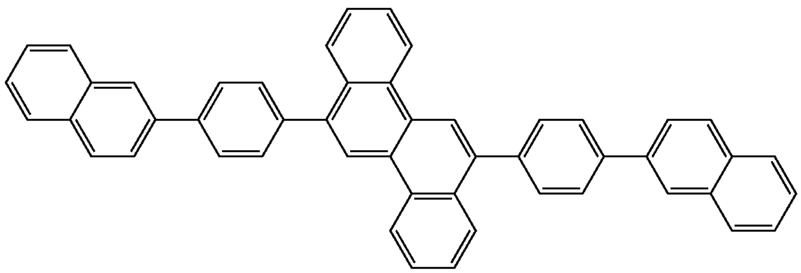

, and

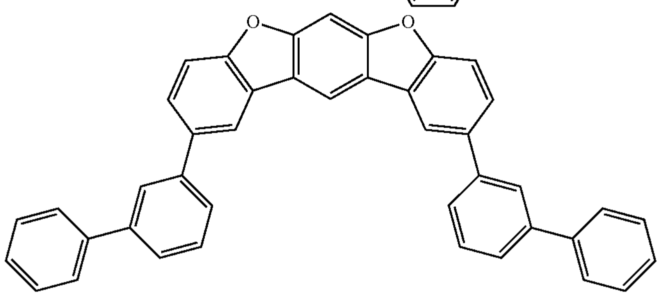

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

-continued
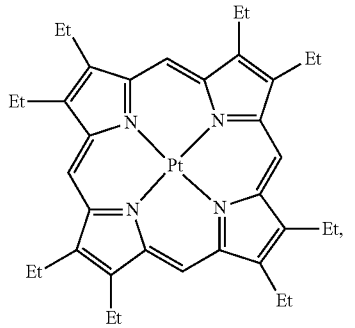
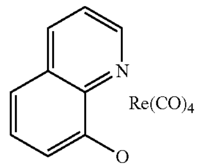
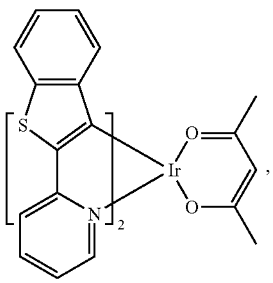
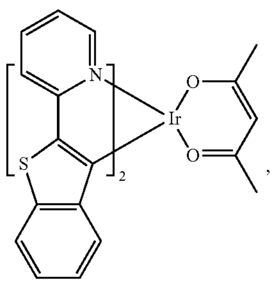
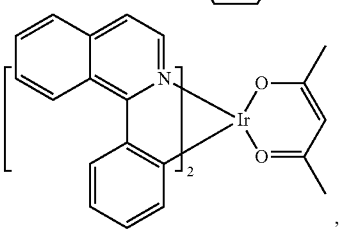
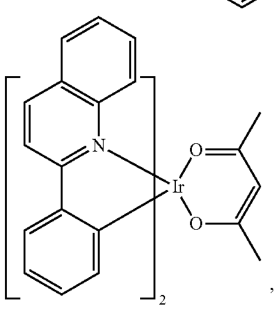
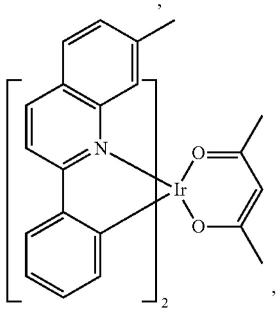
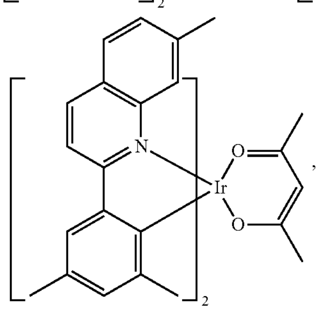
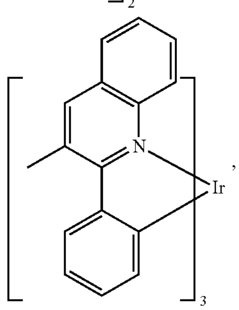
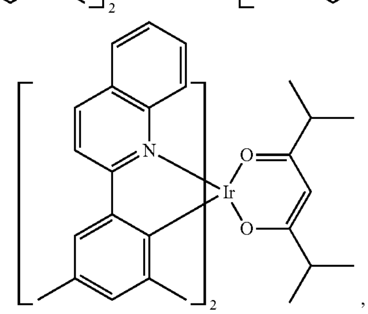
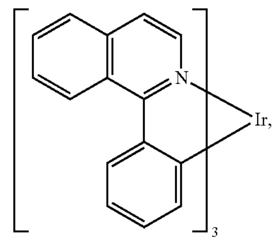
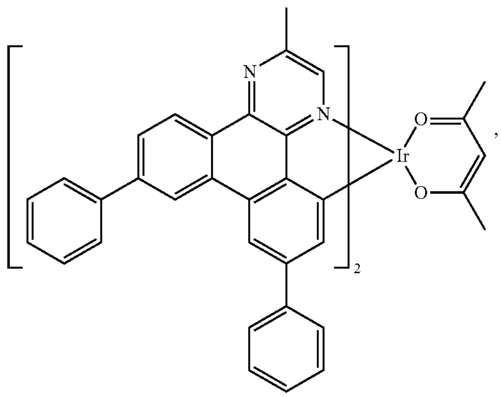
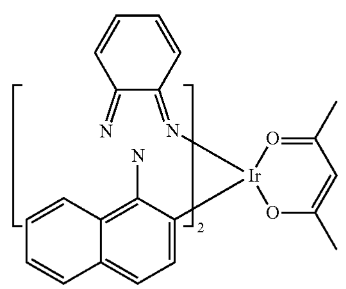
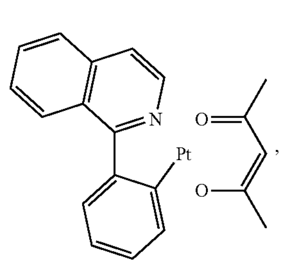
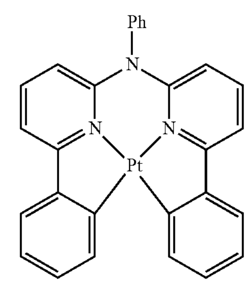
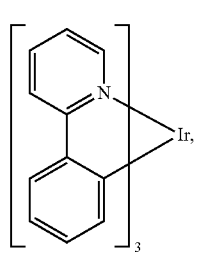
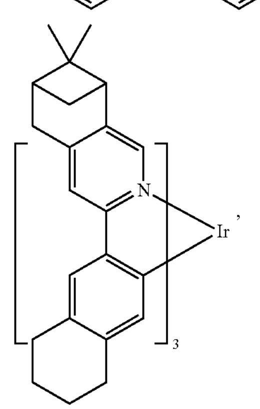

-continued
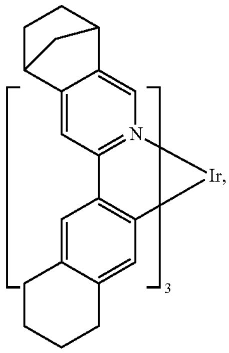
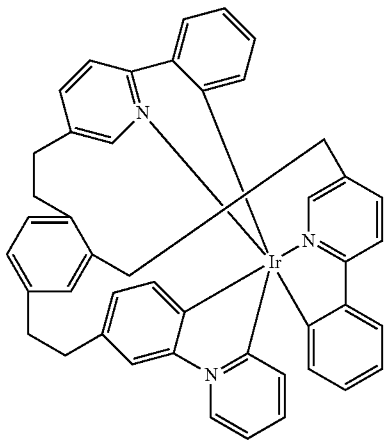
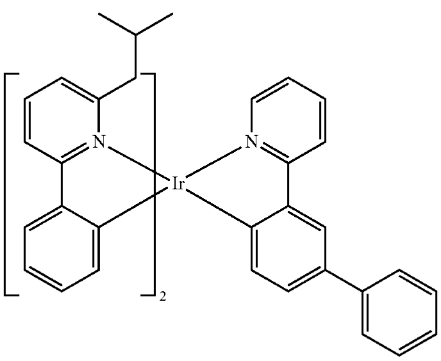
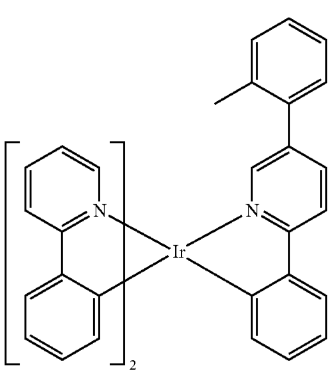
-continued
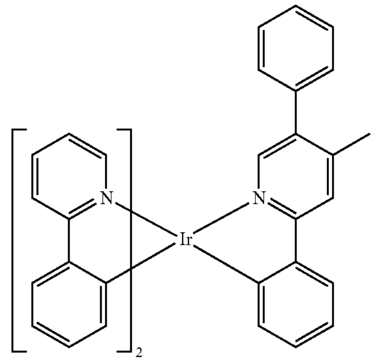
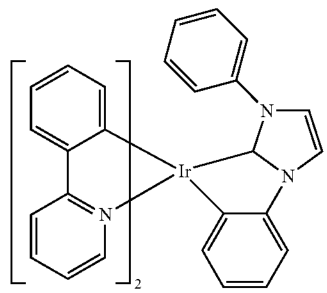
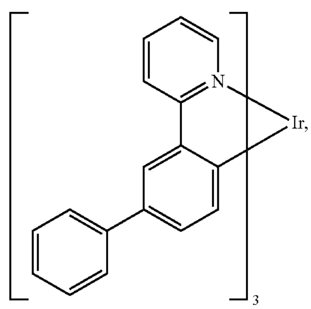
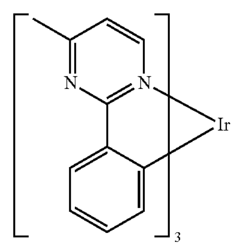
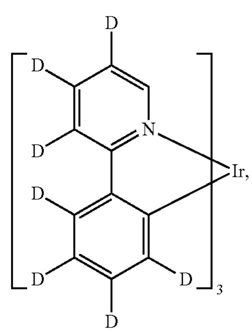
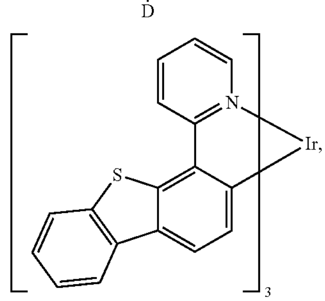

-continued
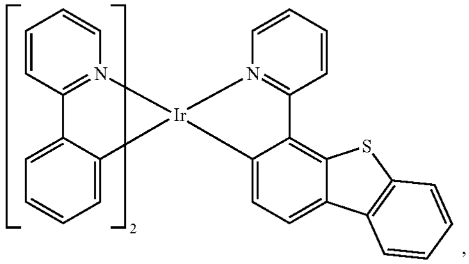
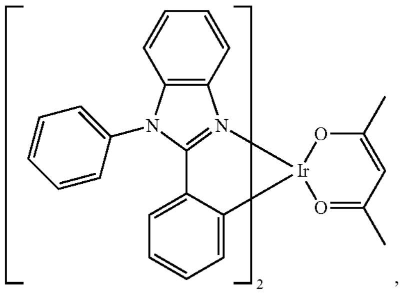
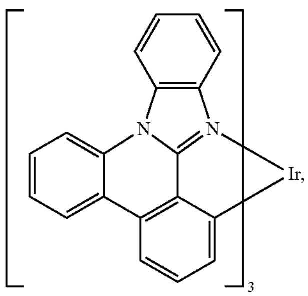
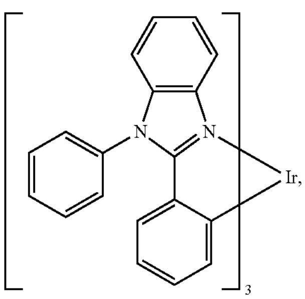
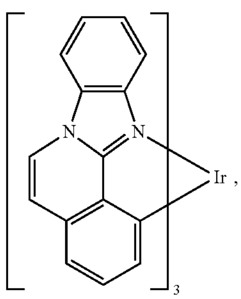
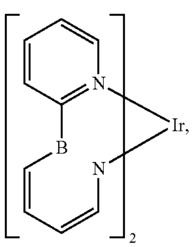
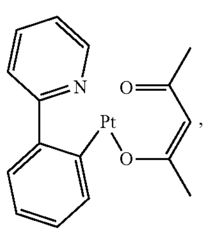
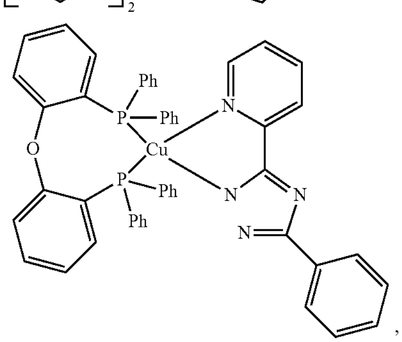
-continued
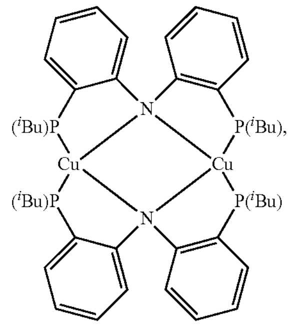
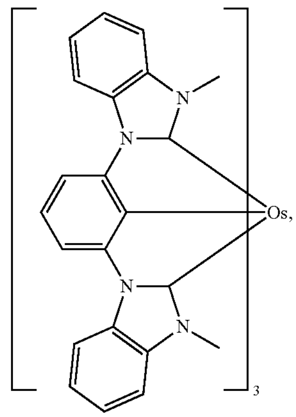
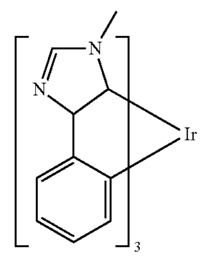
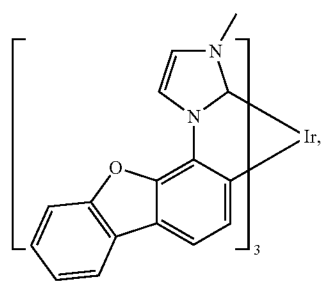
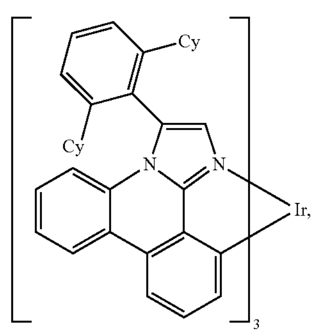
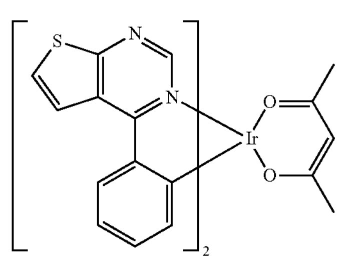

-continued
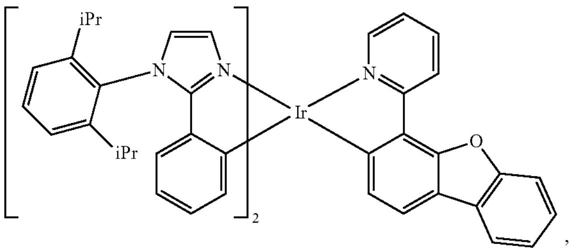
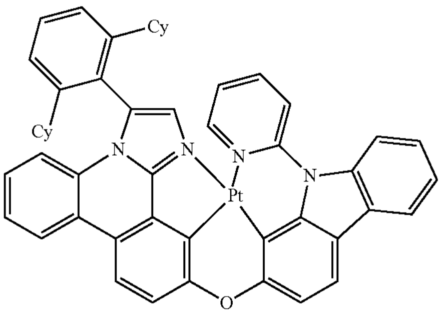
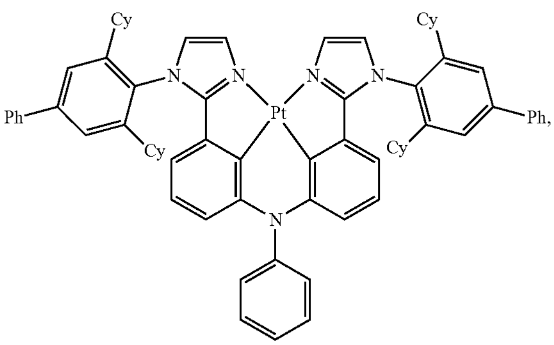
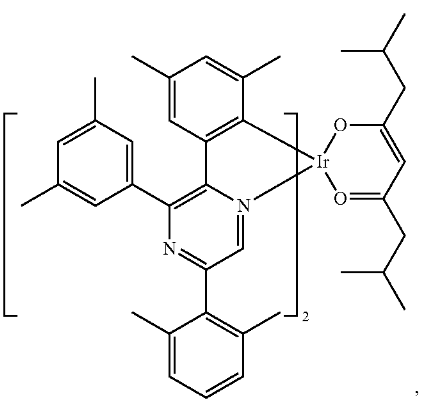
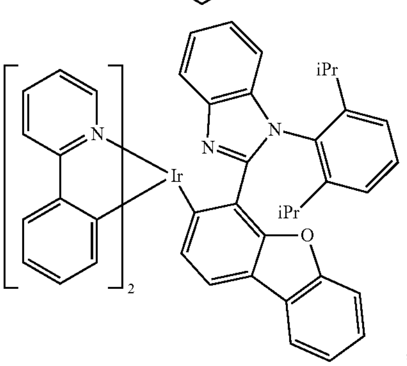
-continued
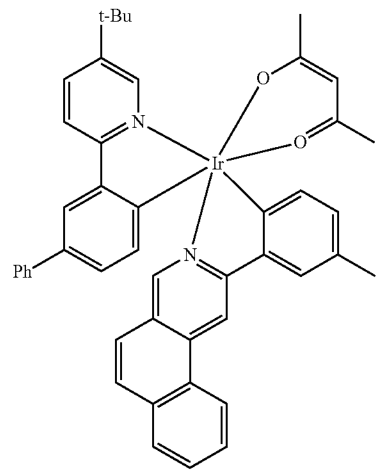
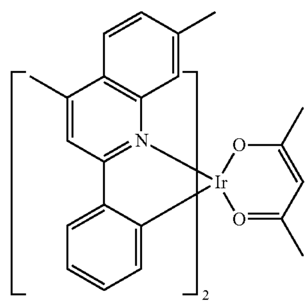
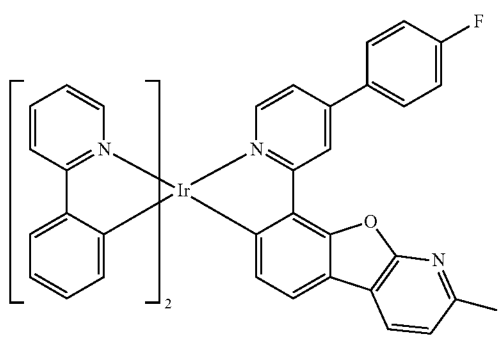
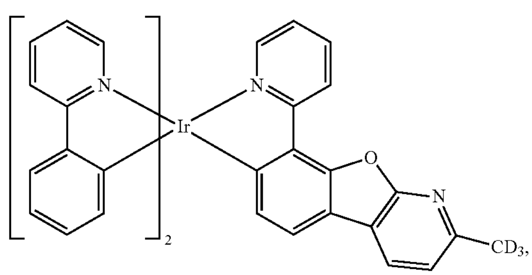
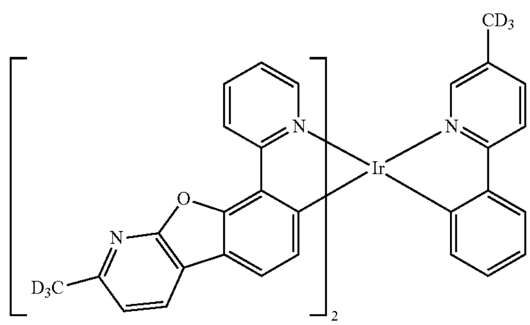

-continued
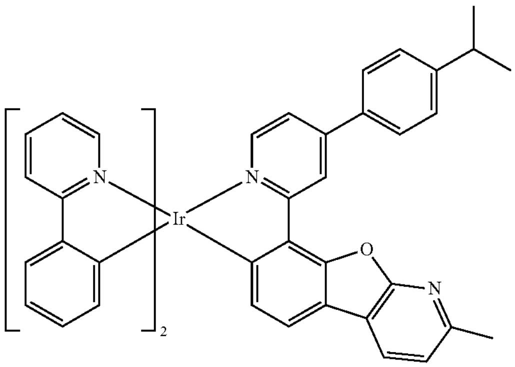
,
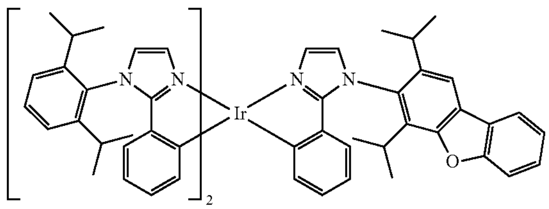
,
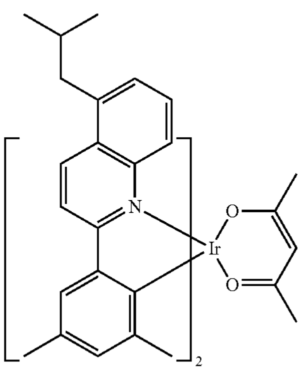
,
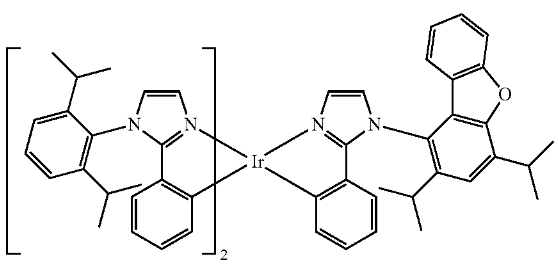
,
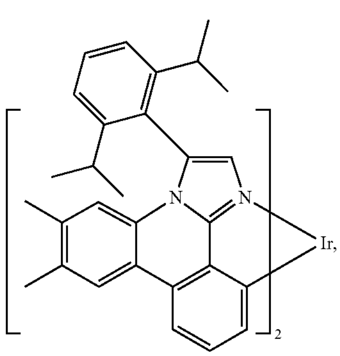
-continued
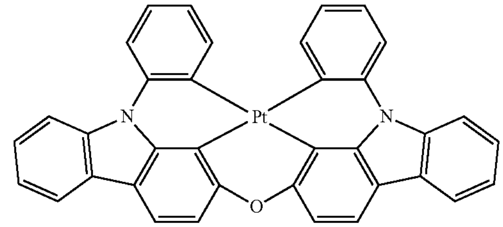
,
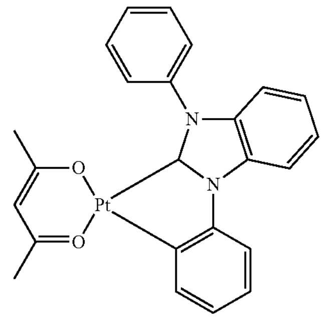
,
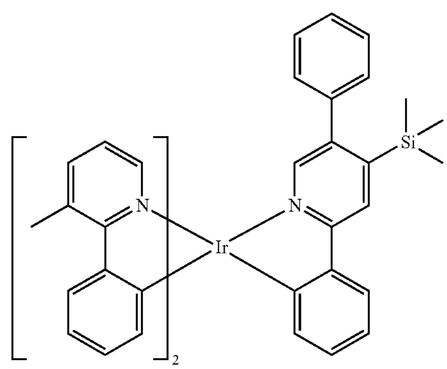
,
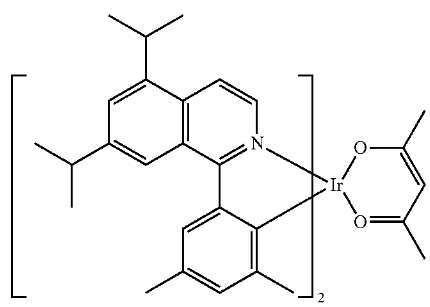
,
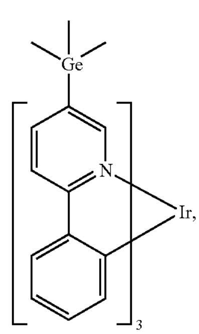

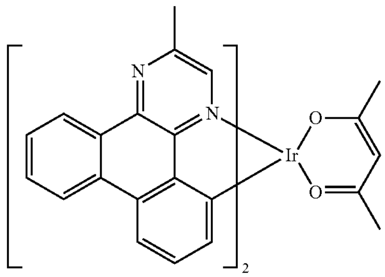
,
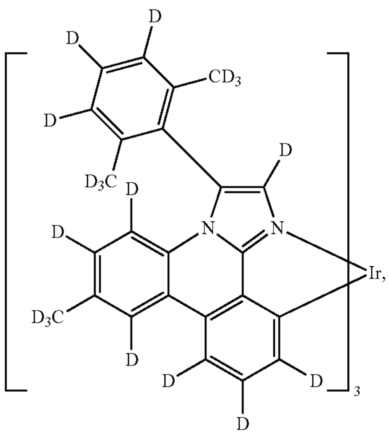
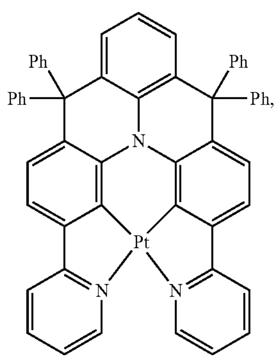
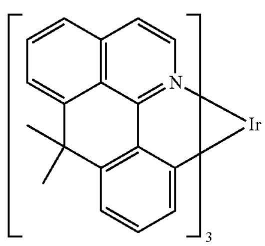
,
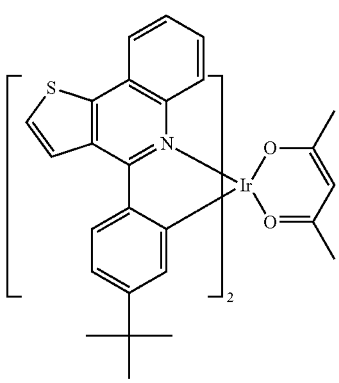
,
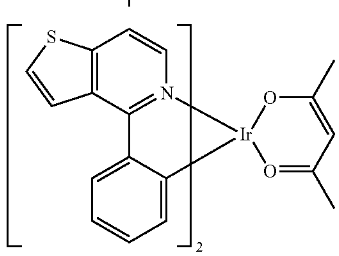
,
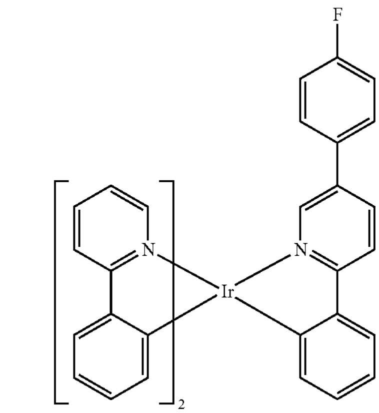
,
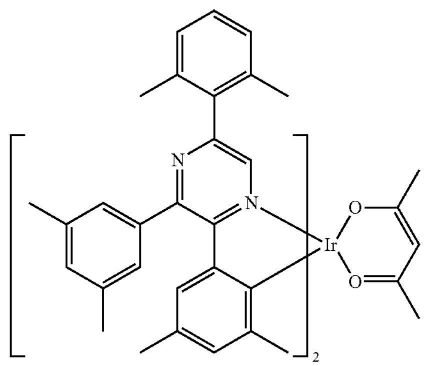
,
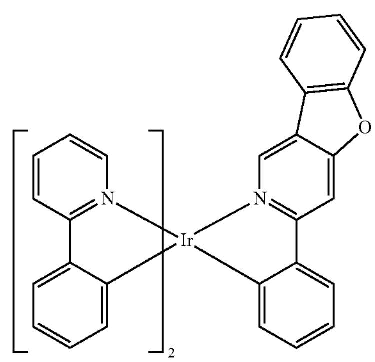
,
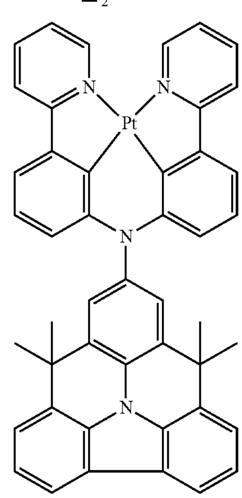
, -continued
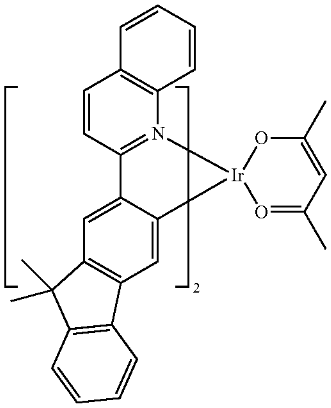
,
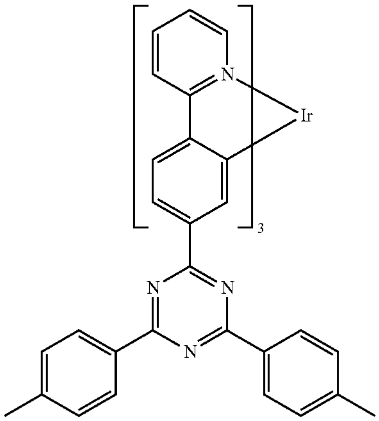
,
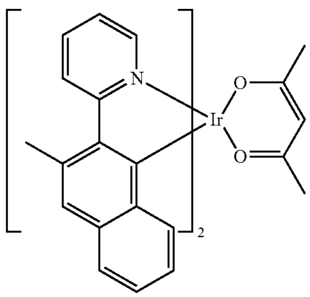
,
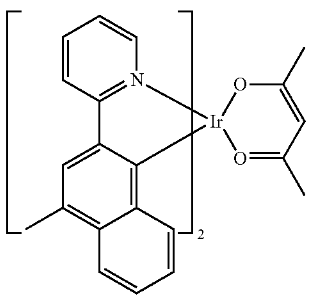
,
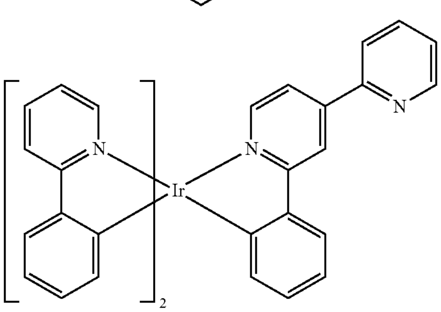
,
-continued
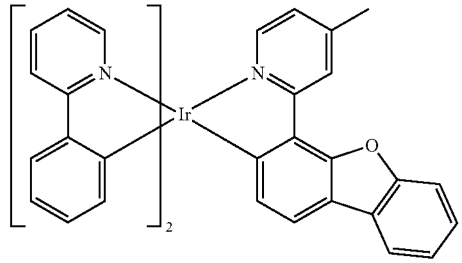
,
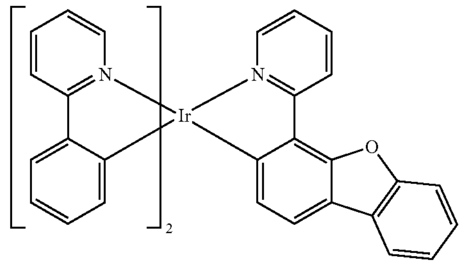
,
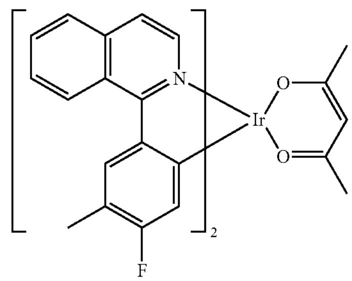
,
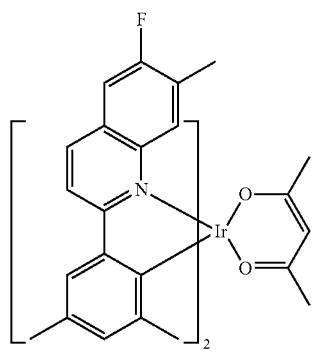
,
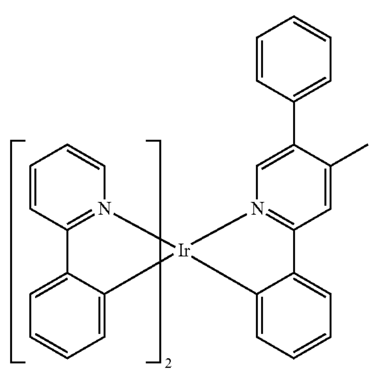
, -continued
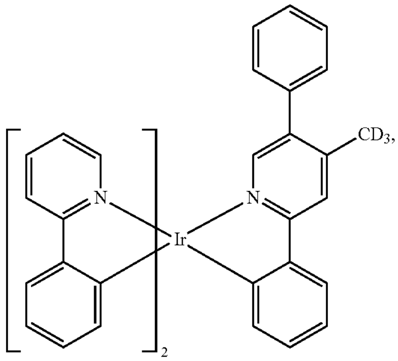
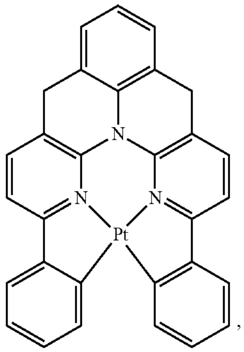
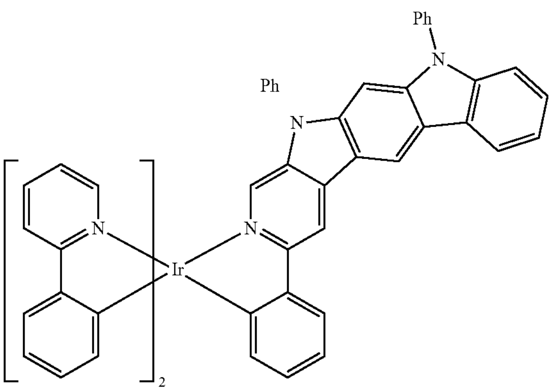
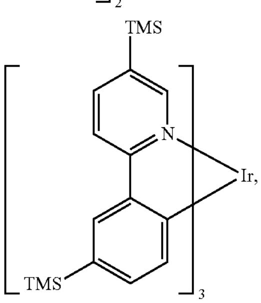
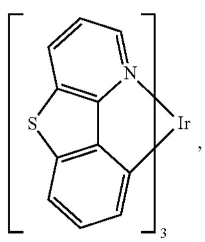
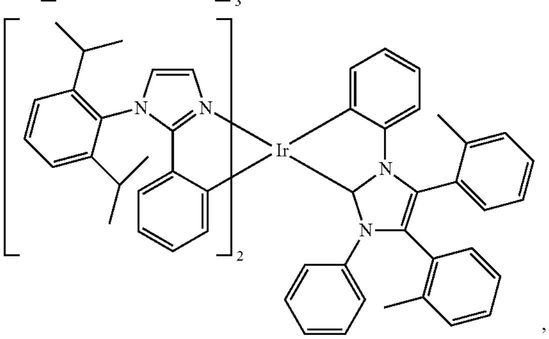
-continued
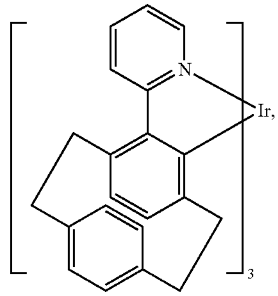
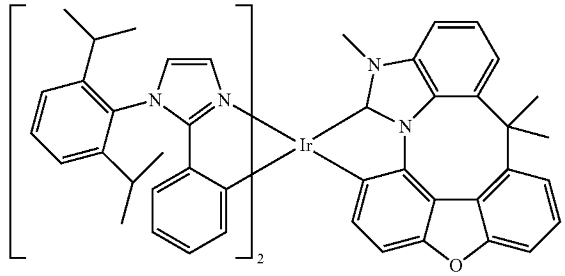
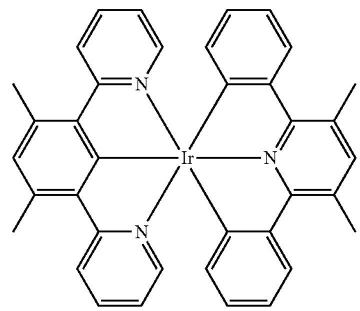
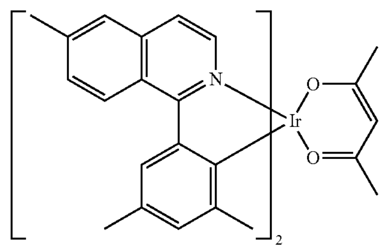
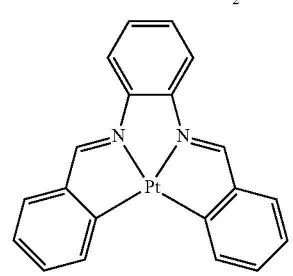
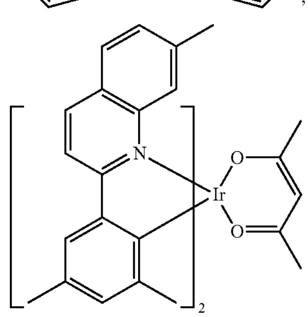

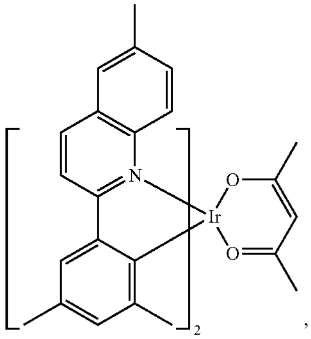
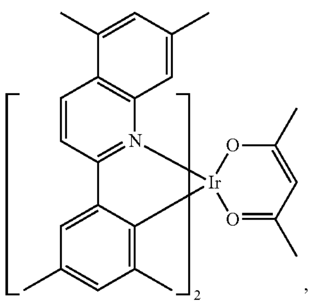
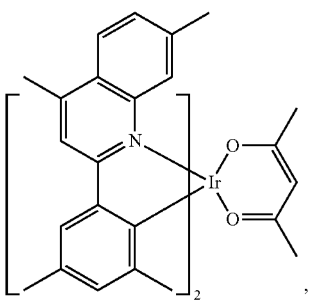
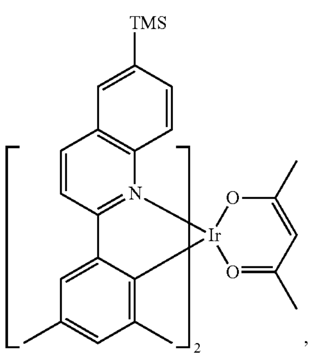
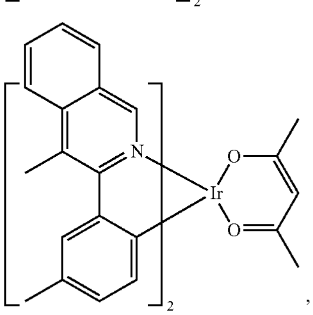
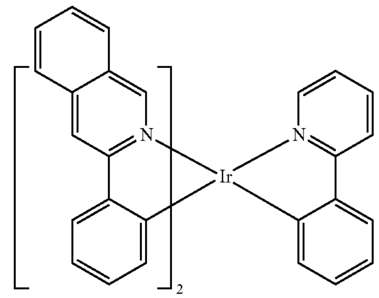
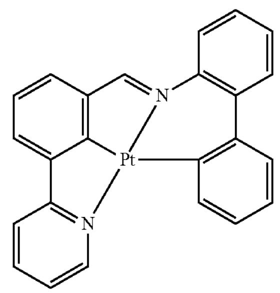
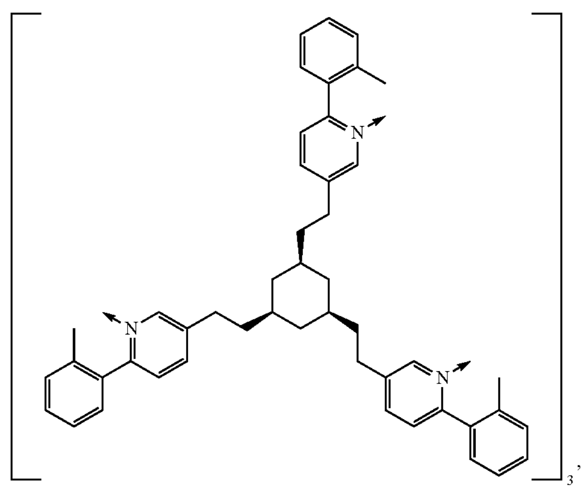
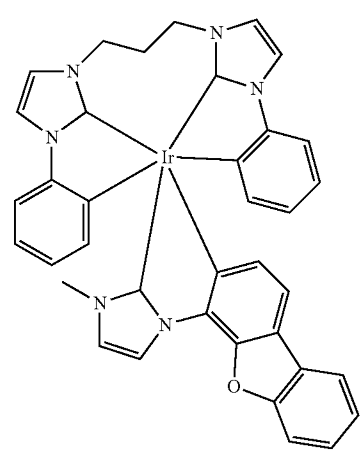

-continued
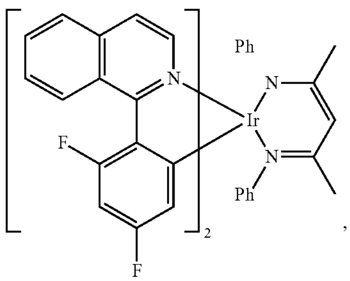
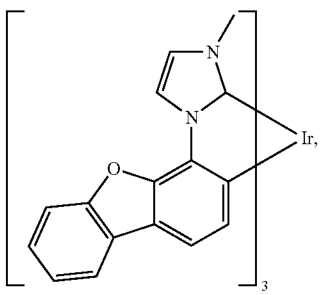
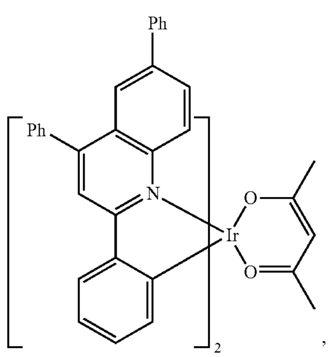
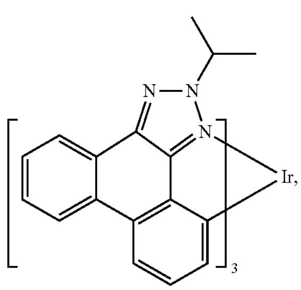
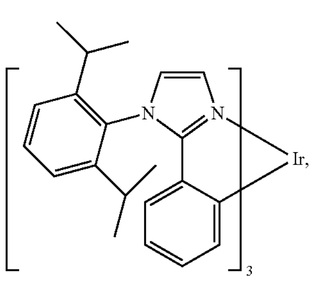
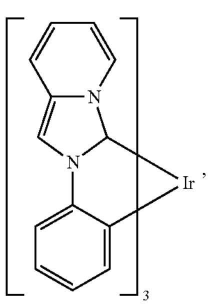
-continued
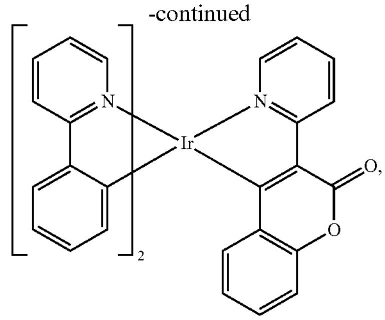
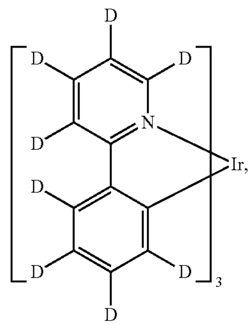
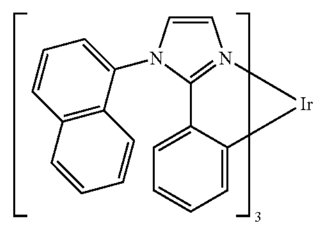
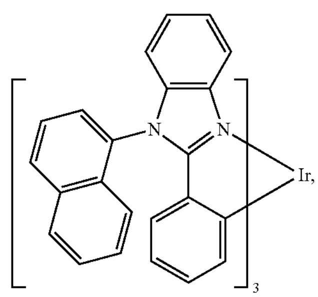
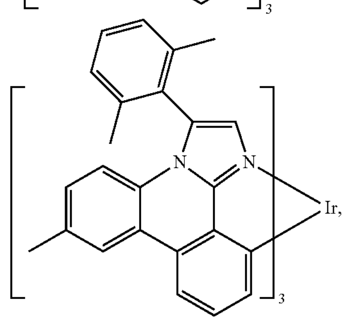
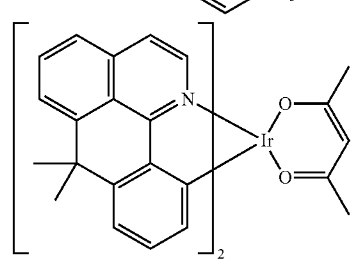
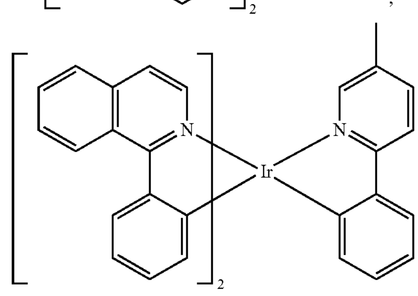

-continued

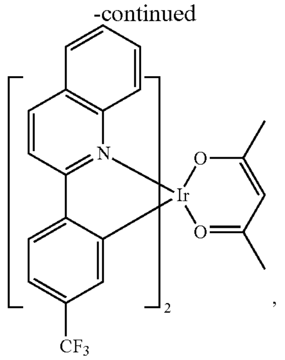

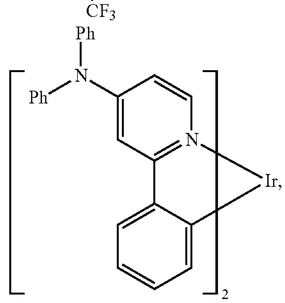

and

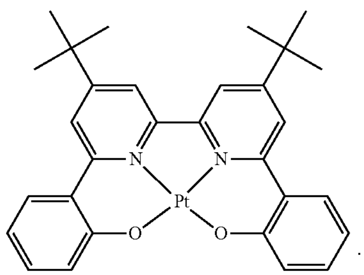

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

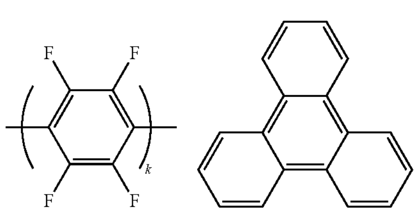

-continued

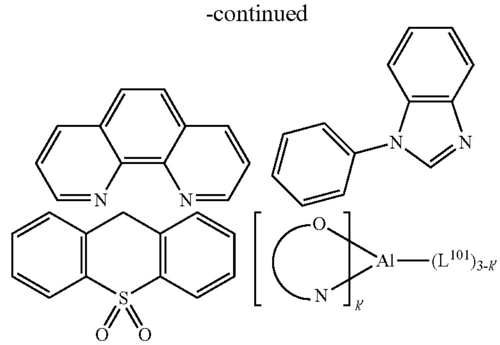

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

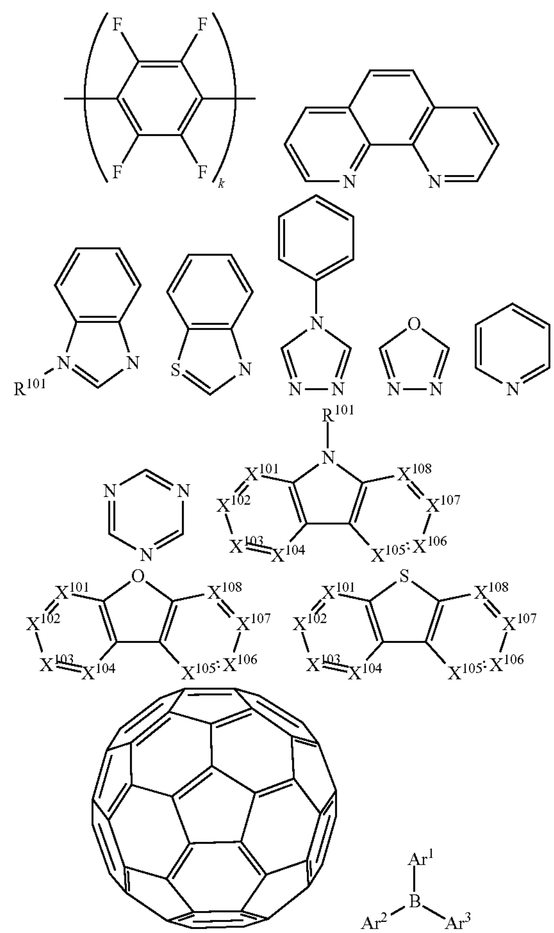

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

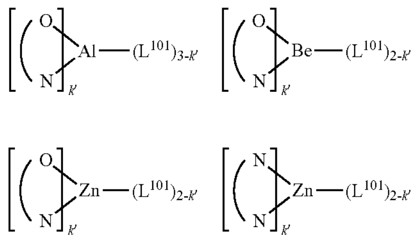

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

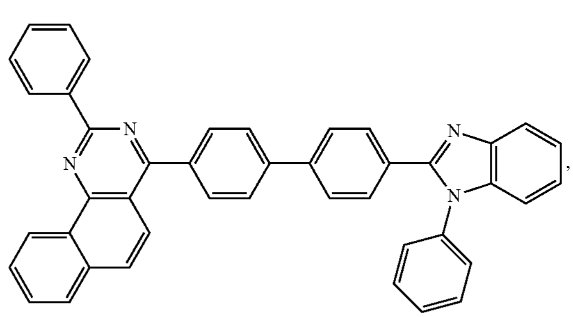

-continued

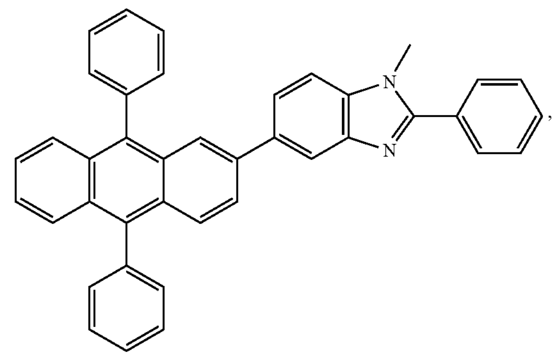

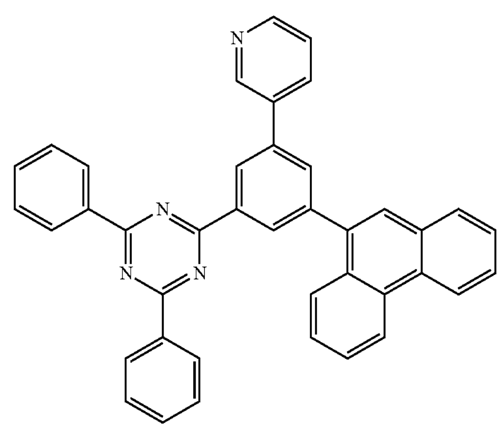

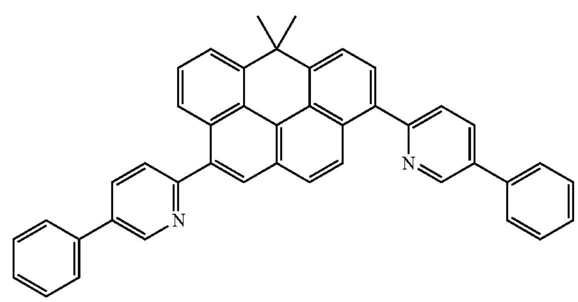

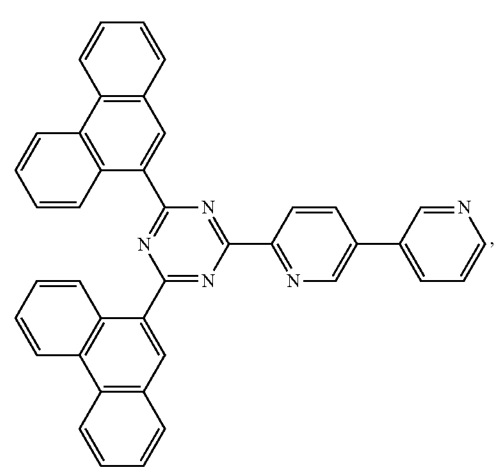

-continued
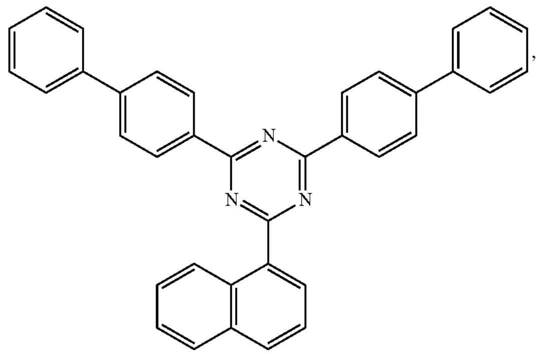
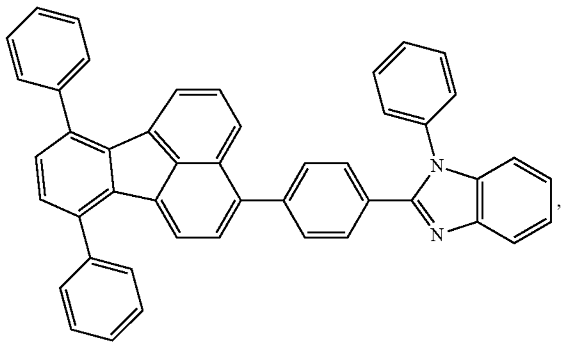
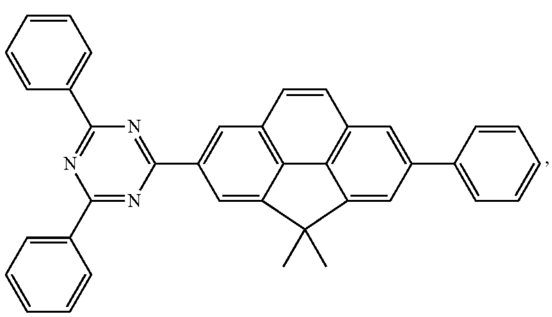
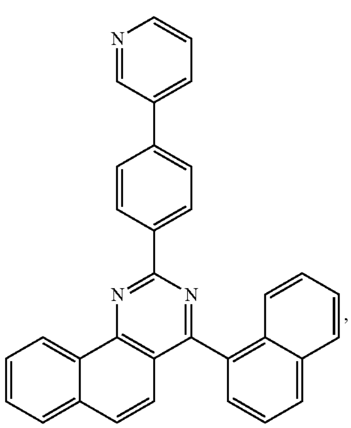
-continued
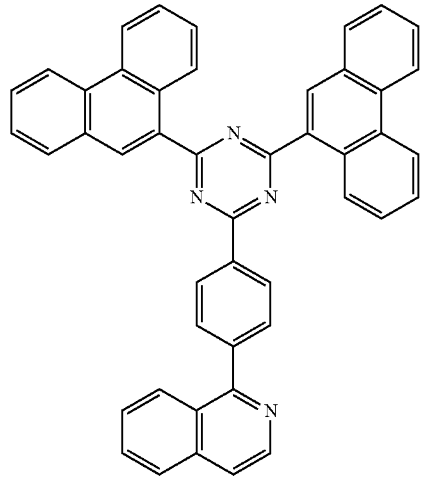
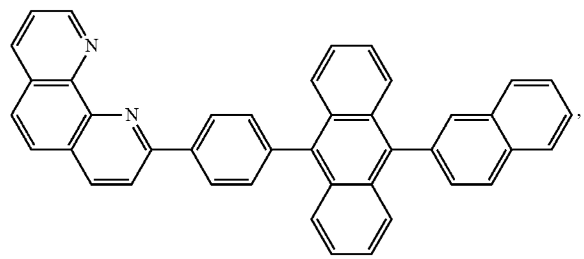
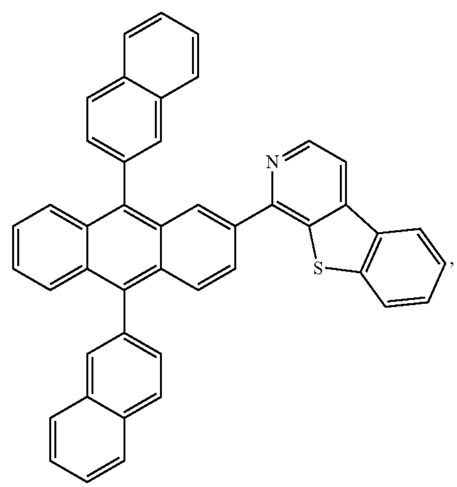
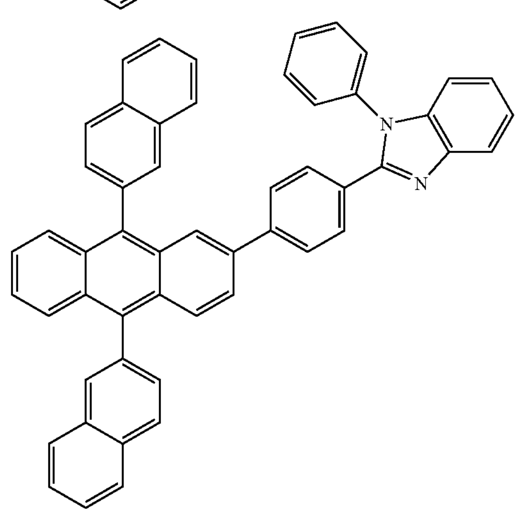

-continued
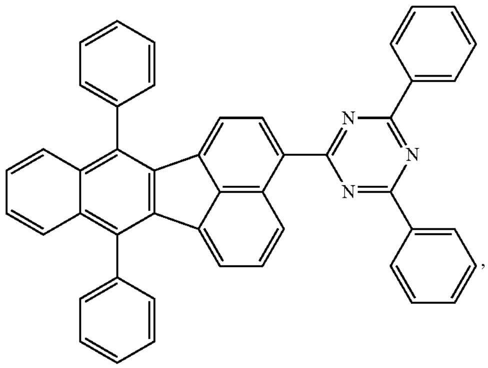
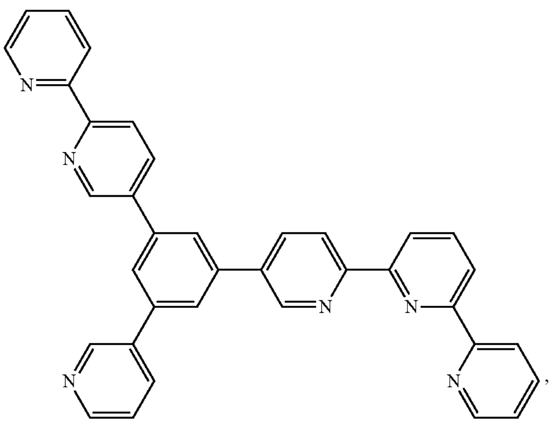
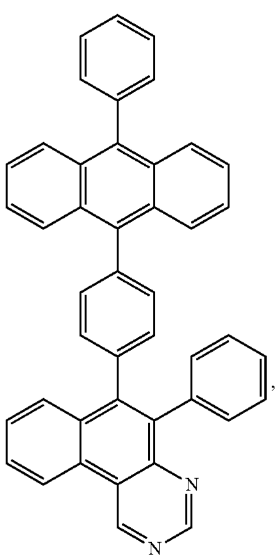
-continued
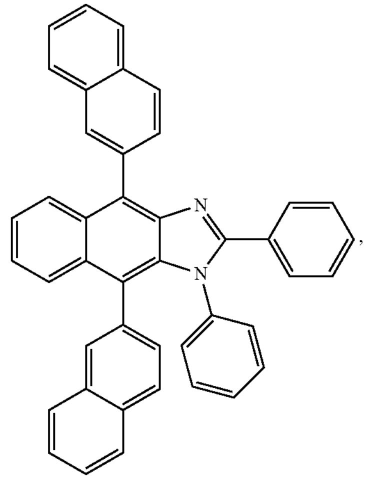
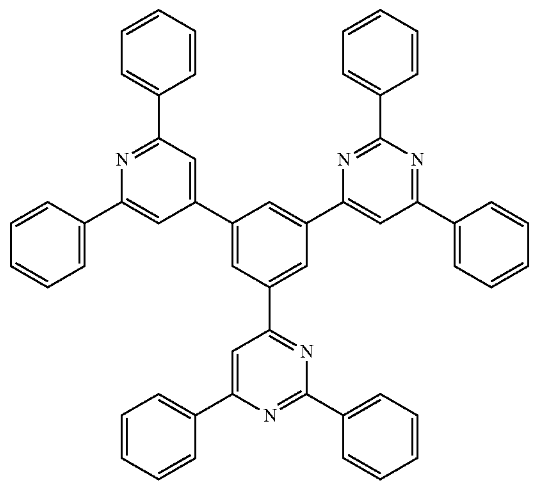
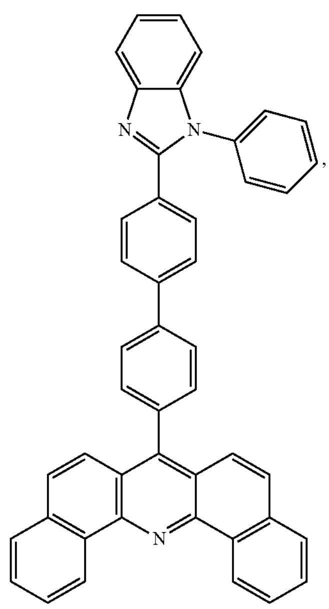

-continued
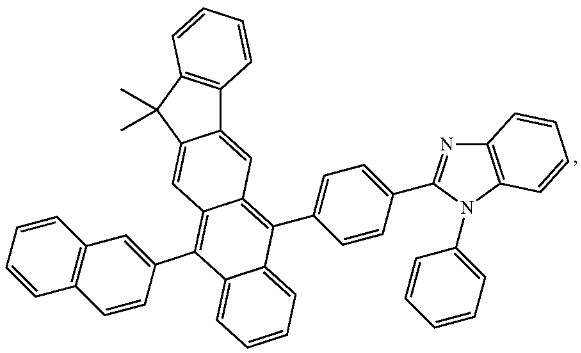
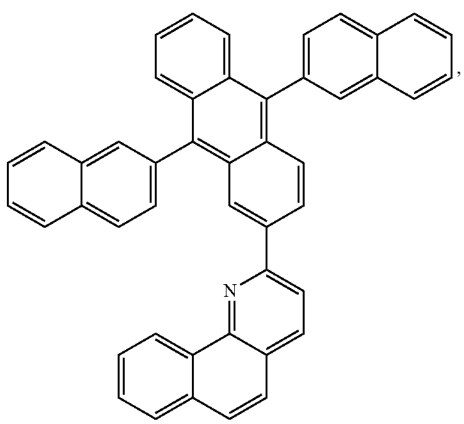
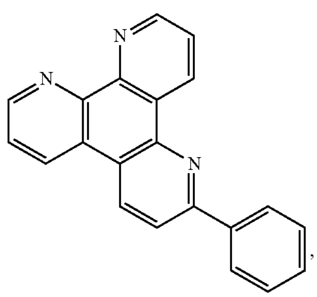
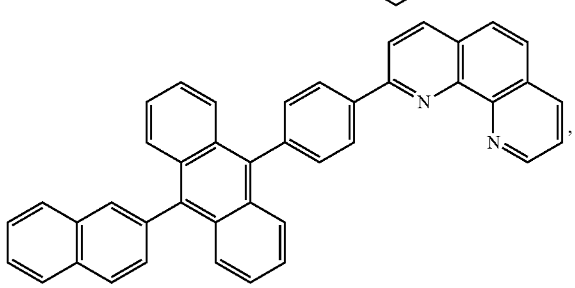
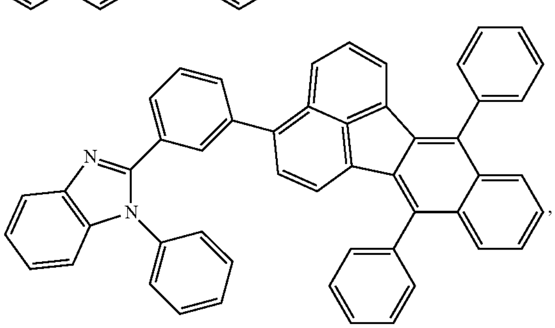
-continued
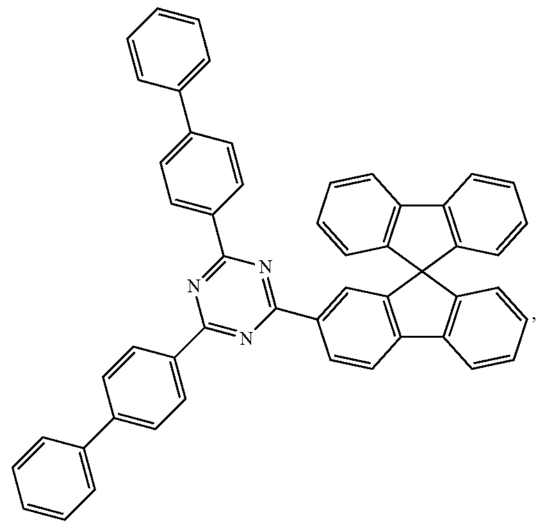
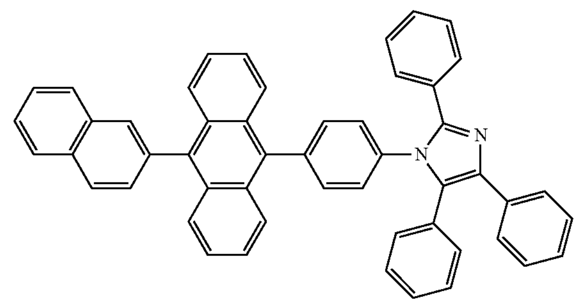
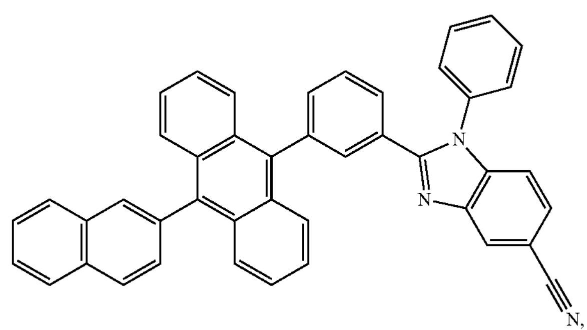
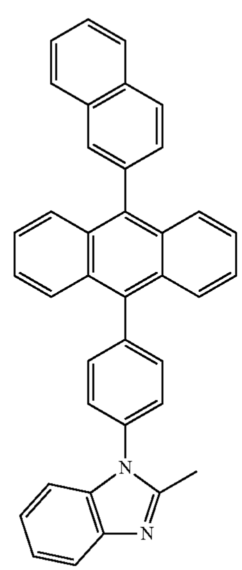

-continued

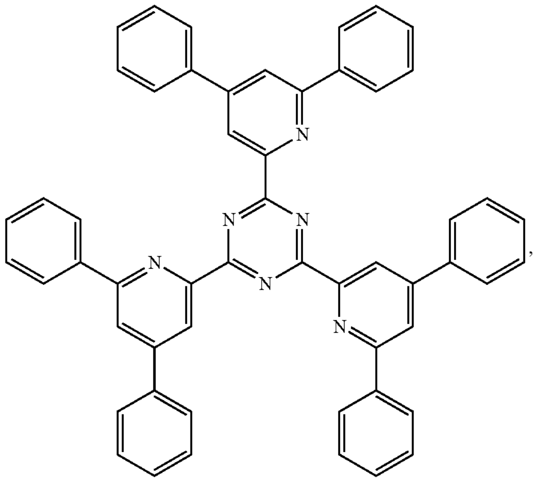

,

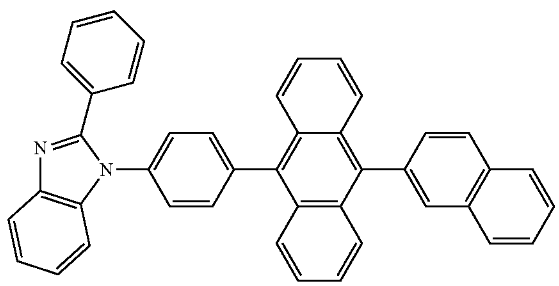

,

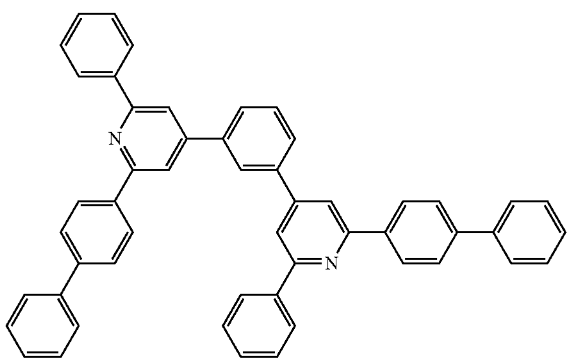

,

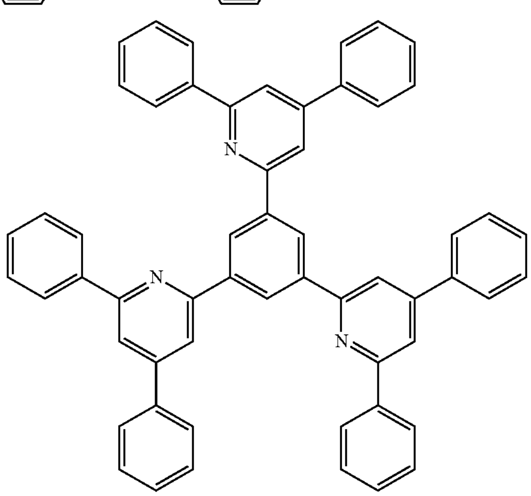

,

-continued

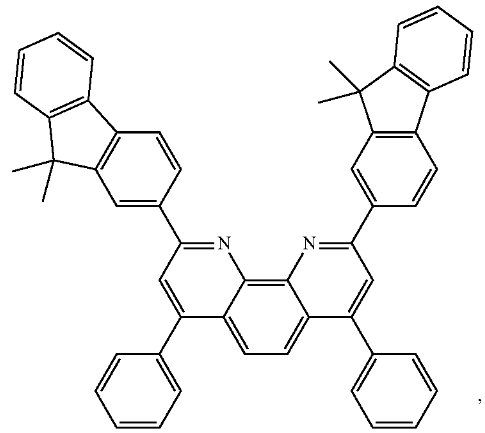

, and

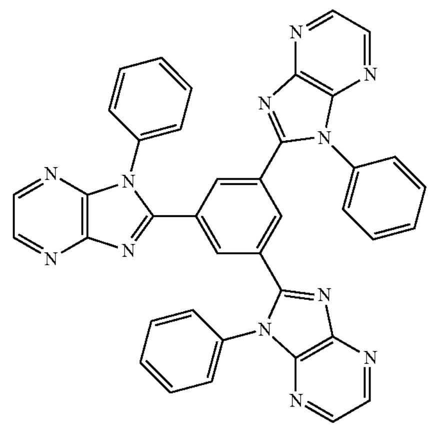

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthetic Examples

1. Synthesis of Comp $(L_{A1})_2Ir(L_{B227})$

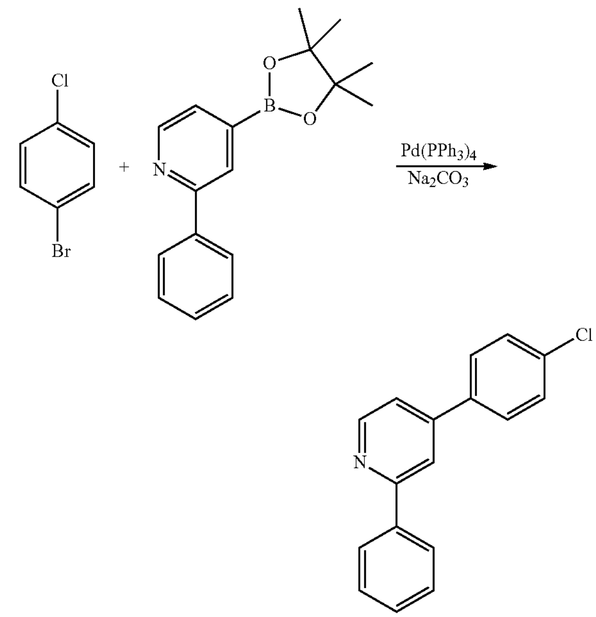

To a 500 mL round bottom flask, 1-bromo-4-chlorobenzene (9.60 g, 50.1 mmol), 2-phenyl-4-(4,4,5,5-tetramethyl-1,3,2-dioxaborolan-2-yl)pyridine (11.75 g, 41.8 mmol), $Pd(PPh_3)_4$ (2.415 g, 2.090 mmol), sodium carbonate (13.29 g, 125 mmol), DME (200 mL) and water (100 mL) were added and refluxed overnight. The reaction mixture was worked up and purified to yield 9.1 g of the desired product (yield 89%). GC and NMR confirmed the desired product.

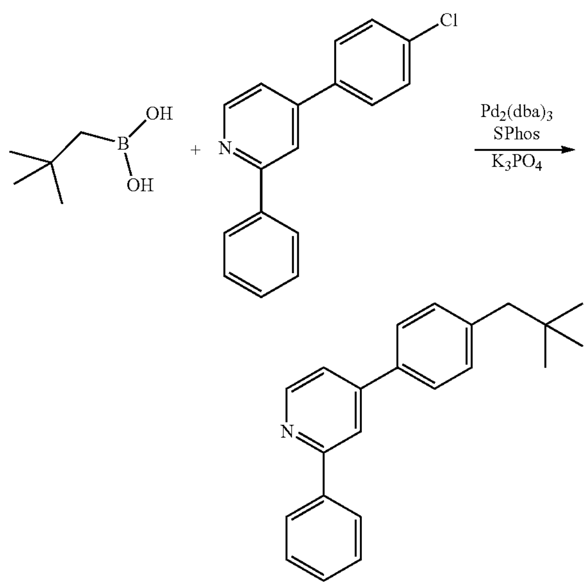

To a 500 mL round bottom flask, neopentylboronic acid (5.0 g, 43.1 mmol), dicyclohexyl(2',6'-dimethoxy-[1,1'-biphenyl]-2-yl)phosphane (SPhos) (1.112 g, 2.71 mmol), $Pd_2(dba)_3$ (0.620 g, 0.677 mmol), potassium phosphate (21.57 g, 102 mmol), water (25 ml), and toluene (250 ml) were added. The reaction mixture was degassed by bubbling in nitrogen for 15 minutes then heated in an oil bath and refluxed for 24 hours. The reaction was cooled down and purified by silca column chromatography to yield 8.0 g of the desired product (78.3% yield).

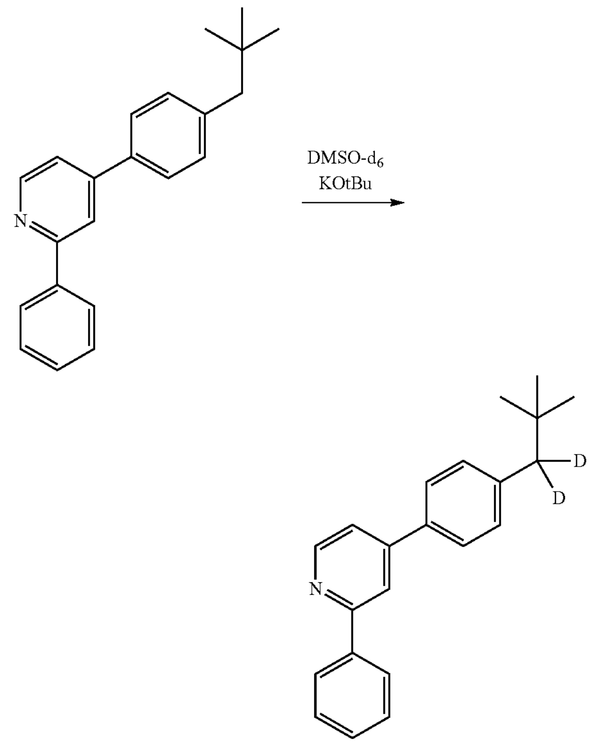 [SMILES: CC(C)(C)Cc1ccc(-c2ccnc(-c3ccccc3)c2)cc1 ; [2H]C([2H])(c1ccc(-c2ccnc(-c3ccccc3)c2)cc1)C(C)(C)C]

This deuteration reaction was carried out based on the literature procedure published in *Tetrahedron* 71(2015) 1425-1430.

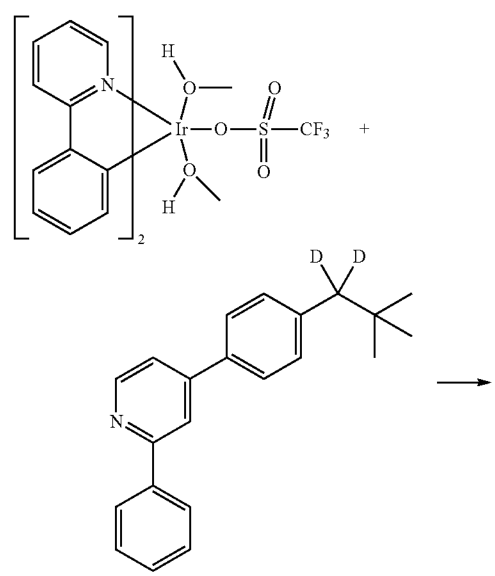

-continued

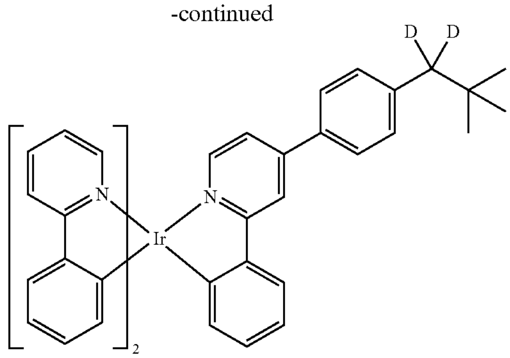

To a 100 mL round bottom flask, the iridium precursor (1.7 g, 2.38 mmol), 4-(4-(2,2-dimethylpropyl-11-$d_2$)phenyl)pyridine (1.8 g, 5.93 mmol), ethanol (25 mL) and methanol (25 mL) were added and heated under nitrogen in an oil bath and refluxed at 80° C. for 2 days. The reaction mixture was purified by silica column chromatography to give 0.9 g (47% yield) of desired product which was confirmed by LC-MS and NMR.

2. Synthesis of Comp $(L_{A147})_2Ir(L_{B184})$

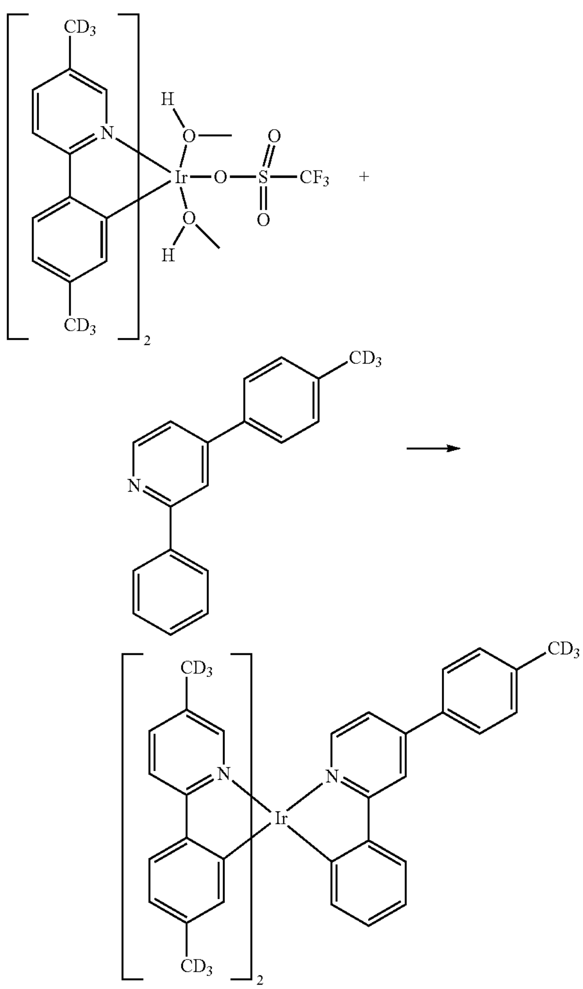

To a 100 mL flask, the iridium precursor (2.5 g, 3.20 mmol), 4-(4-(methyl-$d_3$)phenyl)-2-phenylpyridine (2.382 g, 9.59 mmol), ethanol (25 mL), and methanol (25 mL) were added. The reaction mixture was heated under nitrogen in an oil bath and refluxed at 80° C. for 15 hours. The reaction was allowed to cool to room temperature and filtered off the solid, washed with methanol and dried. The yellow solid was further purified by silica column chromatography to yield 1.25 g product (yield 48.9%) which was confirmed by LC-MS and NMR.

3. Synthesis of Comp $(L_{A147})_2Ir(L_{B86})$

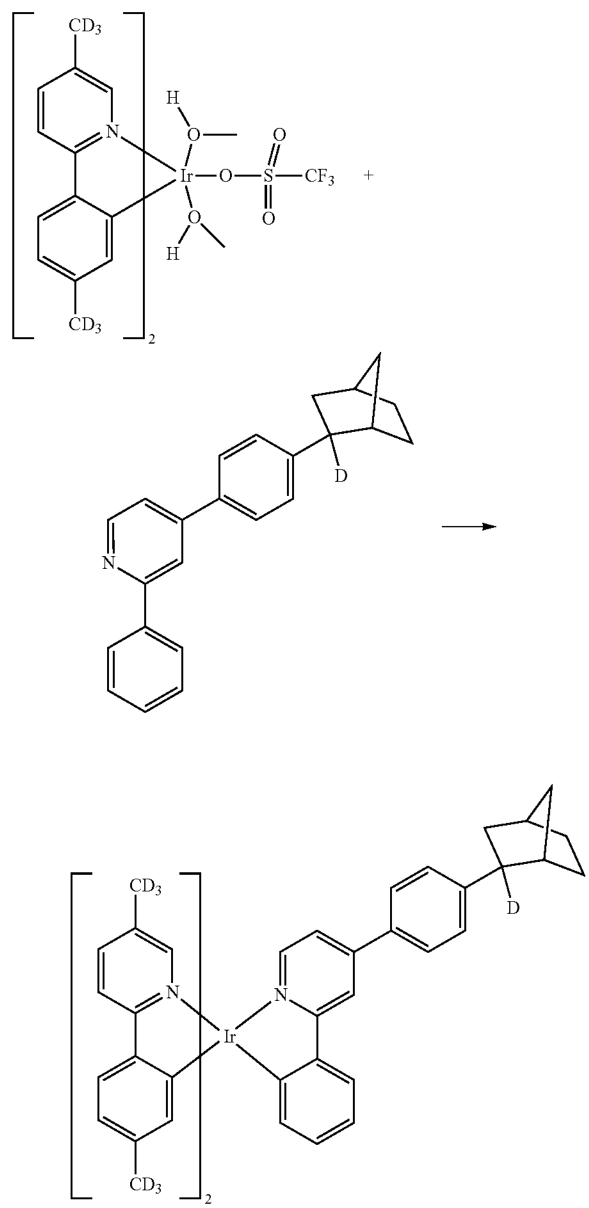

To a 500 mL round bottom flask, the iridium precursor (2 g, 2.56 mmol), 4-(4-(1S,2S,4R)-bicyclo[2.2.1]heptan-2-yl-2-d)phenyl)-2-phenylpyridine (2.104 g, 6.45 mmol), ethanol (40 mL) and methanol (40 mL) were added and refluxed at 80° C. for 23 hours. The reaction mixture was cooled down and filtered. The yellow solid collected was subjected to silica column chromatography to yield the desired product (0.61 g, 26% yield).

4. Synthesis of Comp $(L_{A147})_2Ir(L_{B109})$

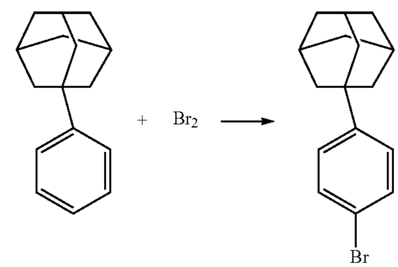

One 100 mL flask was charged with 1-phenyladamantane (2 g, 9.42 mmol), $CCl_4$ (40 mL), dibromine (19.40 mL, 377 mmol), stirred for overnight and protected from the light. The reaction mixture was slowly poured into ice water and quenched with sodium thiosulfate. The reaction mixture was extracted with ethyl acetate. The organic portion was evaporated to yield the desired product (2.74 g, 100%).

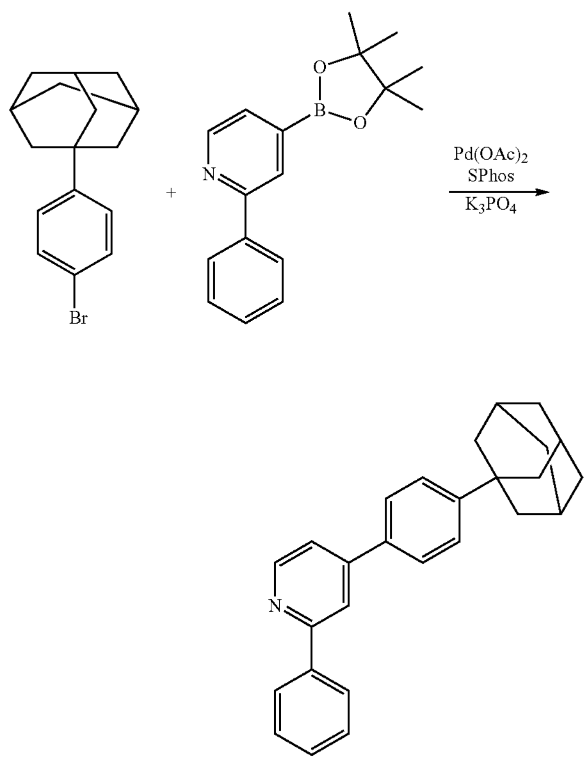

One 250 mL flask was charged with 1-(4-bromophenyl) adamantane (2.76 g, 9.48 mmol), 2-phenyl-4-(4,4,5,5-tetramethyl-1,3,2-dioxaborolan-2-yl)pyridine (4.00 g, 14.22 mmol), diacetoxypalladium (0.064 g, 0.284 mmol), dicyclohexyl(2',6'-dimethoxy-[1,1'-biphenyl]-2-yl)phosphane (SPhos) (0.233 g, 0.569 mmol), $K_3PO_4$ (4.02 g, 18.95 mmol), toluene (30 mL) and water (3 mL). The reaction mixture was heated to 100° C. for overnight and subjected to the aqueous work up with EtOAc. The organic portion was combined and subjected to column chromatography to yield the desired product (2.46 g, 71%).

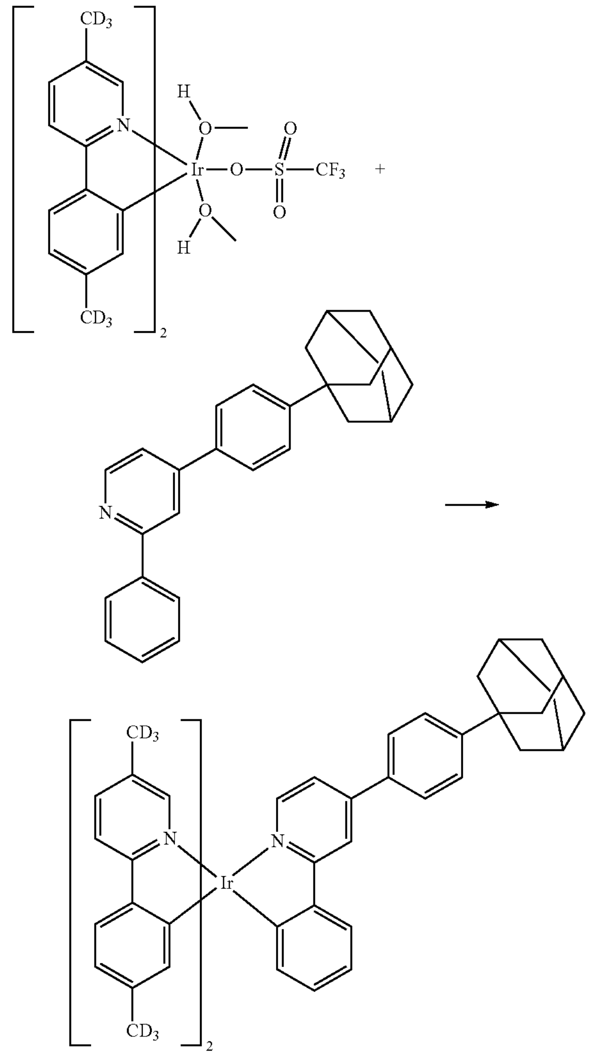

One 500 mL flask was charged with the iridium precursor (2.0 g, 2.56 mmol), 4-(4-(adamantan-1-yl)phenyl)-2-phenylpyridine (2.10 g, 5.75 mmol), ethanol (25 mL) and methanol (25 mL). The reaction mixture was heated to 80° C. for 5 days. The reaction mixture was filtered and the precipitate collected was subjected to column chromatography to yield the desired product (0.74 g, 31%). NMR and LC-MS confirmed the desired product.

5. Synthesis of Comp $(L_{A147})_2Ir(L_{B88})$

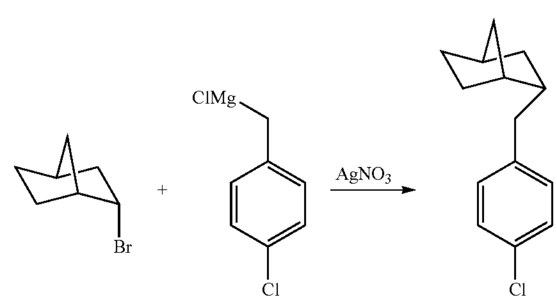

One 100 mL flask was charged with (nitrooxy)silver (0.137 g, 0.805 mmol), 100 mL of anhydrous ether, (1R,2S,4S)-2-bromobicyclo[2.2.1]heptane (3.45 mL, 26.8 mmol) was then added, followed by the addition of (4-chlorobenzyl)magnesium chloride (0.5 M solution in 2-MeTHF, 77 mL, 38.5 mmol) via addition funnel in a dropwise manner for a period of 20 minutes. The reaction mixture was stirred at room temperature for overnight. The reaction mixture was then diluted with water and extracted by ether. The organic portion was combined and subjected to column chromatography to yield the desired product (2.48 g, 41%).

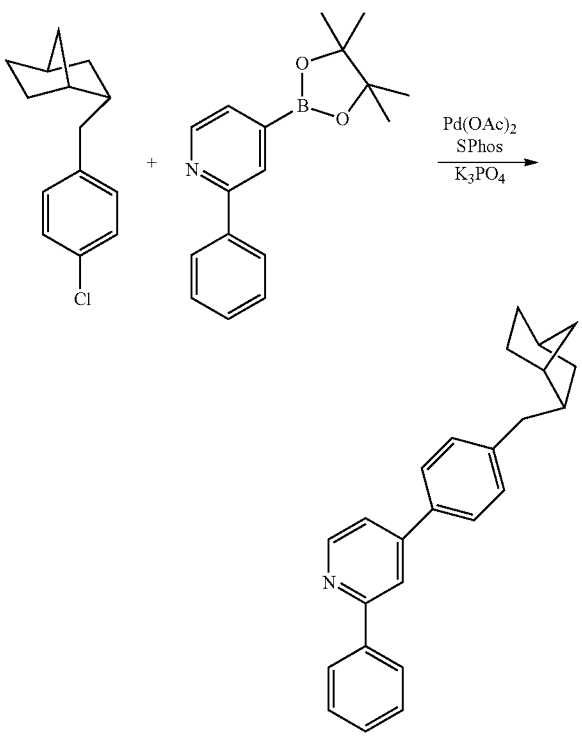

One 250 mL flask was charged with(1R,2R,4S)-2-(4-chlorobenzyl)bicyclo[2.2.1]heptane (2.48 g, 11.23 mmol) 2-phenyl-4-(4,4,5,5-tetramethyl-1,3,2-dioxaborolan-2-yl)pyridine (4.11 g, 14.61 mmol), diacetoxypalladium (0.076 g, 0.337 mmol), dicyclohexyl(2',6'-dimethoxy-[1,1'-biphenyl]-2-yl) phosphane (SPhos) (0.277 g, 0.674 mmol), $K_3PO_4$ (4.77 g, 22.47 mmol), toluene (30 mL) and water (3.00 mL). The reaction mixture was heated to 105° C. for overnight. The reaction mixture was subjected to aqueous work up and extracted with ethyl acetate. The organic portion was combined and subjected to silica column chromatography to yield pure product (3.69 g, 97%).

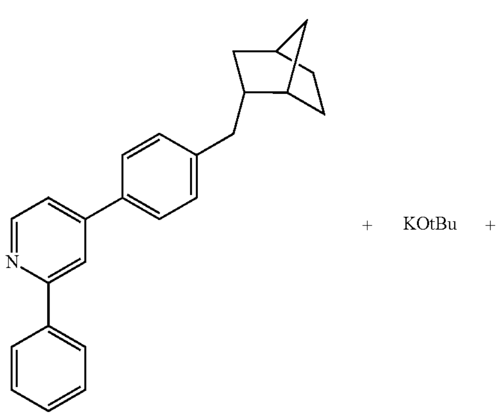

-continued

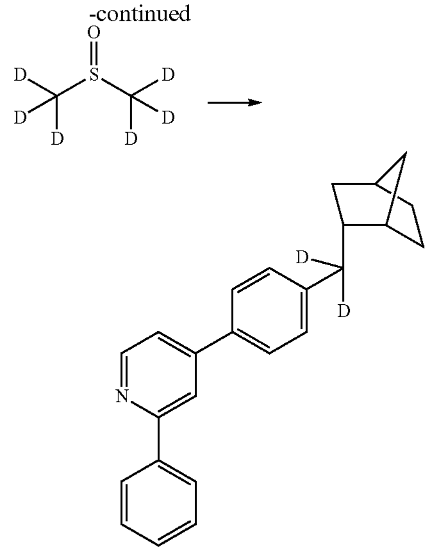

The deuteration reaction was carried out based on the literature procedure published in *Tetrahedron* 71(2015) 1425-1430.

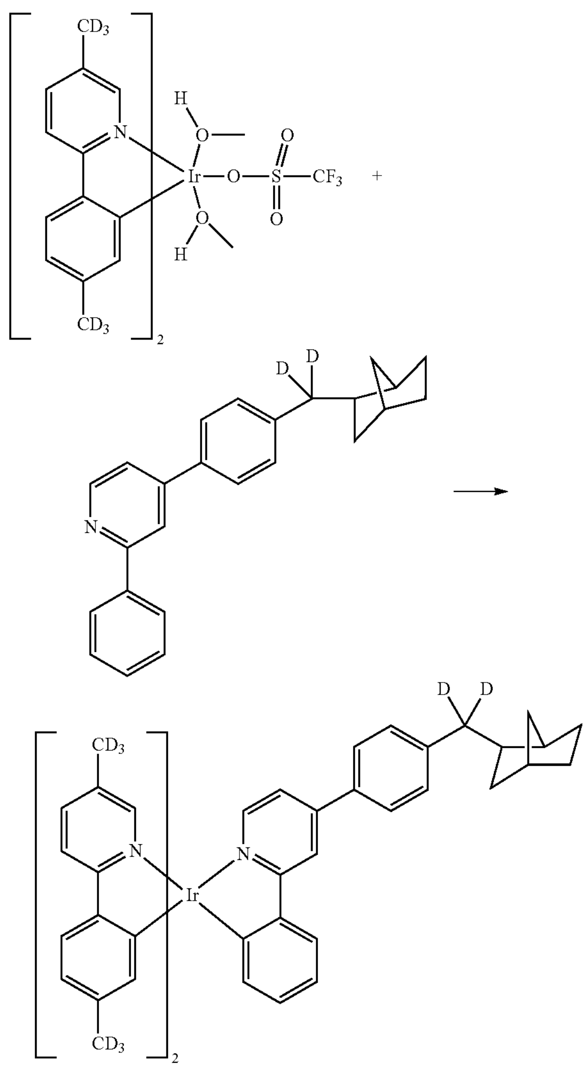

One 500 mL round bottom flask was charged with iridium precursor (2.8 g, 3.58 mmol), 4-(4-(((1R,2S,4S)-bicyclo[2.2.1]heptan-2-yl)methyl-$d_2$)phenyl)-2-phenylpyridine (2.446 g, 7.16 mmol), ethanol (25 mL) and MeOH (25 mL). The reaction mixture was heated to 80° C. for 4 days. The reaction mixture was filtered and the precipitate was collected and subjected to silica column chromatography to yield the desired product (1 g, 30.7%).

6. Synthesis of Comp $(L_{A147})_2Ir(L_{B225})$

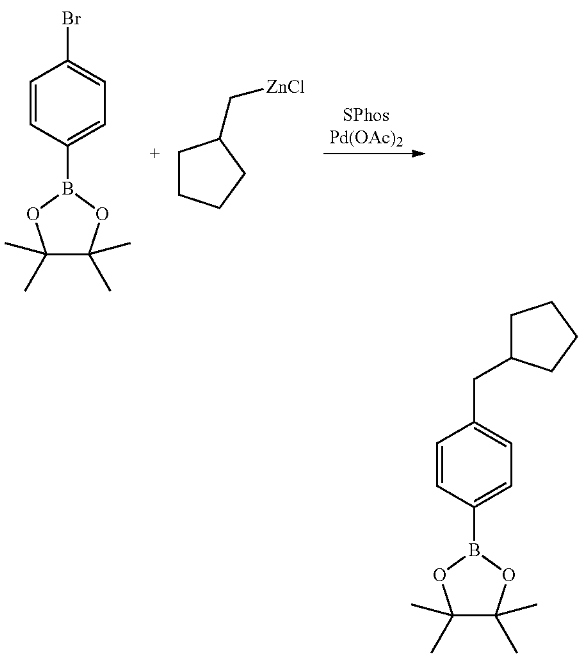

One 500 mL flask was charged with 2-(4-bromophenyl)-4,4,5,5-tetramethyl-1,3,2-dioxaborolane (10.5 g, 37.1 mmol), dicyclohexyl(2',6'-dimethoxy-[1,1'-biphenyl]-2-yl)phosphane (SPhos) (0.914 g, 2.226 mmol), and diacetoxypalladium (0.250 g, 1.113 mmol). The solution of (cyclopentylmethyl)zinc(II) chloride (20.48 g, 111 mmol) was transferred via a cannula into the reaction flask. The reaction mixture was stirred at room temperature for overnight. The reaction mixture was diluted with saturated ammonium chloride solution and extracted by ethyl acetate. The organic portion was combined and subjected to silica column chromatography to yield the desired product. (7.10 g, 67%).

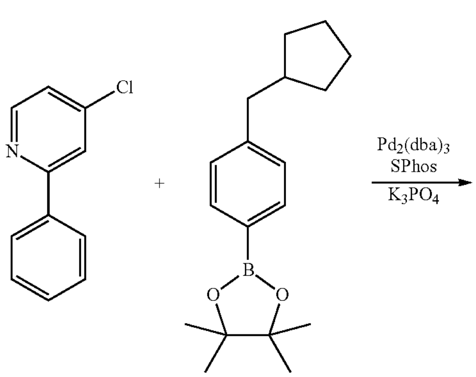

-continued

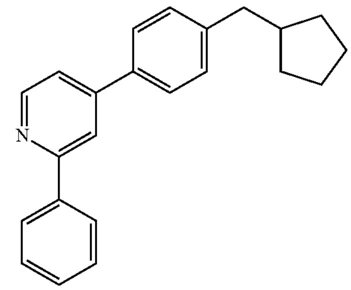

One 250 mL flask was charged with 4-chloro-2-phenylpyridine (3.92 g, 20.67 mmol), 2-(4-(cyclopentylmethyl)phenyl)-4,4,5,5-tetramethyl-1,3,2-dioxaborolane (7.10 g, 24.80 mmol), $Pd_2(dba)_3$(0.379 g, 0.413 mmol), dicyclohexyl(2',6'-dimethoxy-[1,1'-biphenyl]-2-yl)phosphane (SPhos) (0.679 g, 1.654 mmol), $K_3PO_4$ (13.16 g, 62.0 mmol), toluene (70 mL) and water (7.0 mL). The reaction was heated to 100° C. for over night. The reaction mixture was subjected to aqueous work up and extracted by EtOAc. The organic portion was combined and subjected to column chromatography to yield the product (5.71 g, 88%).

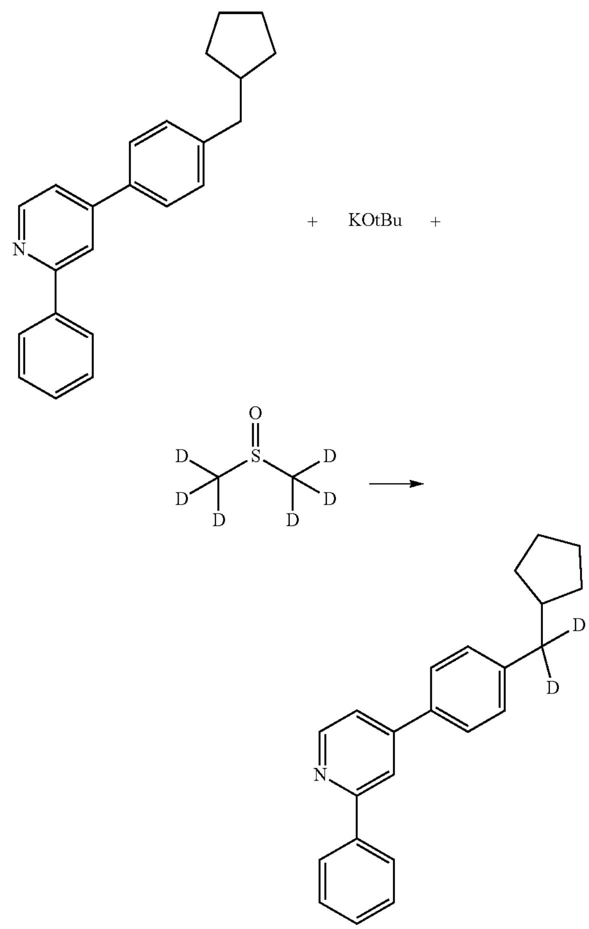

The deuteration reaction was carried out based on the literature procedure published in *Tetrahedron* 71(2015) 1425-1430.

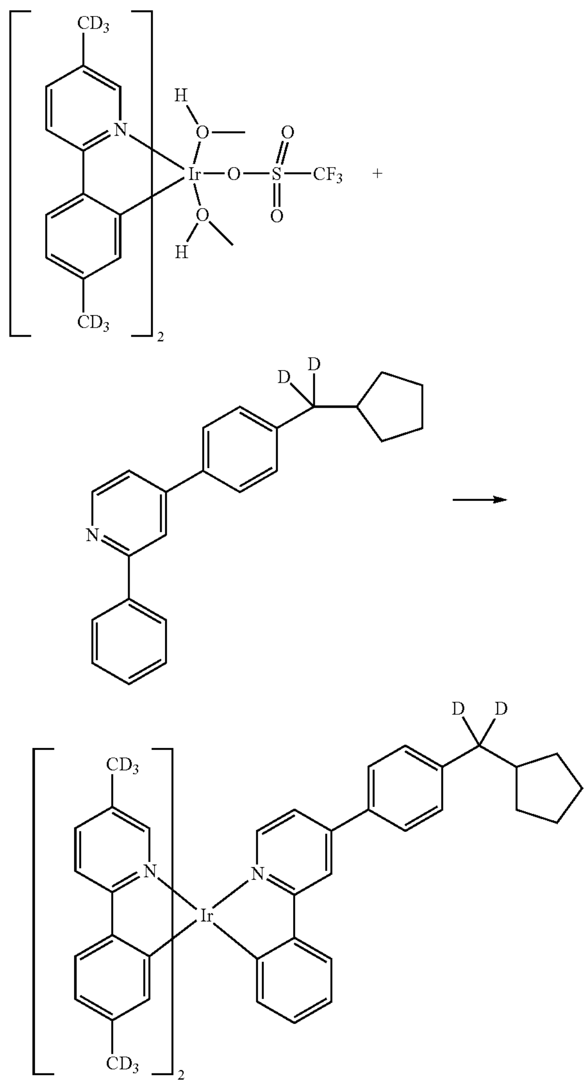

One 100 mL round bottom flask was charged with the iridium precursor (2.22 g, 2.84 mmol), 4-(4-(cyclopentylmethyl-d2)phenyl)-2-phenylpyridine (1.791 g, 5.68 mmol), ethanol (25 mL) and MeOH (25.00 mL). The reaction mixture was heated to 68° C. for 5 days. The reaction mixture was filtered and the precipitate collected was subjected to column chromatography to yield desired product (0.9 g, 36%).

7. Synthesis of Comp $(L_{A153})_2Ir(L_{B86})$

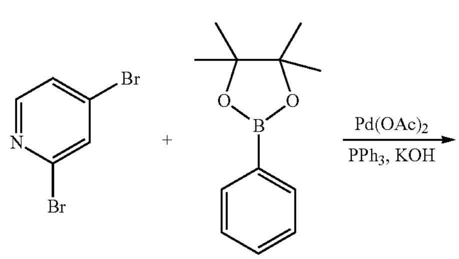

-continued

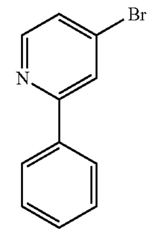

One 1000 mL round bottom flask was charged with 2,4-dibromo-pyridine (9.45 g, 40.4 mmol), 4,4,5,5-tetramethyl-2-phenyl-1,3,2-dioxaborolane (11.37 g, 55.7 mmol), diacetoxypalladium (0.569 g, 2.53 mmol), triphenylphosphane (2.66 g, 10.13 mmol), potassium hydroxide (5.68 g, 101 mmol) and acetonitrile (600 mL). The reaction mixture was heated to 60° C. for 50 hours. The reaction mixture was subjected to aqueous work up with EtOAc. The organic portion was combined and subjected to silica gel column chromatography to yield the desired product (9.45 g, 80%).

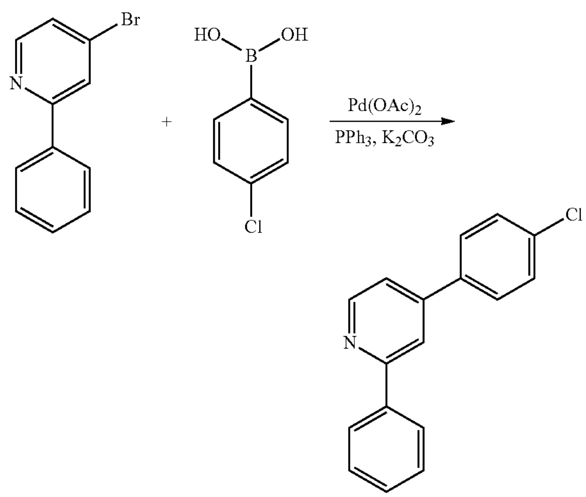

One 500 mL round bottom flask was charged with 4-bromo-2-phenylpyridine (9.52 g, 35.8 mmol), (4-chlorophenyl) boronic acid (6.94 g, 44.4 mmol), diacetoxypalladium (0.453 g, 2.018 mmol), triphenylphosphane (1.059 g, 4.04 mmol), $K_2CO_3$ (11.16 g, 81 mmol), acetonitrile (200 mL) and MeOH (100 mL). The reaction was heated to 40° C. for 21 hours. The reaction mixture was diluted with water and extracted with ethyl acteate. The organic portion was evaporated to dryness. The residue was subjected to column chromatography to yield the desired compound (9.52 g, 89%).

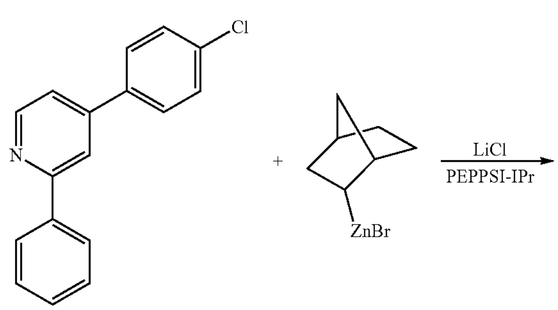

-continued

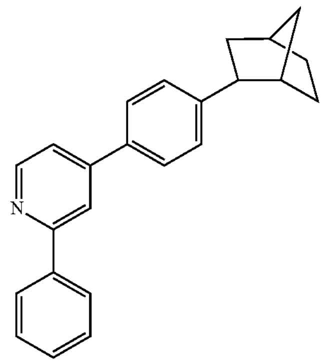

One 250 mL flask was charged with 4-(4-chlorophenyl)-2-phenylpyridine (3 g, 11.29 mmol), lithium chloride (6.52 g, 154 mmol), PEPPSI-Ipr (0.460 g, 0.677 mmol) and ((1S, 2R,4R)-bicyclo[2.2.1]heptan-2-yl)zinc(II) bromide (79 ml, 39.5 mmol) in THF. The reaction mixture was stirred at room temperature for overnight. The reaction mixture was diluted with water and extracted with ethyl acetate. Organic portion was combined and subjected to column chromatography to yield (3.67 g, 100%).

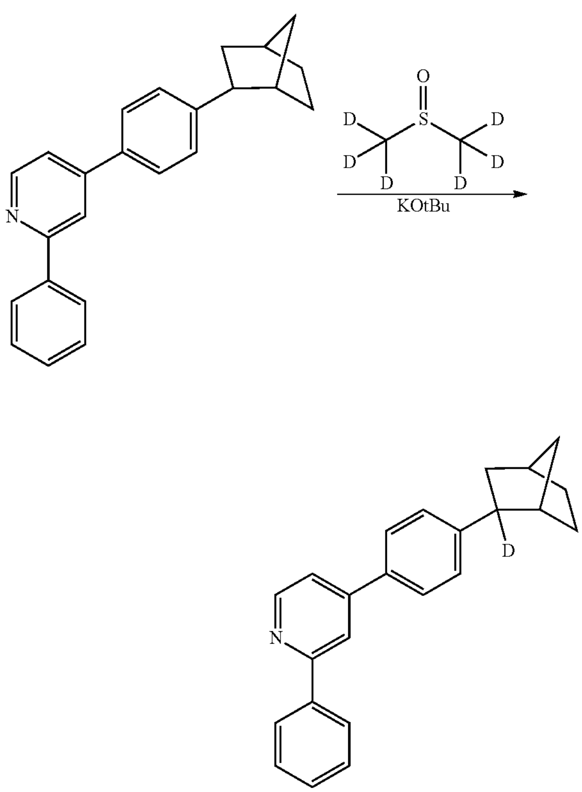

The deuteration reaction was carried out based on the literature procedure published in *Tetrahedron* 71(2015) 1425-1430.

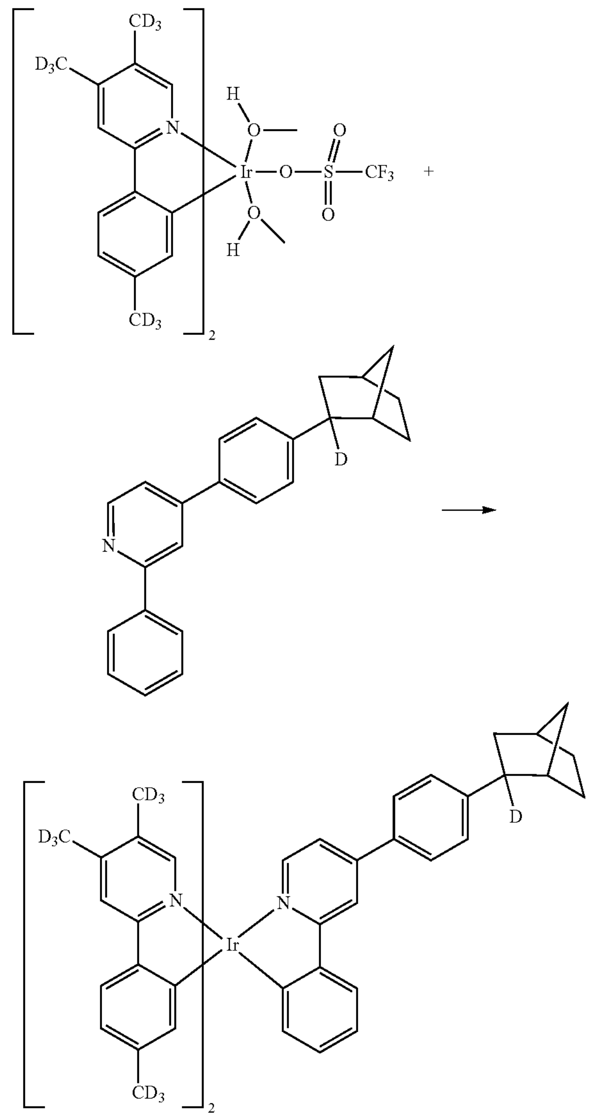

One 500 mL flask was charged with the iridium precursor (4.28 g, 5.24 mmol), 4-(4-((1S,2S,4R)-bicyclo[2.2.1]heptan-2-yl-2-d)phenyl)-2-phenylpyridine (4.36 g, 13.36 mmol), ethanol (40 mL) methanol (40 mL), heated to 70° C. for 50 hours. The reaction mixture was filtered and the yellow solid was collected was subjected to column chromatography to yield the desired product (1.18 g).

Device Examples

All example devices were fabricated by high vacuum (<$10^{-7}$ Torr) thermal evaporation. The anode electrode was 750 Å of indium tin oxide (ITO). The cathode consisted of 10 Å of Liq (8-hydroxyquinoline lithium) followed by 1,000 Å of Al. Devices were encapsulated with a glass lid sealed with an epoxy resin in a nitrogen glove box (<1 ppm of $H_2O$ and $O_2$) immediately after fabrication, and a moisture getter was incorporated inside the package. The stack of the device examples consisted of sequentially, from the ITO surface, 100 Å of HATCN as the hole injection layer (HIL); 450 Å of HTM as a hole transporting layer (HTL); 50 Å of EBM as electron blocking layer, 400 Å of emissive layer (EML) containing two component host (H1:H2 1:1 ratio) and emitter 12% (Inventive or comparative emitter examples), and 350 Å of Liq (8-hydroxyquinoline lithium) doped with 40% of ETM as the electron transporting layer ETL. The chemical structures of the device materials are shown below.

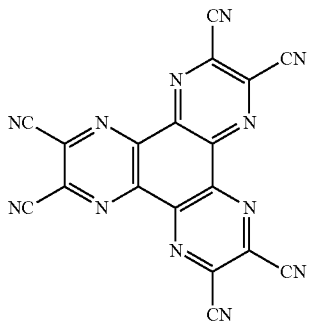

HAT-CN

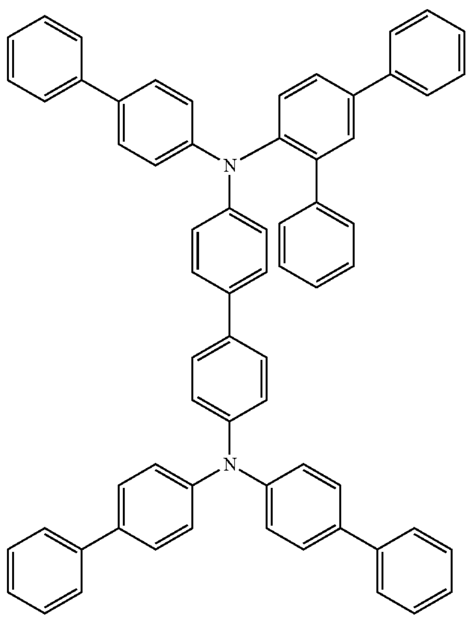

HTM

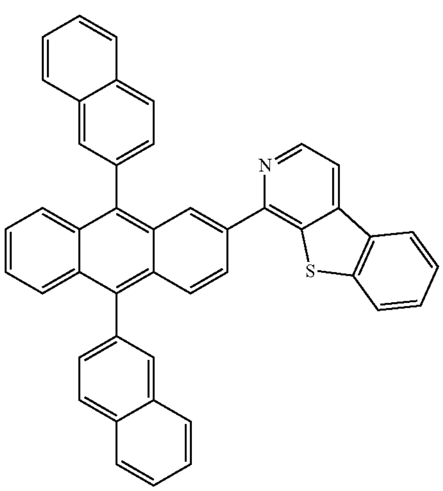

ETM

-continued

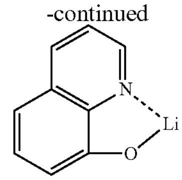

Liq

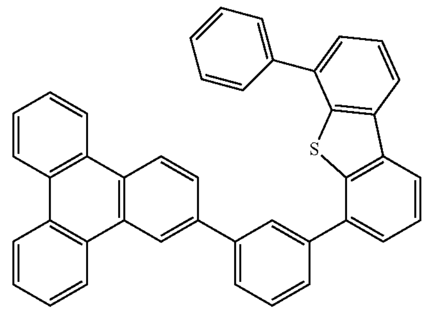

H1

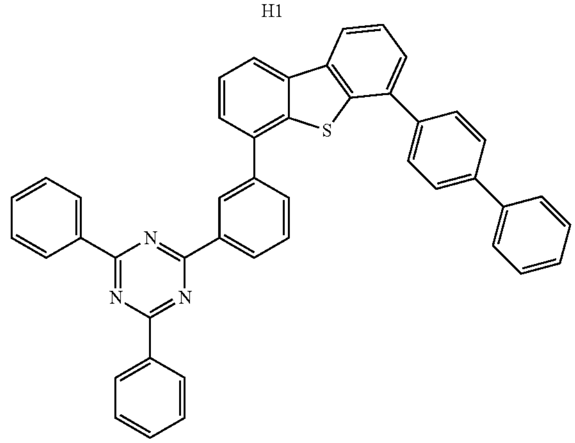

H2

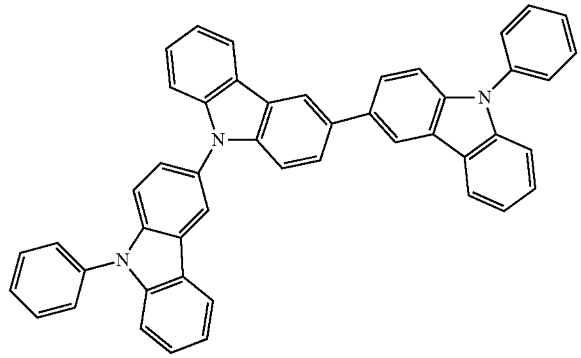

EBM

Table 5 shows the device layer thicknesses and materials.

TABLE 5

Device structure for evaluating EQE of yellow emitters

| Layer | Material | Thickness [Å] |
|---|---|---|
| Anode | ITO | 750 |
| HIL | HATCN | 100 |
| HTL | HTM | 450 |

TABLE 5-continued

| Device structure for evaluating EQE of yellow emitters | | |
|---|---|---|
| Layer | Material | Thickness [Å] |
| EBL | EBM | 50 |
| EML | H1:H2 (1:1): Emitter 12% | 400 |
| ETL | Liq: ETM 40% | 350 |
| EIL | Liq | 10 |
| Cathode | Al | 1000 |

Emitter Examples 1, 2, 5, 7, 8, 9, 10 and CE2 were used to demonstrate the correlation between device EQE and emitter orientation factor. The device EQE measured at 1,000 nits is shown in the Table 6.

TABLE 6

| Correlation of Experimental EQE, Estimated EQE in the device with Emitter PLQY and orientation factor. | | | | |
|---|---|---|---|---|
| Example | # | Emitter | Emitter Orientation factor | Experimental EQE at 1,000 nits [%] |
| CE | 2 | Comp $(L_{A1})_2Ir(L_{B182})$ | 0.80 | 26 |
| Example | 1 | Comp $(L_{A1})_2Ir(L_{B196})$ | 0.82 | 28 |
| Example | 2 | Comp $(L_{A147})_2Ir(L_{B184})$ | 0.85 | 28 |
| Example | 5 | Comp $(L_{A147})_2Ir(L_{B225})$ | 0.90 | 30 |
| Example | 7 | Comp $(L_{A147})_2Ir(L_{B86})$ | 0.92 | 33 |
| Example | 8 | Comp $(L_{A153})_2Ir(L_{B86})$ | 0.92 | 32 |
| Example | 9 | Comp $(L_{A147})_2Ir(L_{B109})$ | 0.92 | 33 |
| Example | 10 | Comp $(L_{A147})_2Ir(L_{B88})$ | 0.94 | 33 |

The observed increase in the device EQE with increasing emitter orientation factor show that EQE is in direct correlation with the emitter orientation.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula $(L_A)_mIr(L_B)_{3-m}$, wherein $L_A$ has a structure of Formula I

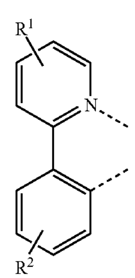

wherein m is 1 or 2;

wherein $R^1$ and $R^2$ each independently represent mono, di, tri, or tetra substitution, or no substitution;

wherein $R^1$ and $R^2$ are each independently hydrogen or a substituent selected from the group consisting of deuterium, C1 to C6 alkyl, C1 to C6 cycloalkyl, and partially or fully deuterated or fluorinated variants thereof; and wherein $L_B$ is selected from the group consisting of:

$L_{B1}$

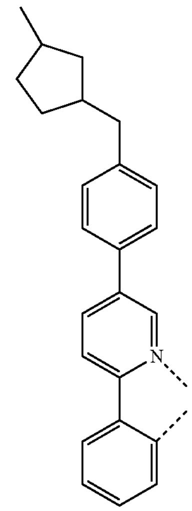

$L_{B2}$

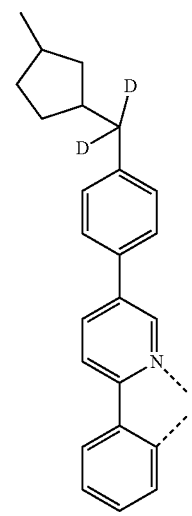

$L_{B3}$

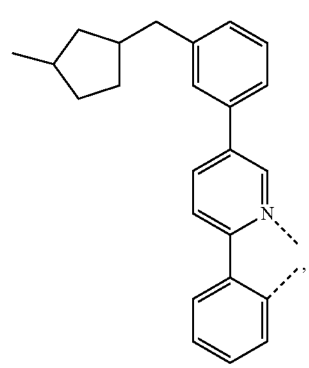

-continued
$L_{B4}$
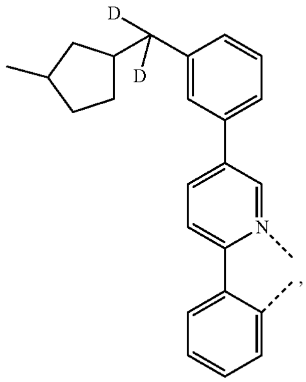
$L_{B5}$
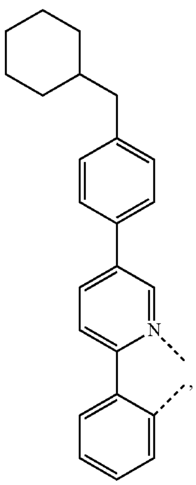
$L_{B6}$
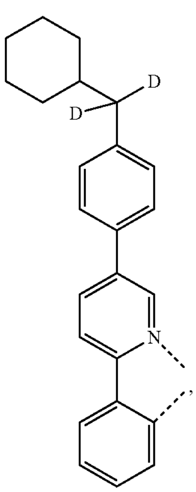
-continued
$L_{B7}$
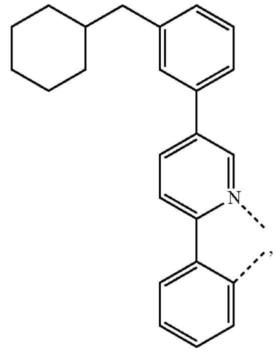
$L_{B8}$
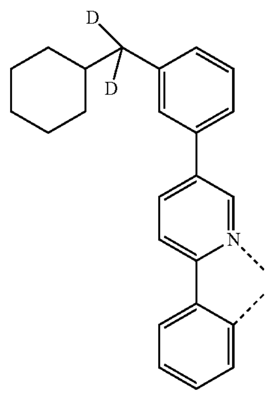
$L_{B9}$
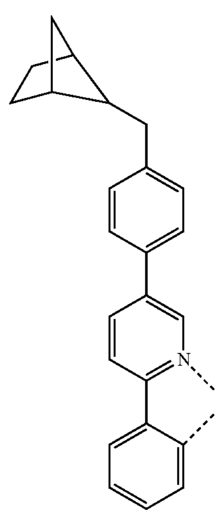

-continued
$L_{B10}$
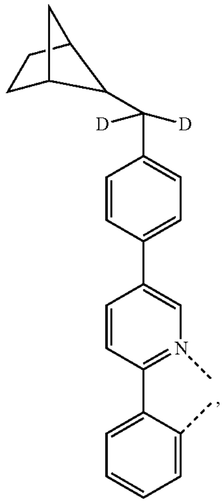
$L_{B11}$
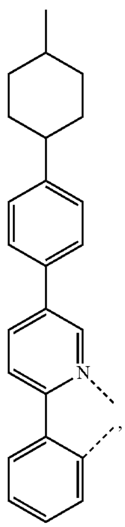
$L_{B12}$
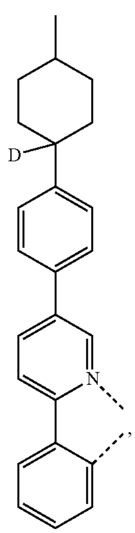
-continued
$L_{B13}$
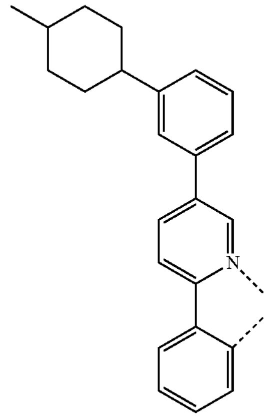
$L_{B14}$
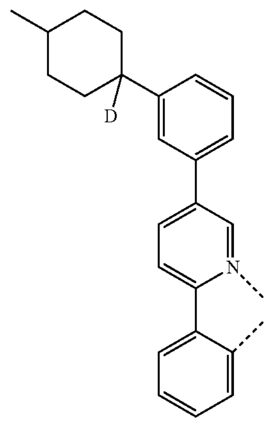
$L_{B15}$
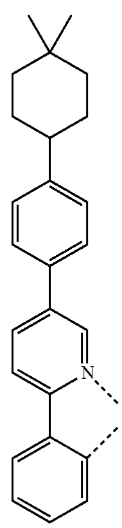

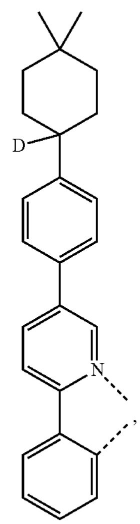
$L_{B16}$
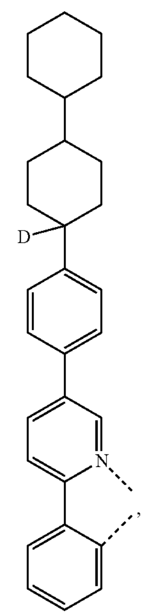
$L_{B18}$
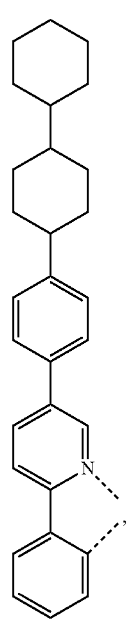
$L_{B17}$
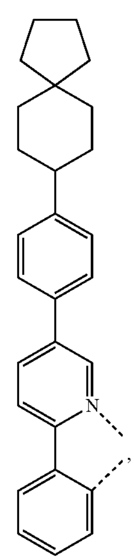
$L_{B19}$

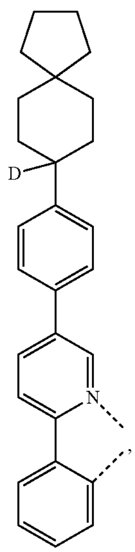
$L_{B20}$
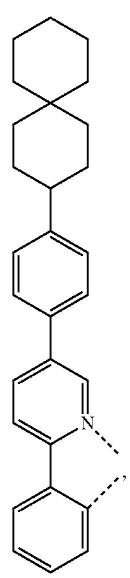
$L_{B21}$
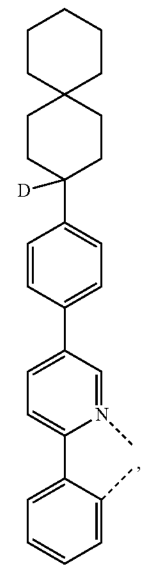
$L_{B22}$
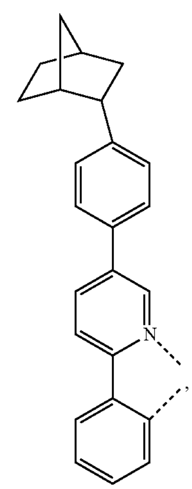
$L_{B23}$
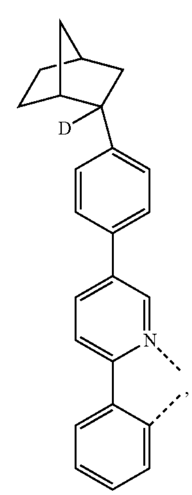
$L_{B24}$ -continued
$L_{B25}$
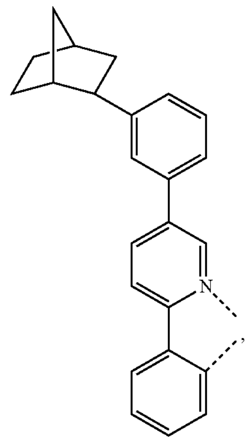
$L_{B26}$
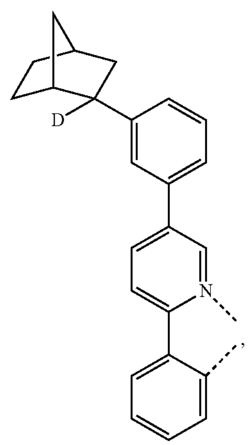
$L_{B27}$
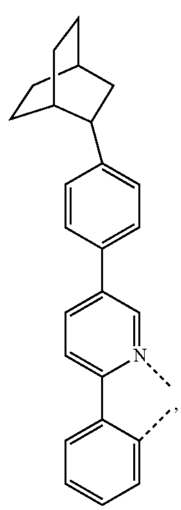
-continued
$L_{B28}$
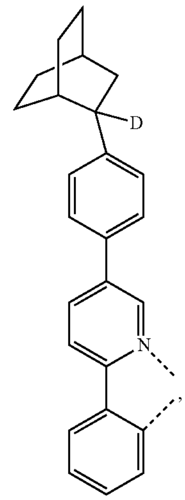
$L_{B29}$
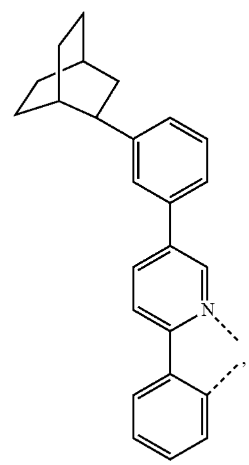
$L_{B30}$
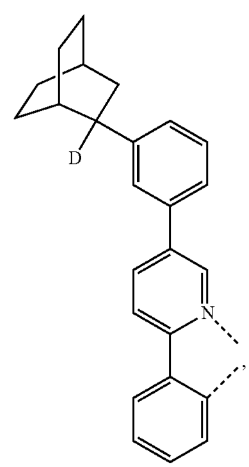

-continued
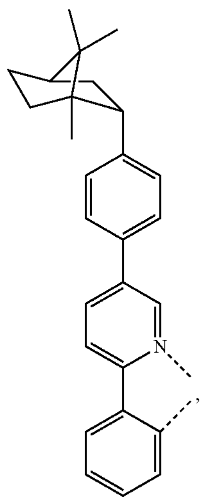
$L_{B31}$
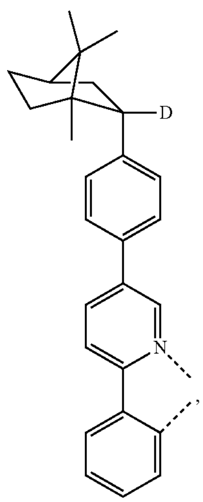
$L_{B32}$
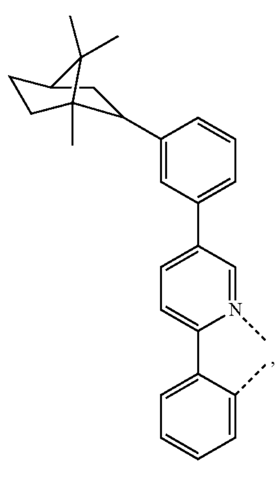
$L_{B33}$
-continued
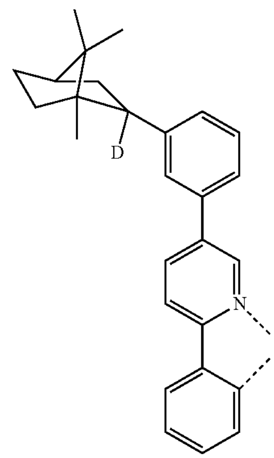
$L_{B34}$
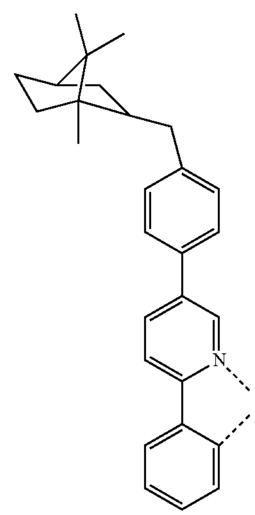
$L_{B35}$
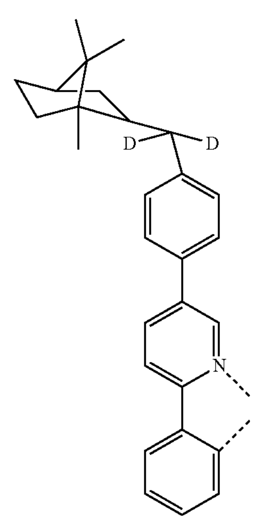
$L_{B36}$ -continued
$L_{B37}$
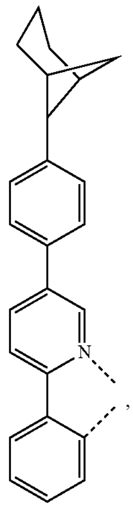
$L_{B38}$
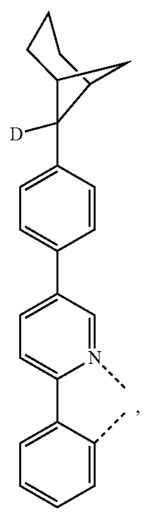
$L_{B39}$
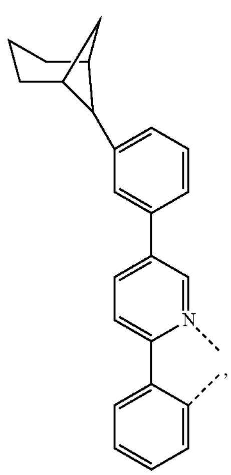
-continued
$L_{B40}$
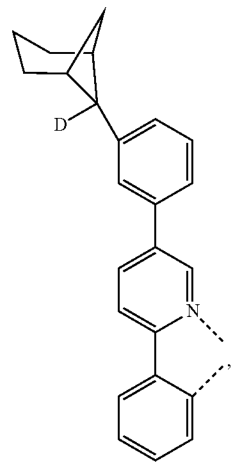
$L_{B41}$
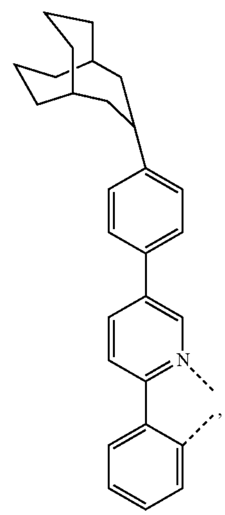
$L_{B42}$
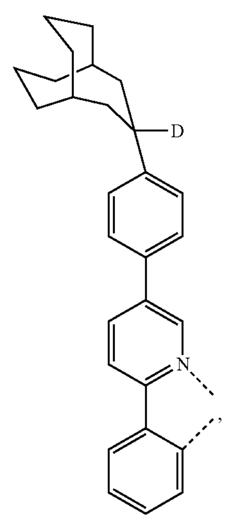

-continued
$L_{B43}$
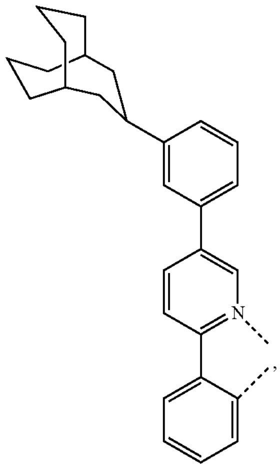
$L_{B44}$
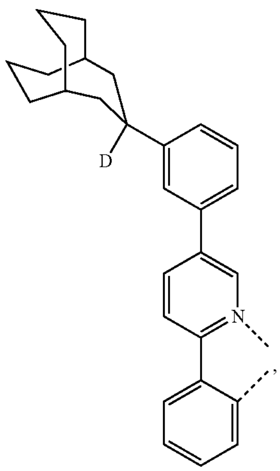
$L_{B45}$
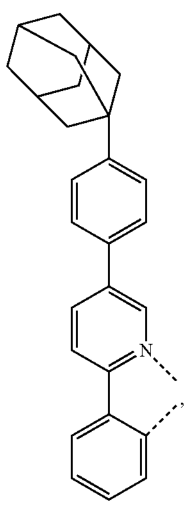
-continued
$L_{B46}$
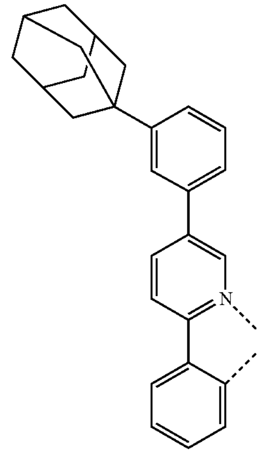
$L_{B47}$
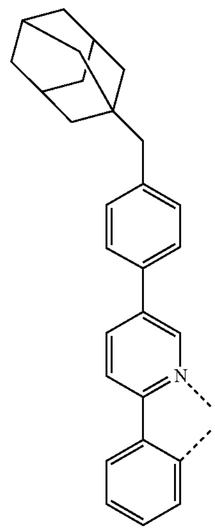
$L_{B48}$
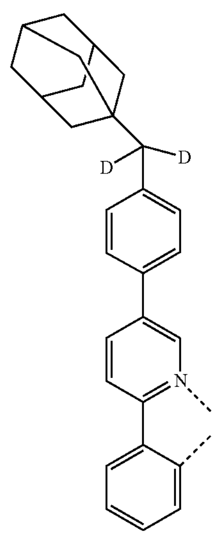

-continued
$L_{B49}$
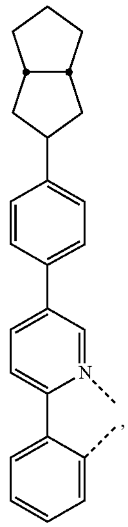
$L_{B50}$
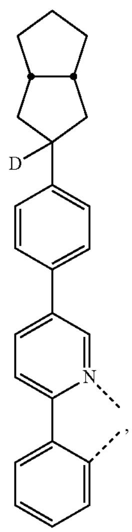
$L_{B51}$
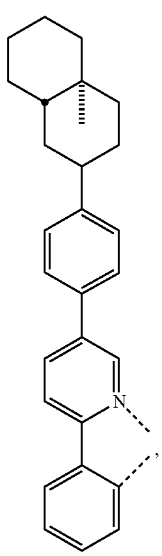
-continued
$L_{B52}$
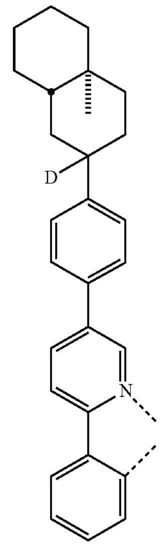
$L_{B53}$
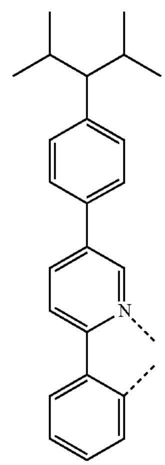
$L_{B54}$
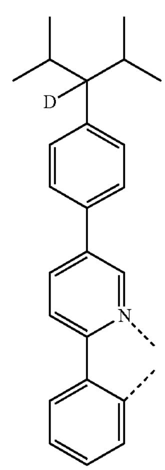

-continued
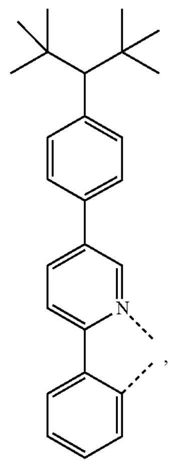
$L_{B55}$
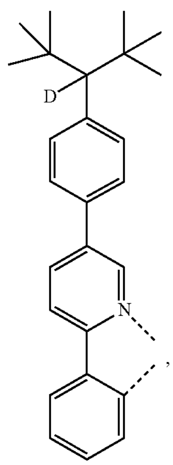
$L_{B56}$
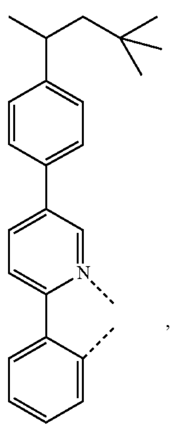
$L_{B57}$
-continued
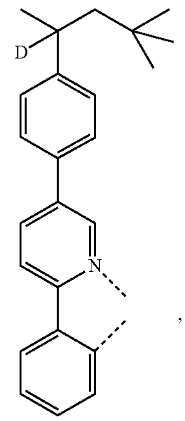
$L_{B58}$
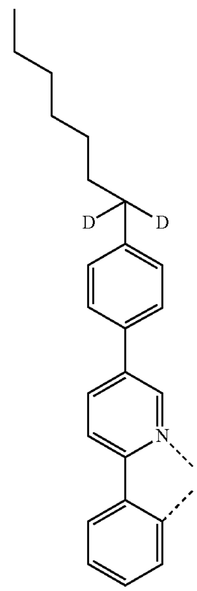
$L_{B60}$
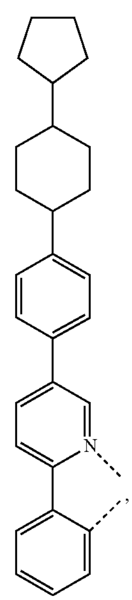
$L_{B61}$ -continued
LB62
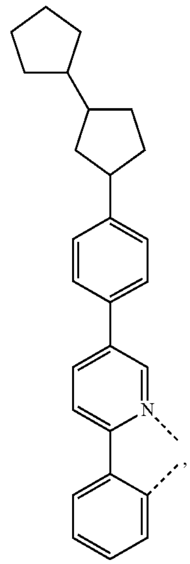
LB63
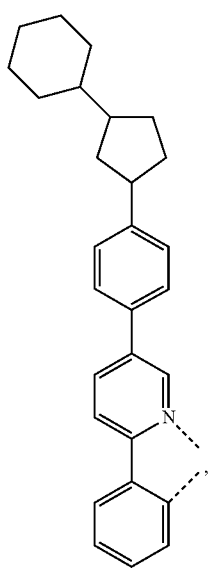
-continued
LB64
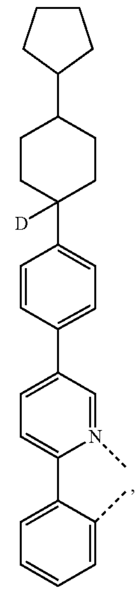
LB65
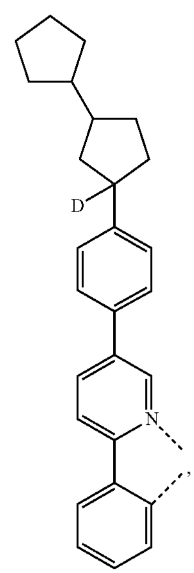

-continued
$L_{B66}$
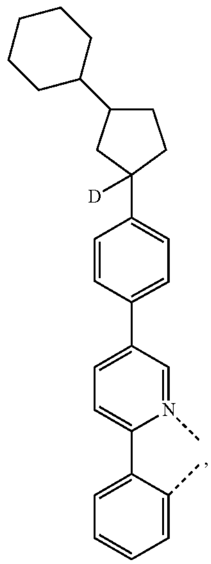
$L_{B67}$
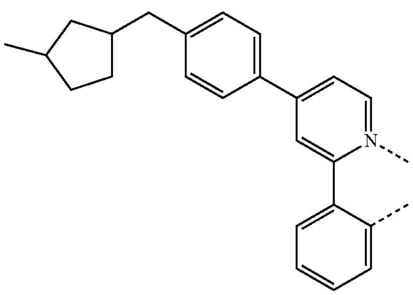
$L_{B68}$
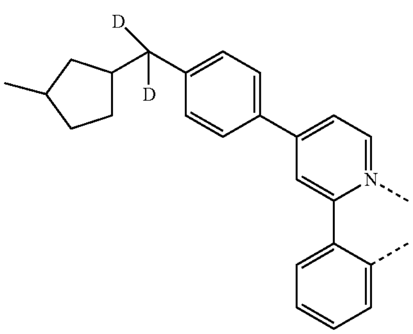
$L_{B69}$
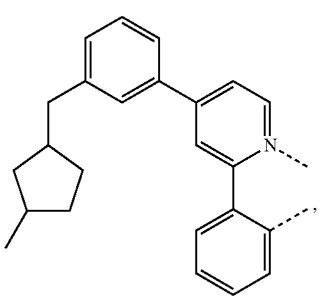
-continued
$L_{B70}$
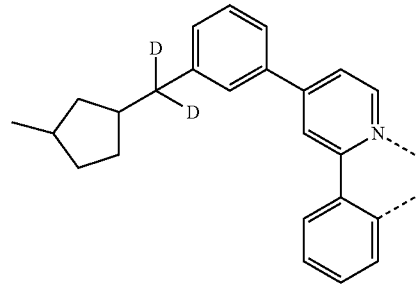
$L_{B71}$
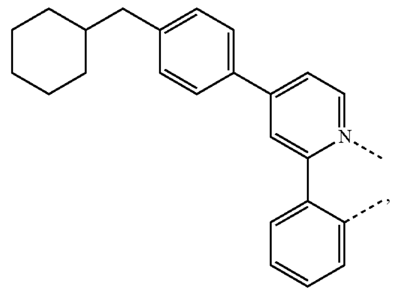
$L_{B72}$
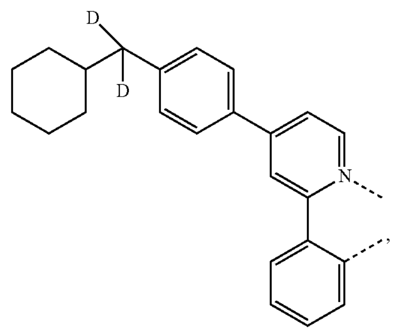
$L_{B73}$
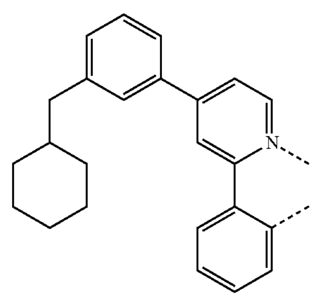
$L_{B74}$
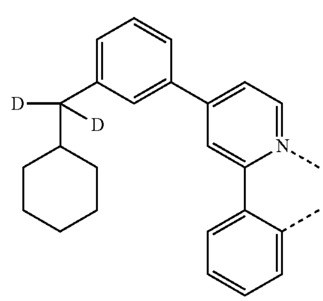

$L_{B75}$
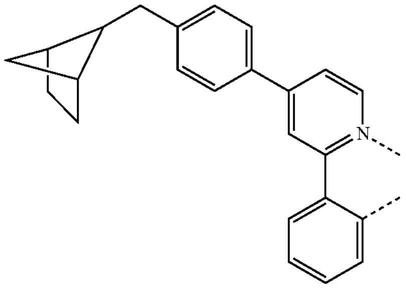
$L_{B76}$
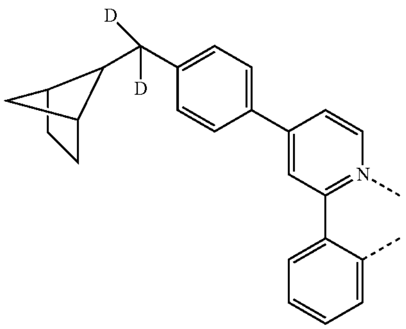
$L_{B77}$
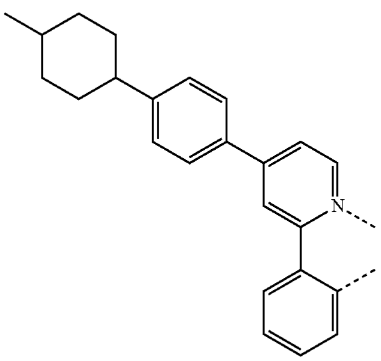
$L_{B78}$
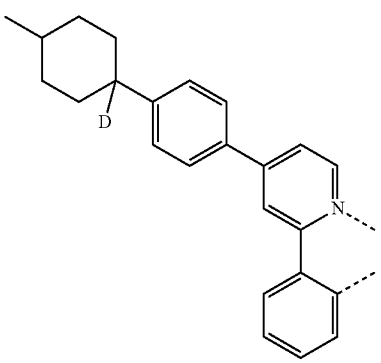
$L_{B79}$
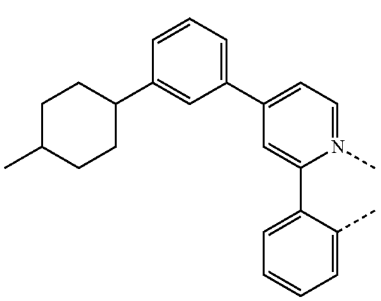
$L_{B80}$
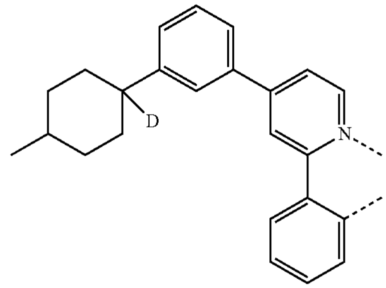
$L_{B81}$
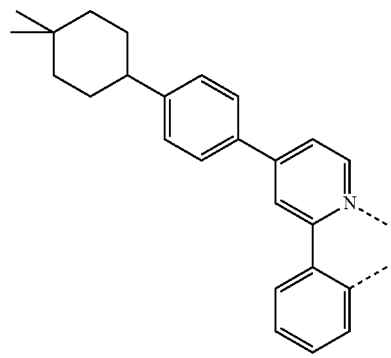
$L_{B82}$
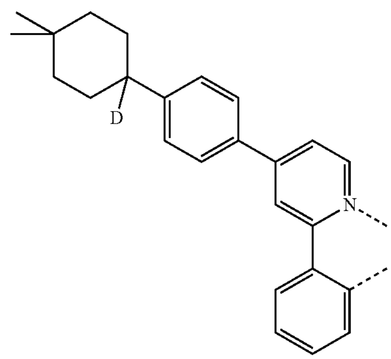
$L_{B83}$
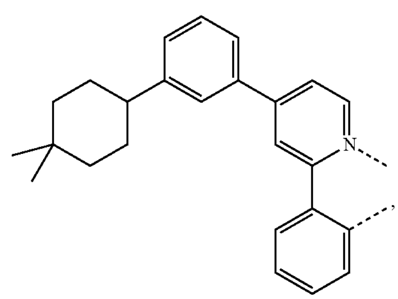
$L_{B84}$
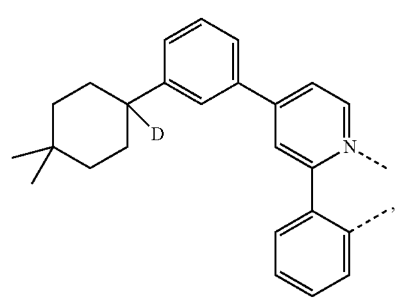

-continued
$L_{B85}$
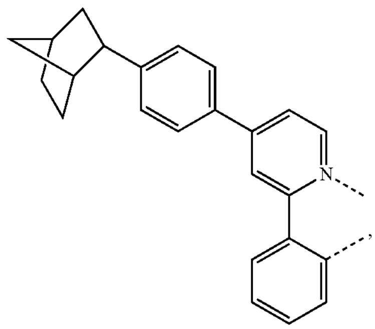
$L_{B86}$
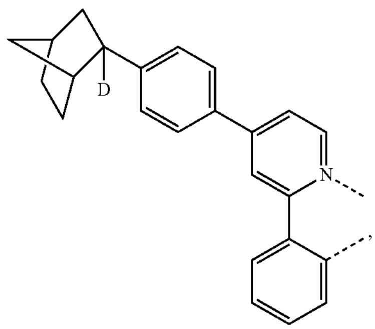
$L_{B89}$
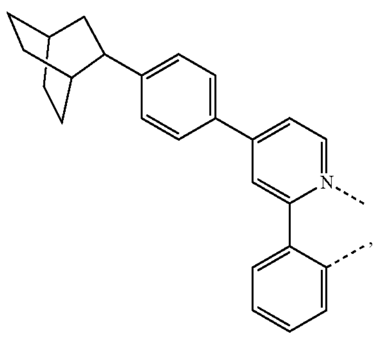
$L_{B90}$
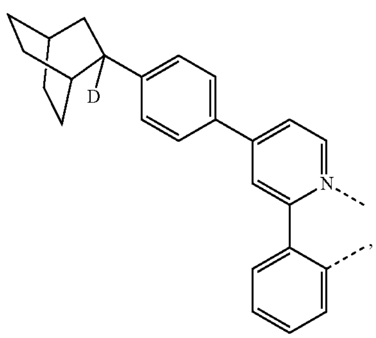
$L_{B91}$
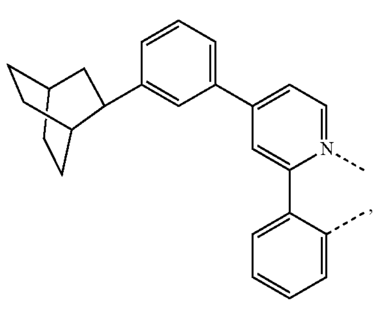
-continued
$L_{B92}$
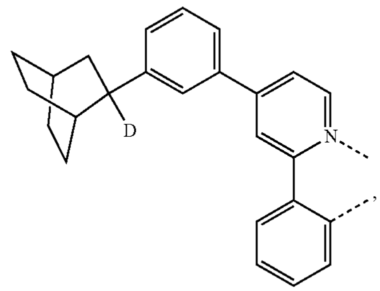
$L_{B93}$
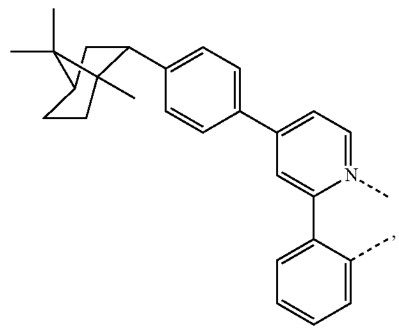
$L_{B94}$
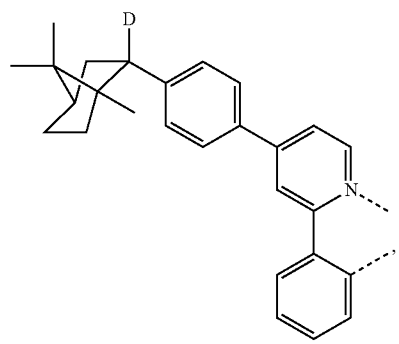
$L_{B95}$
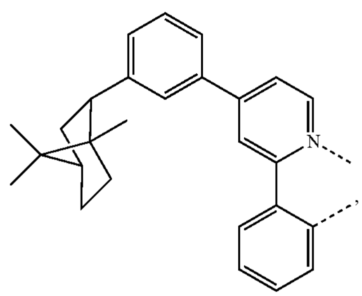
$L_{B96}$
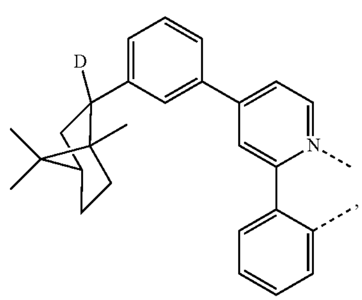

$L_{B97}$
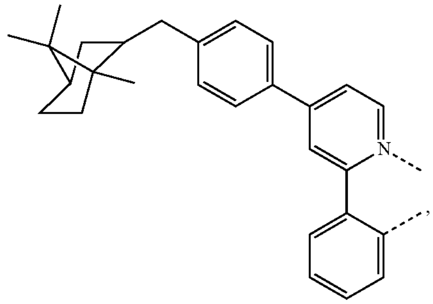
$L_{B98}$
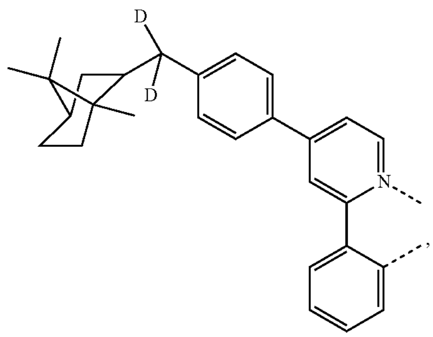
$L_{B99}$
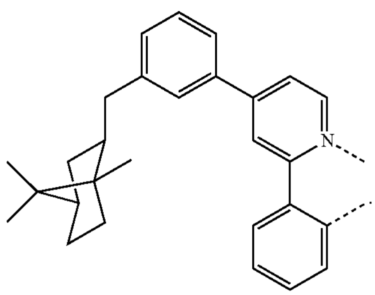
$L_{B100}$
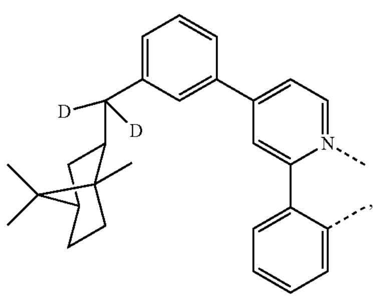
$L_{B101}$
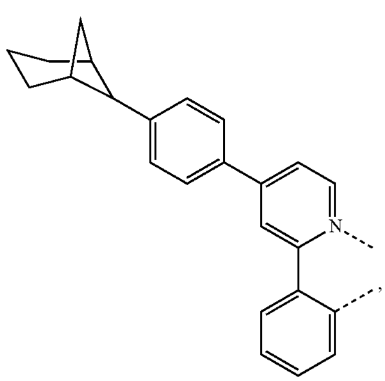
$L_{B102}$
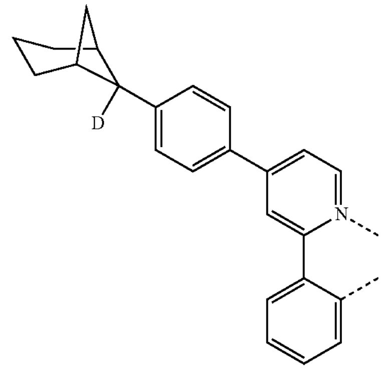
$L_{B103}$
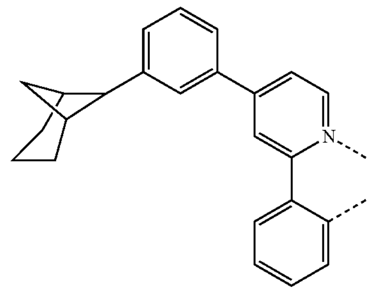
$L_{B104}$
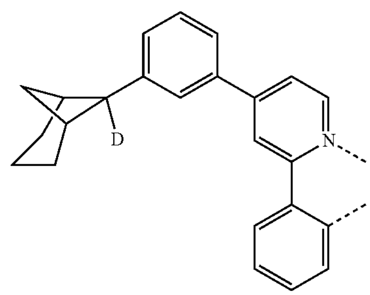
$L_{B105}$
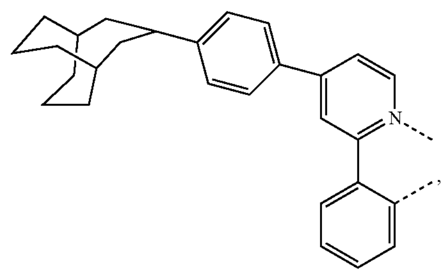
$L_{B106}$
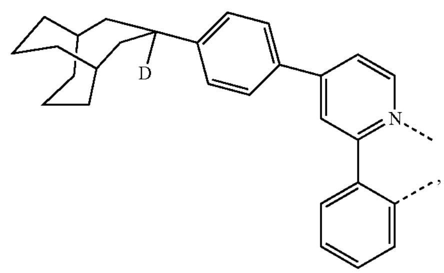

-continued
$L_{B107}$
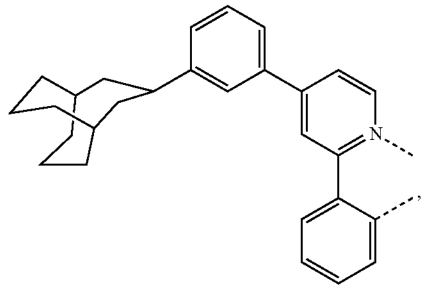
$L_{B108}$
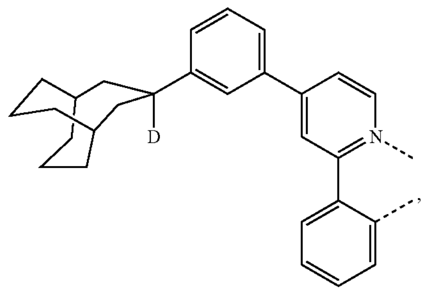
$L_{B109}$
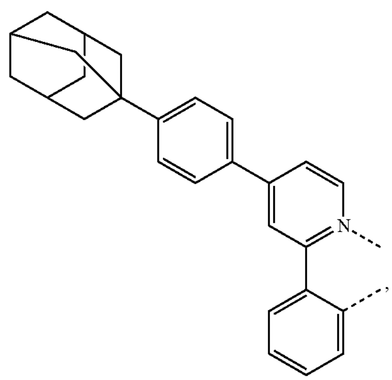
$L_{B110}$
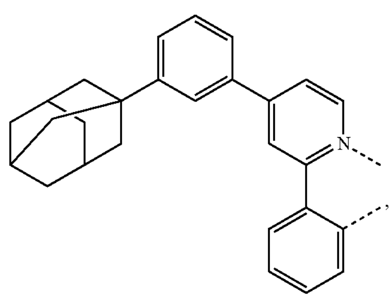
$L_{B111}$
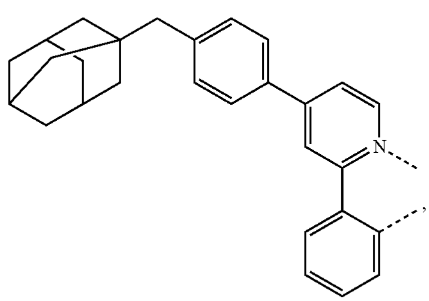
-continued
$L_{B112}$
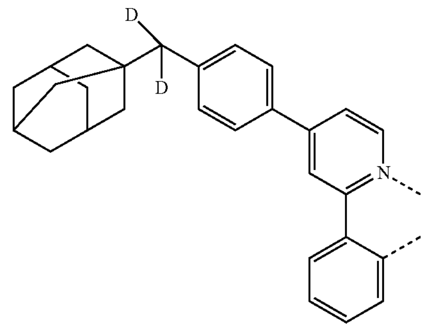
$L_{B113}$
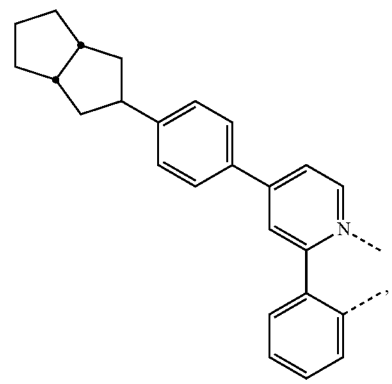
$L_{B114}$
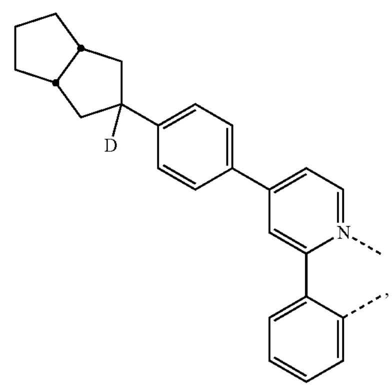
$L_{B115}$
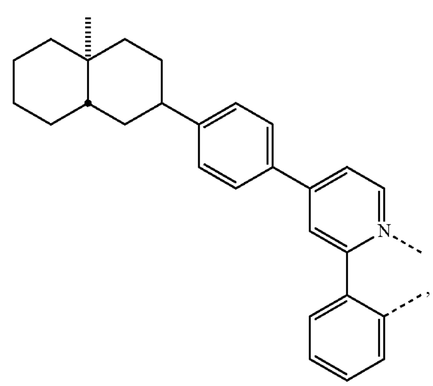

$L_{B116}$
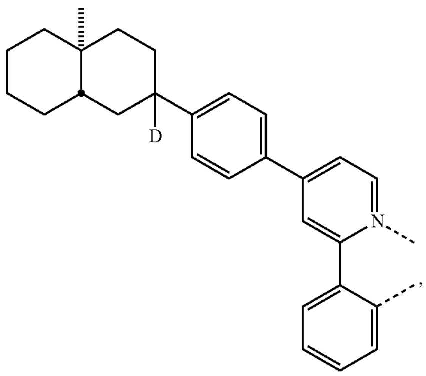
$L_{B117}$
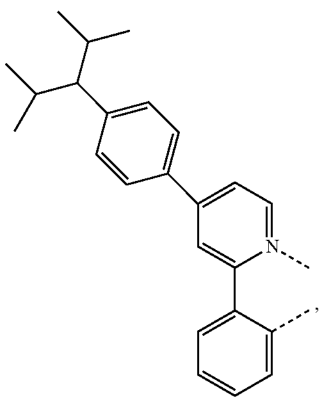
$L_{B118}$
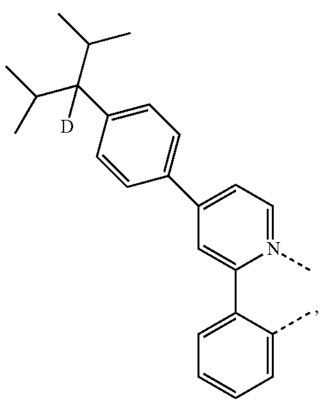
$L_{B119}$
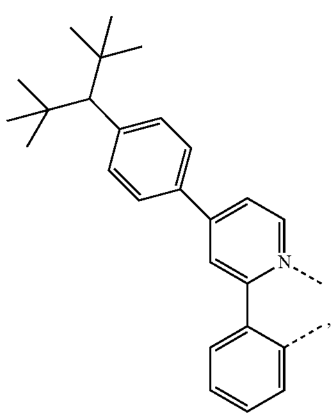
$L_{B120}$
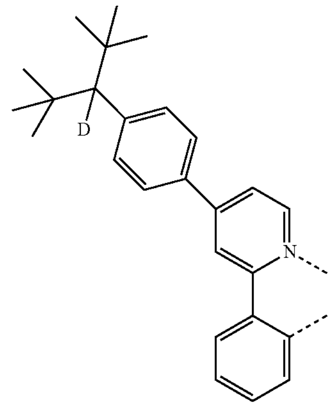
$L_{B121}$
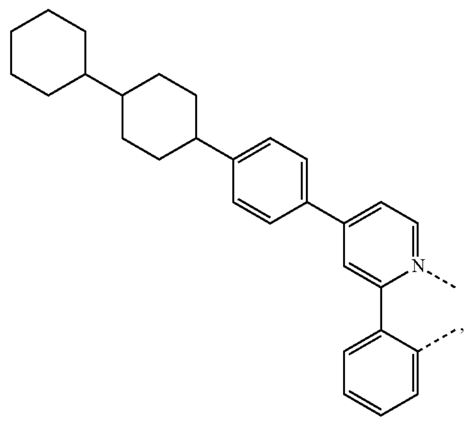
$L_{B122}$
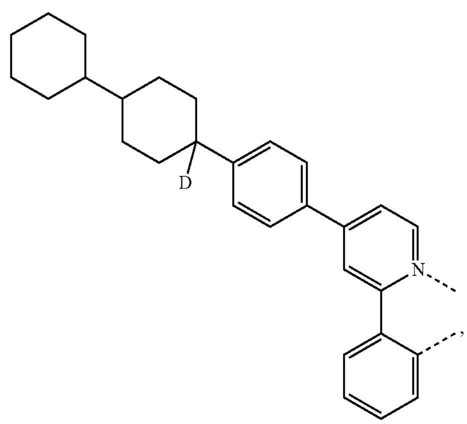
$L_{B123}$
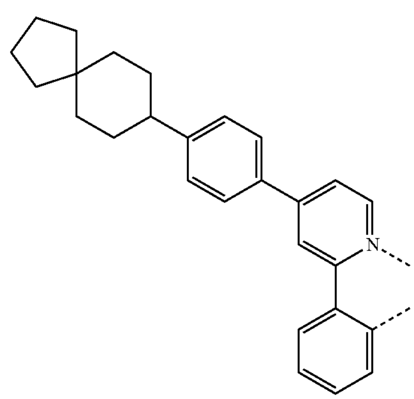

-continued
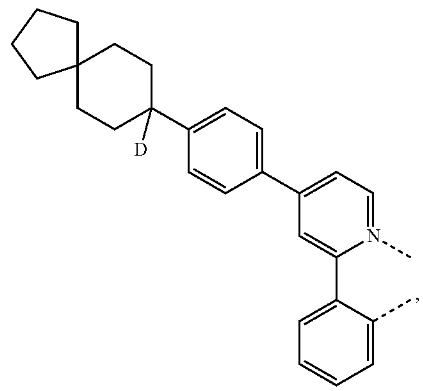
$L_{B124}$
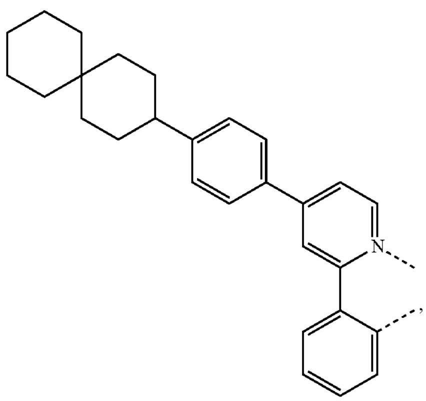
$L_{B125}$
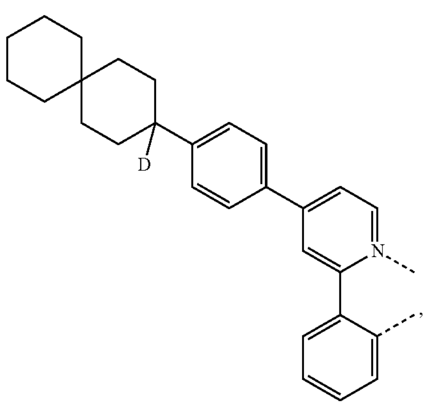
$L_{B126}$
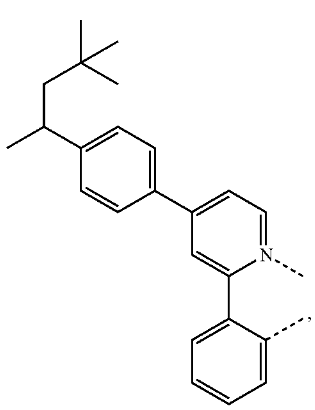
$L_{B127}$
-continued
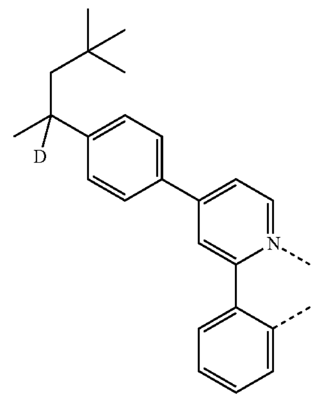
$L_{B128}$
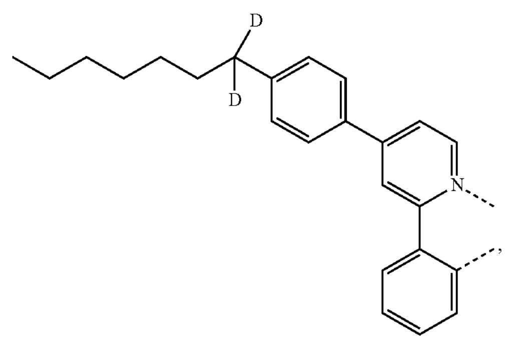
$L_{B132}$
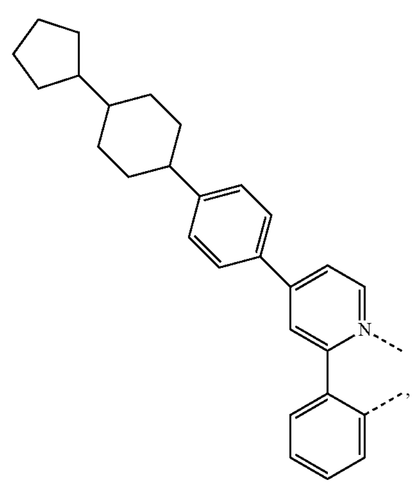
$L_{B133}$ -continued
$L_{B134}$
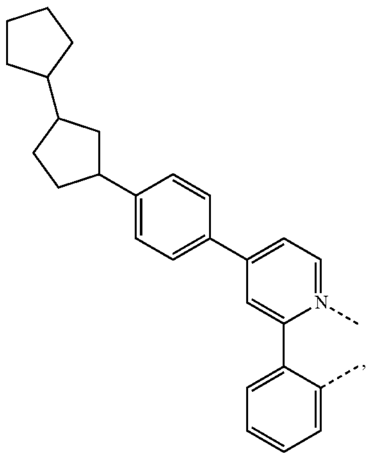
$L_{B135}$
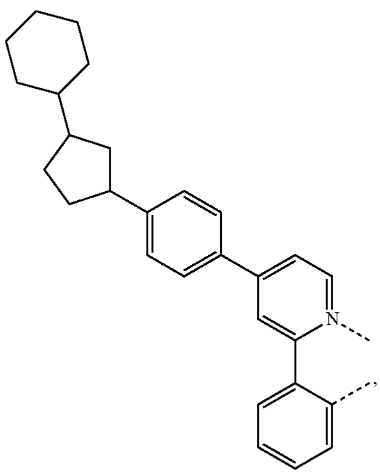
$L_{B136}$
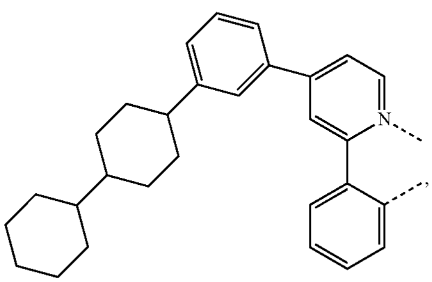
$L_{B137}$
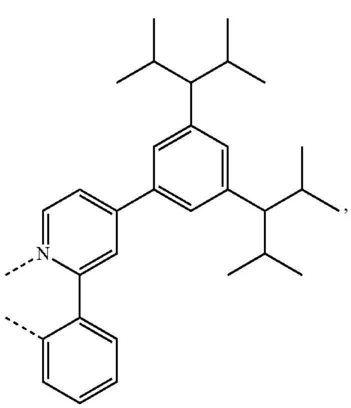
-continued
$L_{B138}$
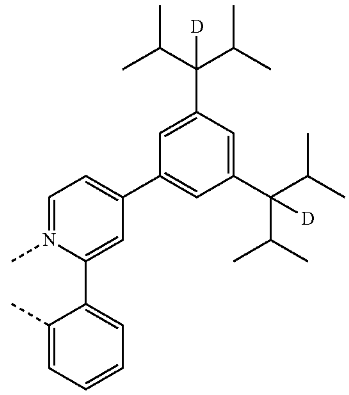
$L_{B177}$
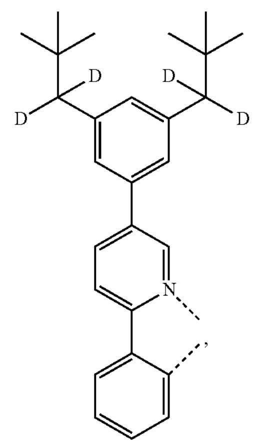
and
$L_{B223}$
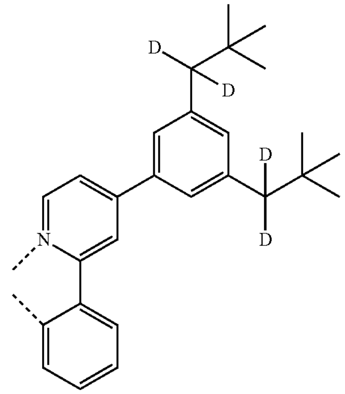
2. The compound of claim 1, wherein $L_B$ is selected from the group consisting of:

-continued
$L_{B1}$
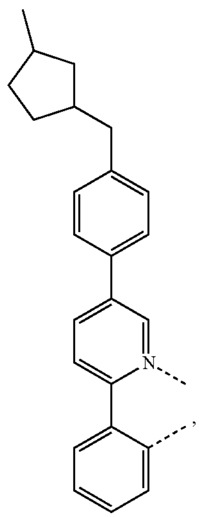
$L_{B2}$
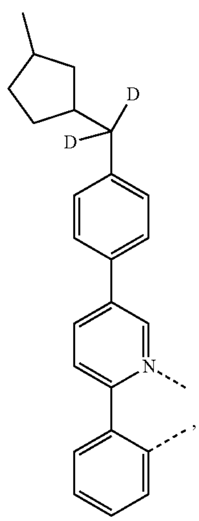
$L_{B3}$
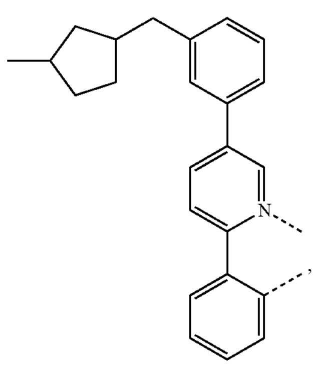
$L_{B4}$
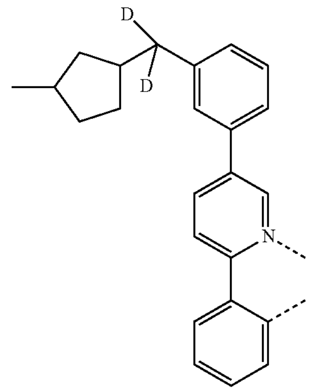
$L_{B5}$
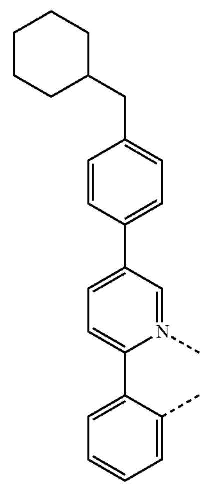
$L_{B6}$
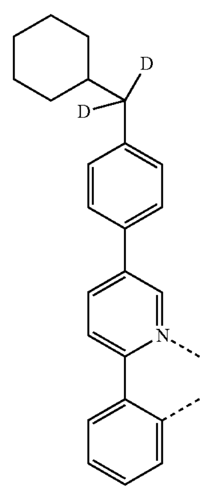

-continued
L$_{B7}$
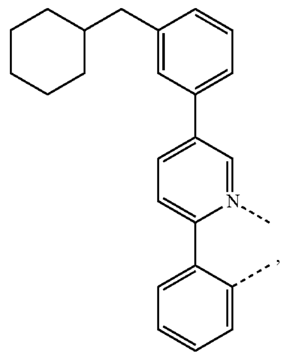
L$_{B8}$
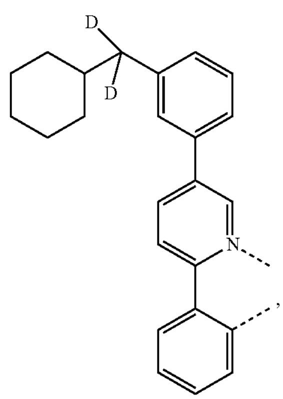
L$_{B9}$
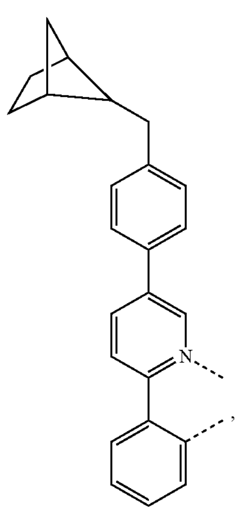
-continued
L$_{B10}$
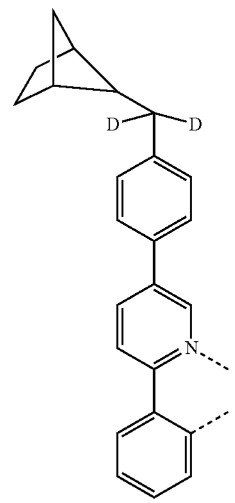
L$_{B11}$
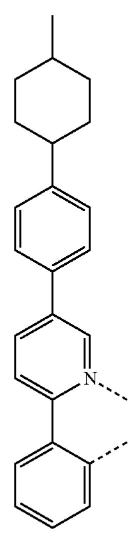
L$_{B12}$
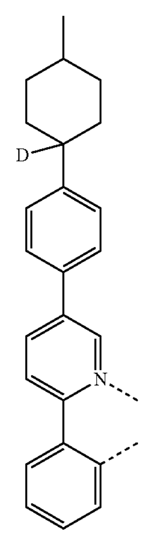

-continued
$L_{B13}$
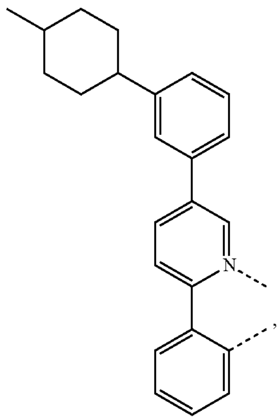
$L_{B14}$
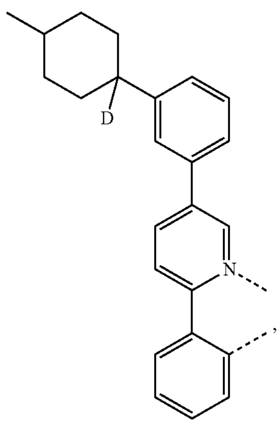
$L_{B15}$
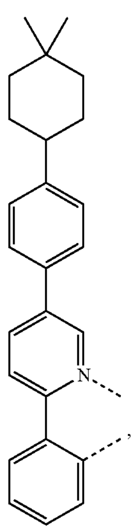
-continued
$L_{B16}$
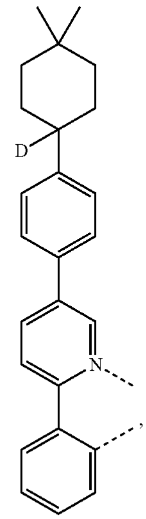
$L_{B17}$
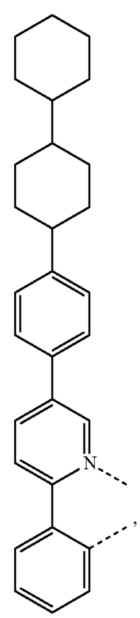

L$_{B18}$
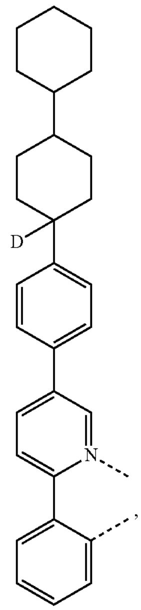
L$_{B20}$
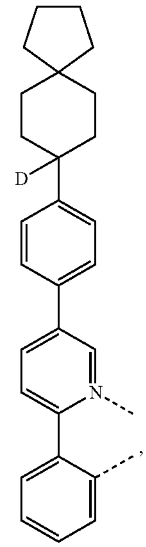
L$_{B19}$
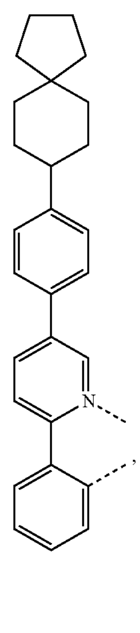
L$_{B21}$
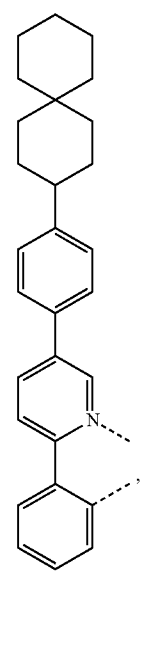

-continued
$L_{B22}$
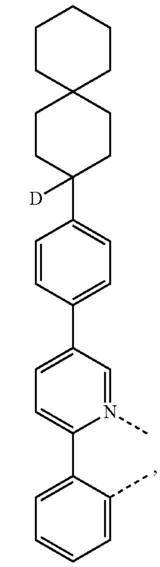
$L_{B23}$
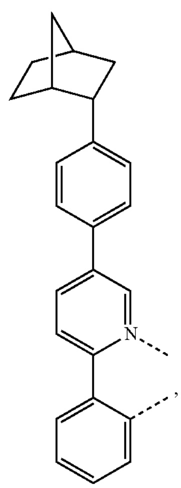
$L_{B24}$
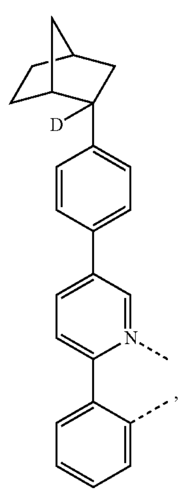
-continued
$L_{B25}$
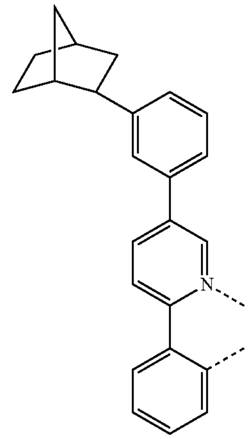
$L_{B26}$
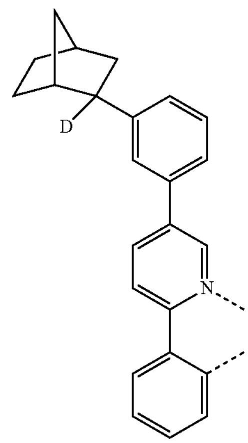
$L_{B27}$
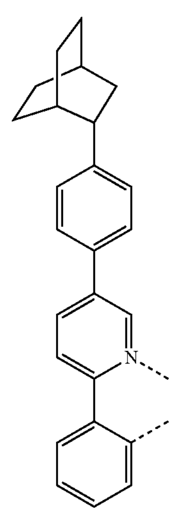

-continued
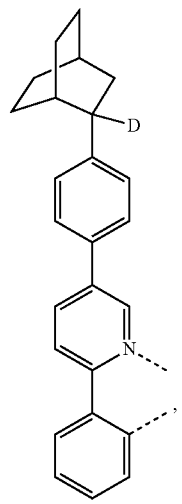
$L_{B28}$
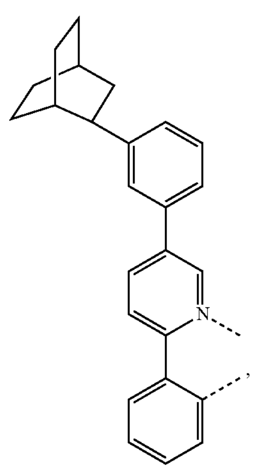
$L_{B29}$
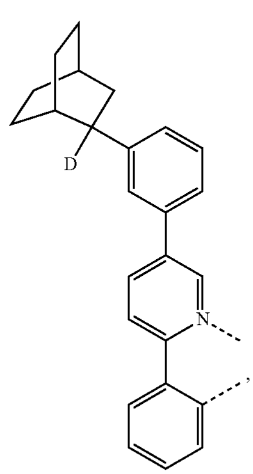
$L_{B30}$
-continued
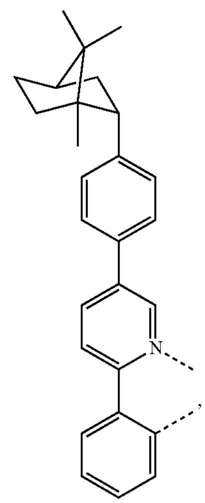
$L_{B31}$
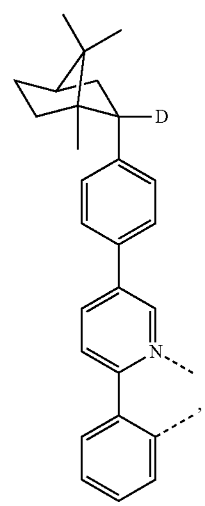
$L_{B32}$
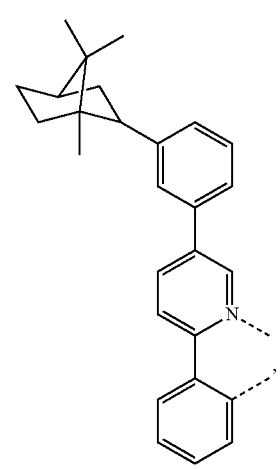
$L_{B33}$ -continued
L$_{B34}$
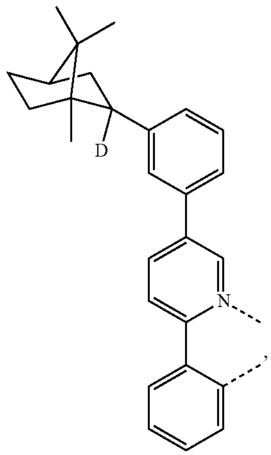
L$_{B35}$
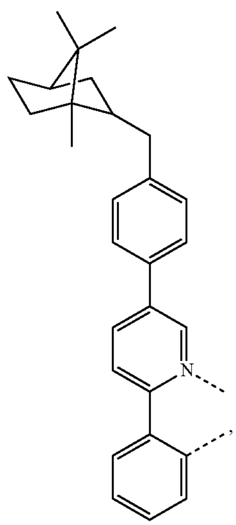
L$_{B36}$
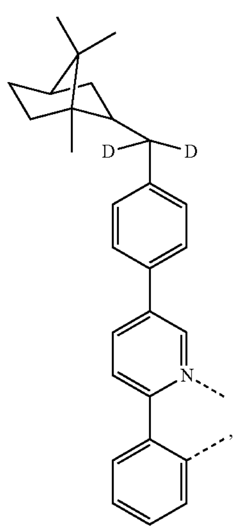
-continued
L$_{B37}$
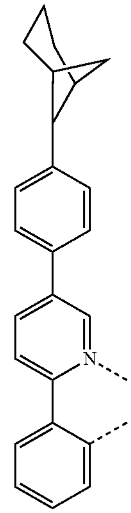
L$_{B38}$
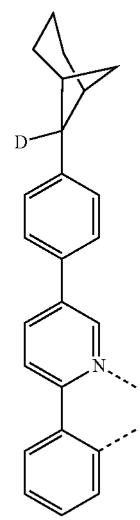
L$_{B39}$
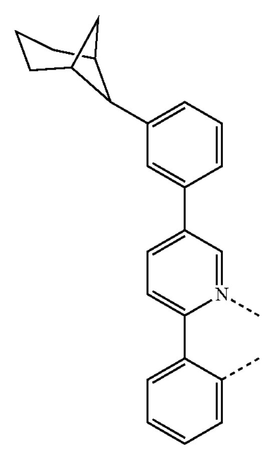

-continued
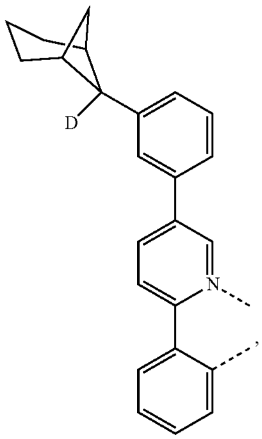
$L_{B40}$
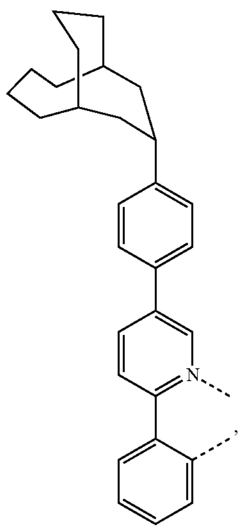
$L_{B41}$
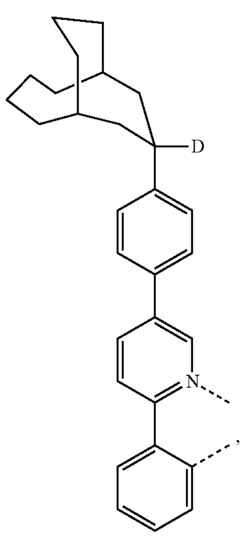
$L_{B42}$
-continued
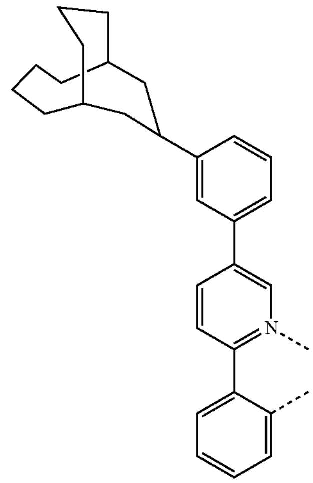
$L_{B43}$
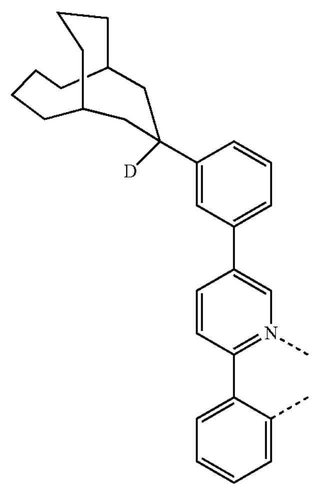
$L_{B44}$
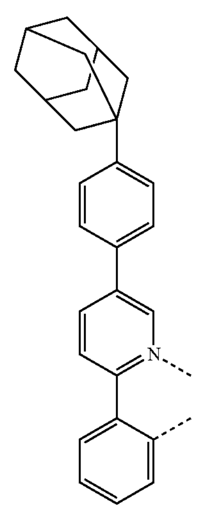
$L_{B45}$ $L_{B46}$
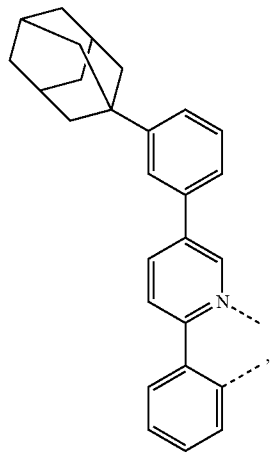
$L_{B47}$
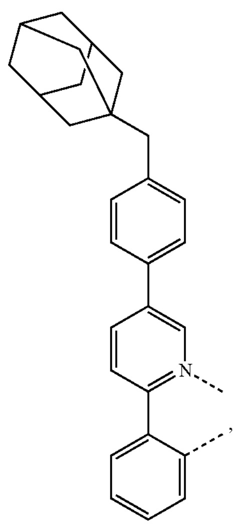
$L_{B48}$
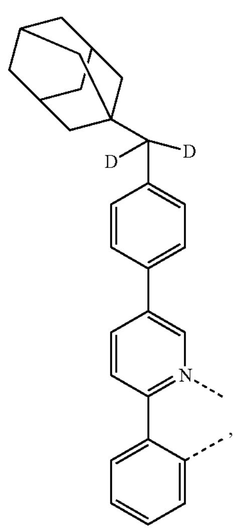
$L_{B49}$
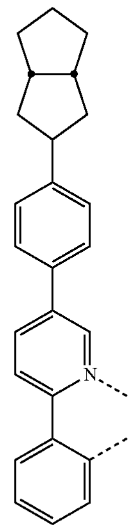
$L_{B50}$
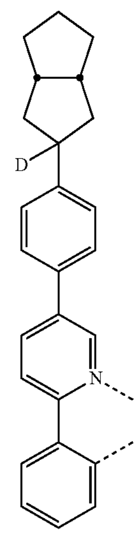
$L_{B51}$
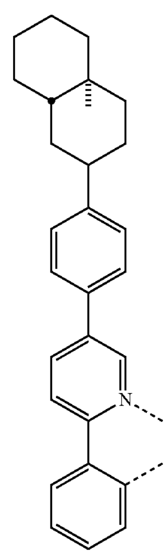

-continued
$L_{B52}$
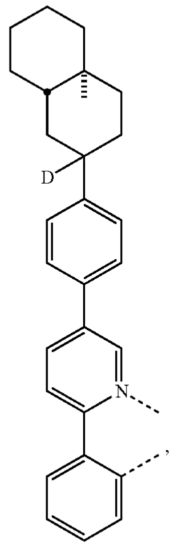
$L_{B54}$
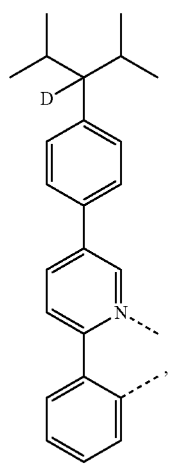
$L_{B56}$
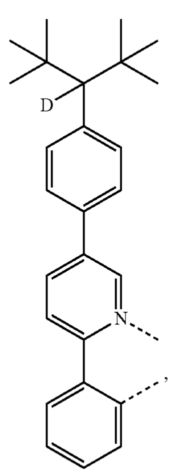
-continued
$L_{B58}$
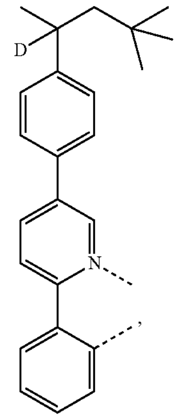
$L_{B60}$
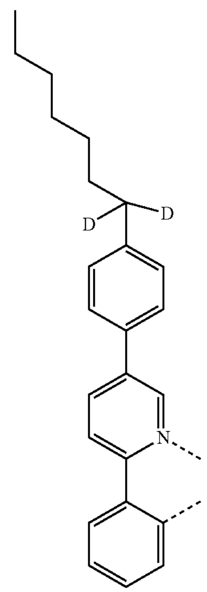
$L_{B61}$
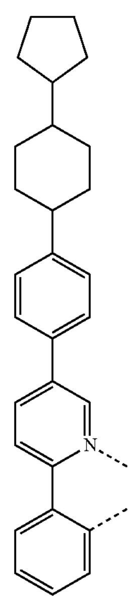

-continued
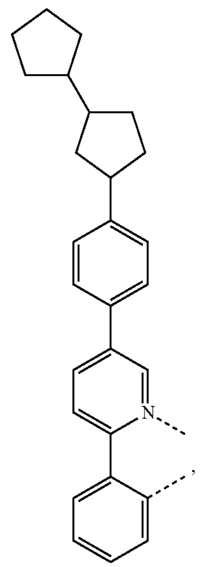
$L_{B62}$
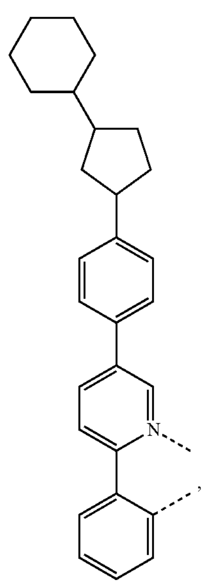
$L_{B63}$
-continued
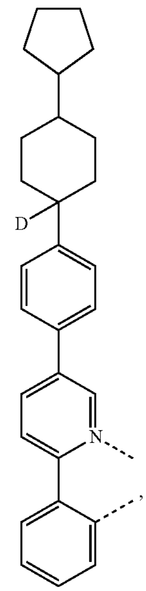
$L_{B64}$
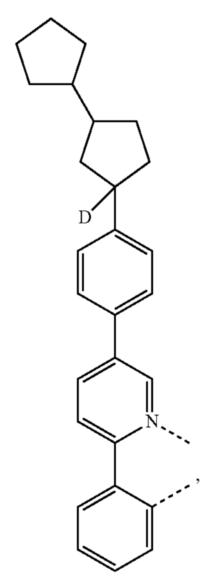
$L_{B65}$ -continued
$L_{B66}$
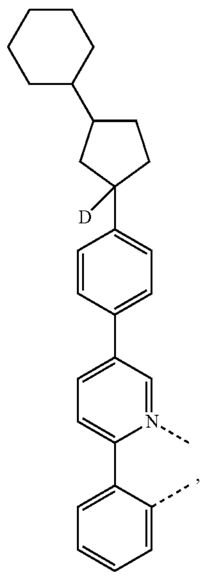
$L_{B67}$
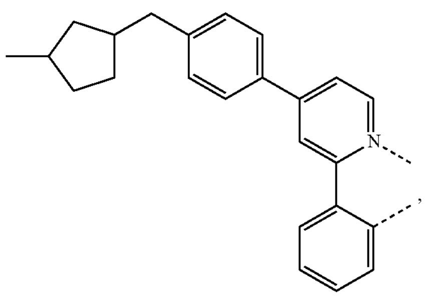
$L_{B68}$
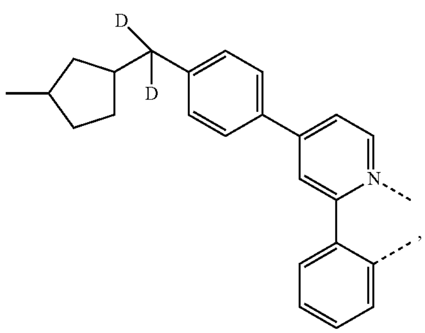
$L_{B69}$
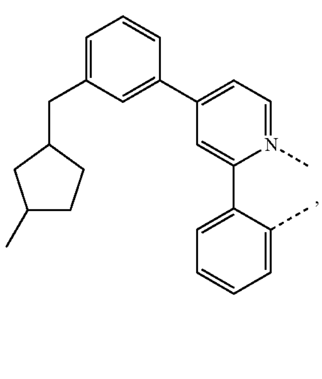
-continued
$L_{B70}$
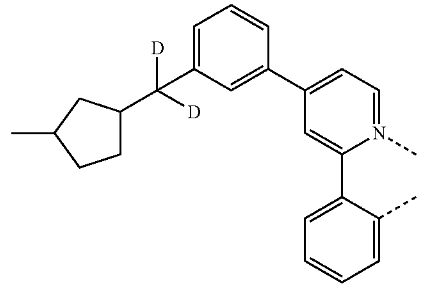
$L_{B71}$
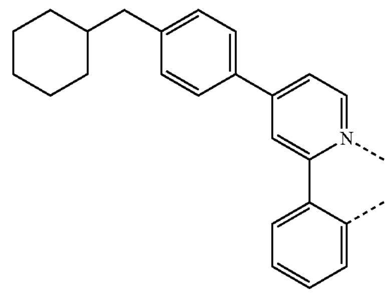
$L_{B72}$
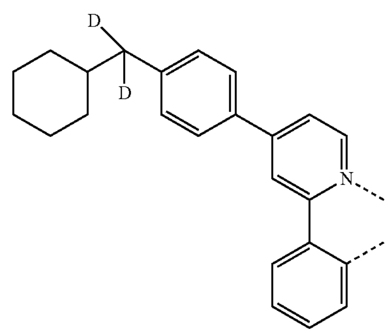
$L_{B73}$
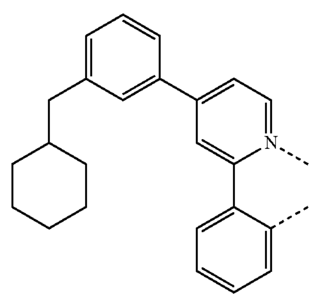
$L_{B74}$
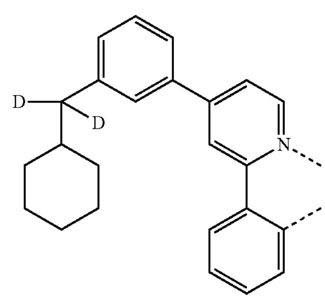

-continued
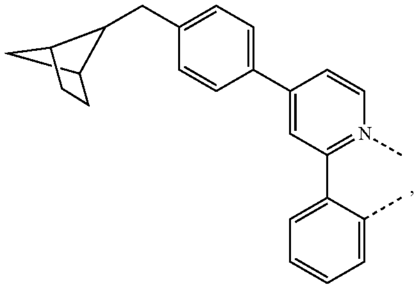
$L_{B75}$
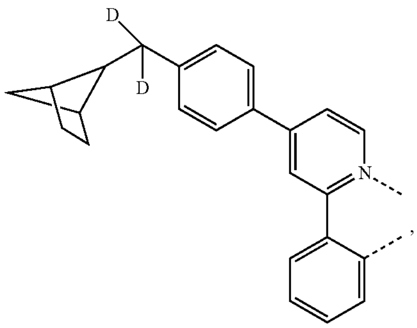
$L_{B76}$
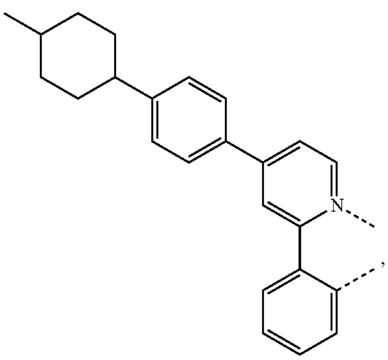
$L_{B77}$
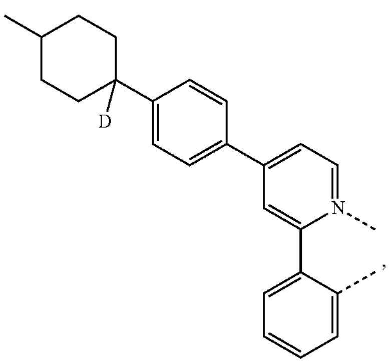
$L_{B78}$
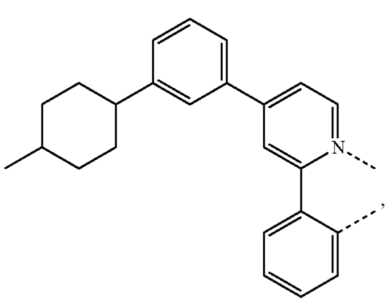
$L_{B79}$
-continued
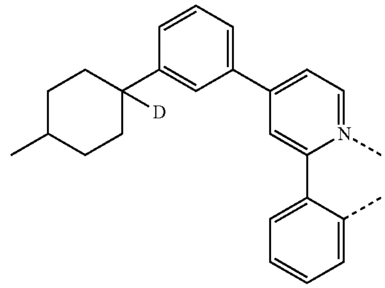
$L_{B80}$
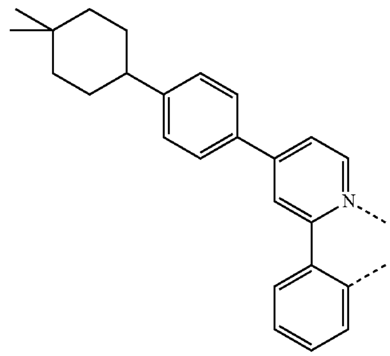
$L_{B81}$
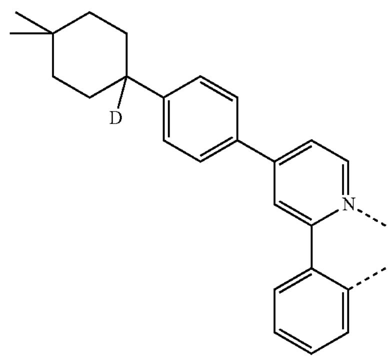
$L_{B82}$
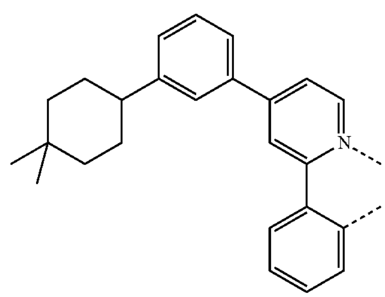
$L_{B83}$
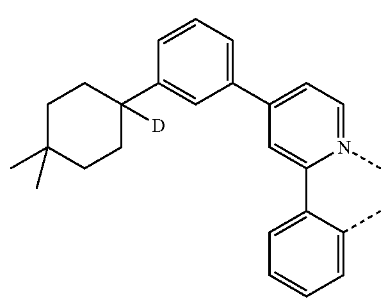
$L_{B84}$ -continued
$L_{B85}$
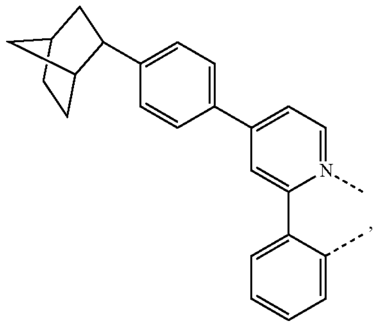
$L_{B86}$
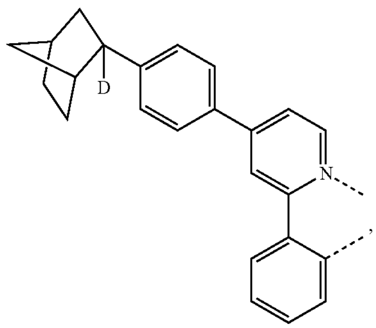
$L_{B89}$
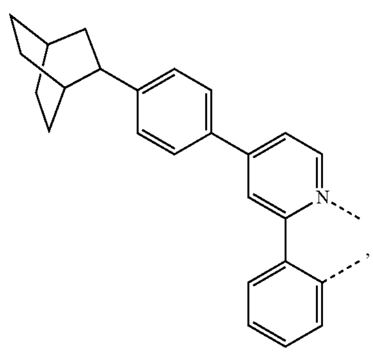
$L_{B90}$
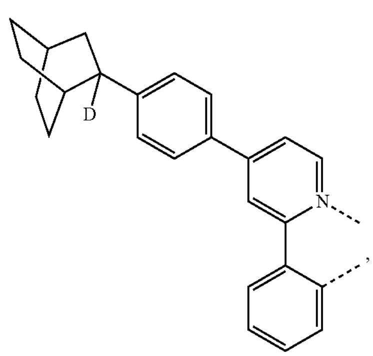
-continued
$L_{B91}$
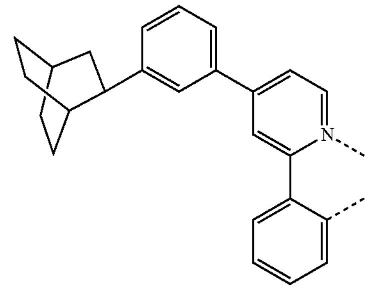
$L_{B92}$
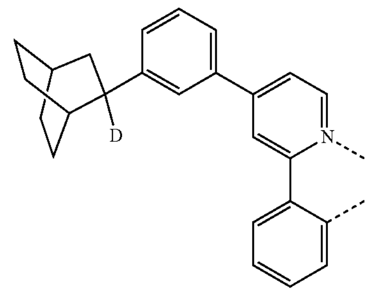
$L_{B93}$
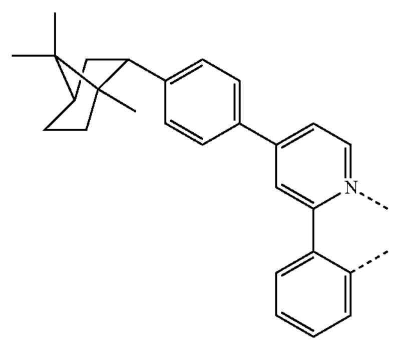
$L_{B94}$
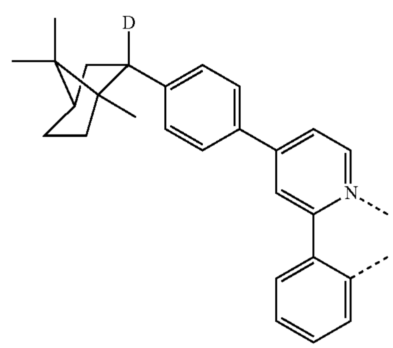
$L_{B95}$
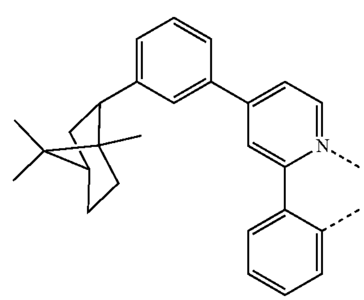

$L_{B96}$
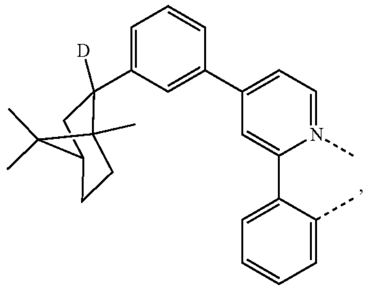
$L_{B97}$
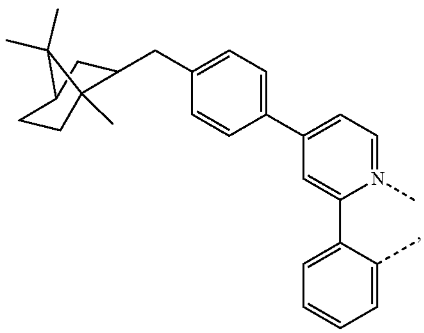
$L_{B98}$
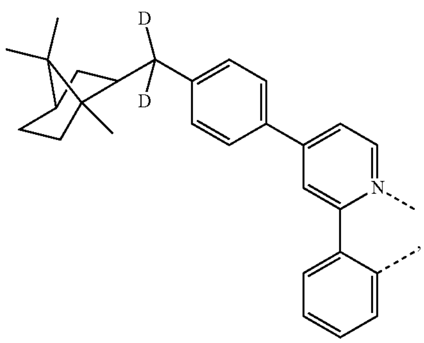
$L_{B99}$
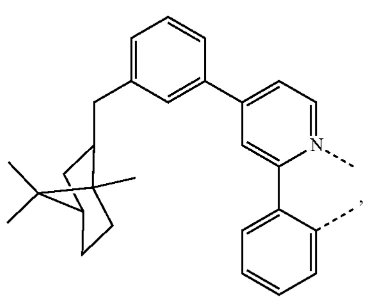
$L_{B100}$
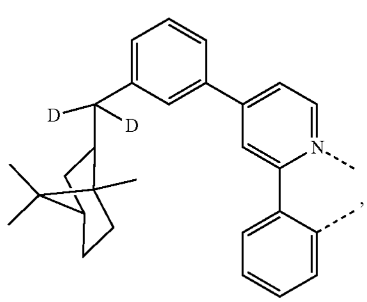
$L_{B101}$
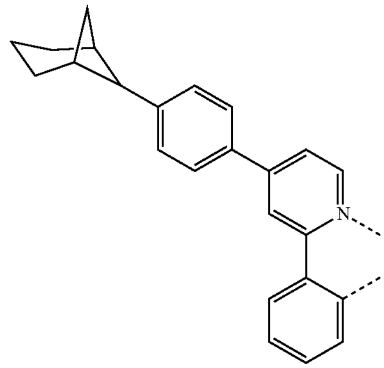
$L_{B102}$
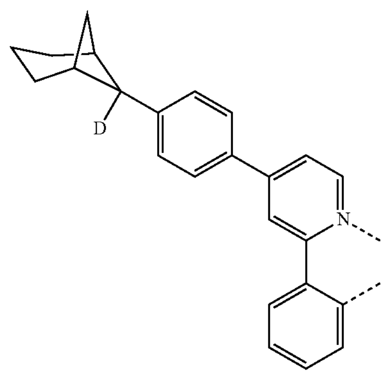
$L_{B103}$
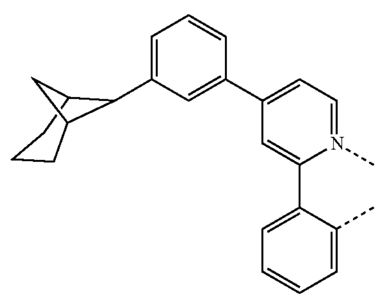
$L_{B104}$
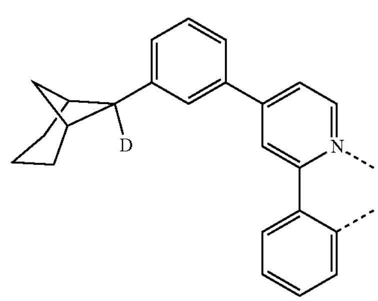

$L_{B105}$
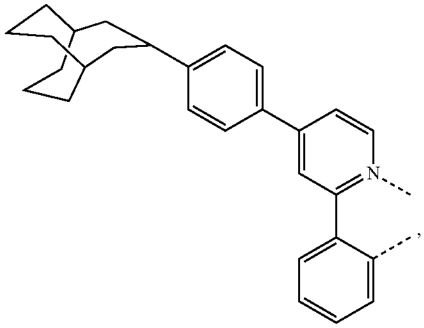
$L_{B106}$
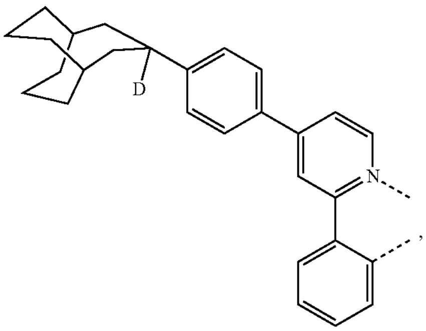
$L_{B107}$
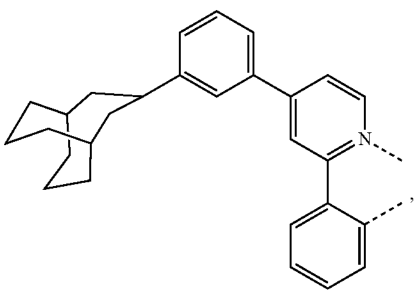
$L_{B108}$
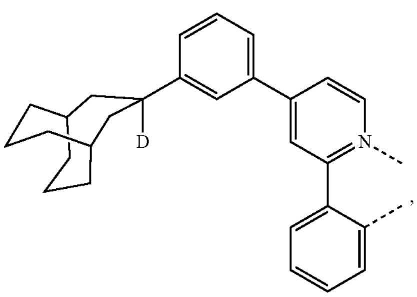
$L_{B109}$
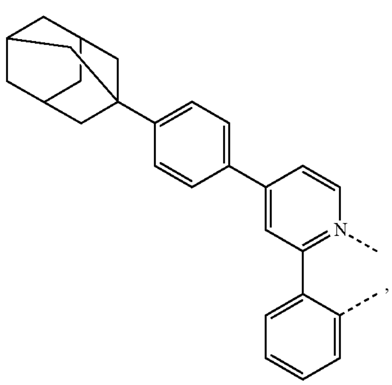
$L_{B110}$
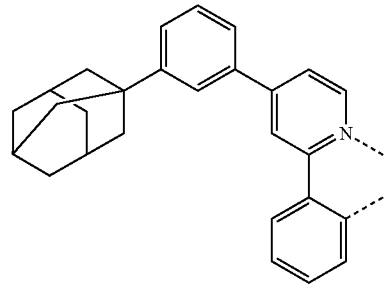
$L_{B111}$
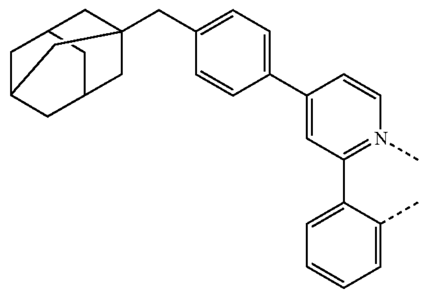
$L_{B112}$
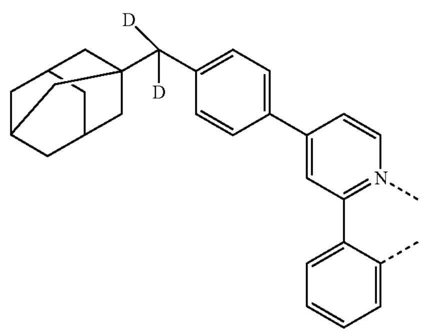
$L_{B113}$
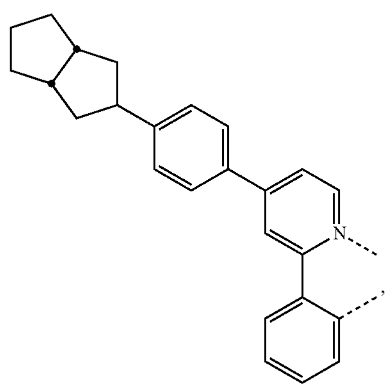

-continued
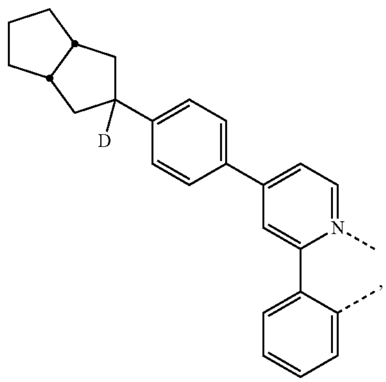
$L_{B114}$
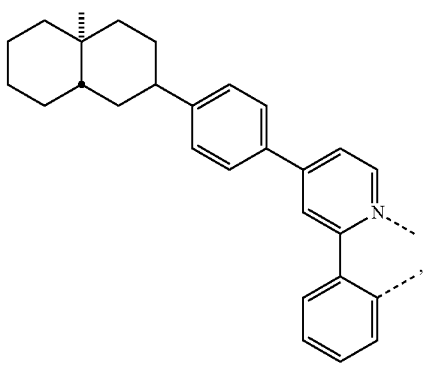
$L_{B115}$
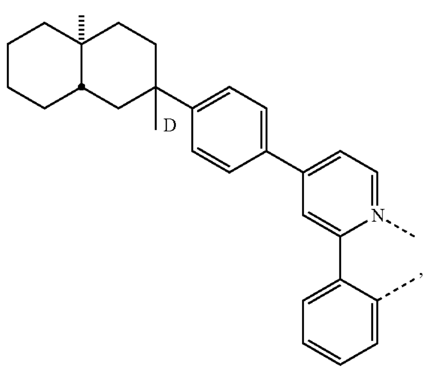
$L_{B116}$
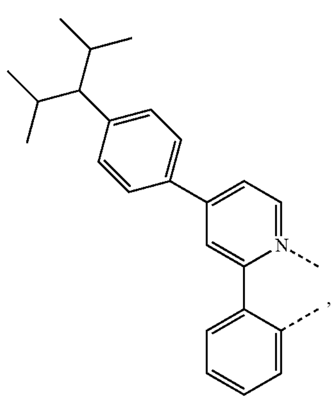
$L_{B117}$
-continued
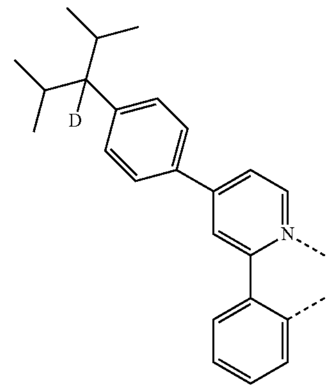
$L_{B118}$
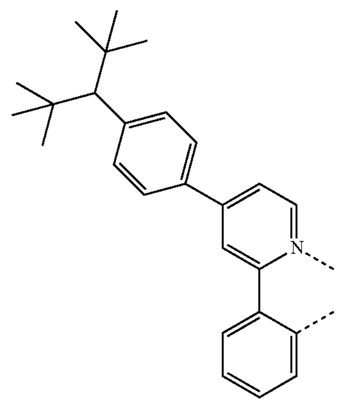
$L_{B119}$
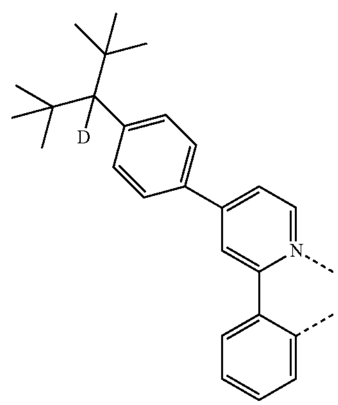
$L_{B120}$
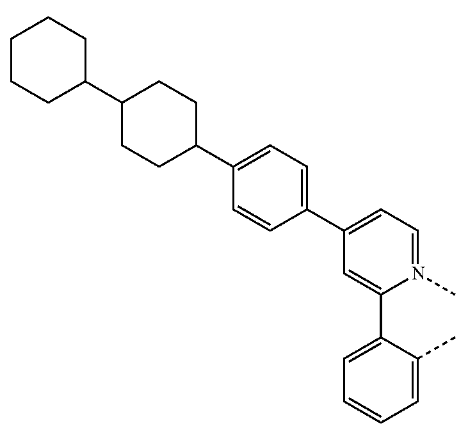
$L_{B121}$ -continued
$L_{B122}$
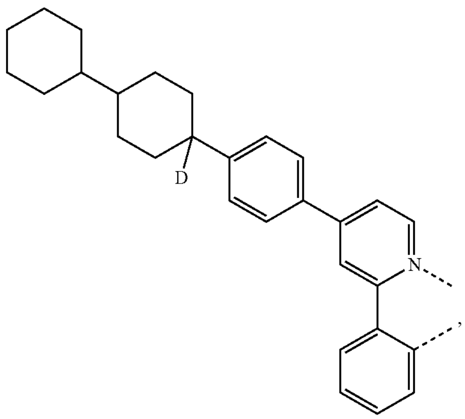
$L_{B123}$
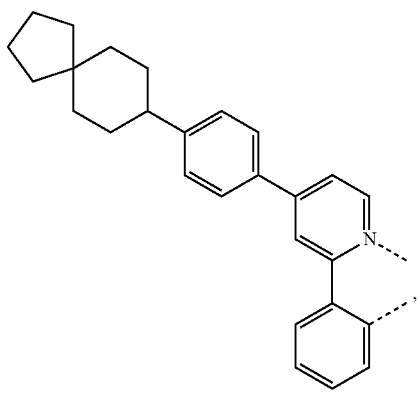
$L_{B124}$
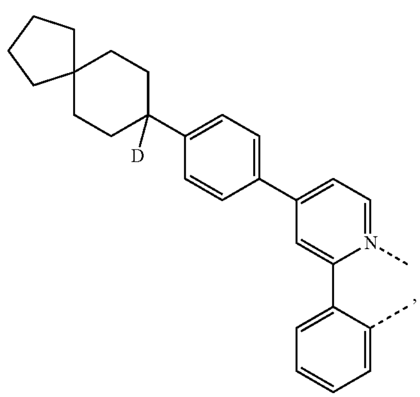
$L_{B125}$
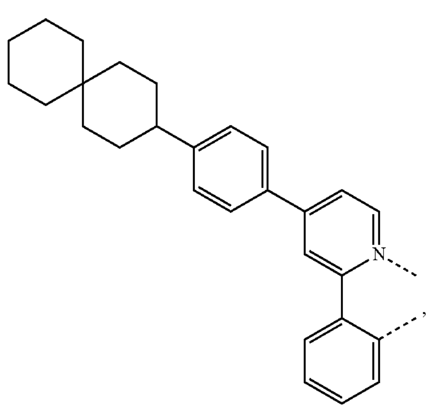
-continued
$L_{B126}$
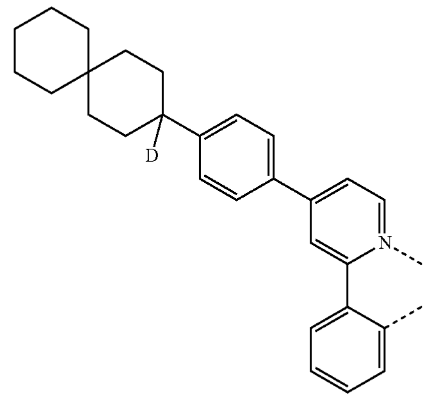
$L_{B127}$
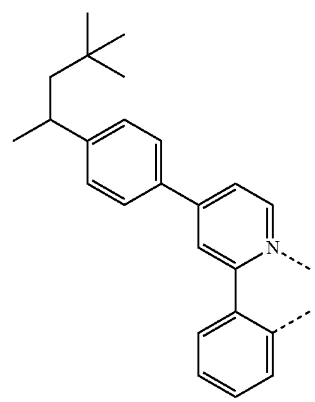
$L_{B128}$
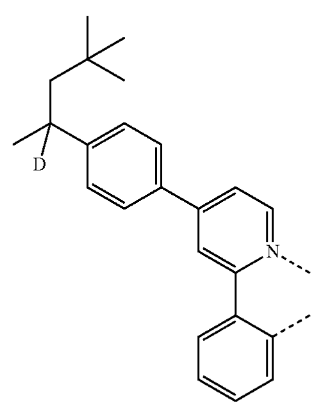
$L_{B132}$
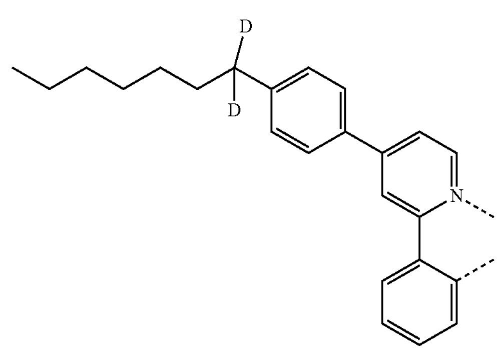

-continued

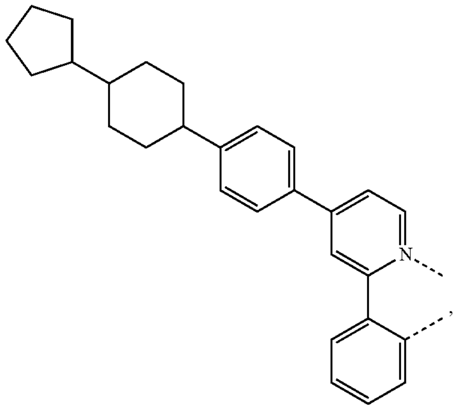

$L_{B133}$

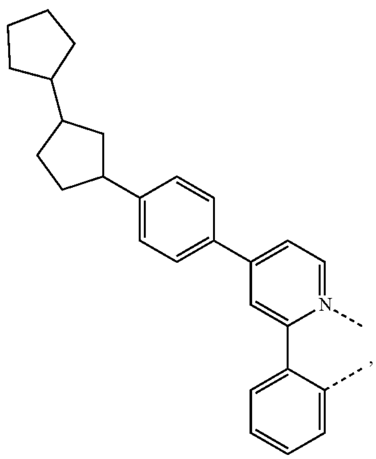

$L_{B134}$

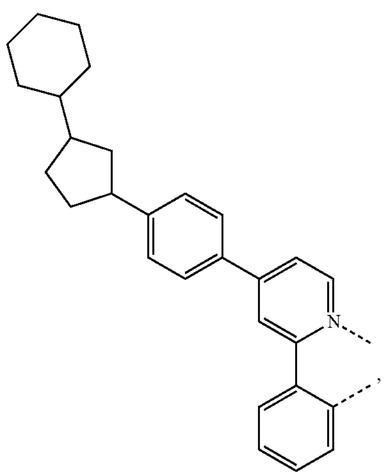

$L_{B135}$

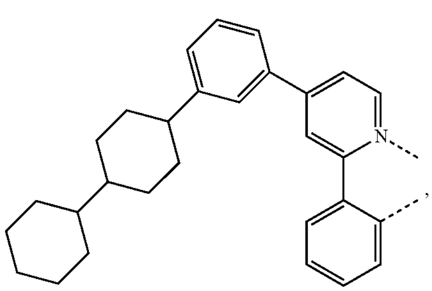

$L_{B136}$

-continued

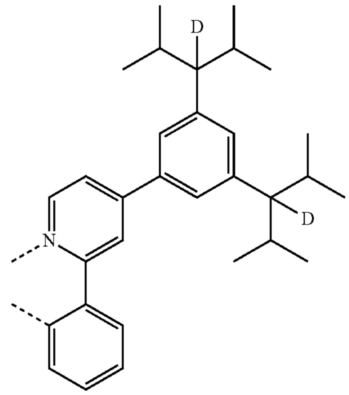

$L_{B138}$

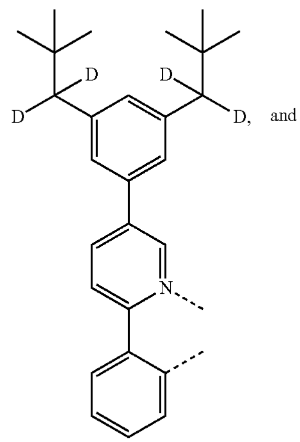

$L_{B177}$

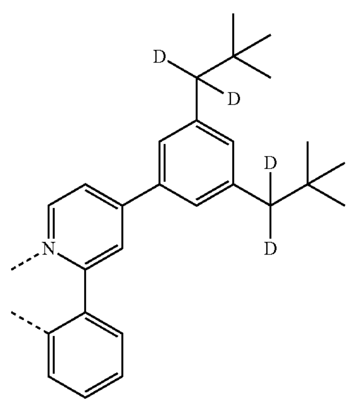

$L_{B223}$

3. The compound of claim 1, wherein $R^6$ is selected from the group consisting of partially deuterated or partially fluorinated alkyl having at least seven carbon atoms, partially deuterated or partially fluorinated cycloalkyl having at least seven carbon atoms, alkyl-cycloalkyl having at least seven carbon atoms, and partially or fully deuterated or fluorinated alkyl-cycloalkyl having at least seven carbon atoms.

4. The compound of claim 1, wherein $L_A$ is selected from the group consisting of:

-continued
$L_{A1}$
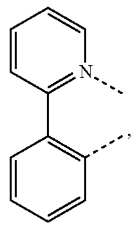
$L_{A2}$
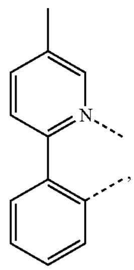
$L_{A3}$
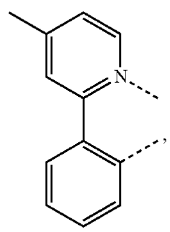
$L_{A4}$
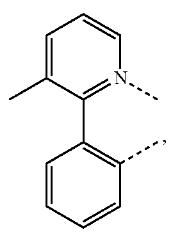
$L_{A5}$
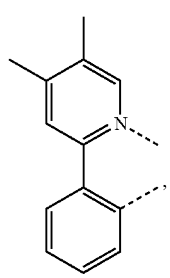
$L_{A6}$
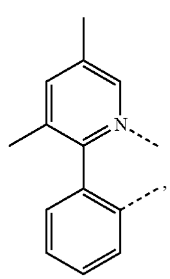
$L_{A7}$
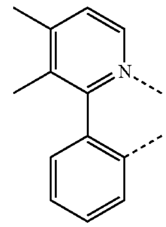
$L_{A8}$
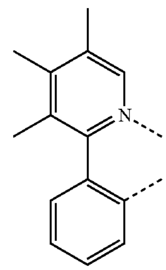
$L_{A9}$
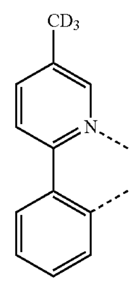
$L_{A10}$
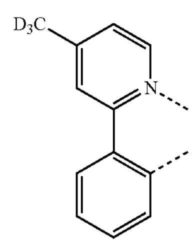
$L_{A11}$
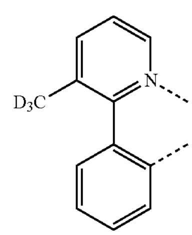
$L_{A12}$
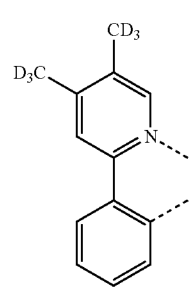

$L_{A13}$
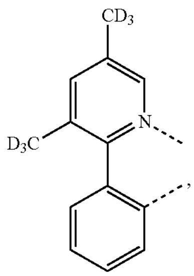
$L_{A14}$
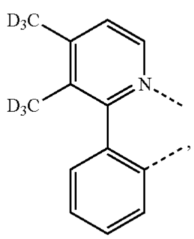
$L_{A15}$
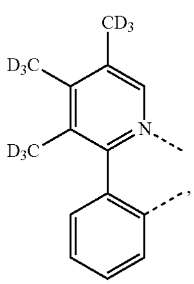
$L_{A16}$
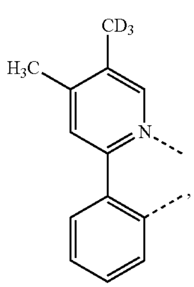
$L_{A17}$
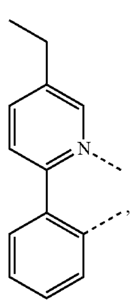
$L_{A18}$
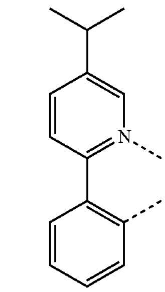
$L_{A19}$
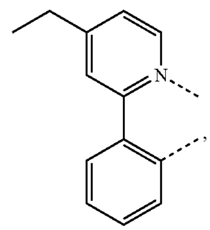
$L_{A20}$
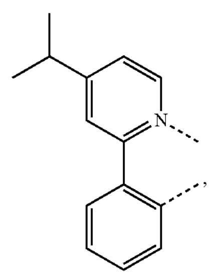
$L_{A21}$
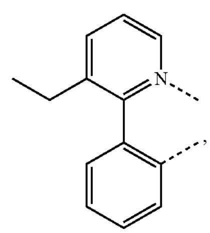
$L_{A22}$
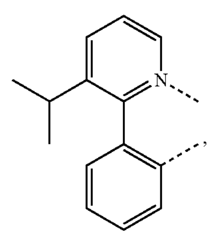
$L_{A23}$
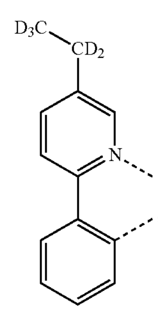

-continued
$L_{A24}$
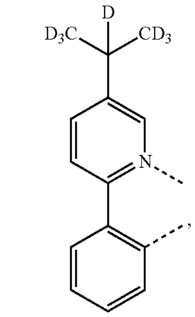
$L_{A25}$
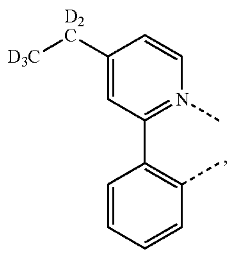
$L_{A26}$
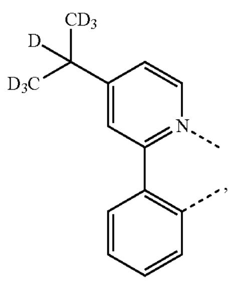
$L_{A27}$
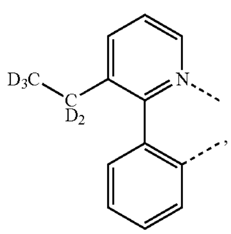
$L_{A28}$
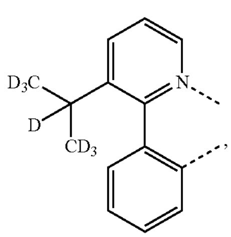
$L_{A29}$
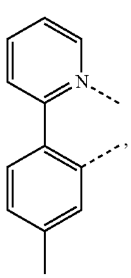
-continued
$L_{A30}$
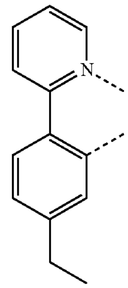
$L_{A31}$
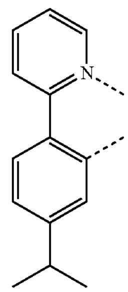
$L_{A32}$
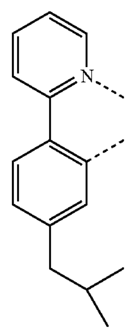
$L_{A33}$
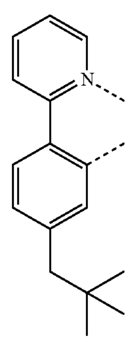
$L_{A34}$
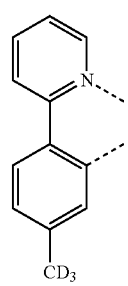

$L_{A35}$
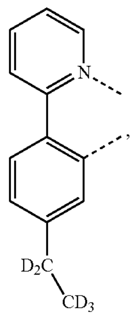
$L_{A36}$
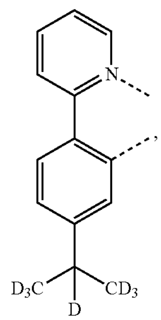
$L_{A37}$
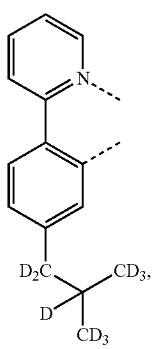
$L_{A38}$
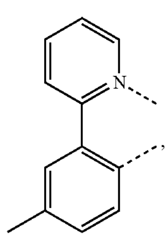
$L_{A39}$
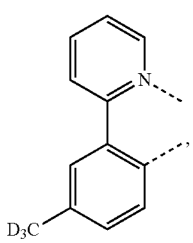
$L_{A40}$
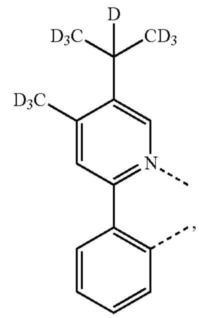
$L_{A41}$
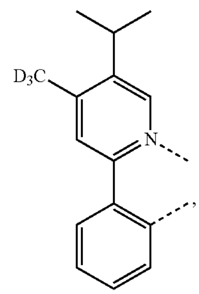
$L_{A42}$
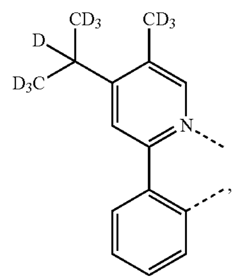
$L_{A43}$
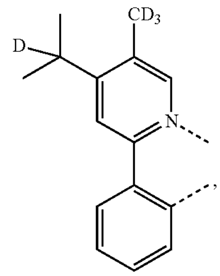
$L_{A44}$
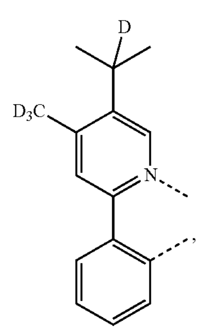

368
-continued
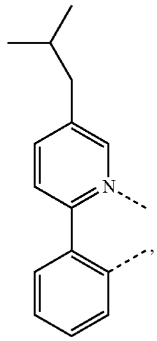
$L_{A45}$
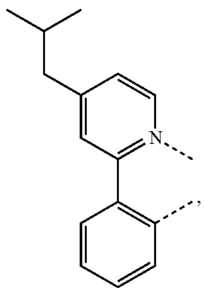
$L_{A46}$
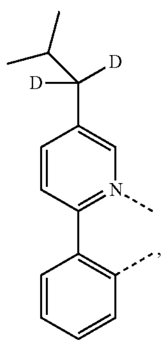
$L_{A47}$
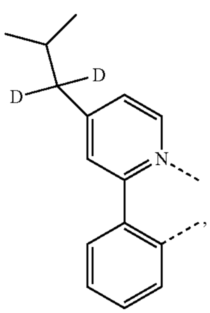
$L_{A48}$
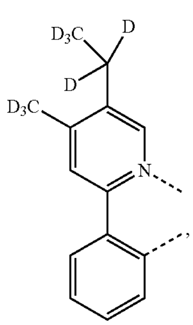
$L_{A49}$
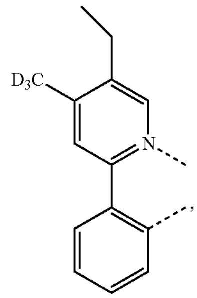
$L_{A50}$
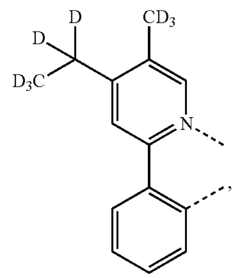
$L_{A51}$
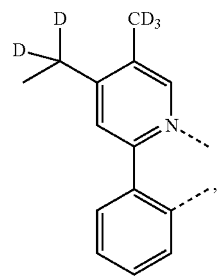
$L_{A52}$
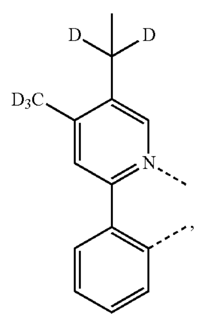
$L_{A53}$
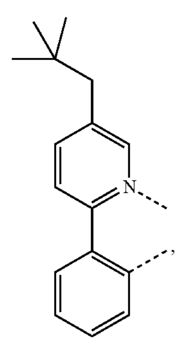
$L_{A54}$ -continued
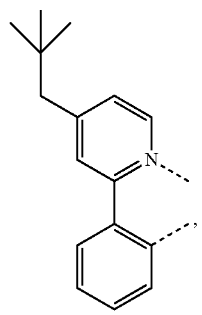
$L_{A55}$
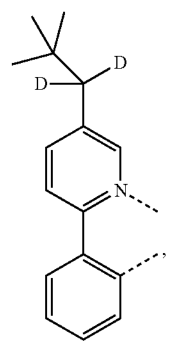
$L_{A56}$
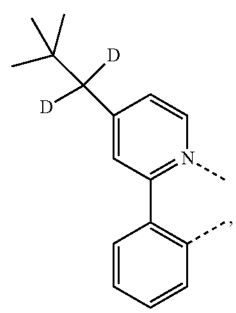
$L_{A57}$
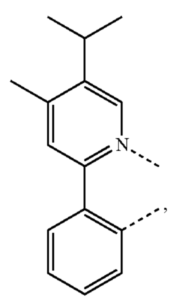
$L_{A58}$
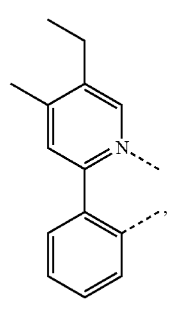
$L_{A59}$
-continued
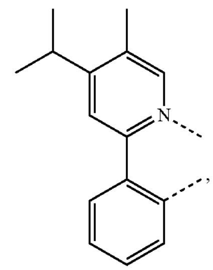
$L_{A60}$
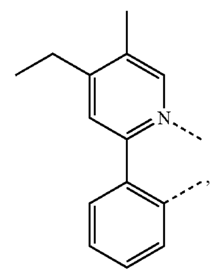
$L_{A61}$
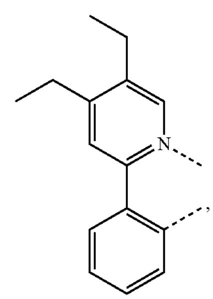
$L_{A62}$
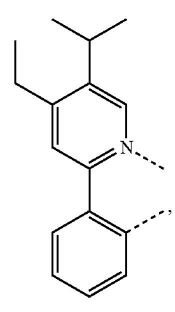
$L_{A63}$
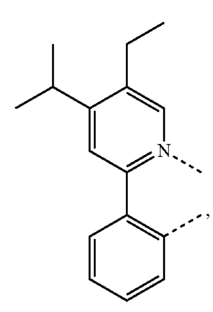
$L_{A64}$ -continued
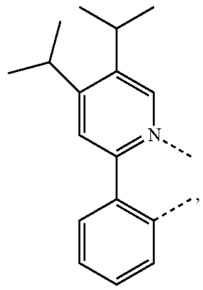
$L_{A65}$
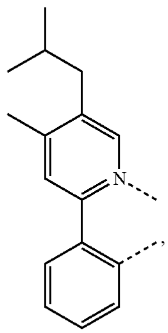
$L_{A66}$
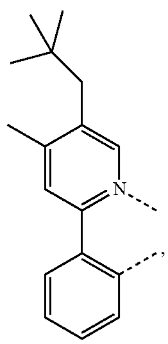
$L_{A67}$
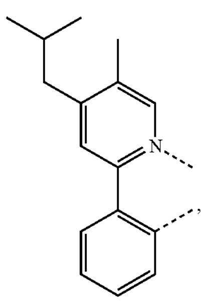
$L_{A68}$
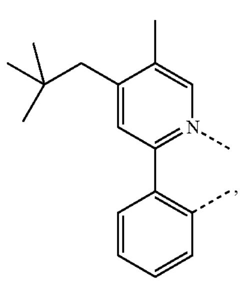
$L_{A69}$
-continued
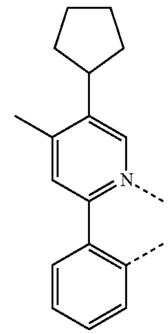
$L_{A70}$
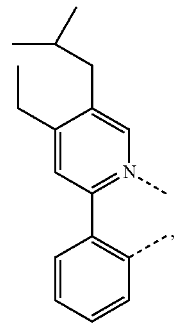
$L_{A71}$
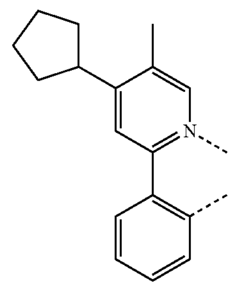
$L_{A72}$
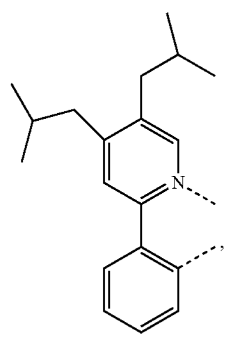
$L_{A73}$
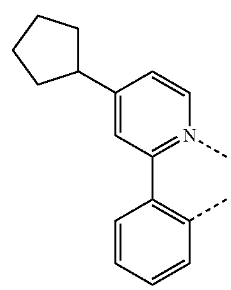
$L_{A74}$

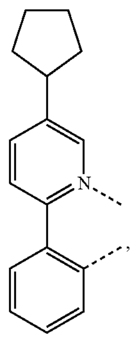
$L_{A75}$
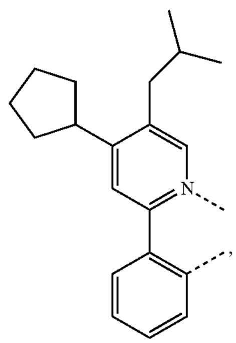
$L_{A76}$
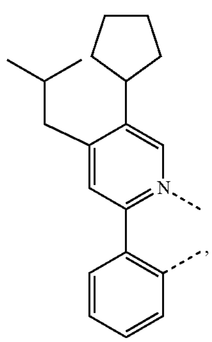
$L_{A77}$
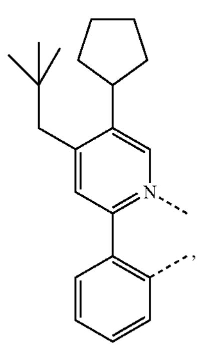
$L_{A78}$
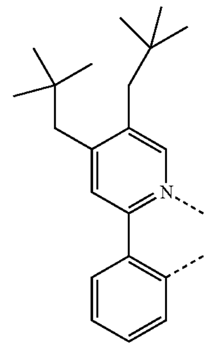
$L_{A79}$
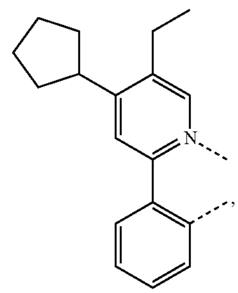
$L_{A80}$
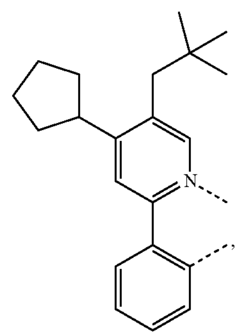
$L_{A81}$
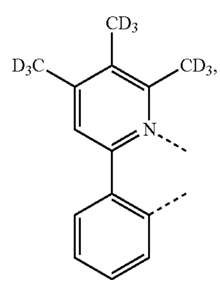
$L_{A82}$
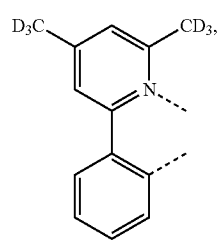
$L_{A83}$ -continued
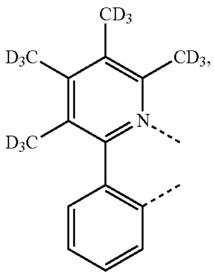
$L_{A84}$
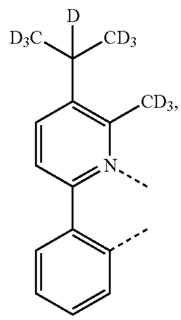
$L_{A85}$
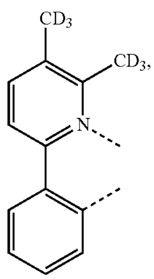
$L_{A86}$
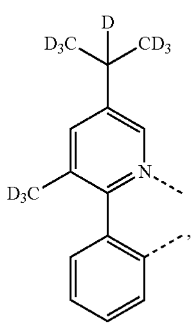
$L_{A87}$
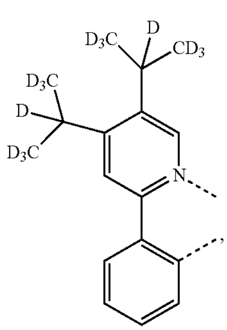
$L_{A88}$
-continued
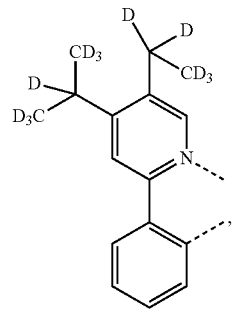
$L_{A89}$
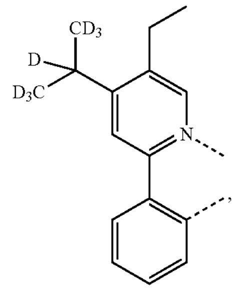
$L_{A90}$
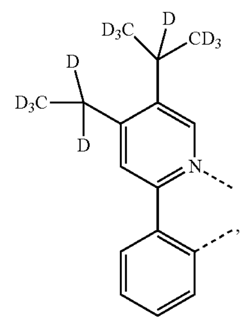
$L_{A91}$
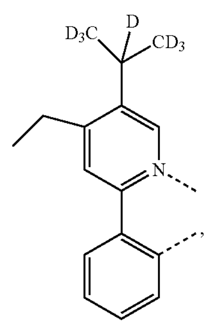
$L_{A92}$
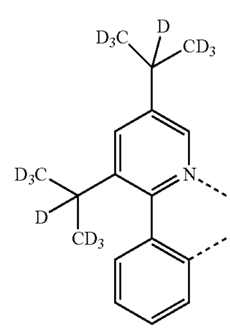
$L_{A93}$ -continued
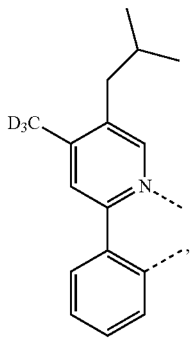
$L_{A94}$
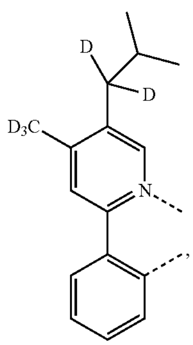
$L_{A95}$
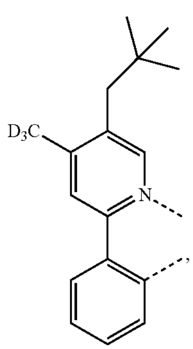
$L_{A96}$
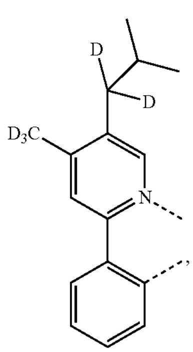
$L_{A97}$
-continued
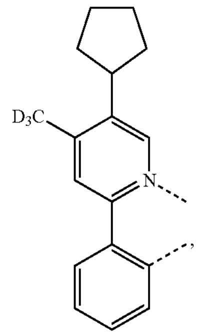
$L_{A98}$
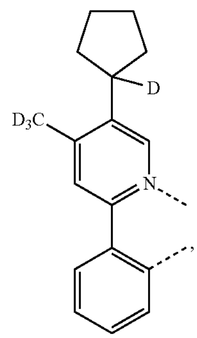
$L_{A99}$
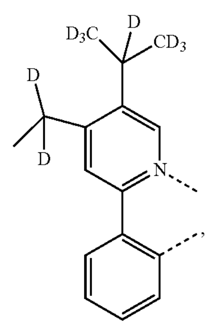
$L_{A100}$
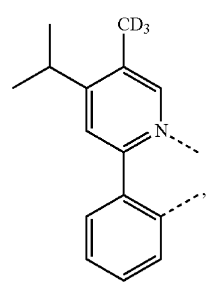
$L_{A101}$
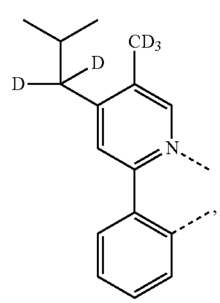
$L_{A102}$ -continued
L$_{A103}$
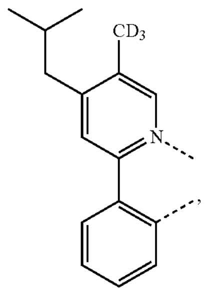
L$_{A104}$
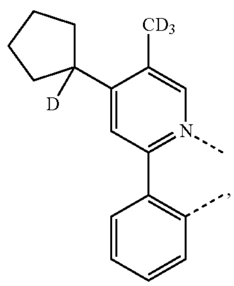
L$_{A105}$
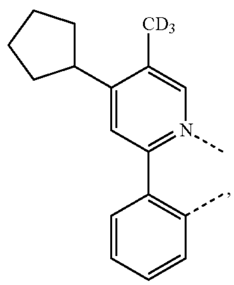
L$_{A106}$
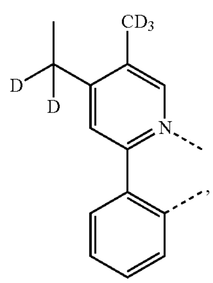
L$_{A107}$
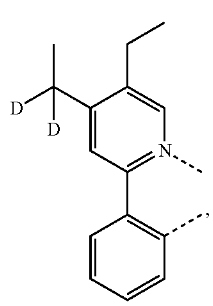
-continued
L$_{A108}$
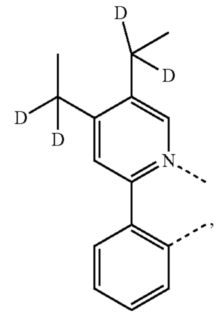
L$_{A109}$
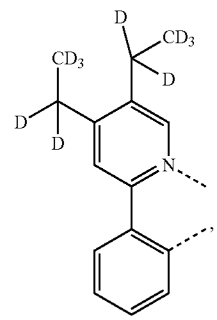
L$_{A110}$
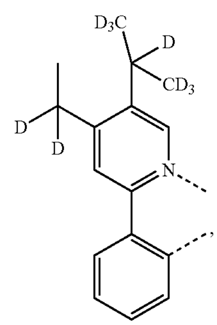
L$_{A111}$
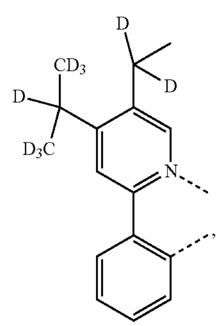
L$_{A131}$
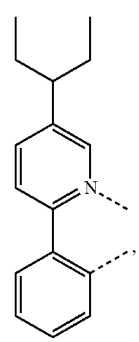

$L_{A132}$
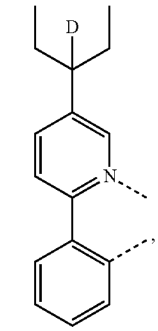
$L_{A133}$
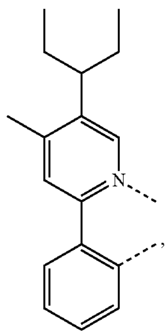
$L_{A134}$
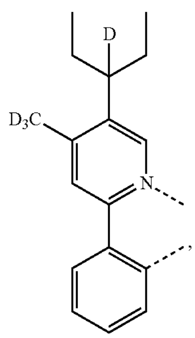
$L_{A135}$
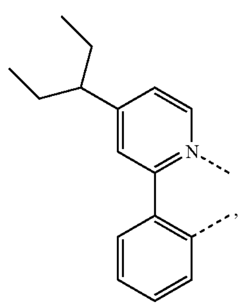
$L_{A136}$
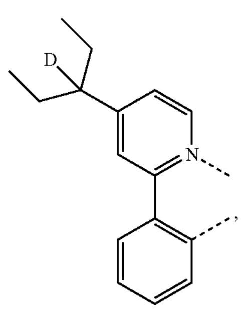
$L_{A137}$
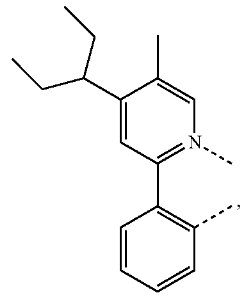
$L_{A138}$
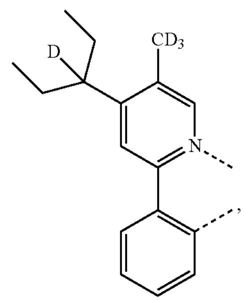
$L_{A139}$
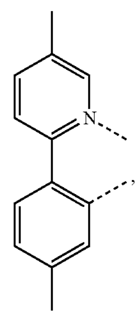
$L_{A140}$
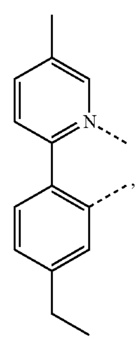
$L_{A141}$
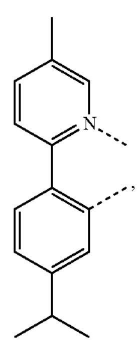

-continued
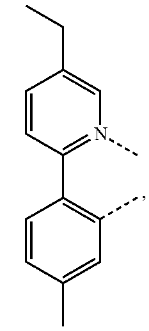
$L_{A142}$
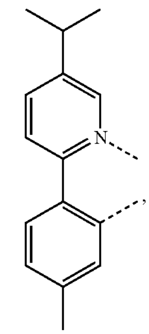
$L_{A143}$
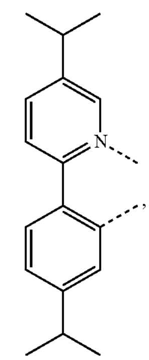
$L_{A144}$
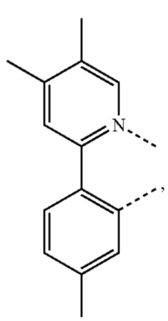
$L_{A145}$
-continued
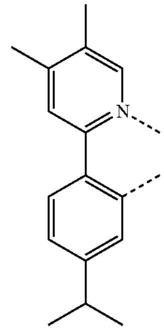
$L_{A146}$
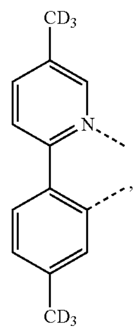
$L_{A147}$
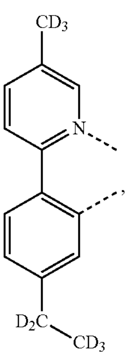
$L_{A148}$
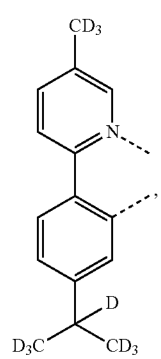
$L_{A149}$ -continued
$L_{A150}$
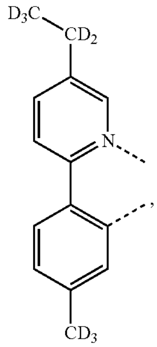
$L_{A151}$
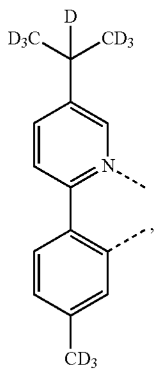
$L_{A152}$
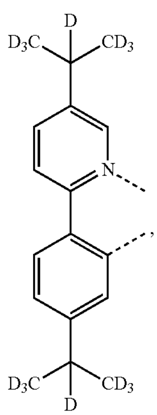
$L_{A153}$
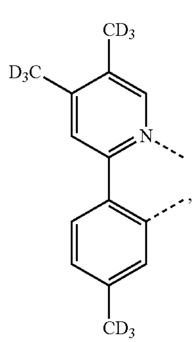
-continued
$L_{A154}$
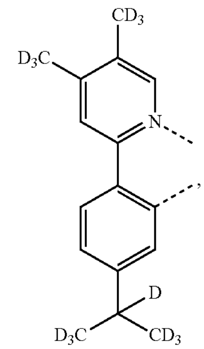
$L_{A155}$
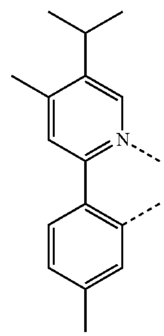
$L_{A156}$
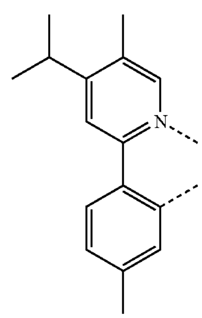
$L_{A157}$
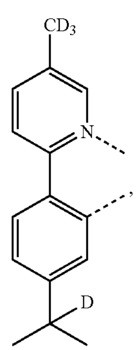

-continued
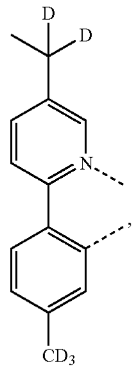
$L_{A158}$
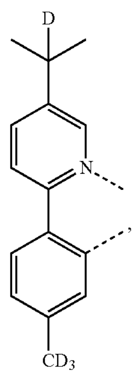
$L_{A159}$
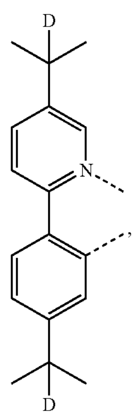
$L_{A160}$
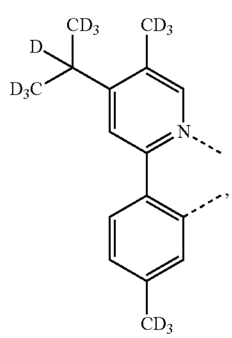
$L_{A161}$
-continued
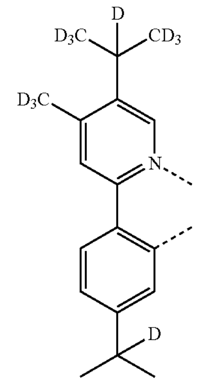
$L_{A162}$
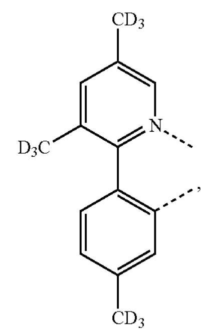
$L_{A163}$
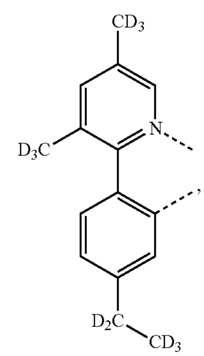
$L_{A164}$
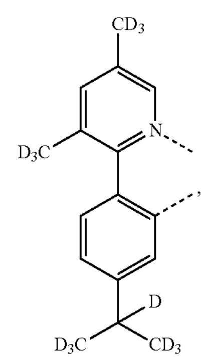
$L_{A165}$ -continued
$L_{A166}$
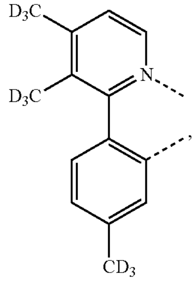
$L_{A167}$
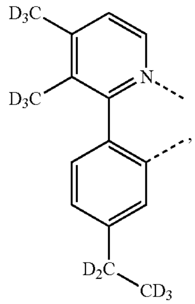
$L_{A168}$
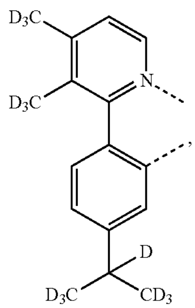
$L_{B169}$
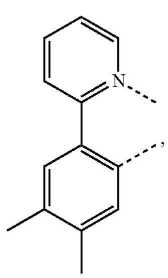
$L_{B170}$
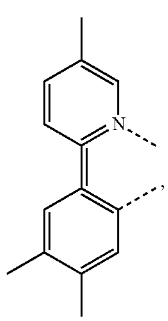
-continued
$L_{B171}$
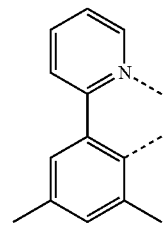
$L_{B172}$
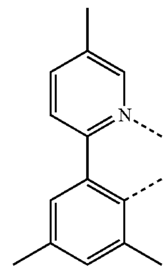
$L_{B173}$
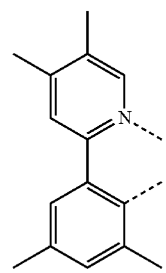
$L_{A174}$
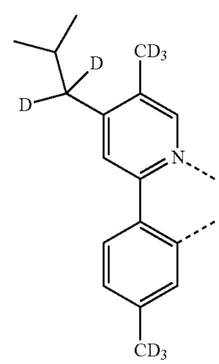
$L_{A175}$
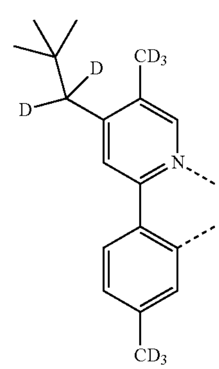

$L_{A176}$
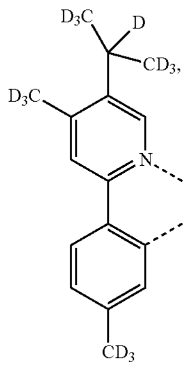
$L_{A177}$
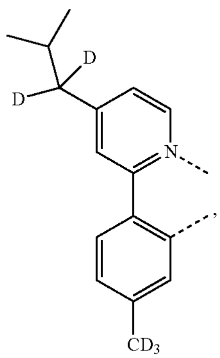
$L_{A178}$
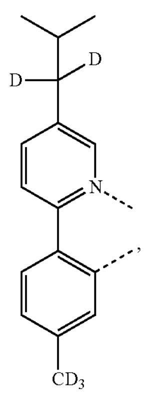
$L_{A179}$
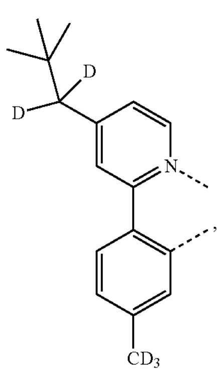
$L_{A180}$
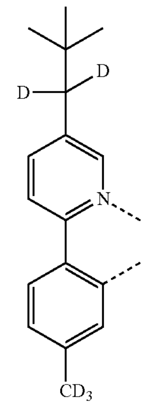
$L_{A181}$
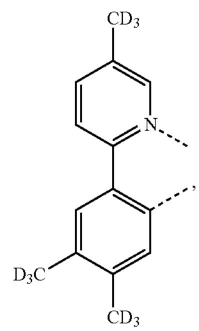
$L_{A182}$
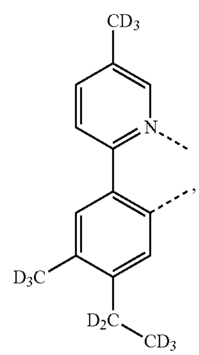
$L_{A183}$
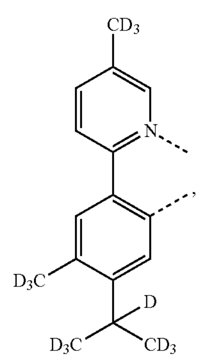

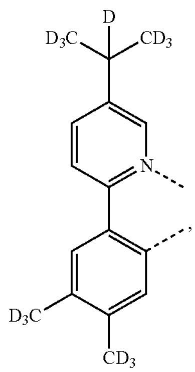
$L_{A184}$
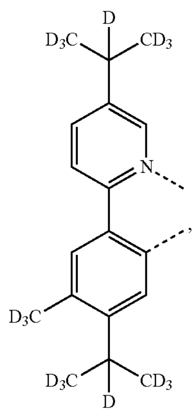
$L_{A185}$
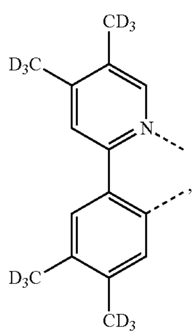
$L_{A186}$
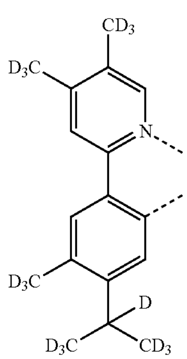
$L_{A187}$
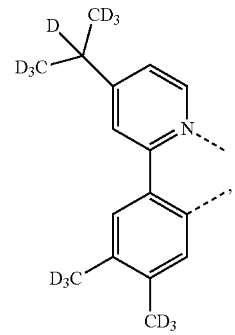
$L_{A188}$
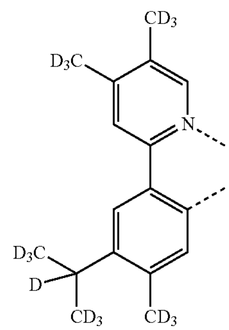
$L_{A189}$
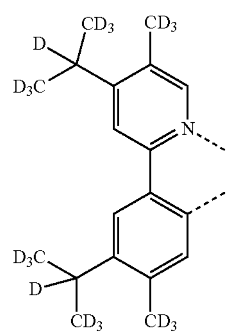
$L_{A190}$
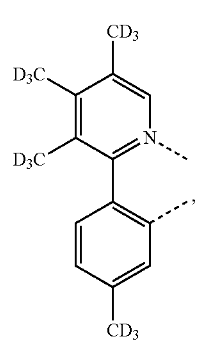
$L_{A191}$ -continued
L$_{A192}$
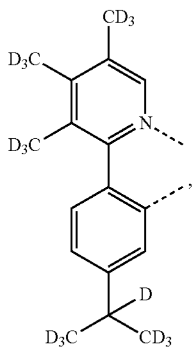
L$_{A212}$
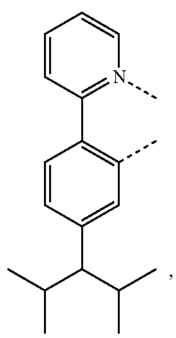
L$_{A213}$
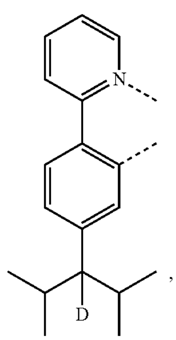
L$_{A214}$
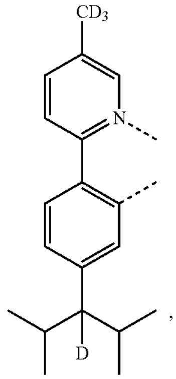
-continued
L$_{A215}$
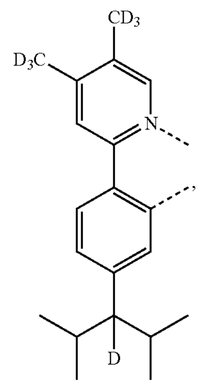
L$_{A216}$
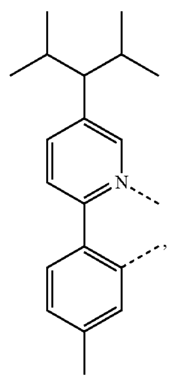
and
L$_{A217}$
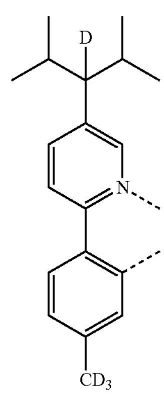
L$_{A201}$
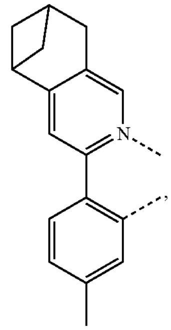

-continued
$L_{A202}$
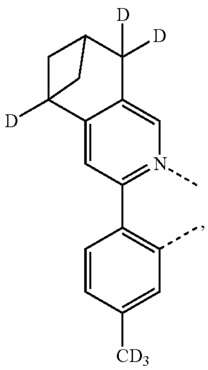
$L_{A203}$
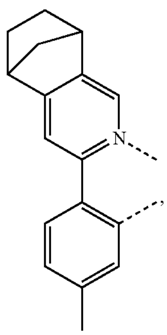
$L_{A204}$
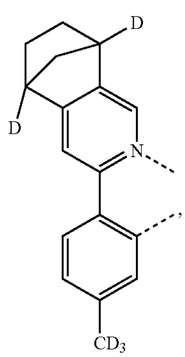
$L_{A205}$
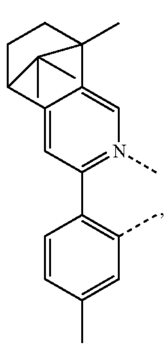
-continued
$L_{A206}$
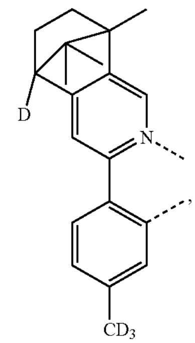
$L_{A207}$
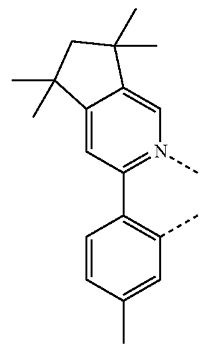
$L_{A208}$
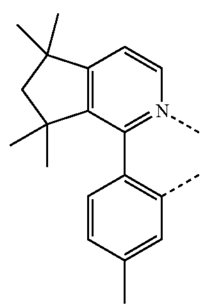
$L_{A209}$
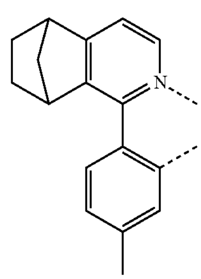
$L_{A210}$
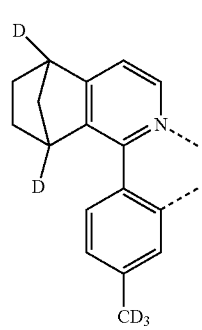

$L_{A211}$
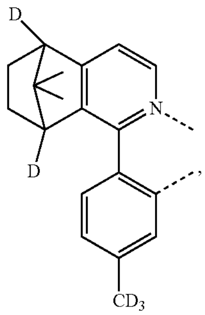
$L_{A212}$
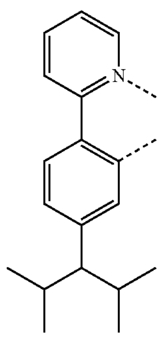
$L_{A213}$
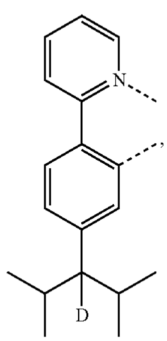
$L_{A214}$
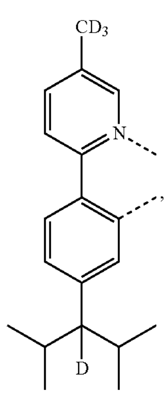
$L_{A215}$
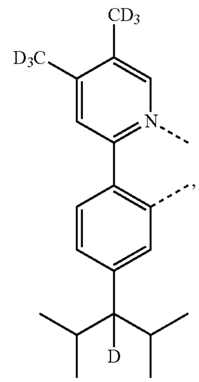
$L_{A215}$
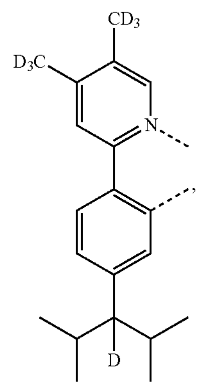
$L_{A216}$
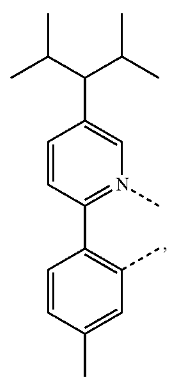
and
$L_{A217}$
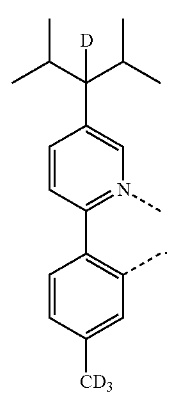
5. The compound of claim 4, wherein the compound is Compound x having the formula $Ir(L_{Af})_2(L_{Bk})$;

wherein x=227j+k−227, j is an integer from 1 to 112, 131 to 192, and 212 to 217, and k is an integer from 1 to 58, 60 to 86, 89 to 128, 132 to 138, 177, and 223;
wherein $L_{B1}$ to $L_{B58}$, $L_{B60}$ to $L_{B86}$, $L_{B89}$ to $L_{B128}$, $L_{B132}$ to $L_{B138}$, $L_{B177}$, and $L_{B223}$ have the following structures:
$L_{B1}$
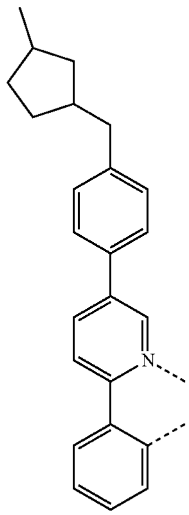
,
$L_{B2}$
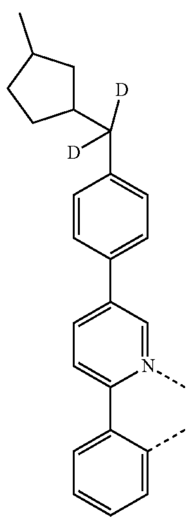
,
$L_{B3}$
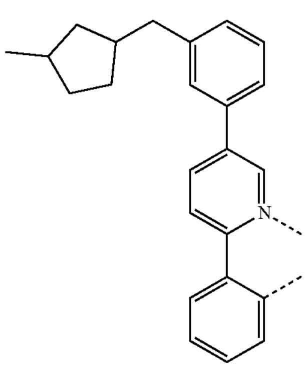
,
-continued
$L_{B4}$
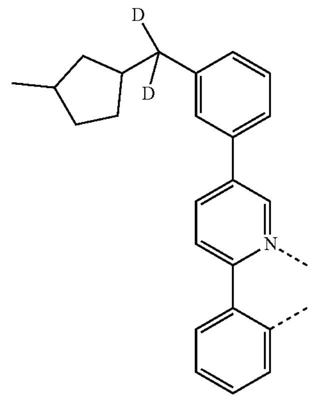
,
$L_{B5}$
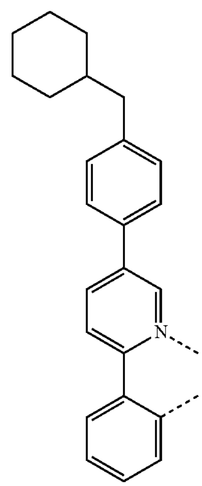
,
$L_{B6}$
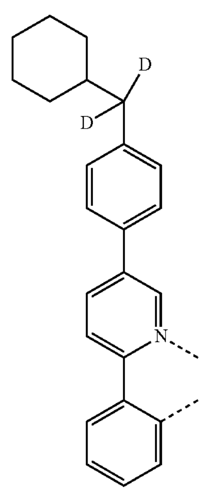
, -continued
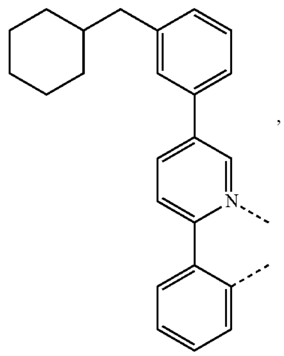
$L_{B7}$
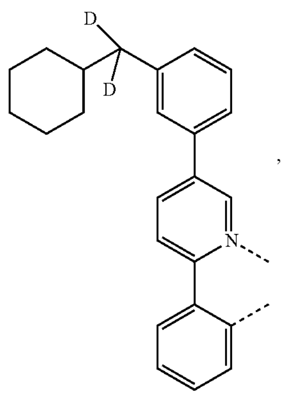
$L_{B8}$
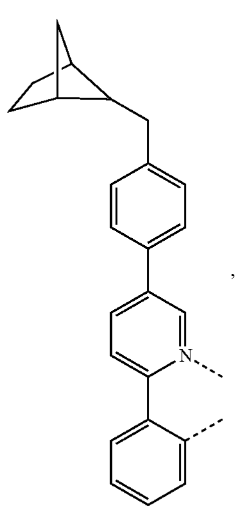
$L_{B9}$
-continued
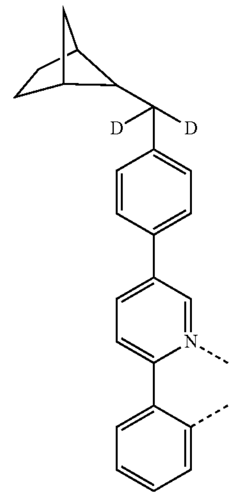
$L_{B10}$
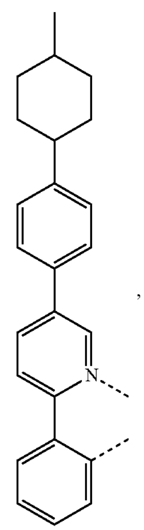
$L_{B11}$
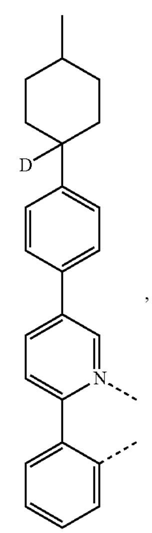
$L_{B12}$ -continued
$L_{B13}$
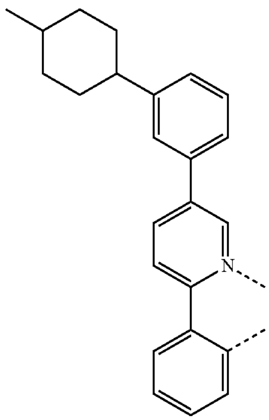
,
$L_{B14}$
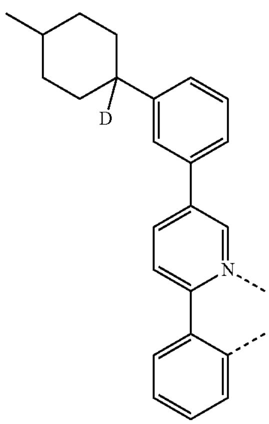
,
$L_{B15}$
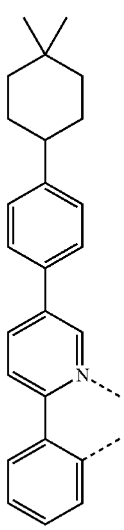
,
-continued
$L_{B16}$
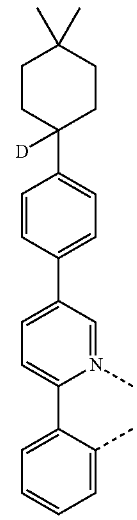
,
$L_{B17}$
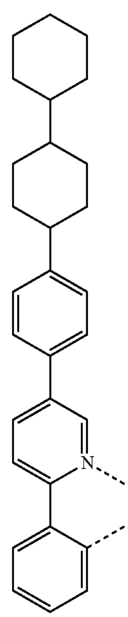
, -continued
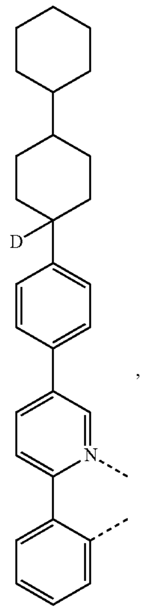
$L_{B18}$
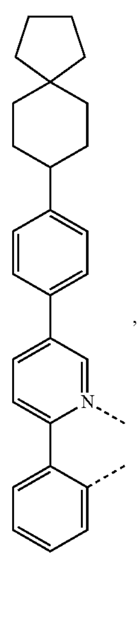
$L_{B19}$
-continued
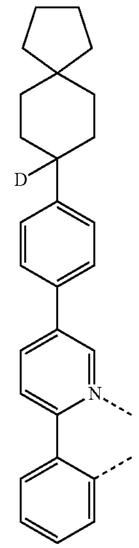
$L_{B20}$
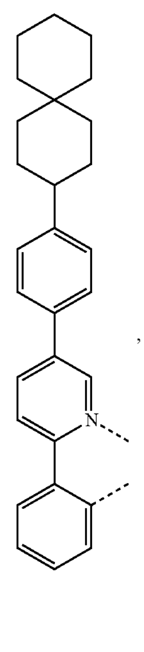
$L_{B21}$ -continued
$L_{B22}$
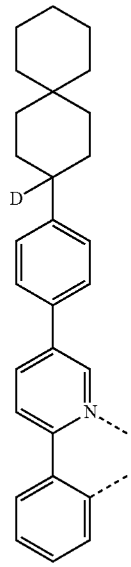
,
$L_{B23}$
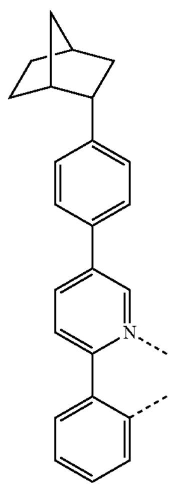
,
$L_{B24}$
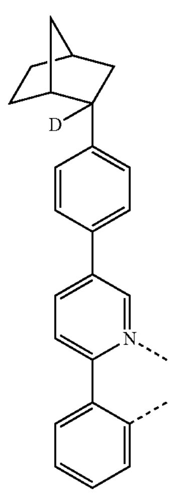
,
-continued
$L_{B25}$
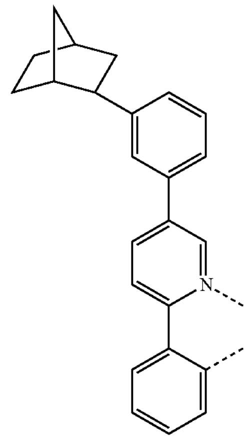
,
$L_{B26}$
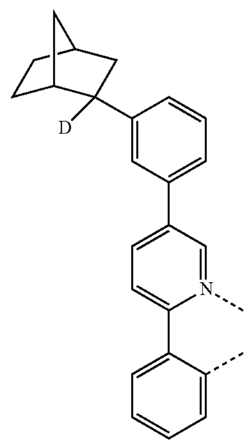
,
$L_{B27}$
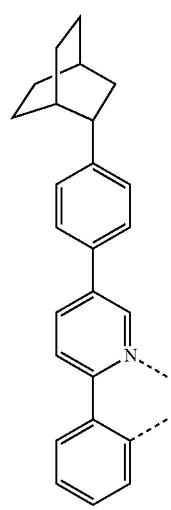
,

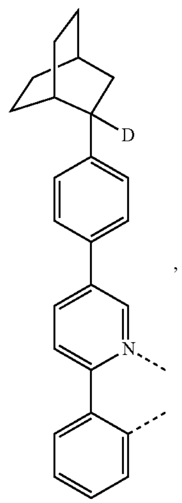
$L_{B28}$
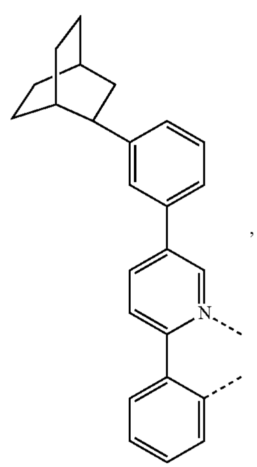
$L_{B29}$
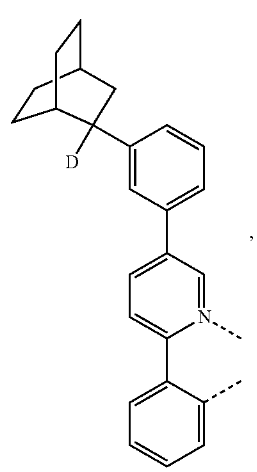
$L_{B30}$
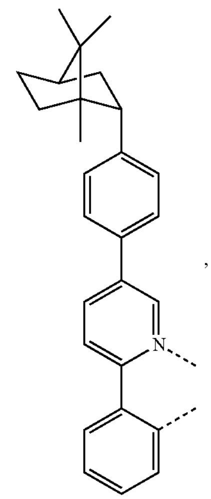
$L_{B31}$
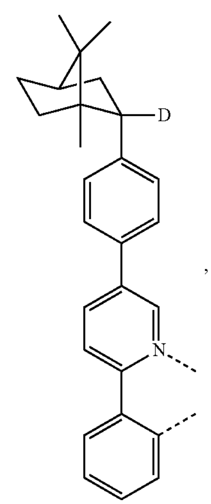
$L_{B32}$
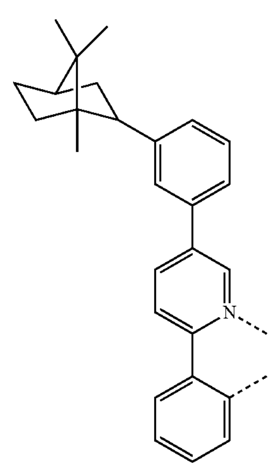
$L_{B33}$ -continued
$L_{B34}$
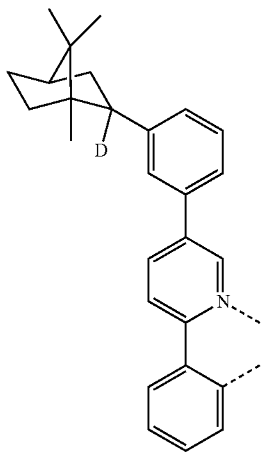
,
$L_{B35}$
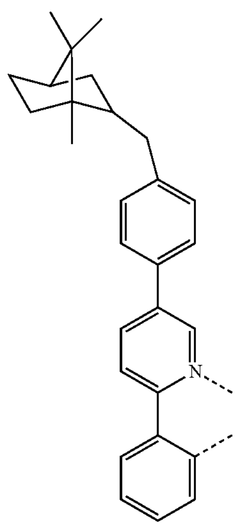
,
$L_{B36}$
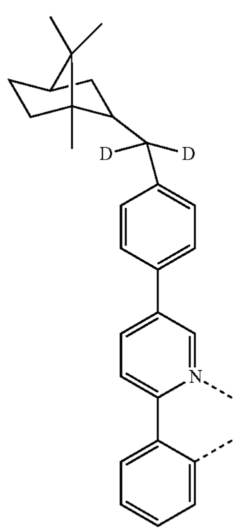
,
-continued
$L_{B37}$
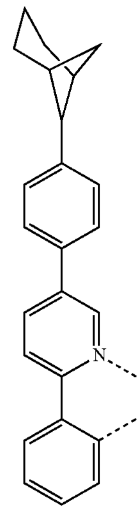
,
$L_{B38}$
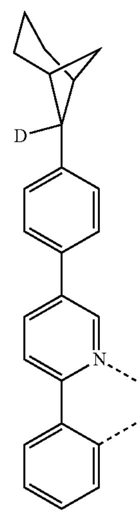
,
$L_{B39}$
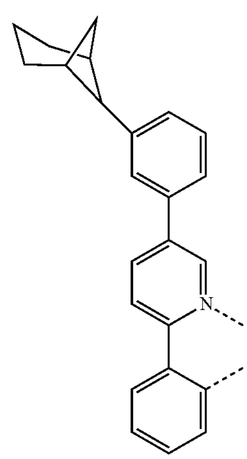
,

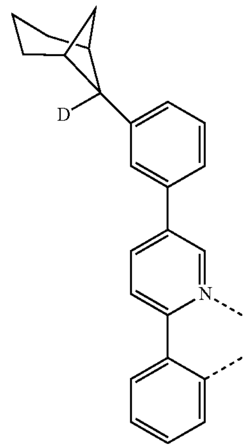
,
$L_{B40}$
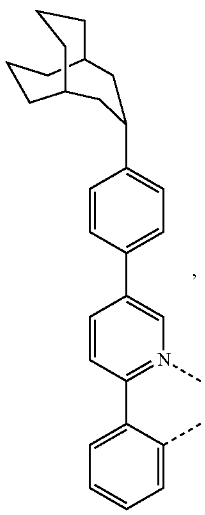
,
$L_{B41}$
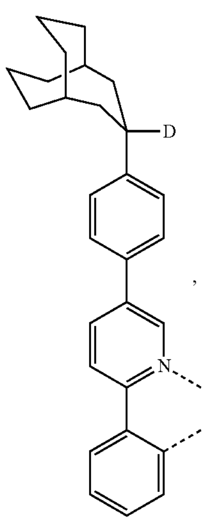
,
$L_{B42}$
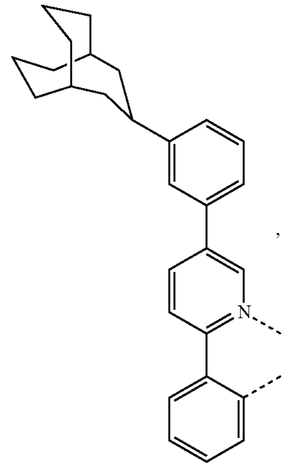
,
$L_{B43}$
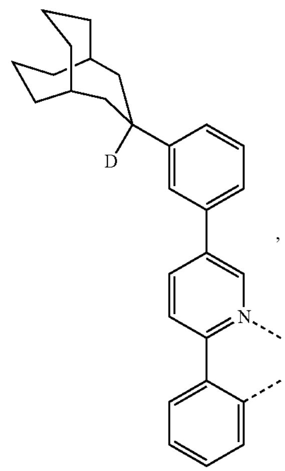
,
$L_{B44}$
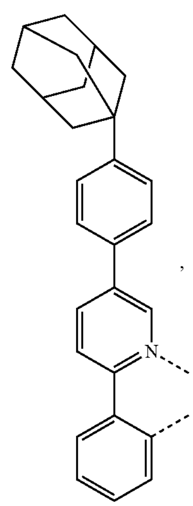
,
$L_{B45}$ -continued
$L_{B46}$
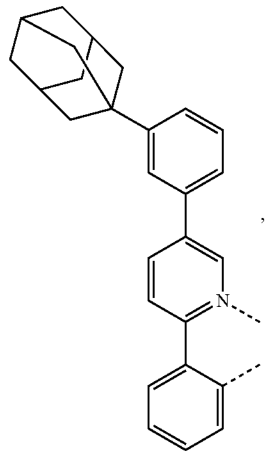
,
$L_{B47}$
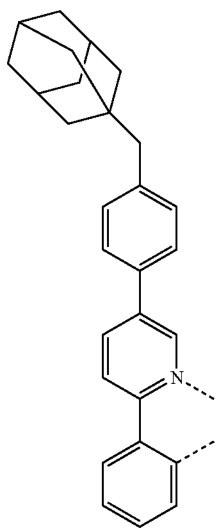
,
$L_{B48}$
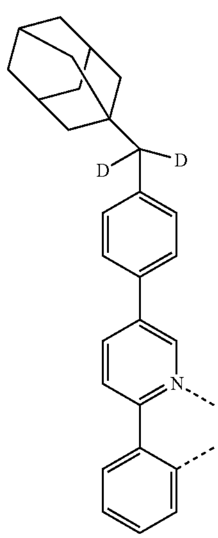
,
-continued
$L_{B49}$
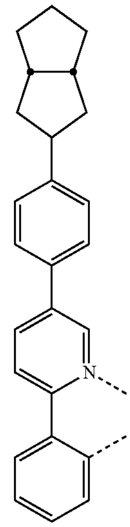
,
$L_{B50}$
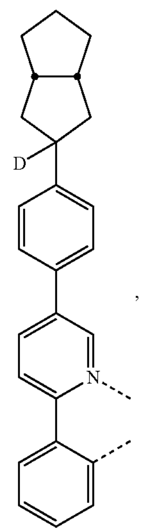
,
$L_{B51}$
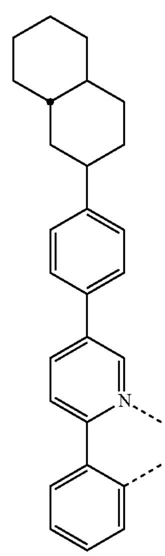
,

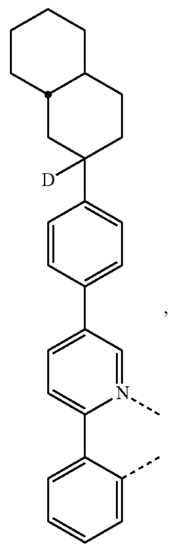
$L_{B52}$
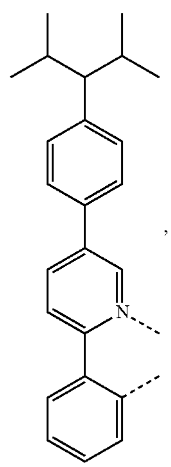
$L_{B53}$
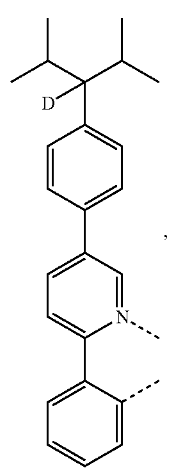
$L_{B54}$
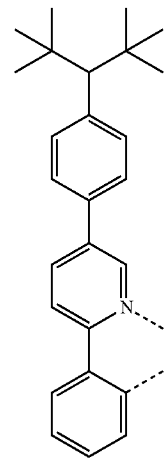
$L_{B55}$
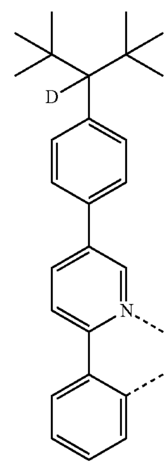
$L_{B56}$
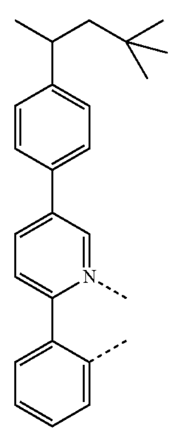
$L_{B57}$ -continued
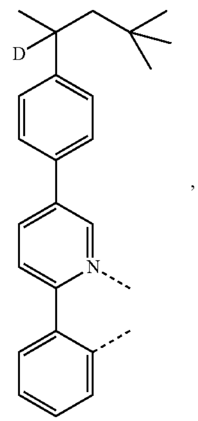
$L_{B58}$
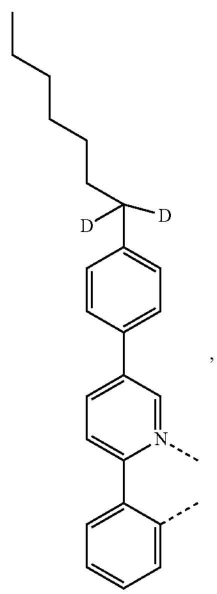
$L_{B60}$
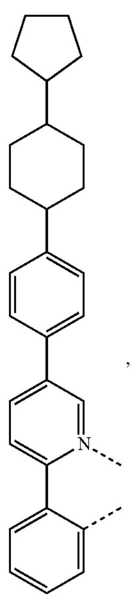
$L_{B61}$
-continued
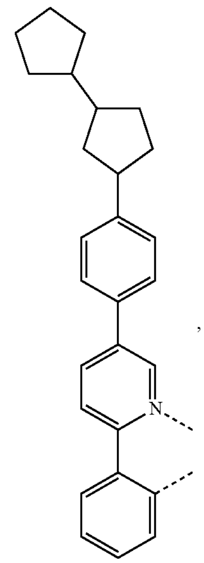
$L_{B62}$
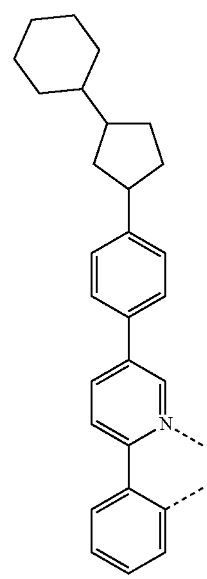
$L_{B63}$ -continued
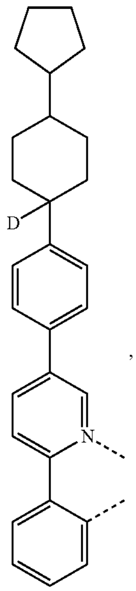
$L_{B64}$
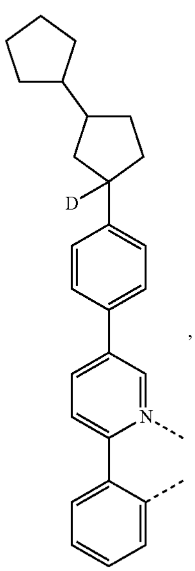
$L_{B65}$
-continued
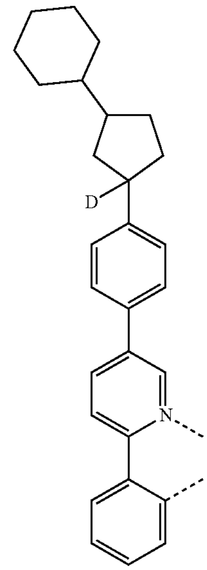
$L_{B66}$
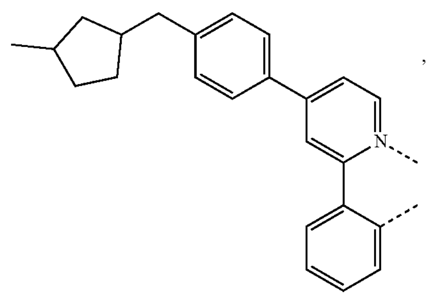
$L_{B67}$
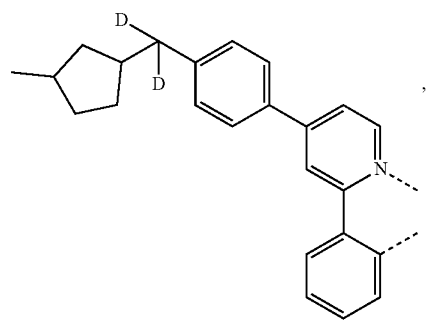
$L_{B68}$
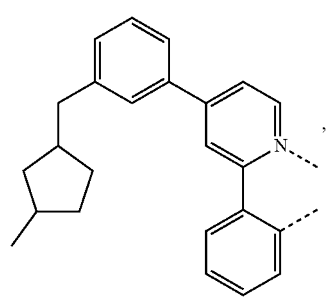
$L_{B69}$ -continued
$L_{B70}$
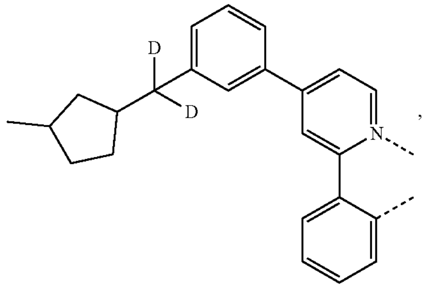
$L_{B71}$
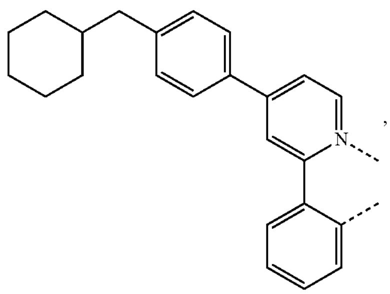
$L_{B72}$
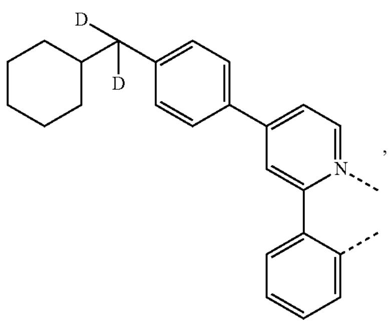
$L_{B73}$
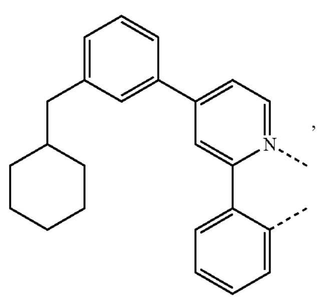
$L_{B74}$
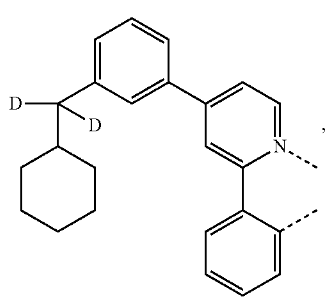
-continued
$L_{B75}$
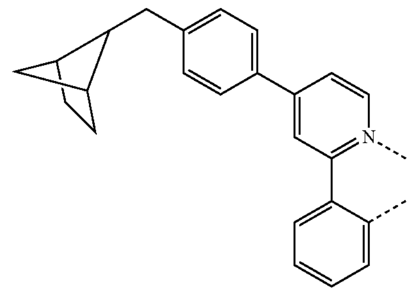
$L_{B76}$
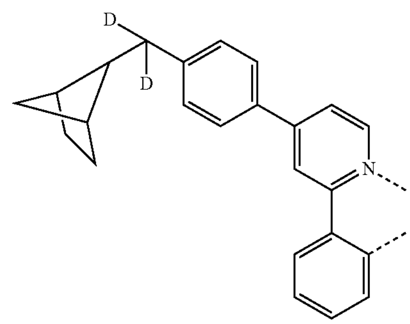
$L_{B77}$
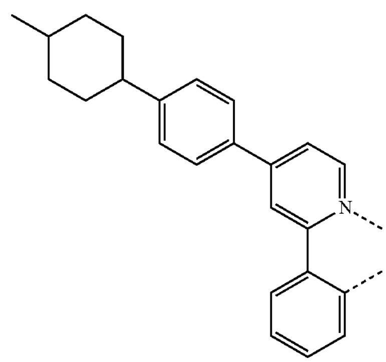
$L_{B78}$
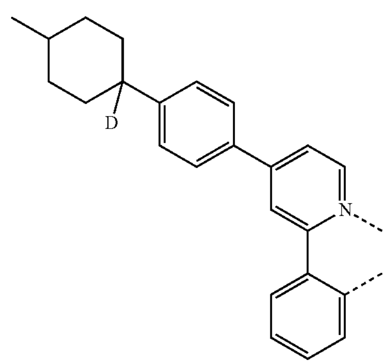
$L_{B79}$
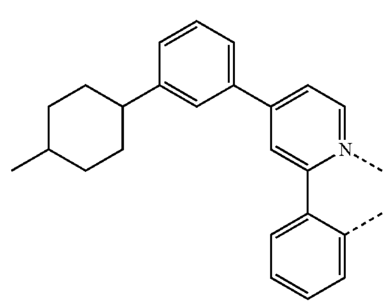

-continued
$L_{B80}$
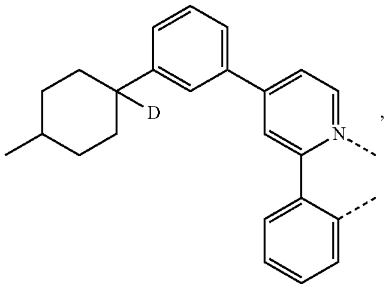
$L_{B81}$
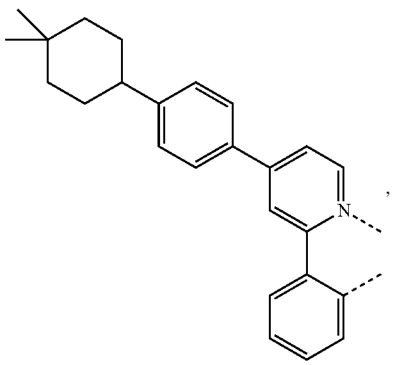
$L_{B82}$
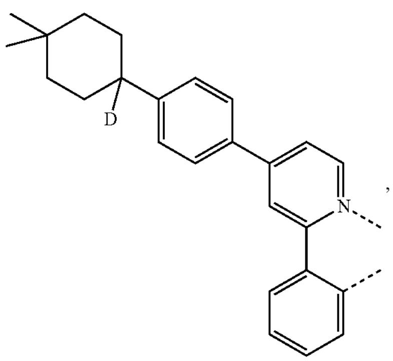
$L_{B83}$
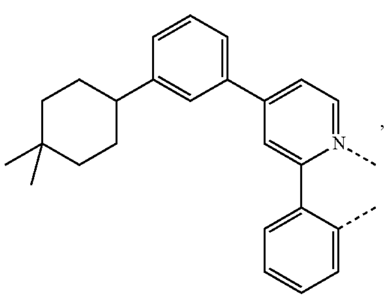
$L_{B84}$
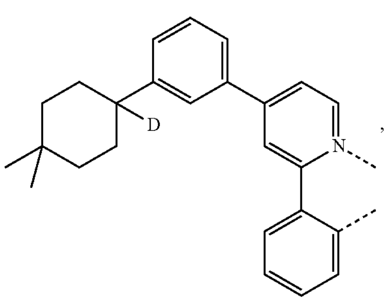
-continued
$L_{B85}$
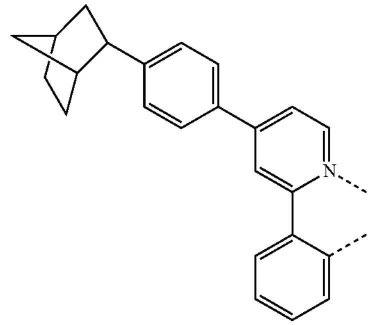
$L_{B86}$
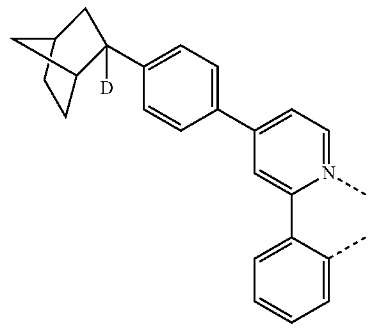
$L_{B89}$
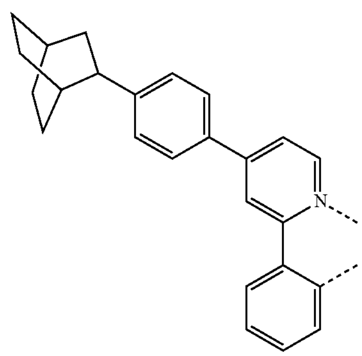
$L_{B90}$
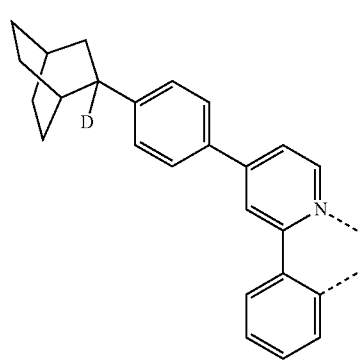

$L_{B91}$
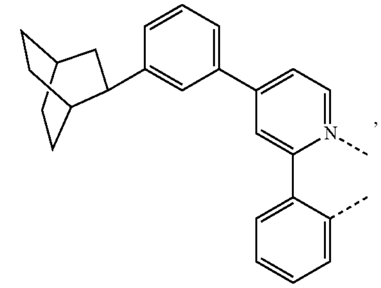
$L_{B92}$
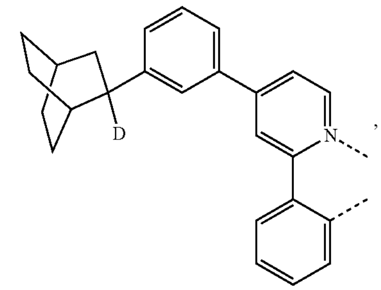
$L_{B93}$
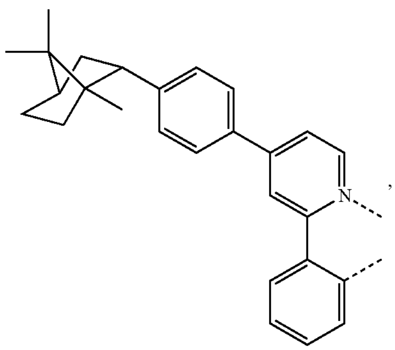
$L_{B94}$
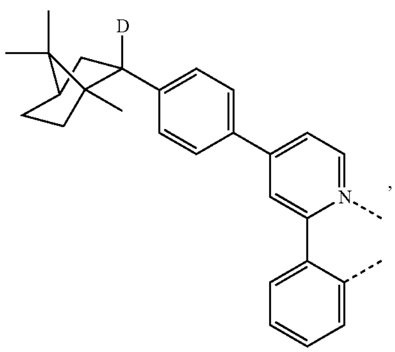
$L_{B95}$
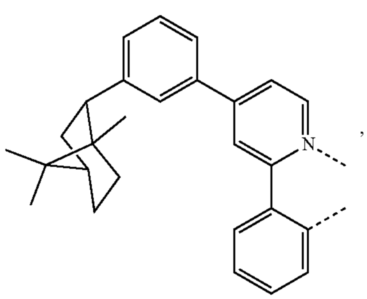
$L_{B96}$
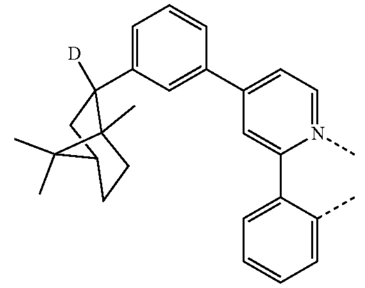
$L_{B97}$
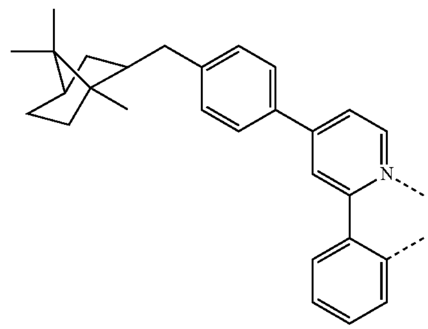
$L_{B98}$
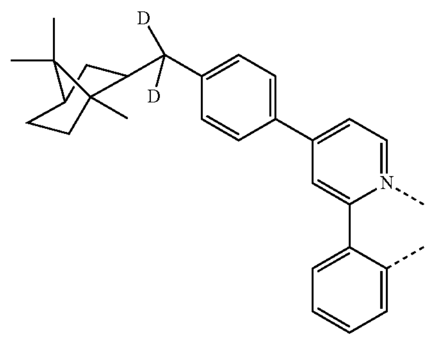
$L_{B99}$
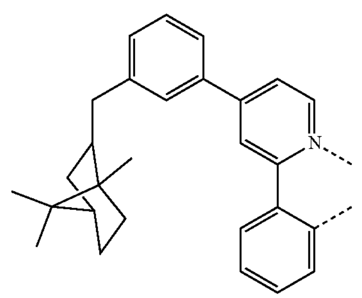
$L_{B100}$
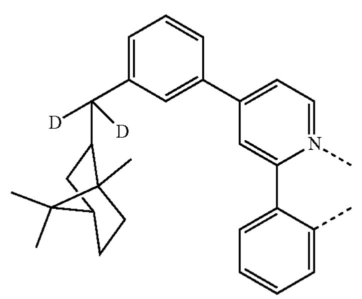

L$_{B101}$
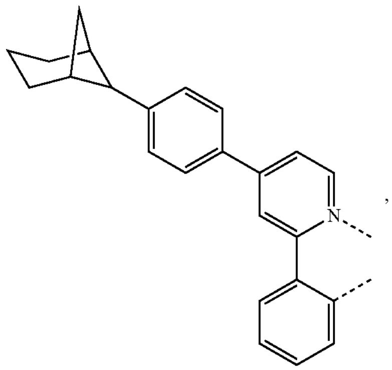
L$_{B102}$
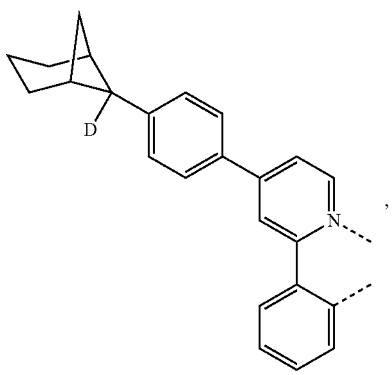
L$_{B103}$
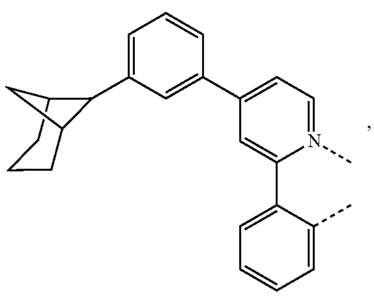
L$_{B104}$
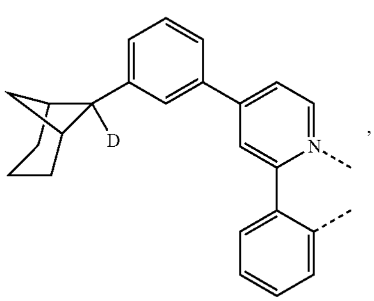
L$_{B105}$
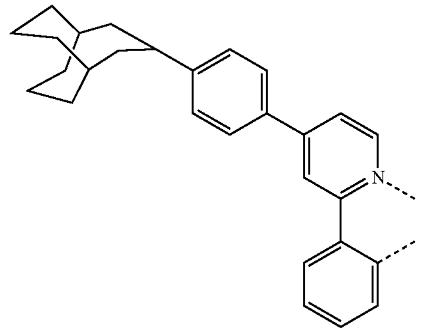
L$_{B106}$
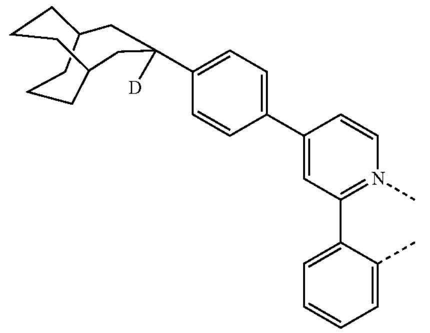
L$_{B107}$
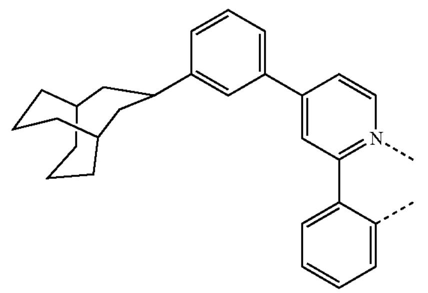
L$_{B108}$
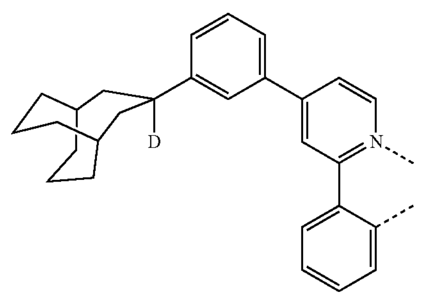
L$_{B109}$
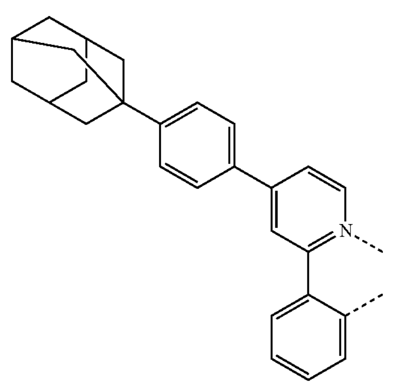

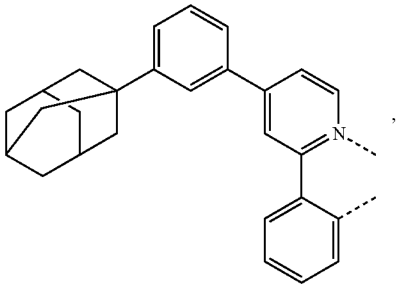
$L_{B110}$
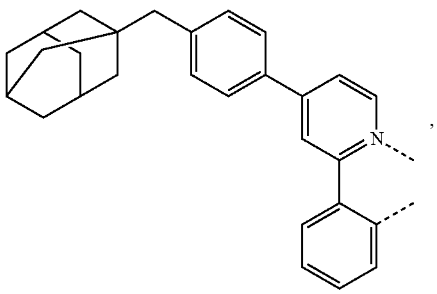
$L_{B111}$
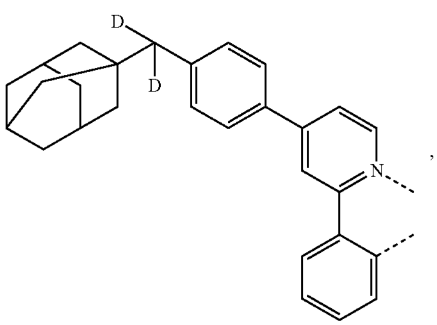
$L_{B112}$
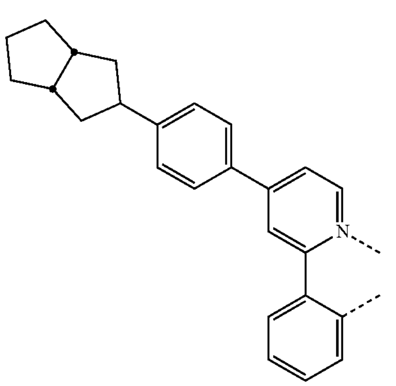
$L_{B113}$
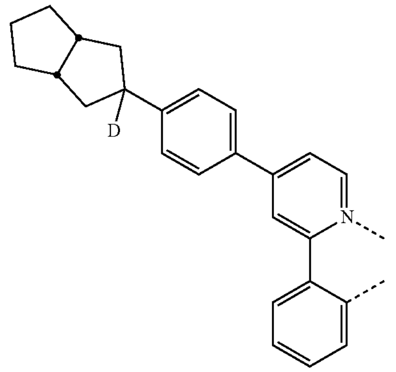
$L_{B114}$
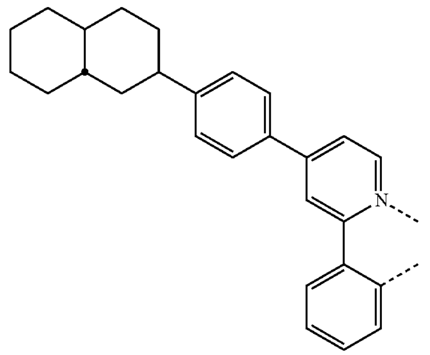
$L_{B115}$
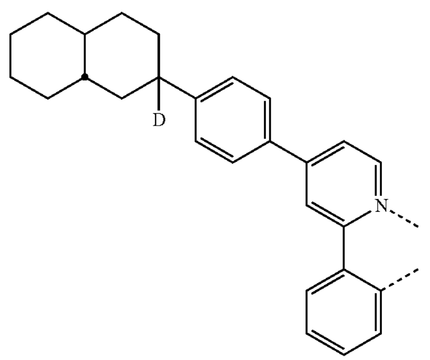
$L_{B116}$
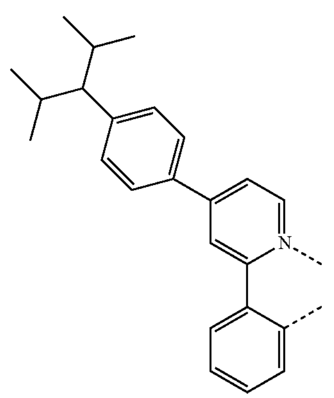
$L_{B117}$ -continued
$L_{B118}$
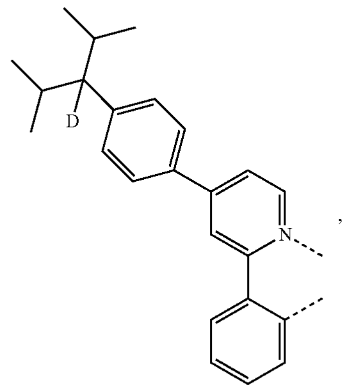
$L_{B119}$
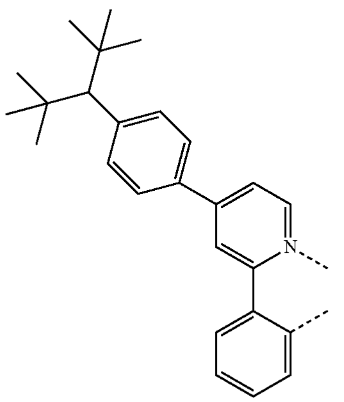
$L_{B120}$
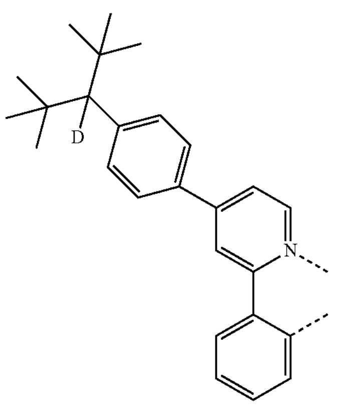
$L_{B121}$
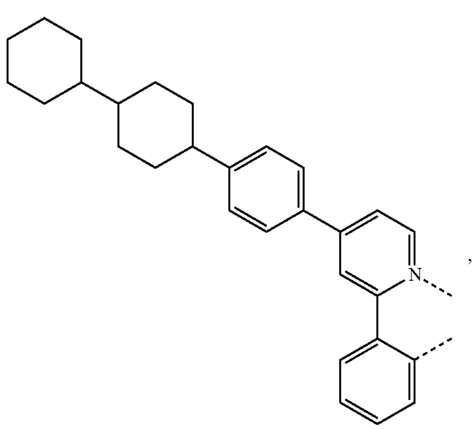
-continued
$L_{B122}$
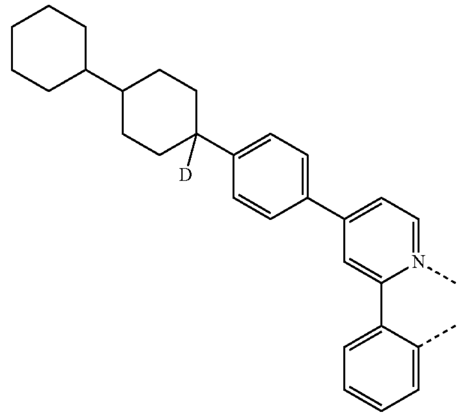
$L_{B123}$
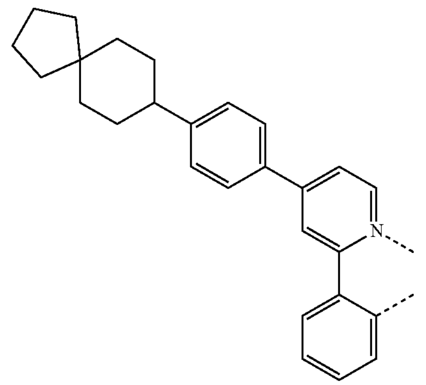
$L_{B124}$
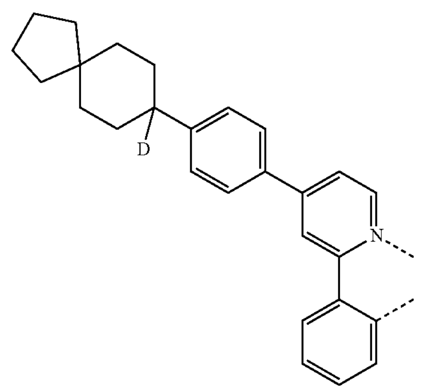
$L_{B125}$
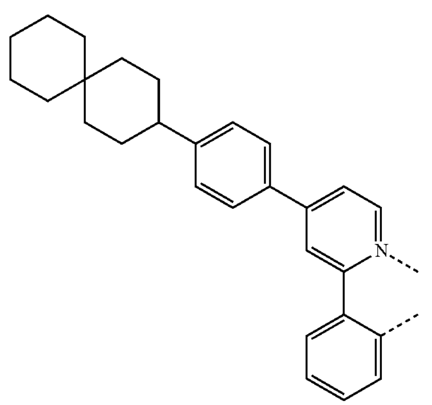

-continued
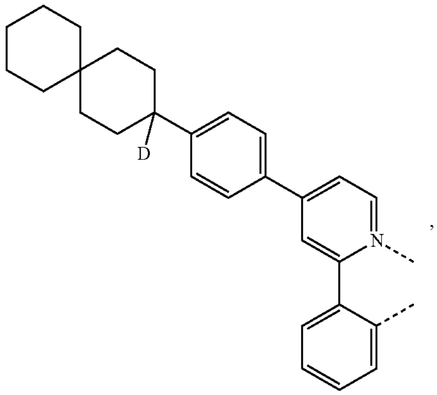
$L_{B126}$
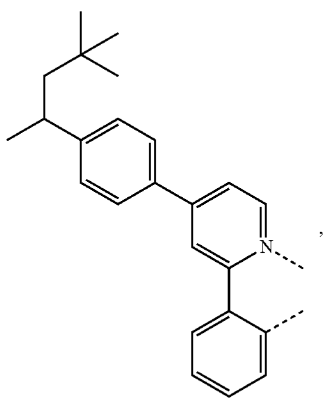
$L_{B127}$
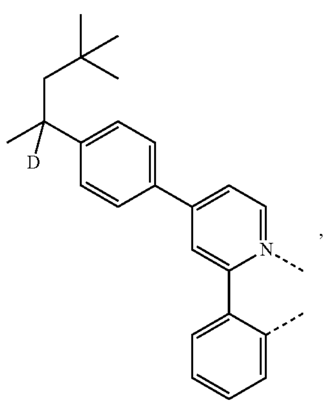
$L_{B128}$
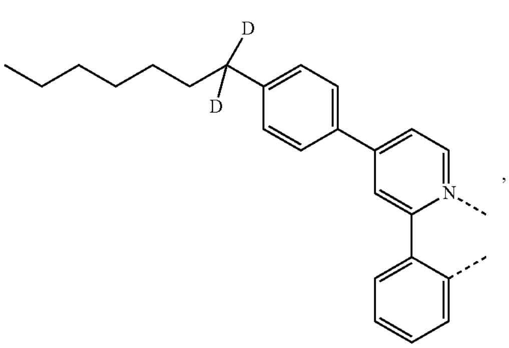
$L_{B132}$
-continued
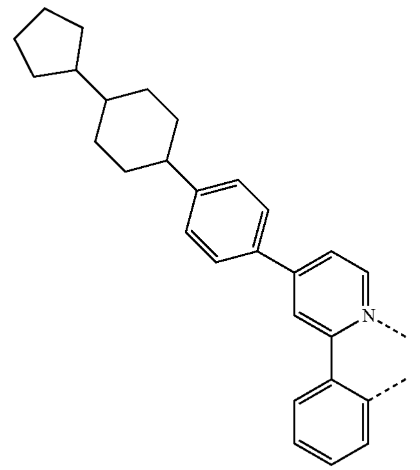
$L_{B133}$
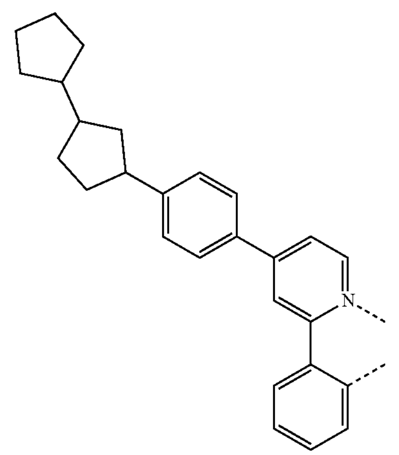
$L_{B134}$
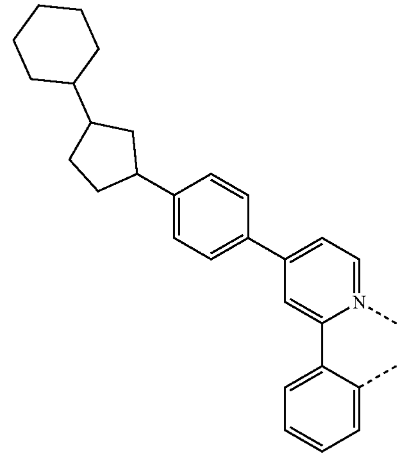
$L_{B135}$ -continued $L_{B136}$

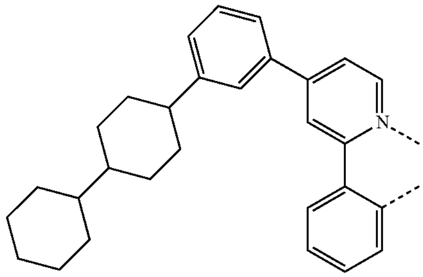

, $L_{B137}$

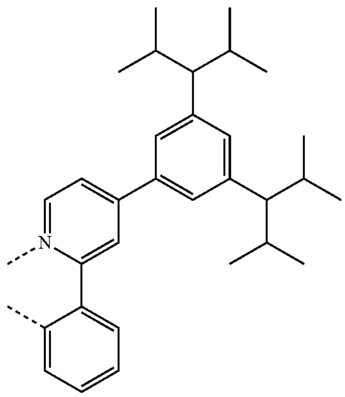

, $L_{B138}$

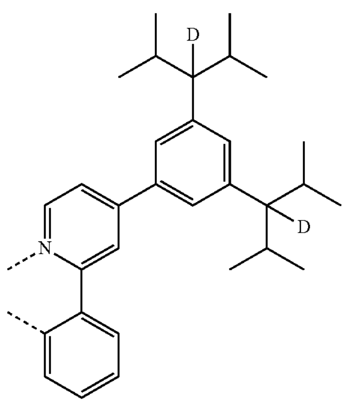

, $L_{B177}$

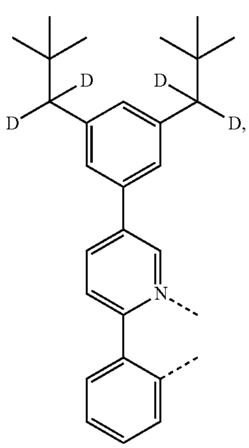

and

-continued $L_{B233}$

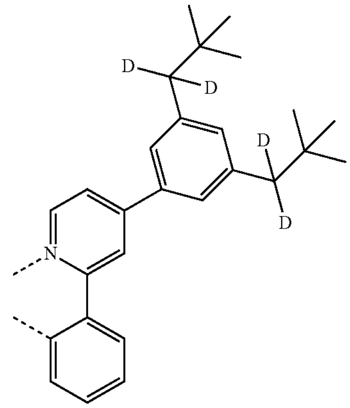

.

6. The compound of claim 1, wherein m is 2.

7. The compound of claim 1, wherein $R^1$ and $R^2$, are each independently selected from the group consisting of hydrogen, deuterium, methyl, ethyl, propyl, isopropyl, and combinations thereof.

8. A formulation comprising a compound according to claim 1.

9. An organic light-emitting device (OLED) comprising:

an anode; a cathode; and an organic layer, disposed between the anode and the cathode, comprising a compound having a formula $(L_A)_m Ir(L_B)_{3-m}$, wherein $L_A$ has a structure of Formula I

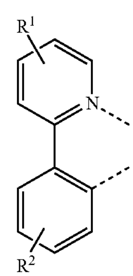

wherein m is 1 or 2;

wherein $R^1$ and $R^2$ each independently represent mono, di, tri, or tetra substitution, or no substitution;

wherein $R^1$ and $R^2$ are each independently hydrogen or a substituent selected from the group consisting of deuterium, C1 to C6 alkyl, C1 to C6 cycloalkyl, and partially or fully deuterated or fluorinated variants thereof; and wherein $L_B$ is selected from the group consisting of:
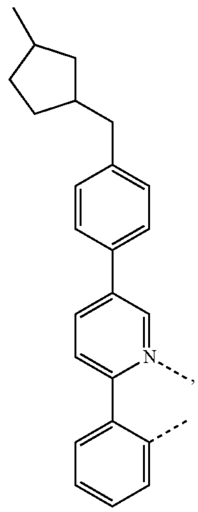
$L_{B1}$
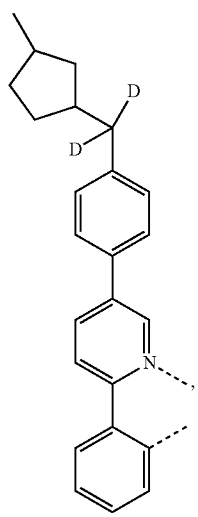
$L_{B2}$
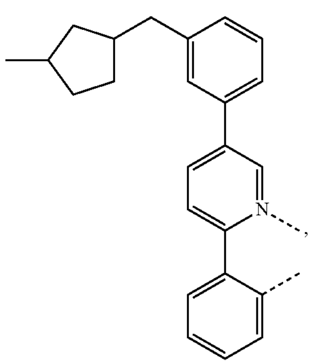
$L_{B3}$
-continued
$L_{B4}$
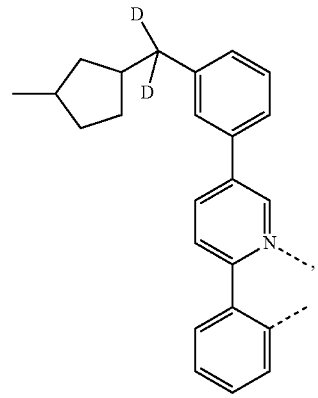
$L_{B5}$
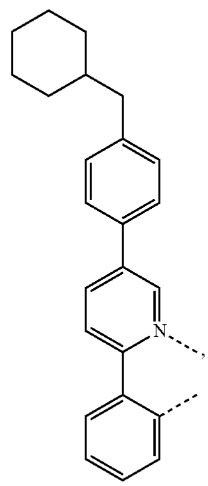
$L_{B6}$
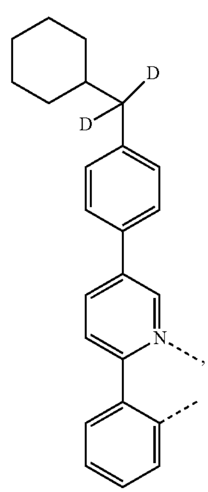

-continued
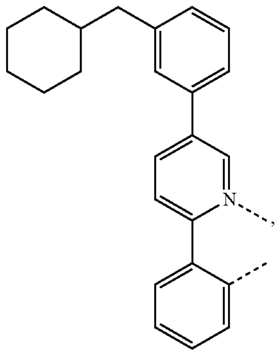
$L_{B7}$
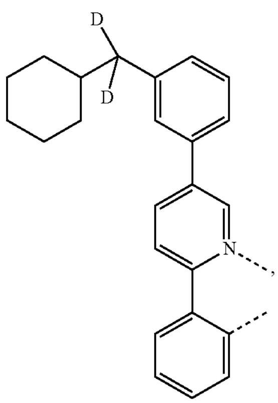
$L_{B8}$
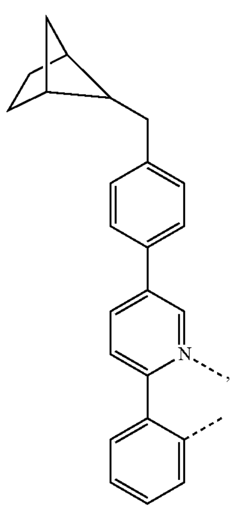
$L_{B9}$
-continued
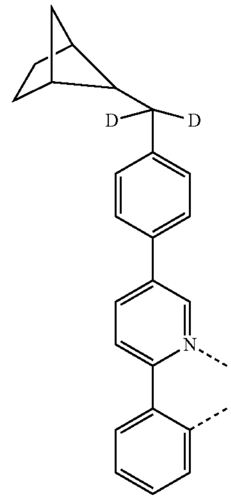
$L_{B10}$
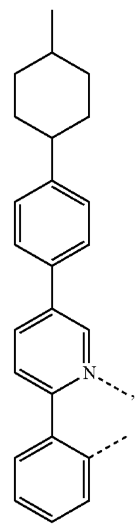
$L_{B11}$
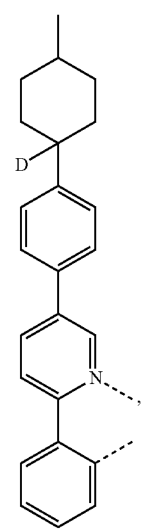
$L_{B12}$ -continued
-continued
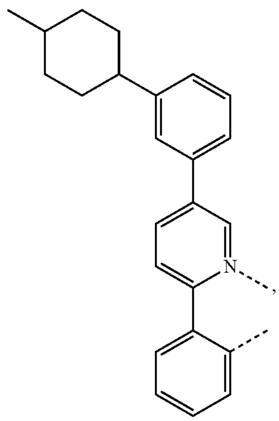
$L_{B13}$
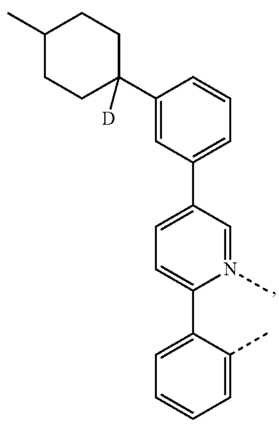
$L_{B14}$
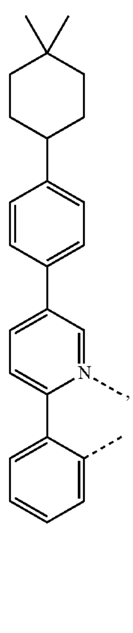
$L_{B15}$
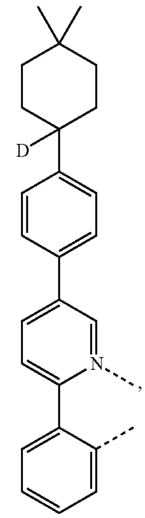
$L_{B16}$
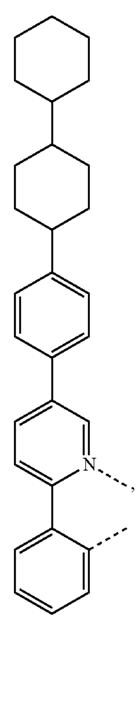
$L_{B17}$ -continued
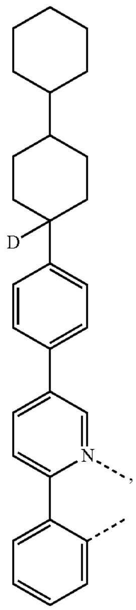
$L_{B18}$
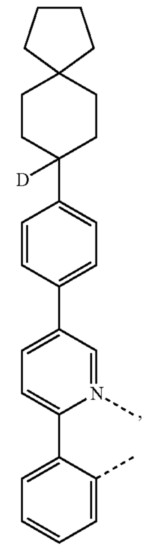
$L_{B20}$
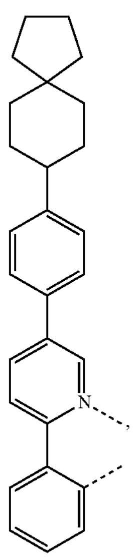
$L_{B19}$
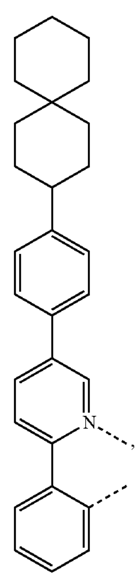
$L_{B21}$ -continued
$L_{B22}$
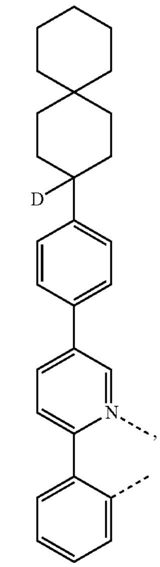
$L_{B23}$
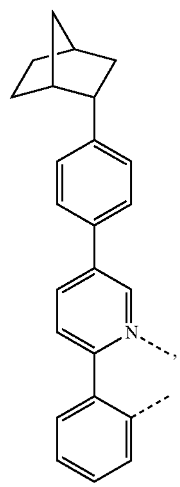
$L_{B24}$
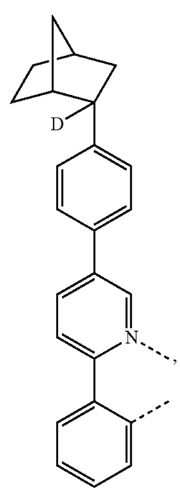
-continued
$L_{B25}$
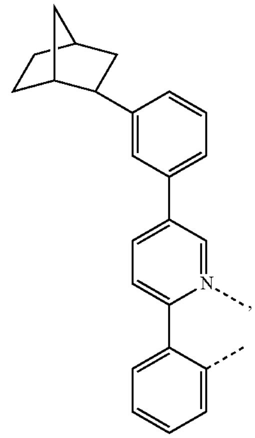
$L_{B26}$
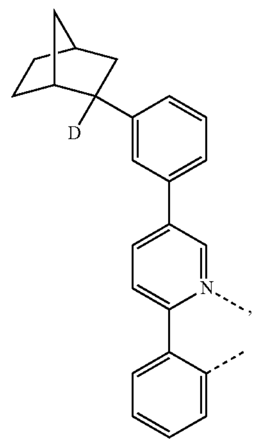
$L_{B27}$
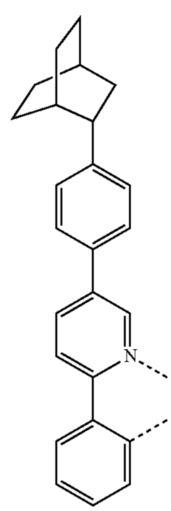

-continued
$L_{B28}$
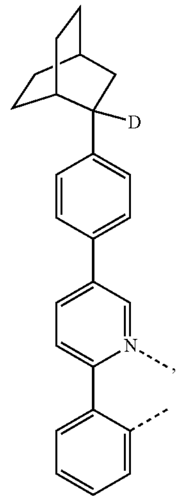
$L_{B29}$
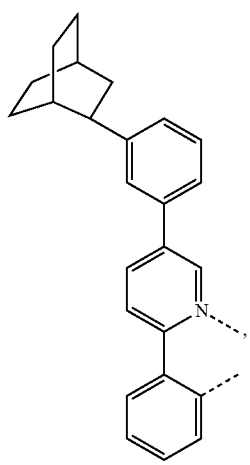
$L_{B30}$
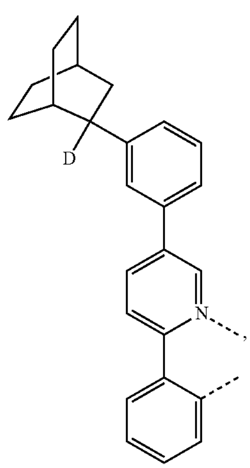
-continued
$L_{B31}$
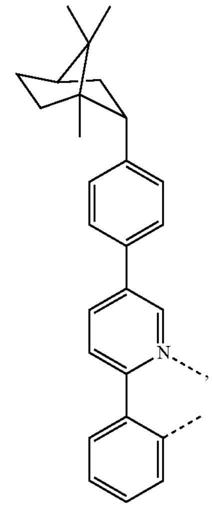
$L_{B32}$
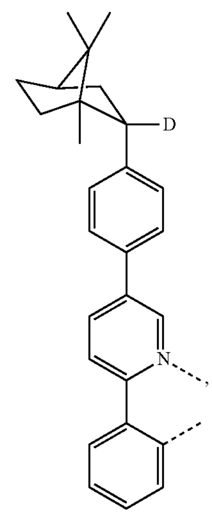
$L_{B33}$
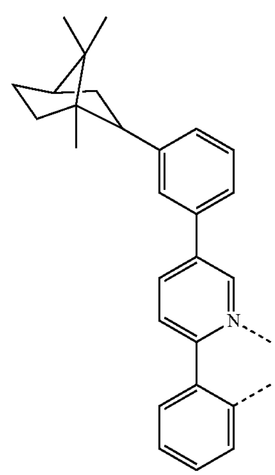

-continued
L$_{B34}$
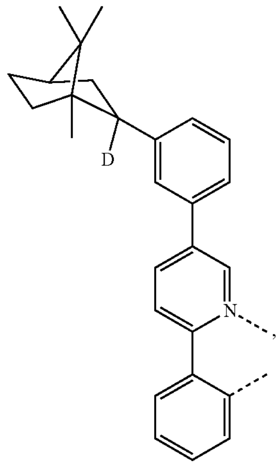
L$_{B35}$
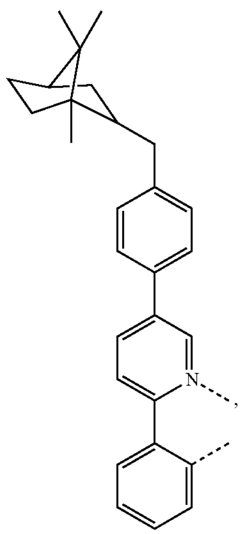
L$_{B36}$
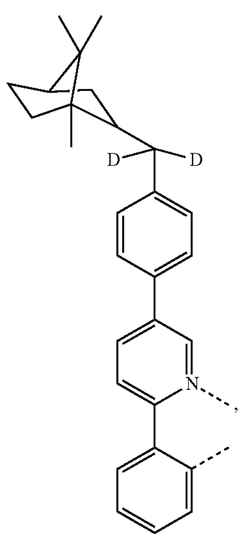
-continued
L$_{B37}$
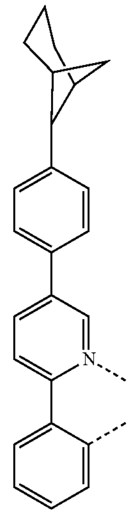
L$_{B38}$
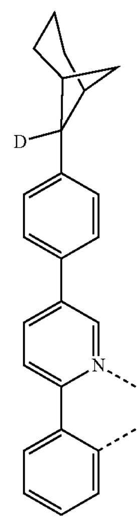
L$_{B39}$
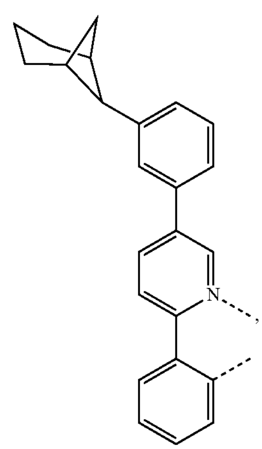

L$_{B40}$
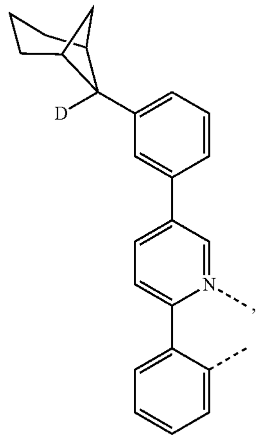
L$_{B41}$
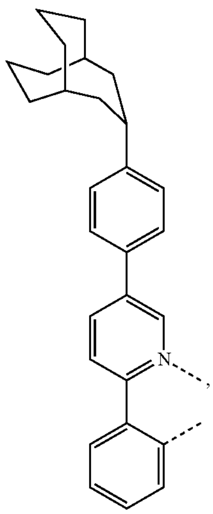
L$_{B42}$
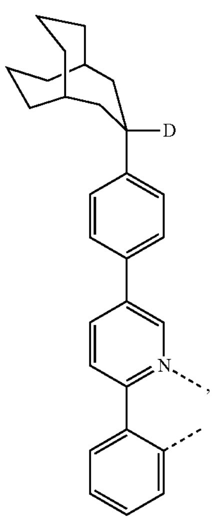
L$_{B43}$
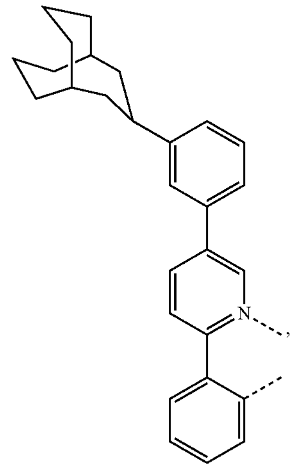
L$_{B44}$
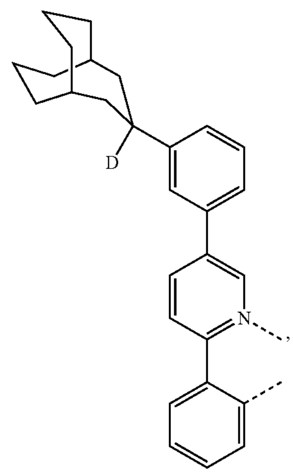
L$_{B45}$
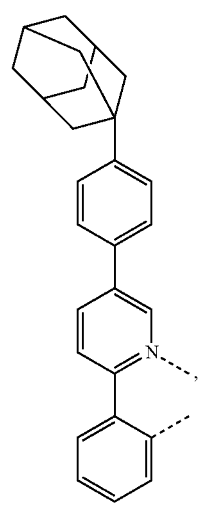

-continued
$L_{B46}$
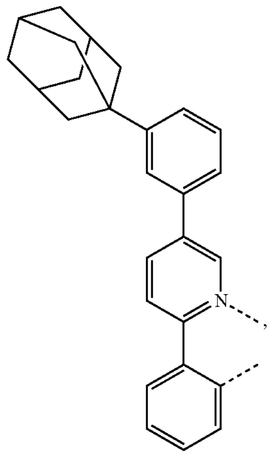
$L_{B47}$
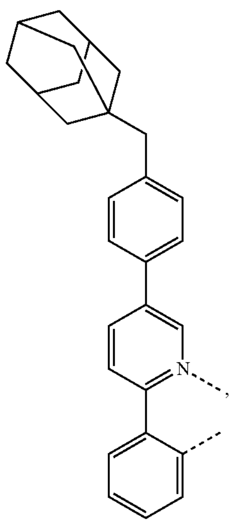
$L_{B48}$
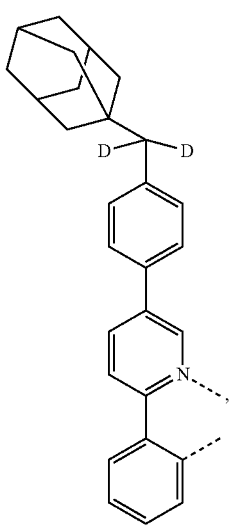
-continued
$L_{B49}$
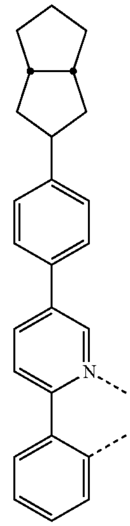
$L_{B50}$
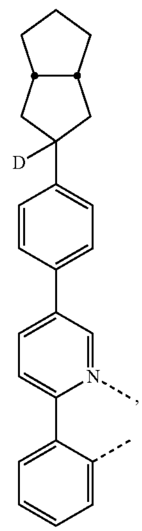
$L_{B51}$
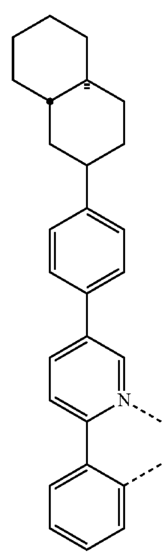

-continued
$L_{B52}$
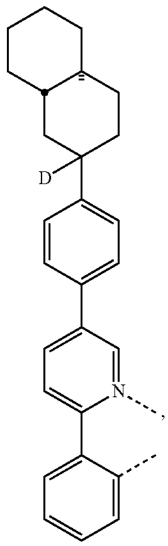
$L_{B53}$
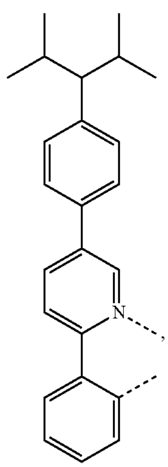
$L_{B54}$
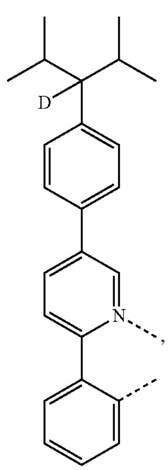
-continued
$L_{B55}$
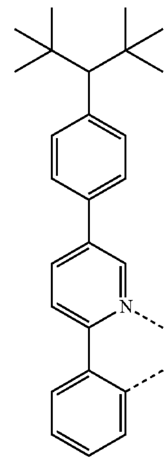
$L_{B56}$
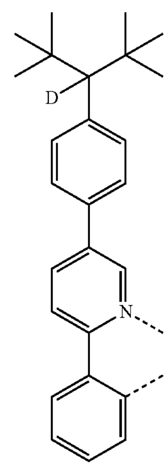
$L_{B57}$
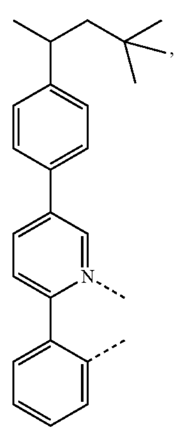

$L_{B58}$
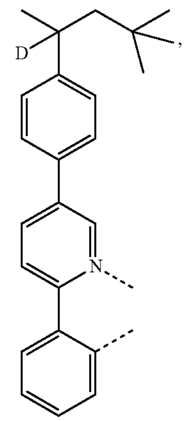
$L_{B60}$
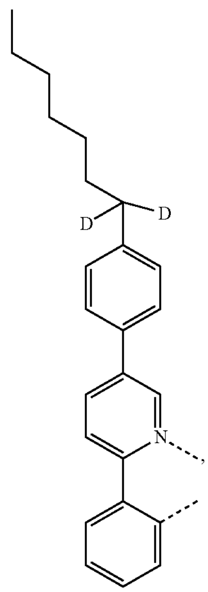
$L_{B61}$
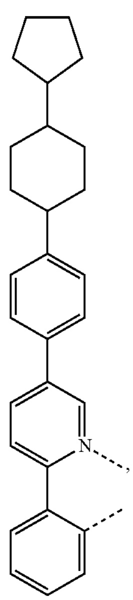
$L_{B62}$
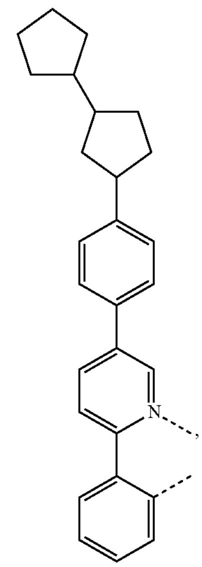
$L_{B63}$
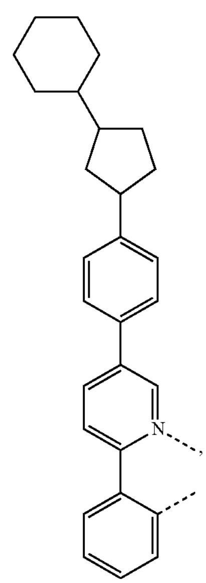

L$_{B64}$
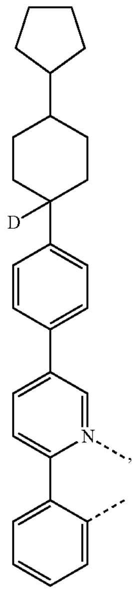
L$_{B65}$
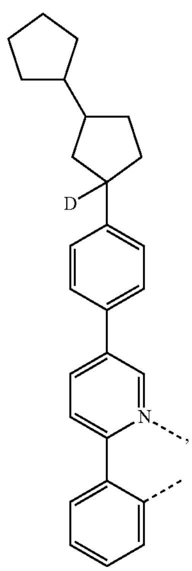
L$_{B66}$
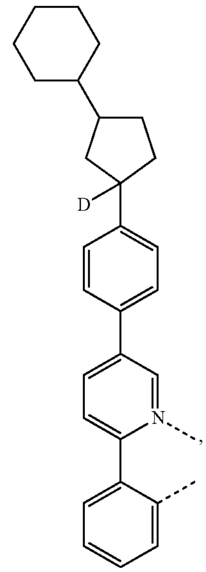
L$_{B67}$
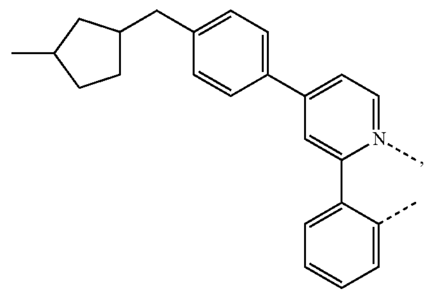
L$_{B68}$
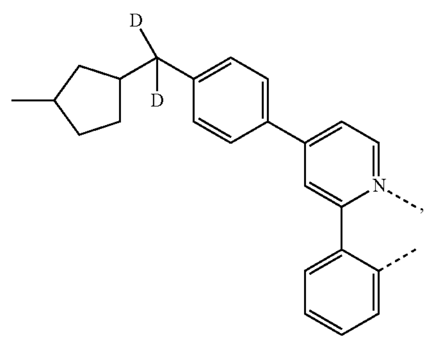
L$_{B69}$
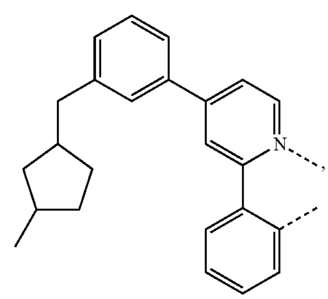

-continued
$L_{B70}$
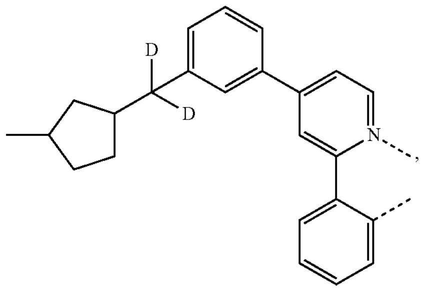
$L_{B71}$
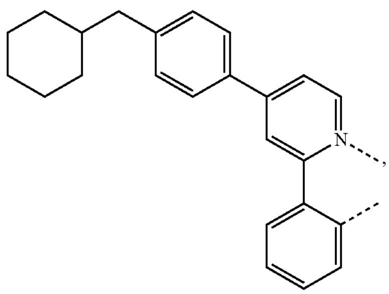
$L_{B72}$
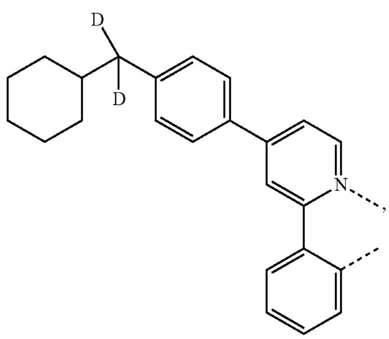
$L_{B73}$
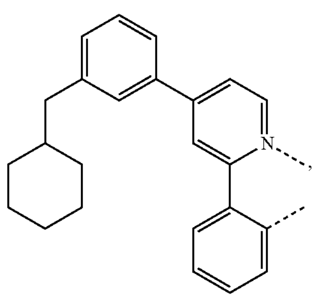
$L_{B74}$
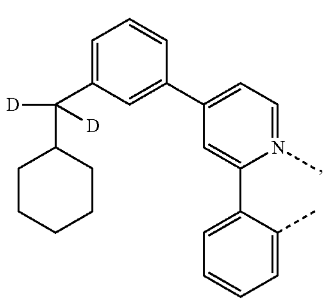
-continued
$L_{B75}$
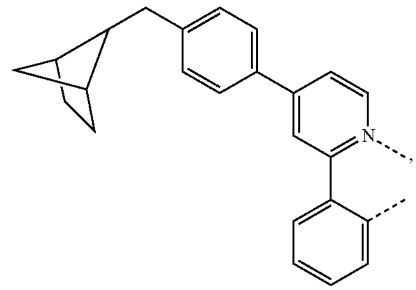
$L_{B76}$
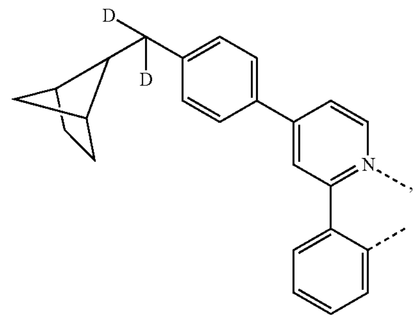
$L_{B77}$
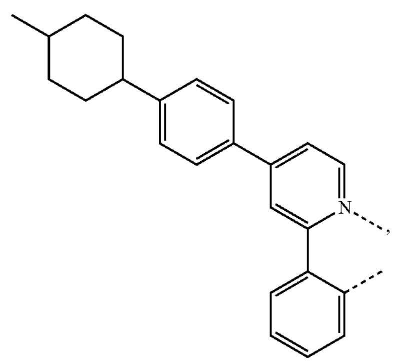
$L_{B78}$
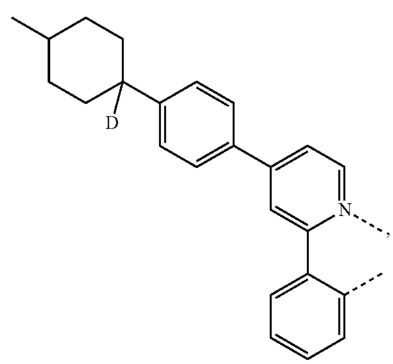
$L_{B79}$
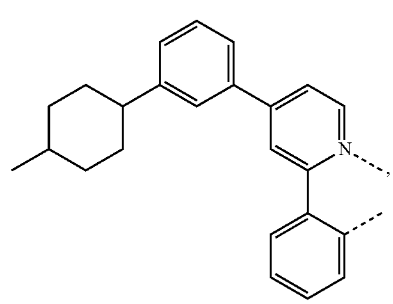

$L_{B80}$
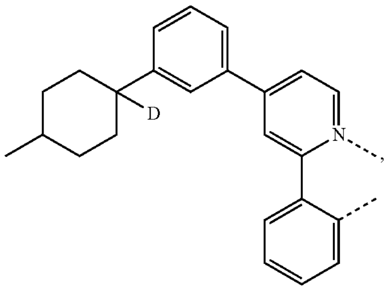
$L_{B81}$
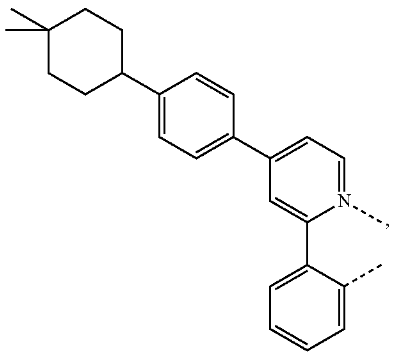
$L_{B82}$
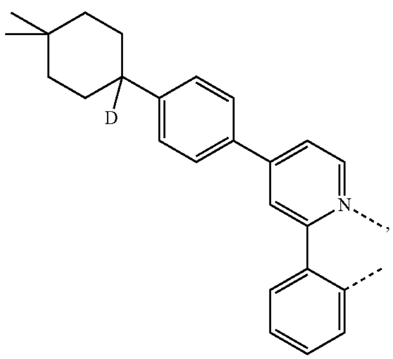
$L_{B83}$
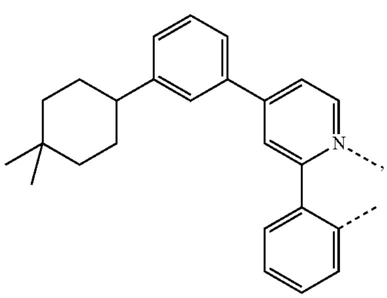
$L_{B84}$
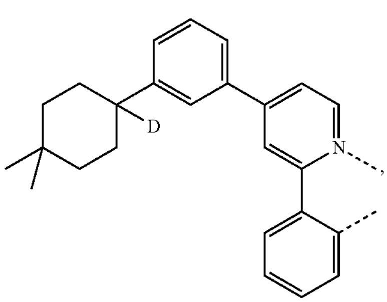
$L_{B85}$
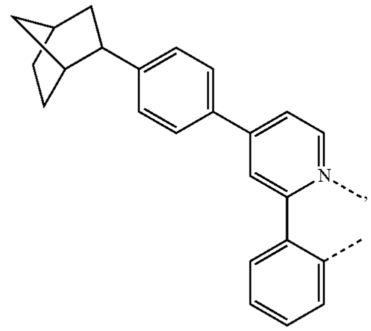
$L_{B86}$
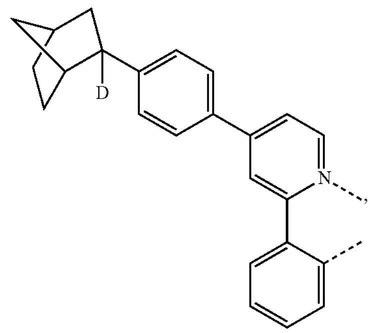
$L_{B89}$
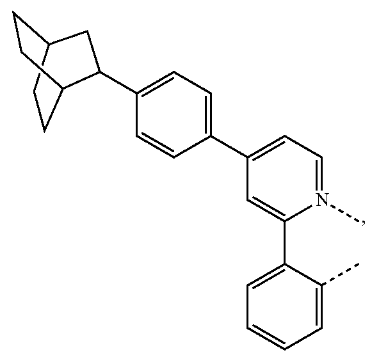
$L_{B90}$
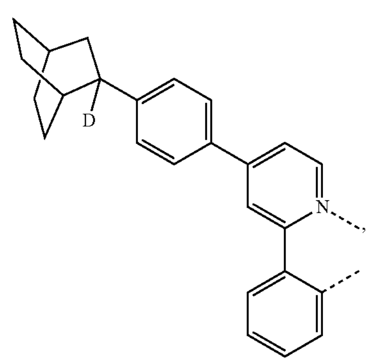

-continued
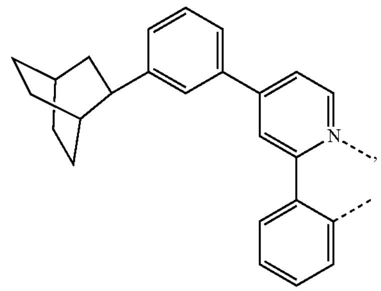
$L_{B91}$
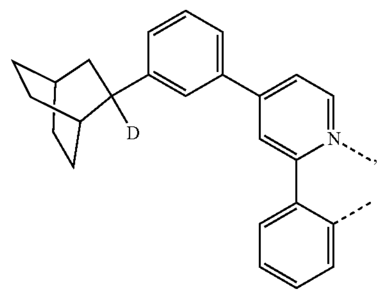
$L_{B92}$
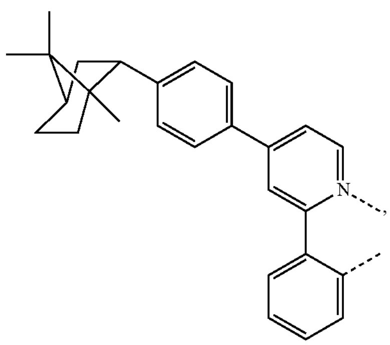
$L_{B93}$
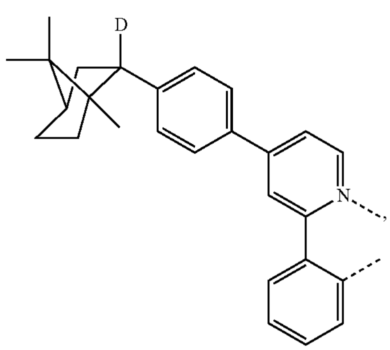
$L_{B94}$
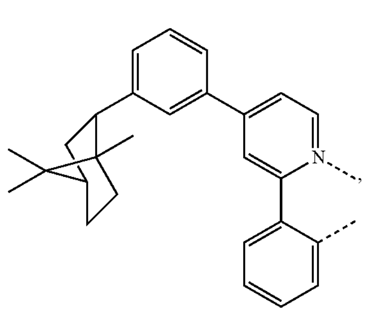
$L_{B95}$
-continued
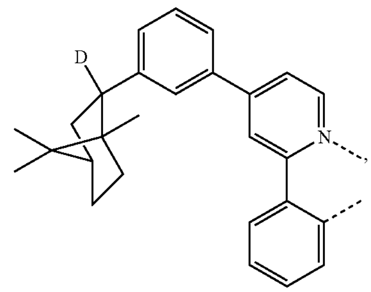
$L_{B96}$
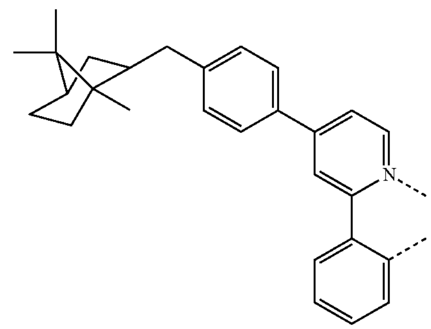
$L_{B97}$
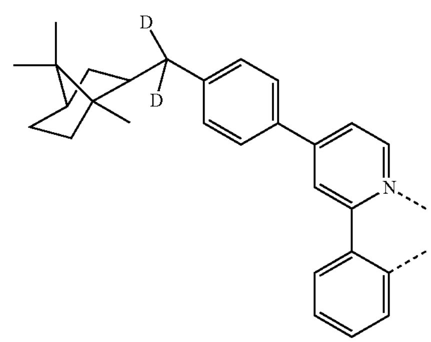
$L_{B98}$
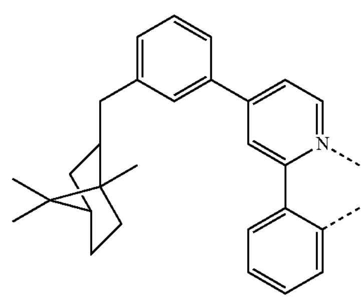
$L_{B99}$
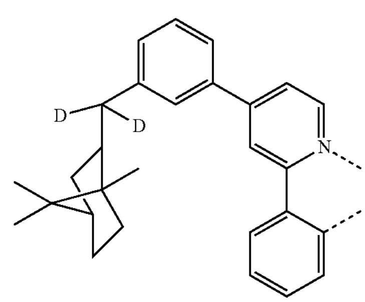
$L_{B100}$ -continued
$L_{B101}$
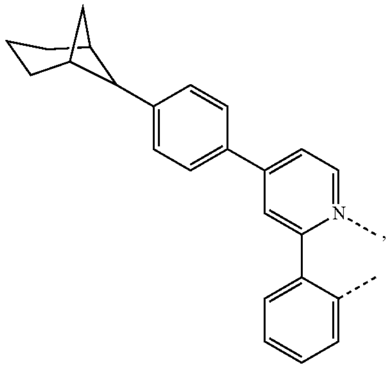
$L_{B102}$
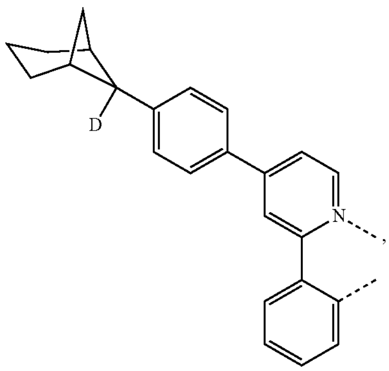
$L_{B103}$
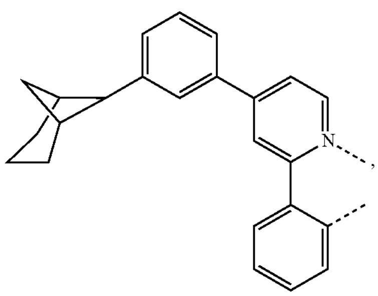
$L_{B104}$
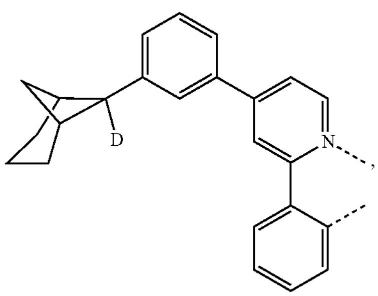
$L_{B105}$
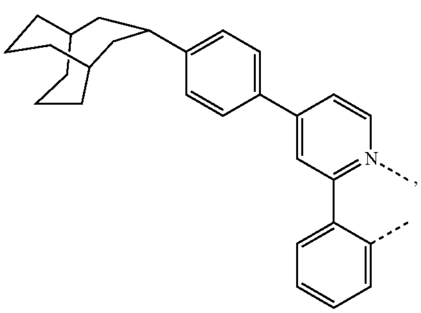
-continued
$L_{B106}$
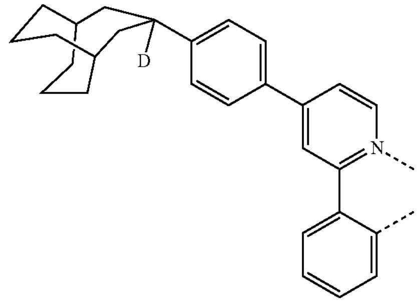
$L_{B107}$
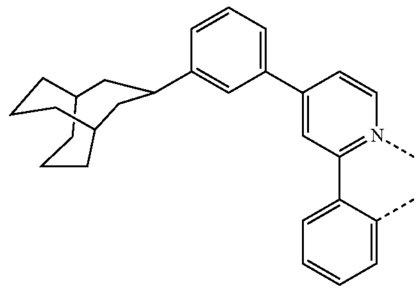
$L_{B108}$
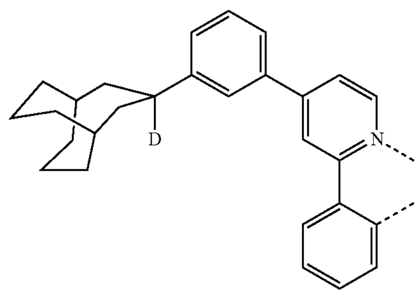
$L_{B109}$
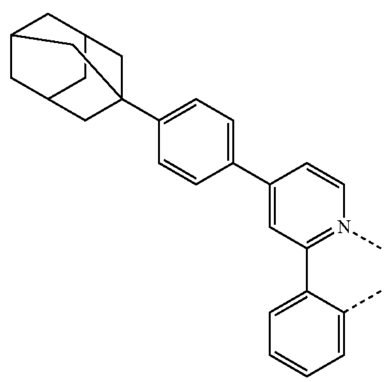
$L_{B110}$
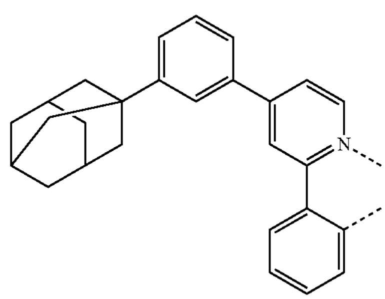

$L_{B111}$
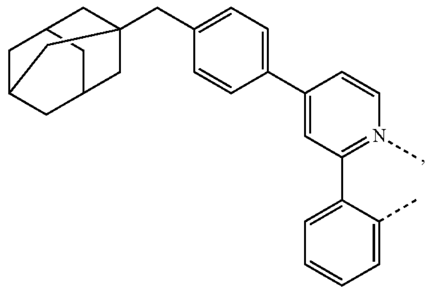
$L_{B112}$
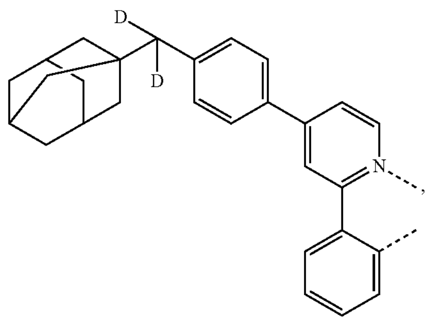
$L_{B113}$
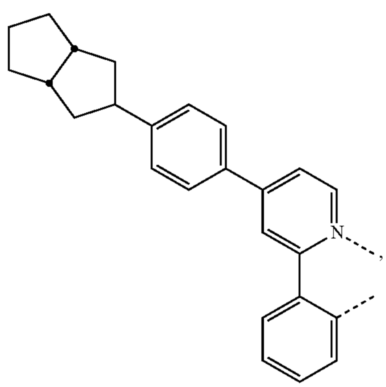
$L_{B114}$
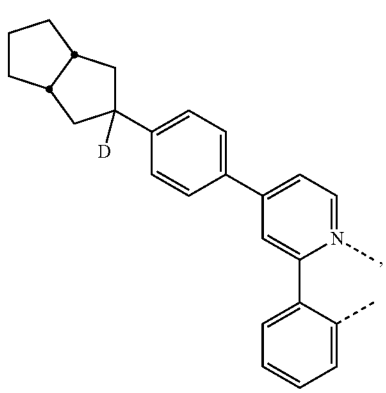
$L_{B115}$
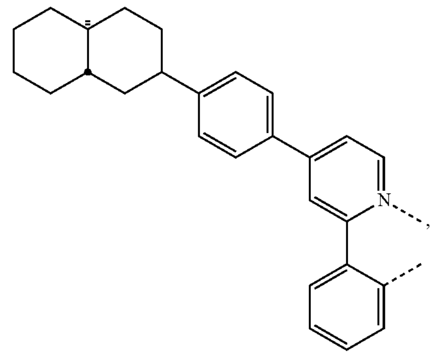
$L_{B116}$
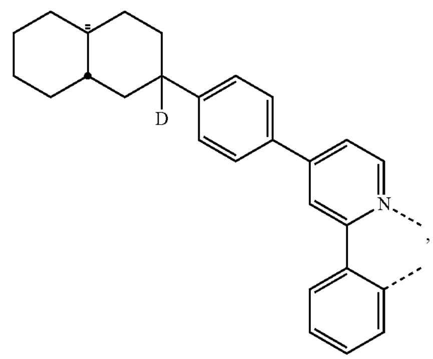
$L_{B117}$
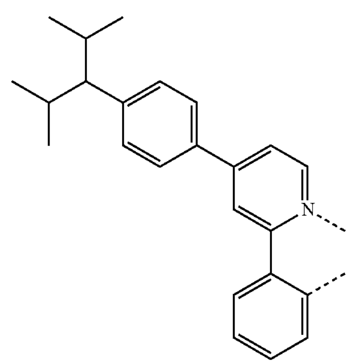
$L_{B118}$
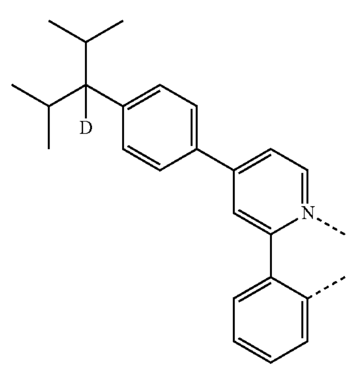

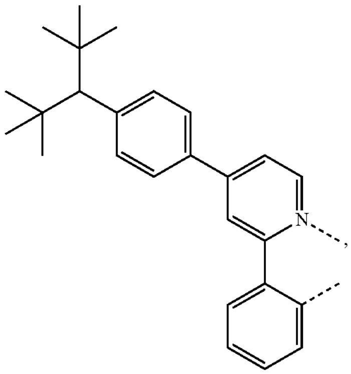
$L_{B119}$
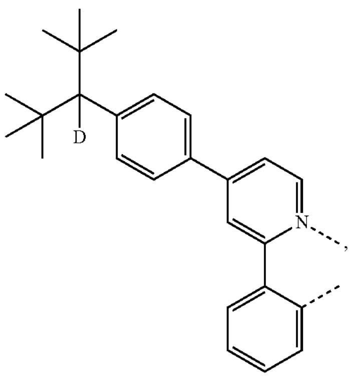
$L_{B120}$
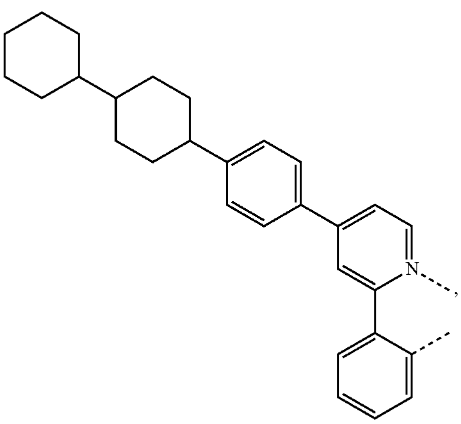
$L_{B121}$
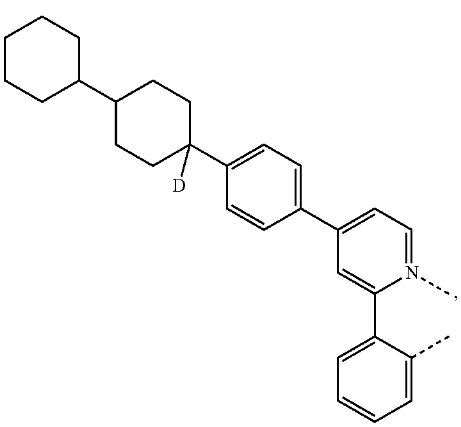
$L_{B122}$
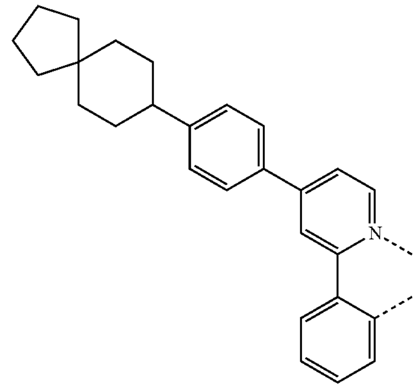
$L_{B123}$
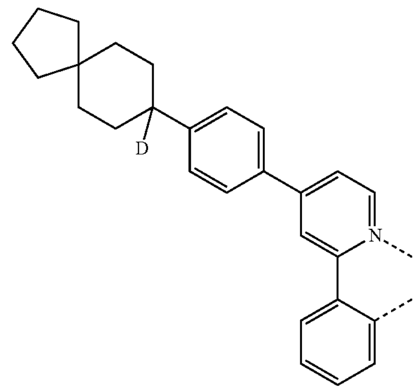
$L_{B124}$
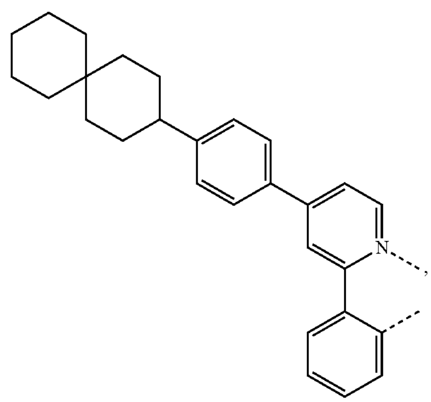
$L_{B125}$
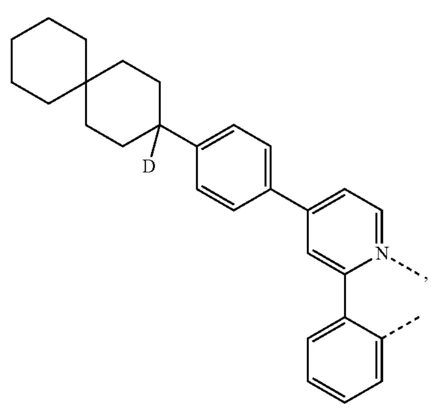
$L_{B126}$ -continued
$L_{B127}$
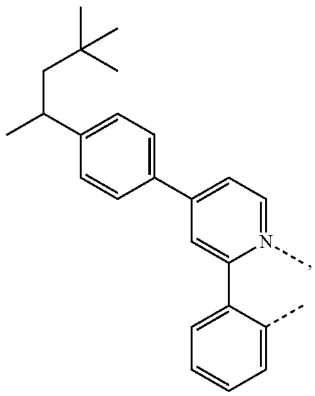
$L_{B128}$
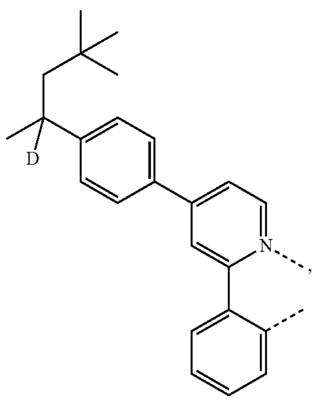
$L_{B132}$
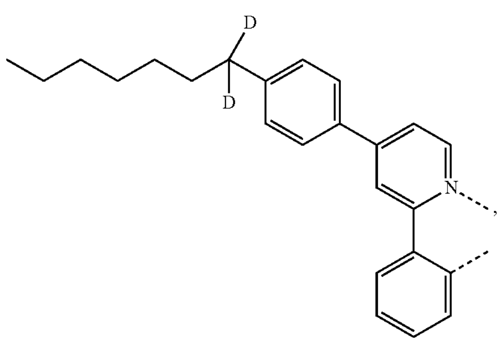
$L_{B133}$
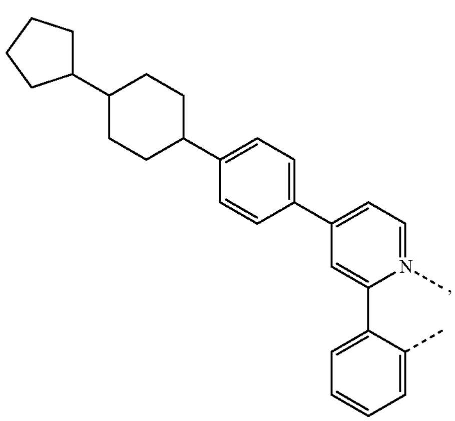
-continued
$L_{B134}$
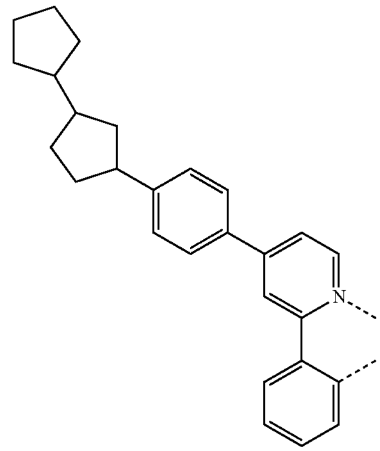
$L_{B135}$
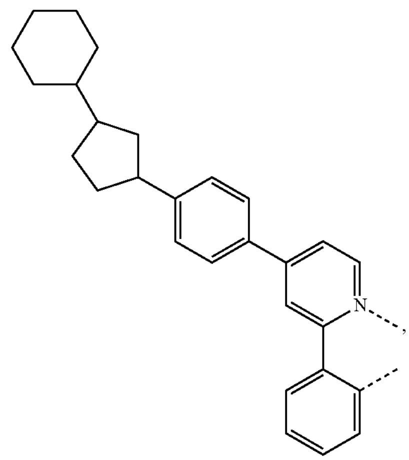
$L_{B136}$
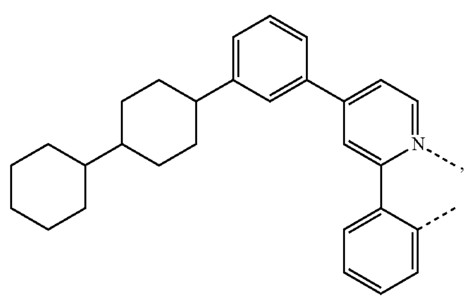
$L_{B137}$
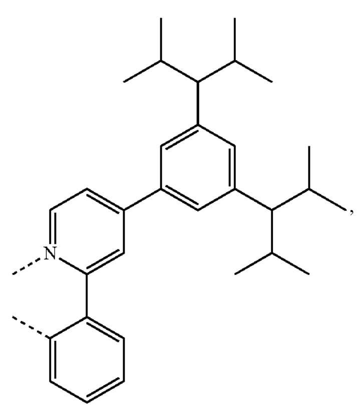

-continued $L_{B138}$

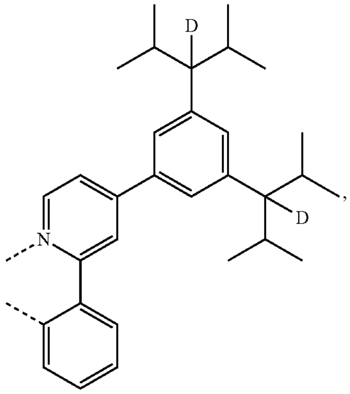

$L_{B177}$

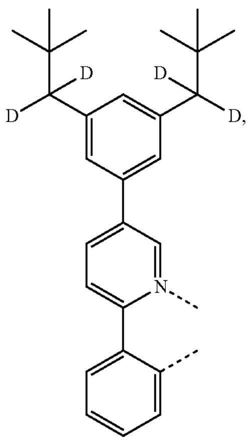

and $L_{B223}$

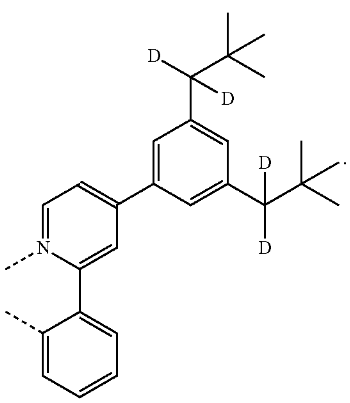

10. A device selected from the group consisting of a consumer product, an electronic component module, and a lighting panel, said device comprising an OLED according to claim 9.

11. The OLED of claim 9, wherein the organic layer is an emissive layer and the compound is an emissive dopant or a non-emissive dopant.

12. The OLED of claim 9, wherein the organic layer further comprises a host, wherein host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

13. The OLED of claim 9, wherein the organic layer further comprises a host, wherein the host is selected from the group consisting of:

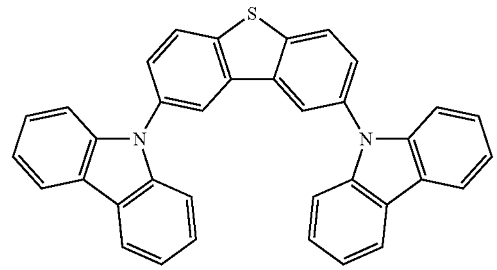

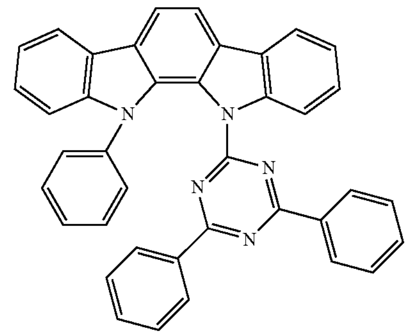

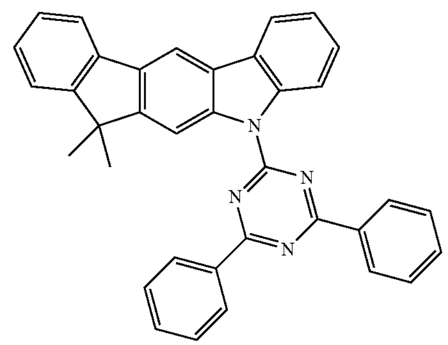

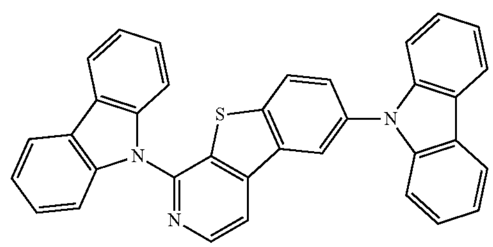

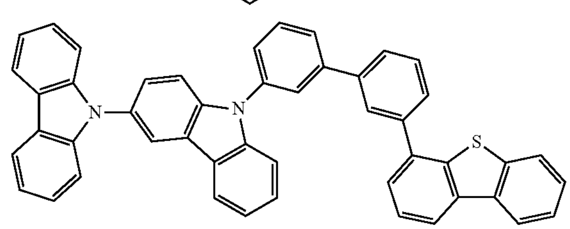

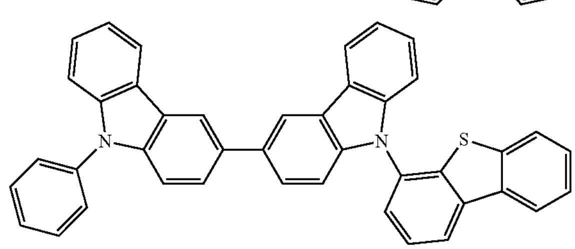

-continued
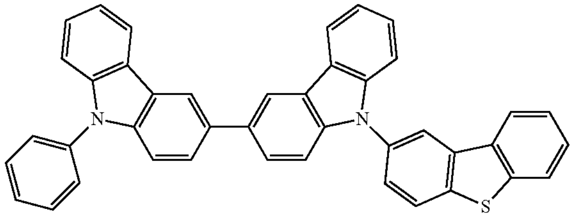
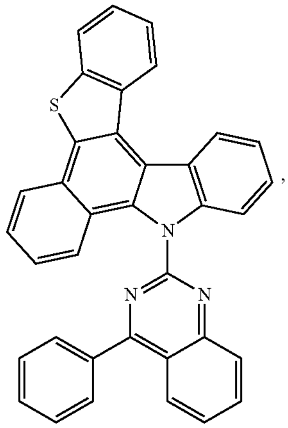
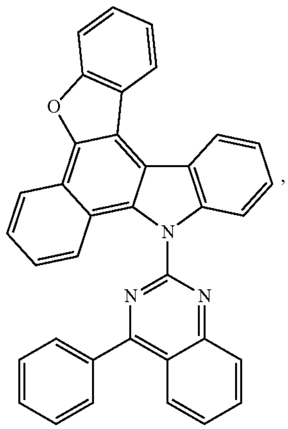
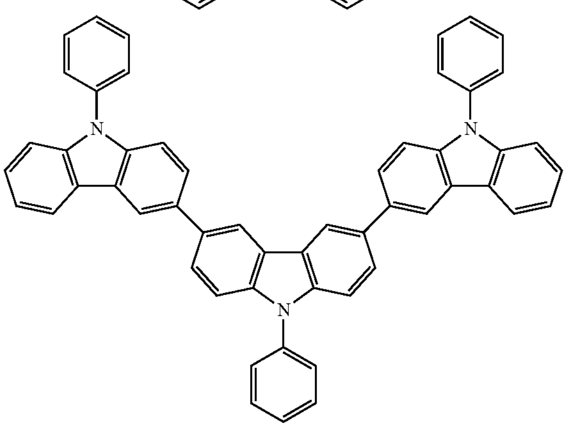
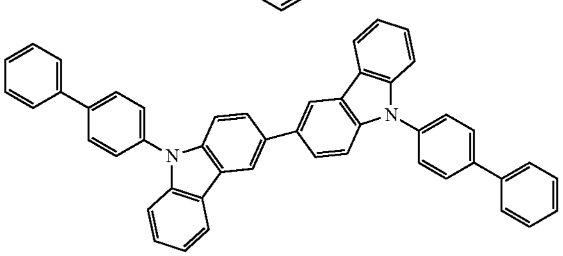
-continued
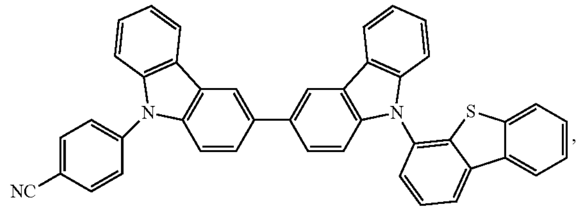
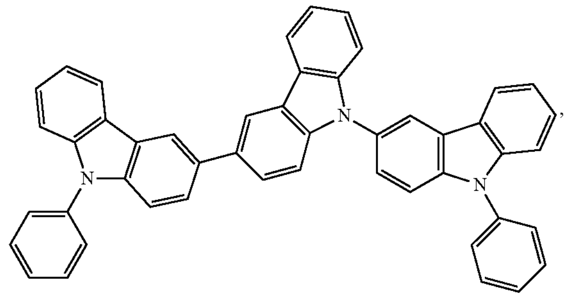
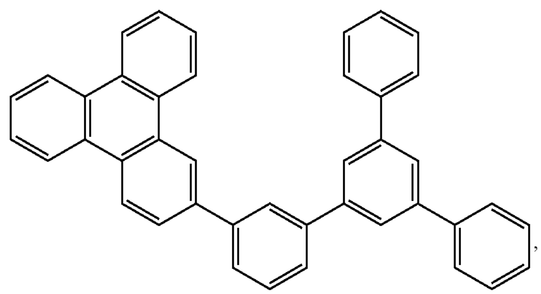
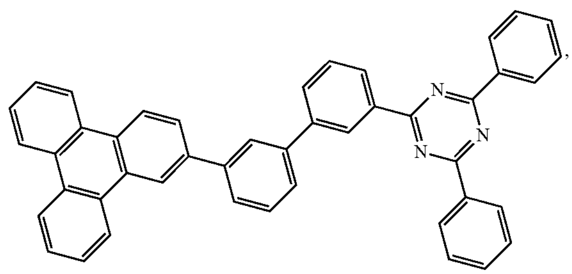
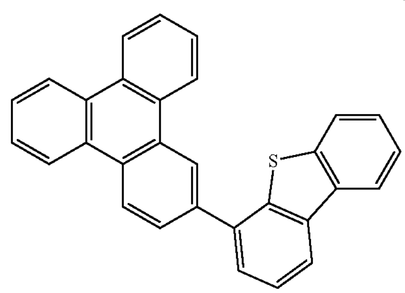
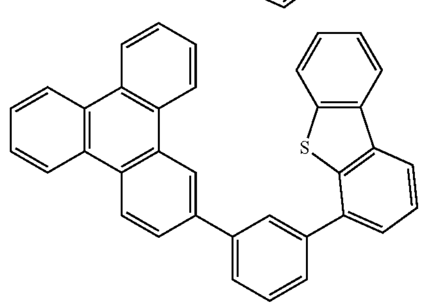

-continued

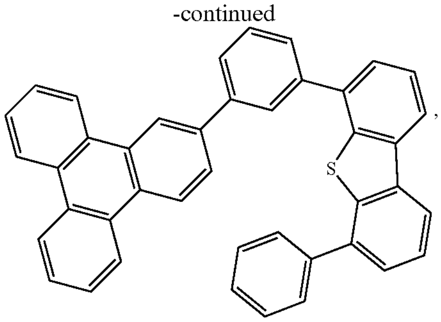

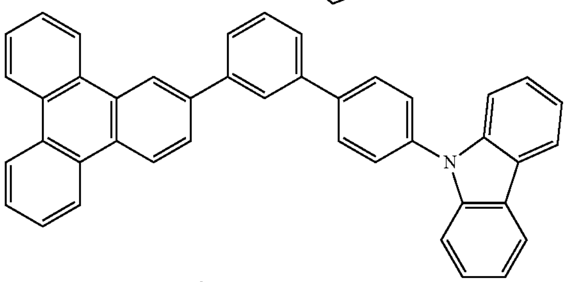

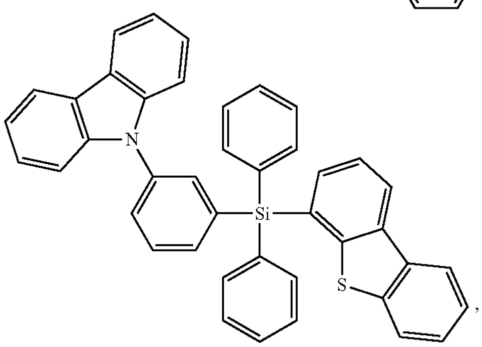

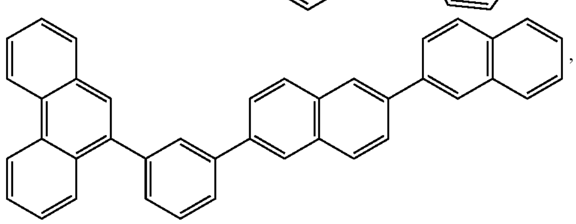

and combinations thereof.

14. A consumer product comprising:

an organic light-emitting device (OLED) comprising:

an anode; a cathode; and an organic layer, disposed between the anode and the cathode, comprising a compound having a formula $(L_A)_m Ir(Le)_{3-m}$, wherein $L_A$ has a structure of Formula I

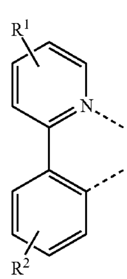

wherein m is 1 or 2;

wherein $R^1$ and $R^2$ each independently represent mono, di, tri, or tetra substitution, or no substitution;

wherein $R^1$ and $R^2$ are each independently hydrogen or a substituent selected from the group consisting of deuterium, C1 to C6 alkyl, C1 to C6 cycloalkyl, and partially or fully deuterated or fluorinated variants thereof; and wherein $L_B$ is selected from the group consisting of:

$L_{B1}$

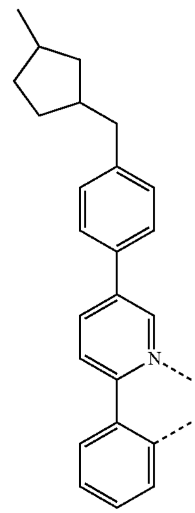

$L_{B2}$

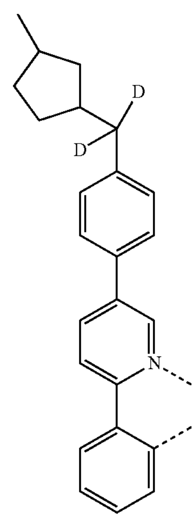

$L_{B3}$

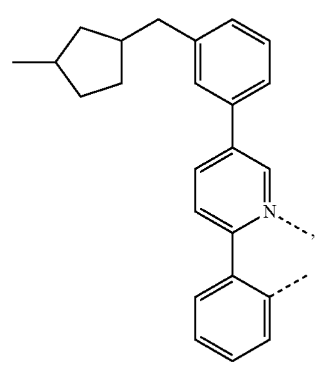

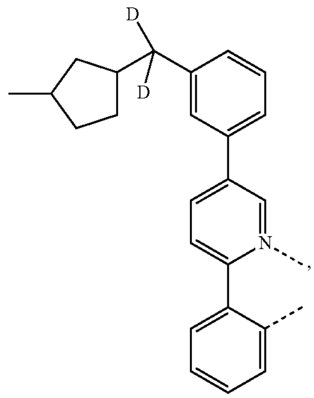
$L_{B4}$
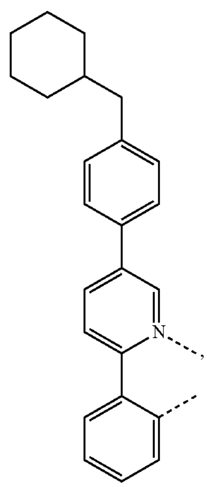
$L_{B5}$
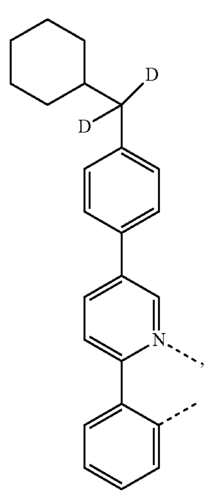
$L_{B6}$
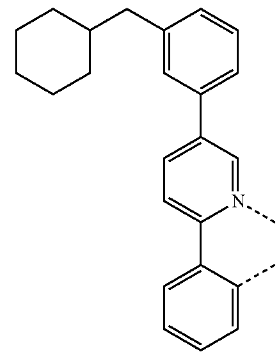
$L_{B7}$
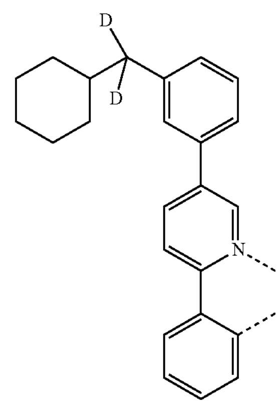
$L_{B8}$
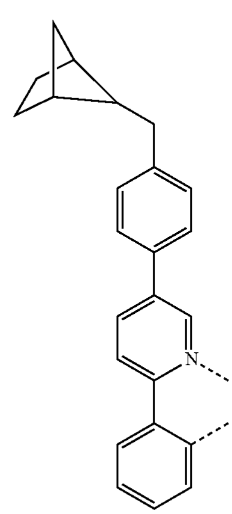
$L_{B9}$ -continued
$L_{B10}$
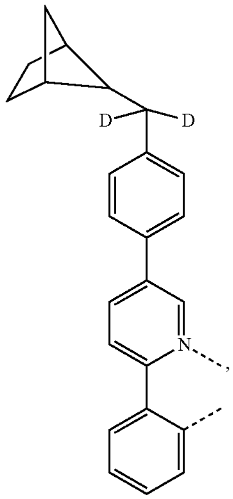
$L_{B11}$
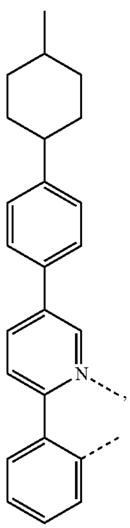
$L_{B12}$
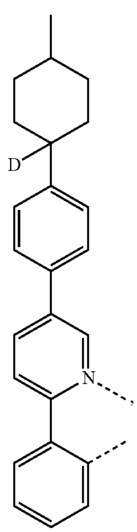
-continued
$L_{B13}$
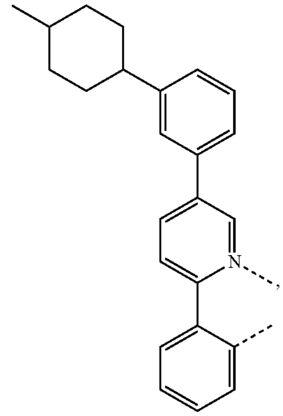
$L_{B14}$
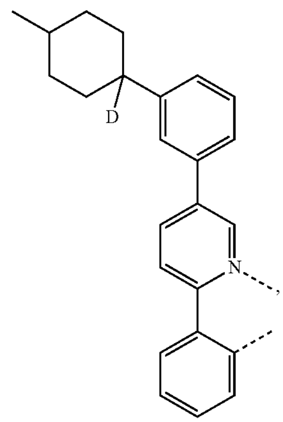
$L_{B15}$
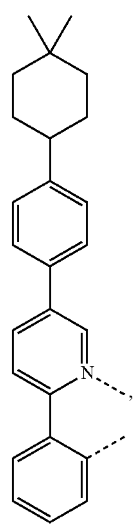

-continued
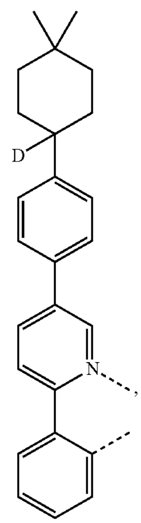
$L_{B16}$
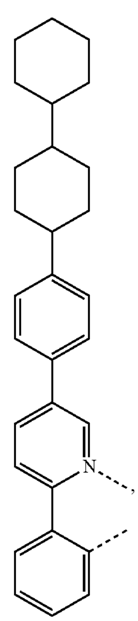
$L_{B17}$
-continued
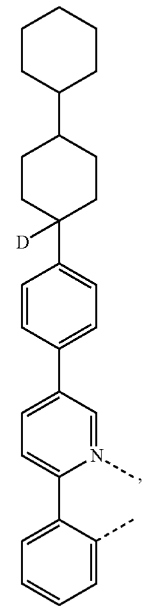
$L_{B18}$
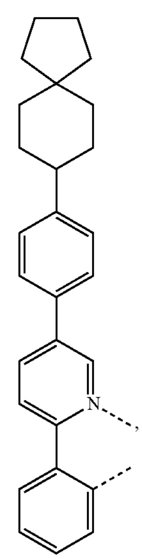
$L_{B19}$ -continued
$L_{B20}$
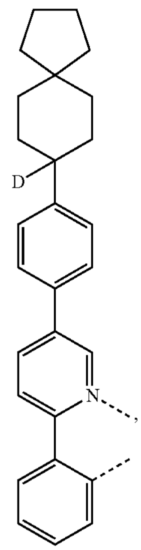
$L_{B21}$
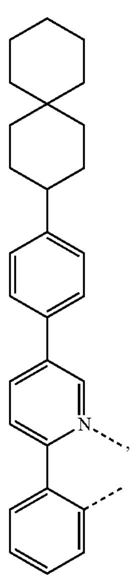
-continued
$L_{B22}$
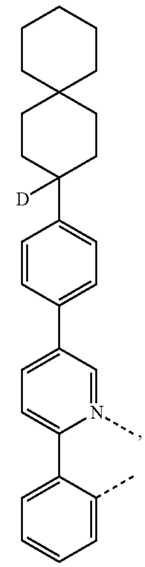
$L_{B23}$
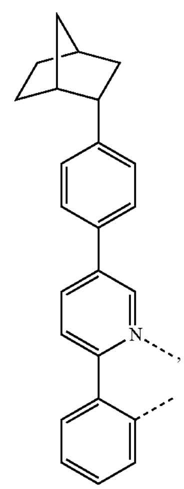
$L_{B24}$
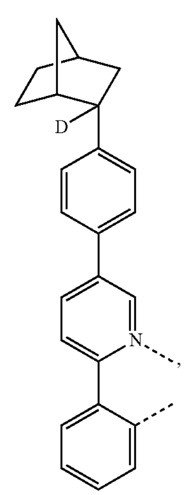

-continued
$L_{B25}$
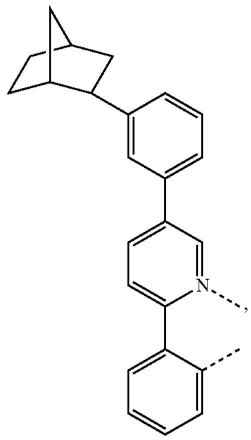
$L_{B26}$
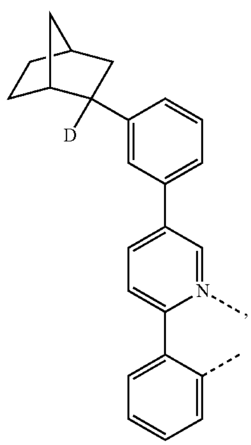
$L_{B27}$
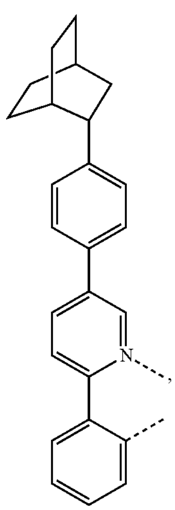
-continued
$L_{B28}$
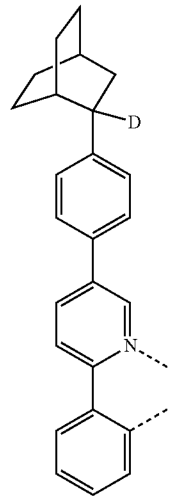
$L_{B29}$
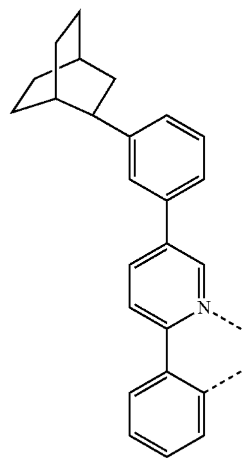
$L_{B30}$
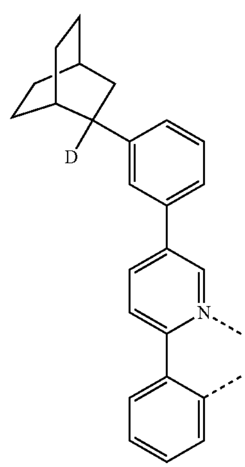

-continued
$L_{B31}$
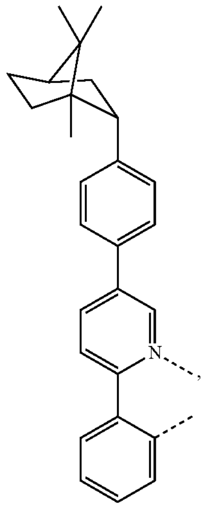
$L_{B32}$
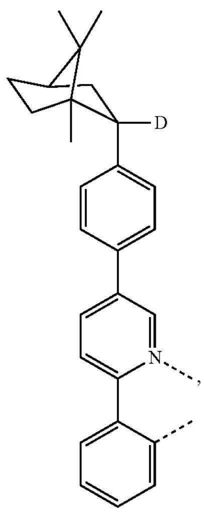
$L_{B33}$
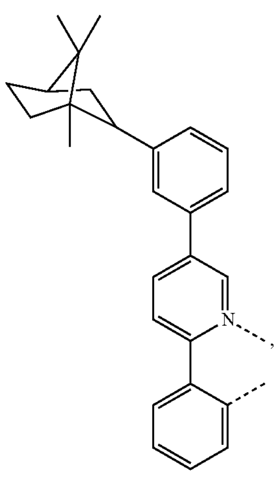
-continued
$L_{B34}$
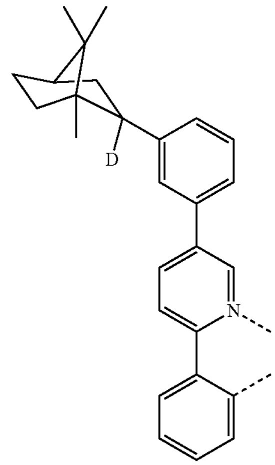
$L_{B35}$
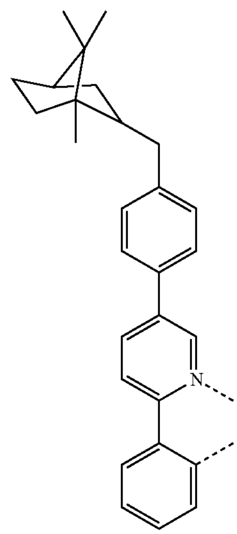
$L_{B36}$
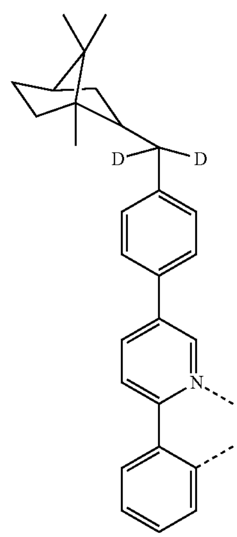

-continued
$L_{B37}$
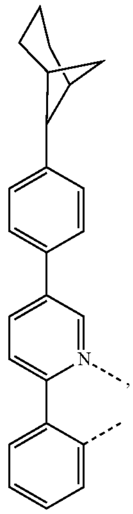
$L_{B38}$
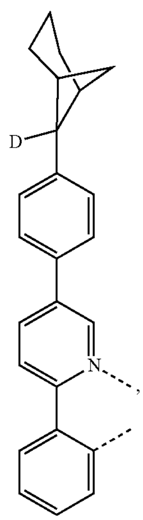
$L_{B39}$
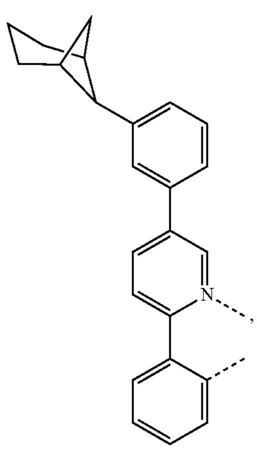
-continued
$L_{B40}$
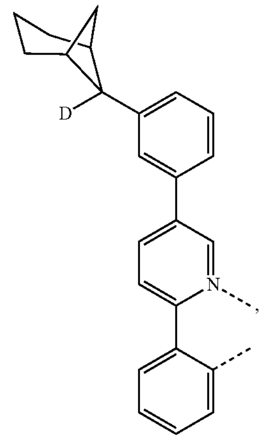
$L_{B41}$
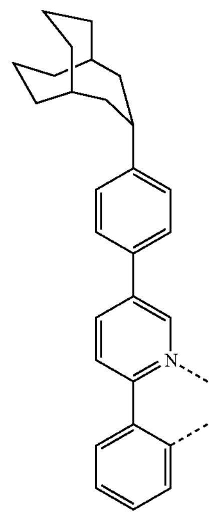
$L_{B42}$
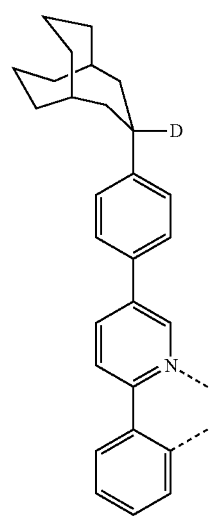

-continued
$L_{B43}$
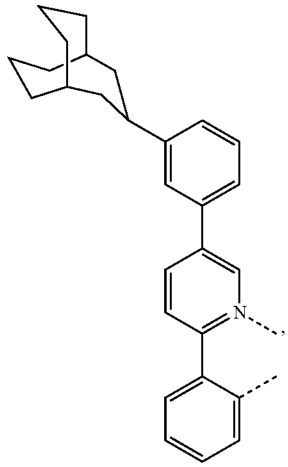
$L_{B44}$
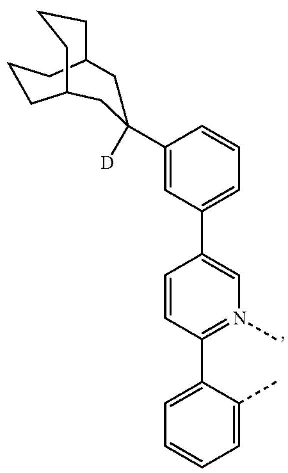
$L_{B45}$
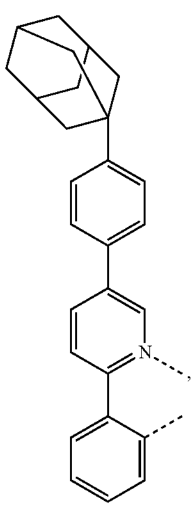
-continued
$L_{B46}$
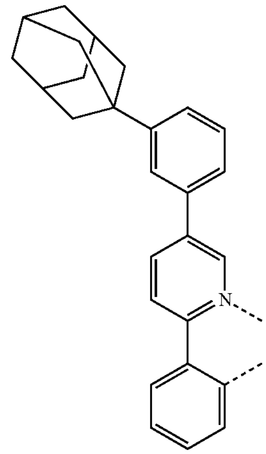
$L_{B47}$
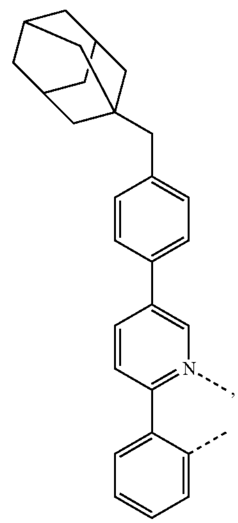
$L_{B48}$
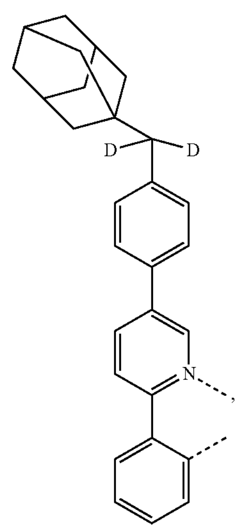

-continued
L$_{B49}$
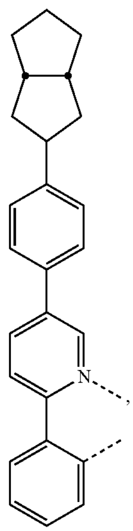
L$_{B50}$
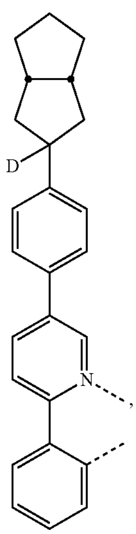
L$_{B51}$
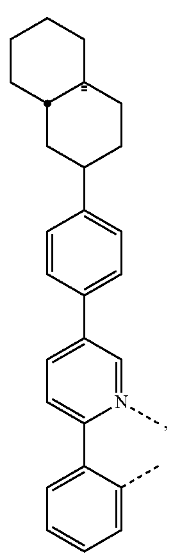
-continued
L$_{B52}$
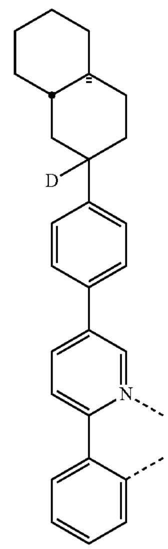
L$_{B53}$
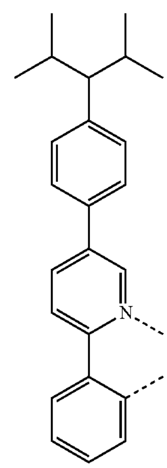
L$_{B54}$
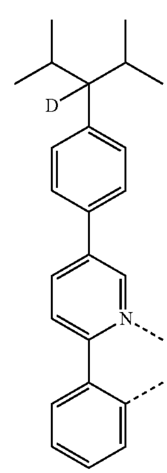

-continued
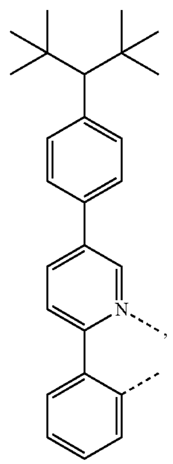
$L_{B55}$
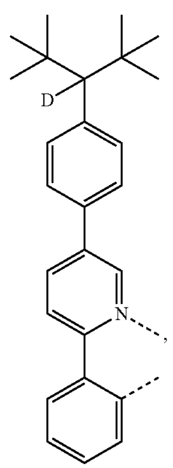
$L_{B56}$
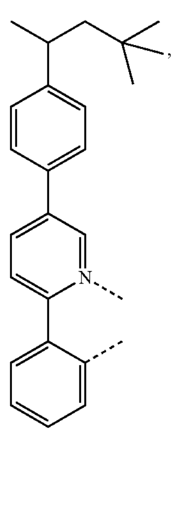
$L_{B57}$
-continued
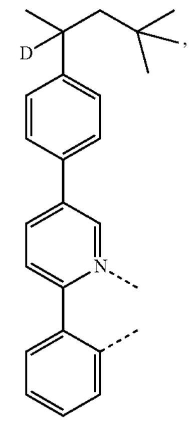
$L_{B58}$
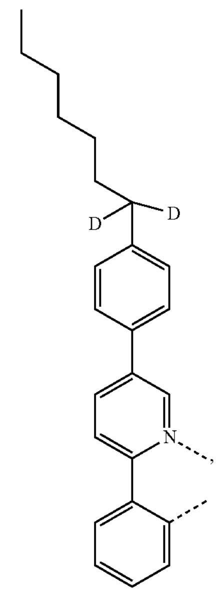
$L_{B60}$
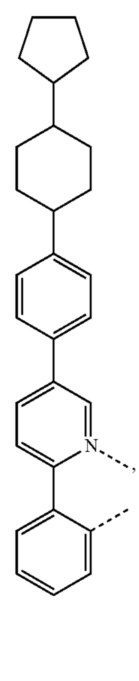
$L_{B61}$ -continued
-continued
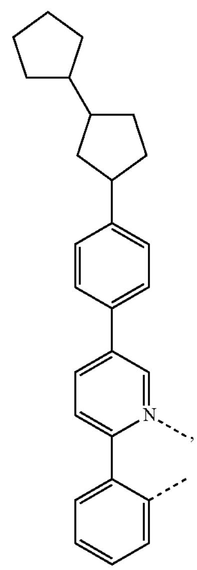
$L_{B62}$
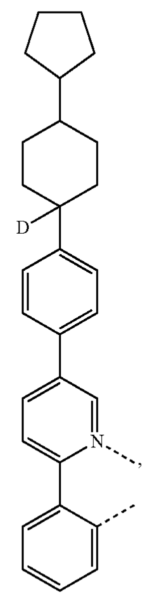
$L_{B64}$
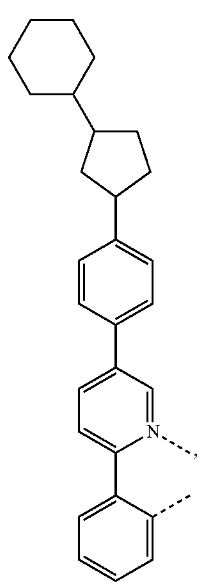
$L_{B63}$
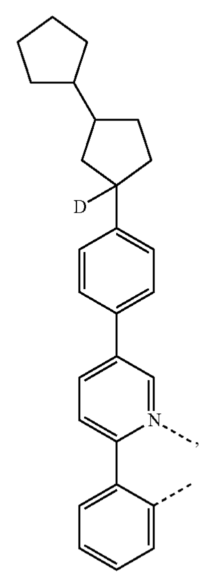
$L_{B65}$ $L_{B66}$
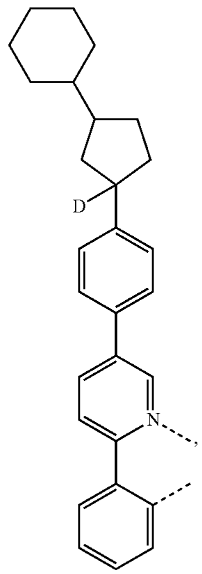
$L_{B67}$
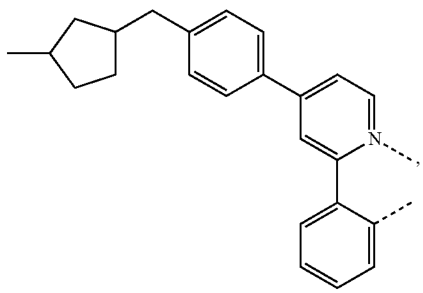
$L_{B68}$
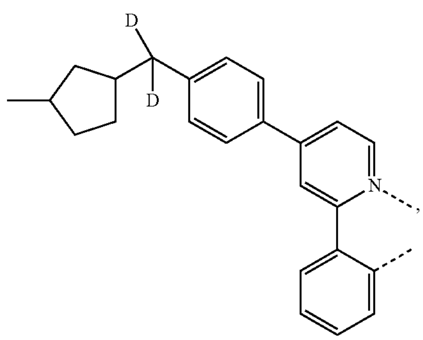
$L_{B69}$
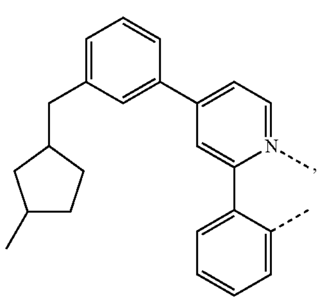
$L_{B70}$
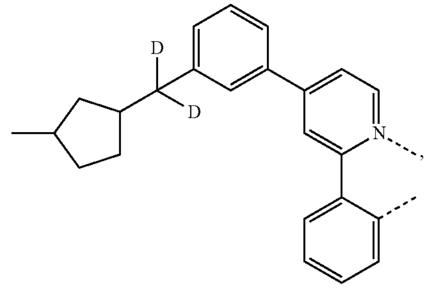
$L_{B71}$
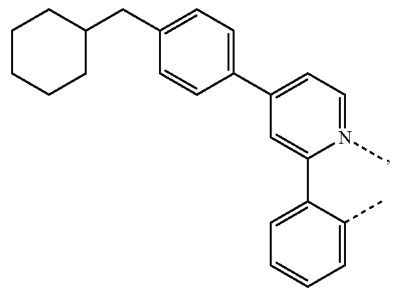
$L_{B72}$
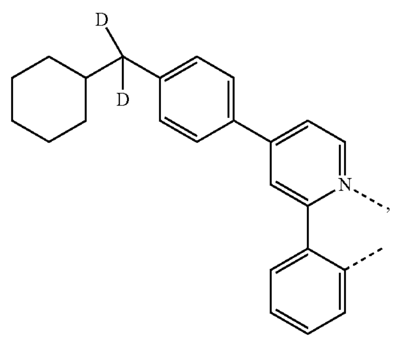
$L_{B73}$
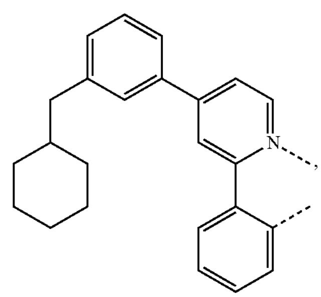
$L_{B74}$
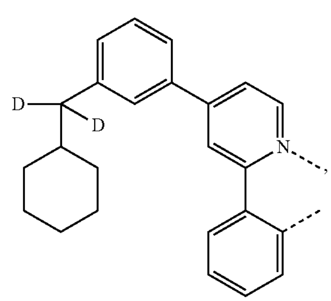

$L_{B75}$
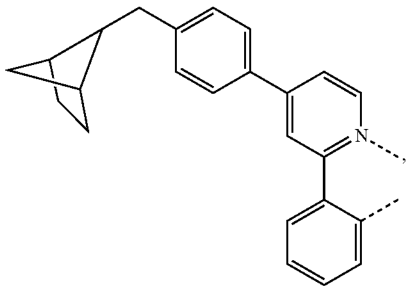
$L_{B76}$
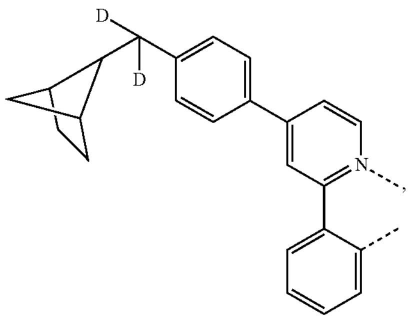
$L_{B77}$
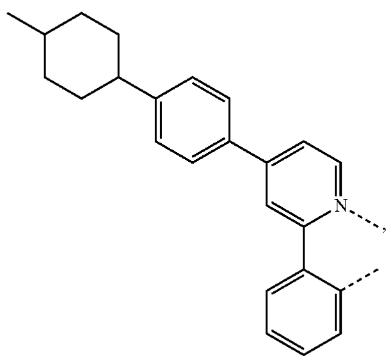
$L_{B78}$
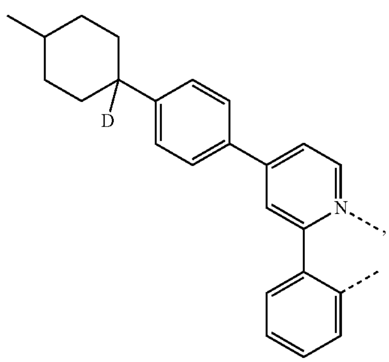
$L_{B79}$
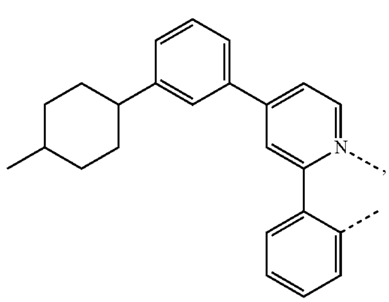
$L_{B80}$
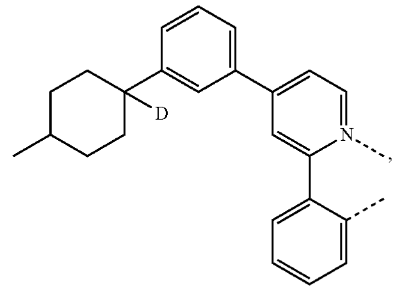
$L_{B81}$
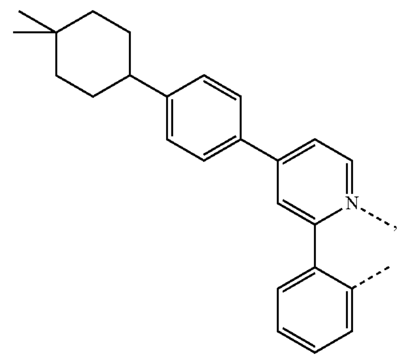
$L_{B82}$
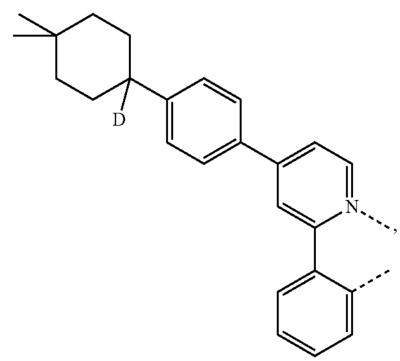
$L_{B83}$
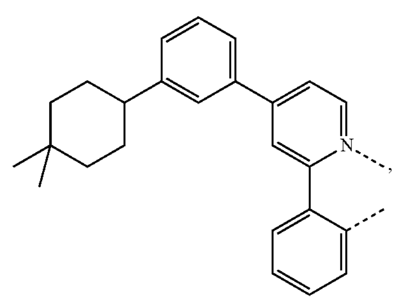
$L_{B84}$
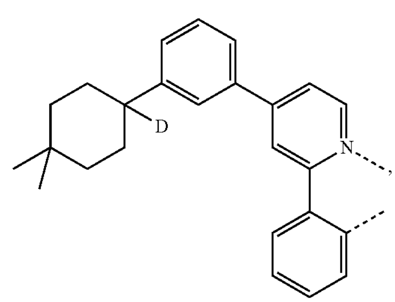

-continued
$L_{B85}$
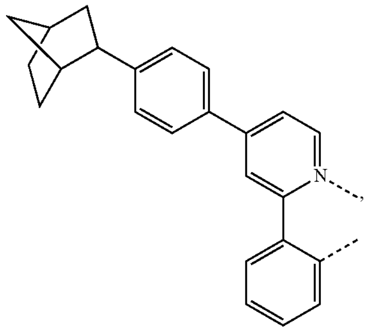
$L_{B86}$
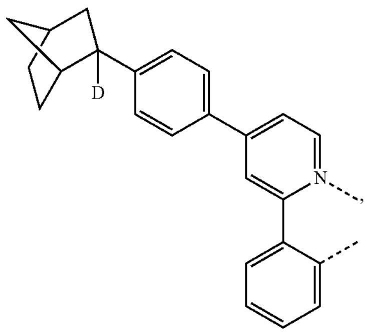
$L_{B89}$
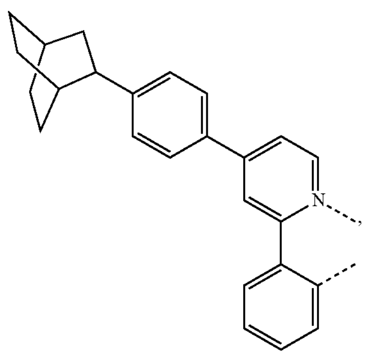
$L_{B90}$
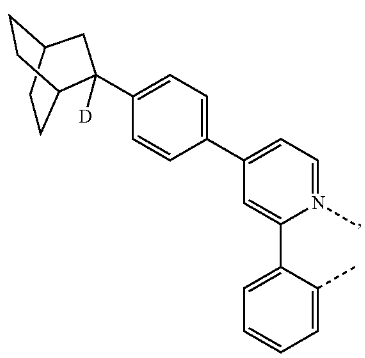
-continued
$L_{B91}$
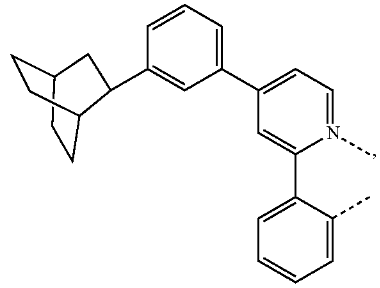
$L_{B92}$
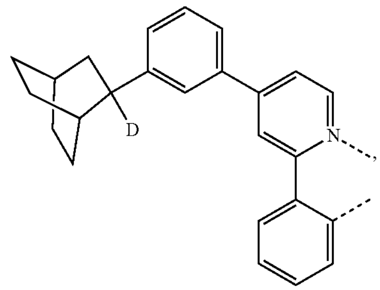
$L_{B93}$
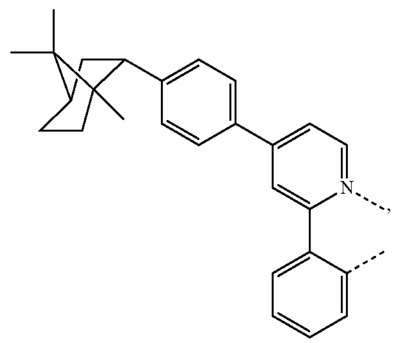
$L_{B94}$
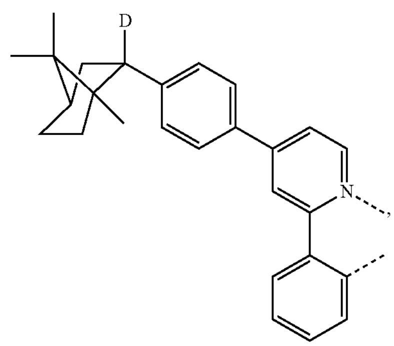
$L_{B95}$
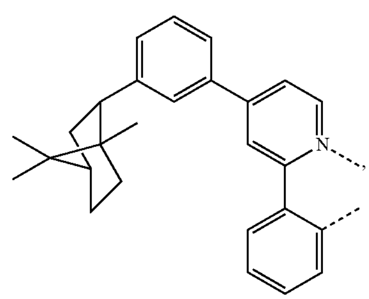

-continued
$L_{B96}$
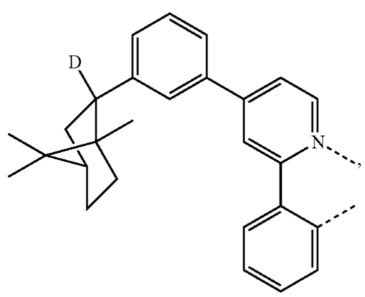
$L_{B97}$
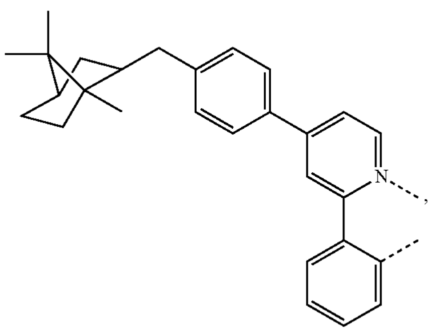
$L_{B98}$
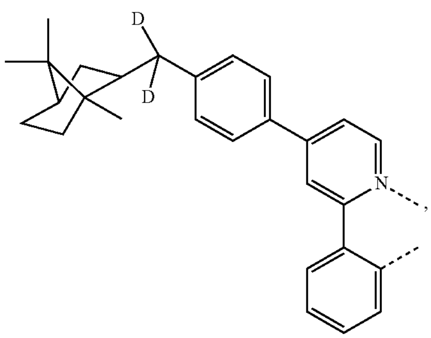
$L_{B99}$
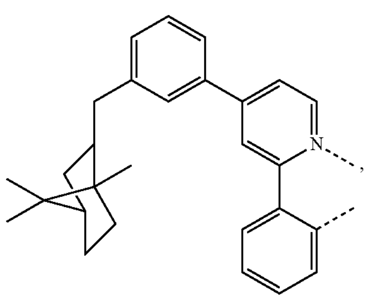
$L_{B100}$
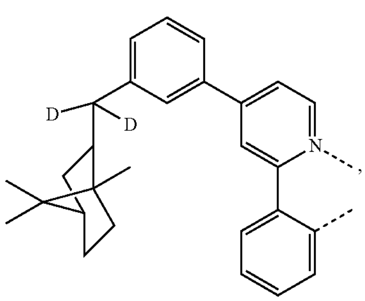
-continued
$L_{B101}$
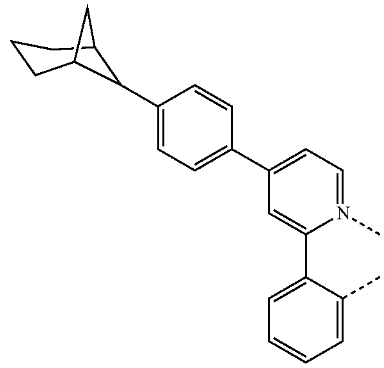
$L_{B102}$
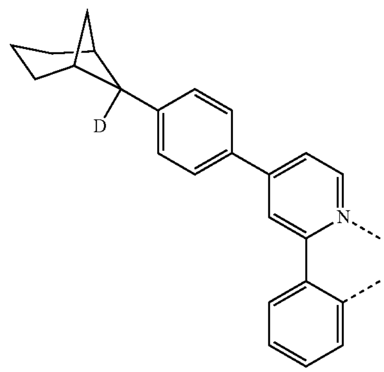
$L_{B103}$
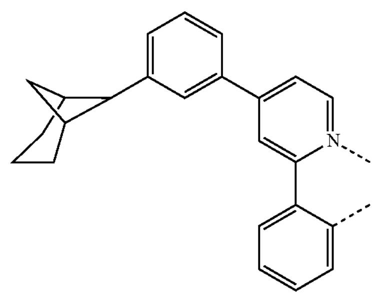
$L_{B104}$
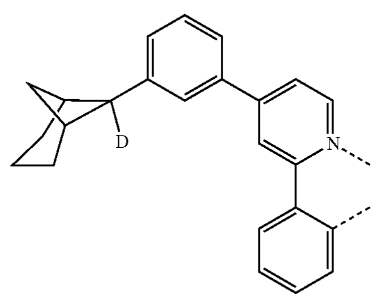
$L_{B105}$
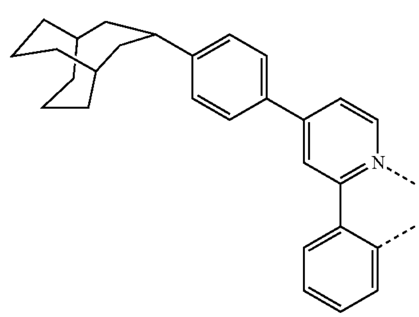

$L_{B106}$
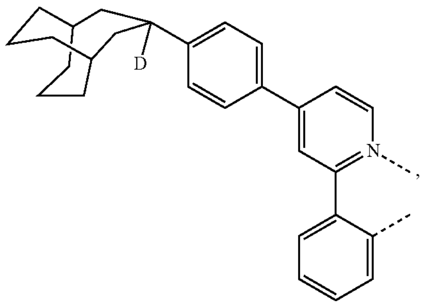
$L_{B107}$
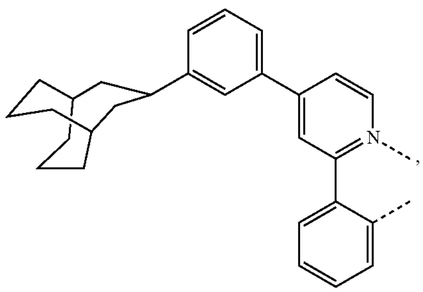
$L_{B108}$
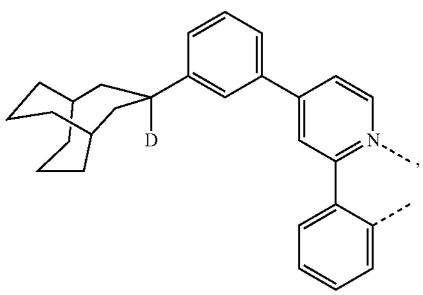
$L_{B109}$
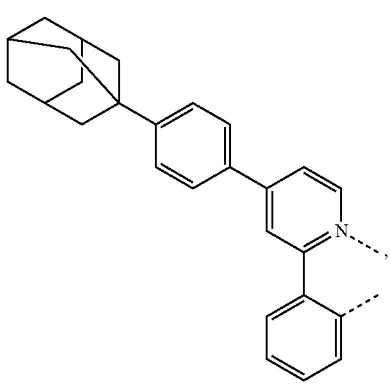
$L_{B110}$
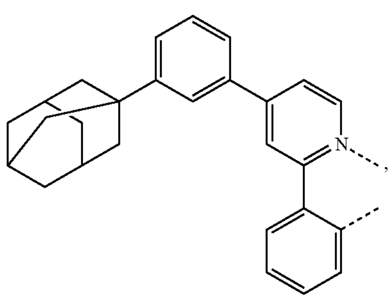
$L_{B111}$
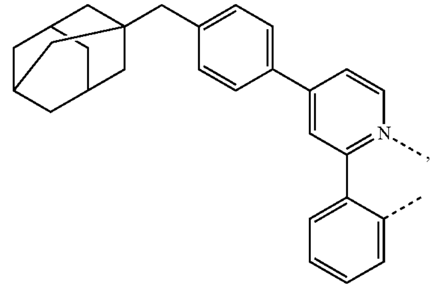
$L_{B112}$
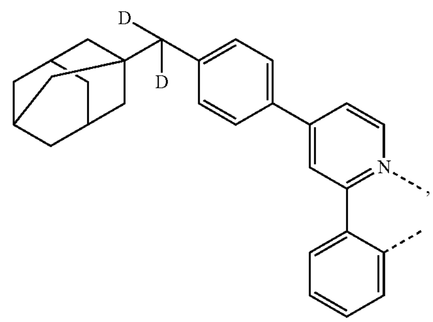
$L_{B113}$
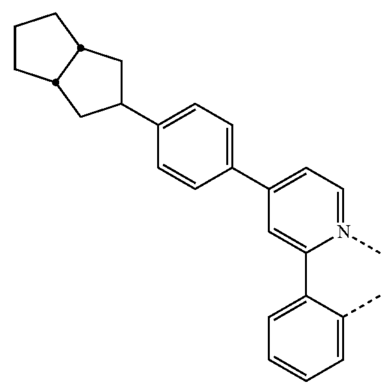
$L_{B114}$
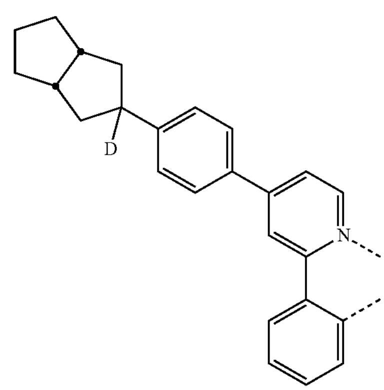

-continued
$L_{B115}$
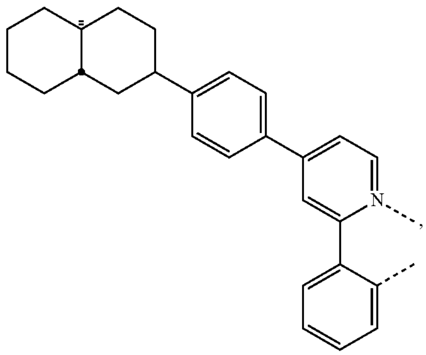
$L_{B116}$
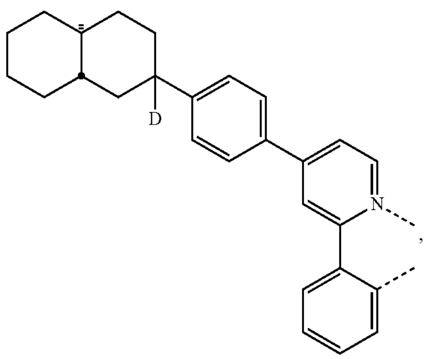
$L_{B117}$
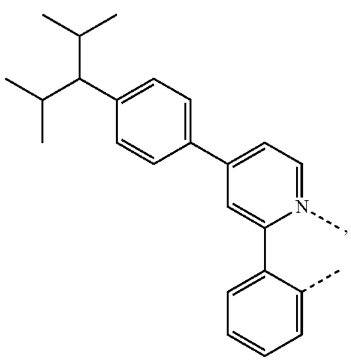
$L_{B118}$
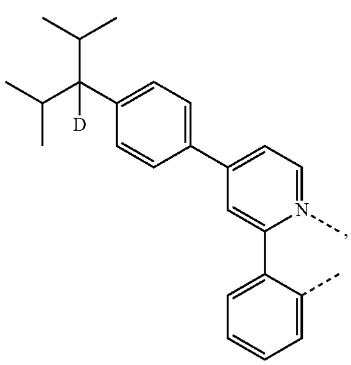
-continued
$L_{B119}$
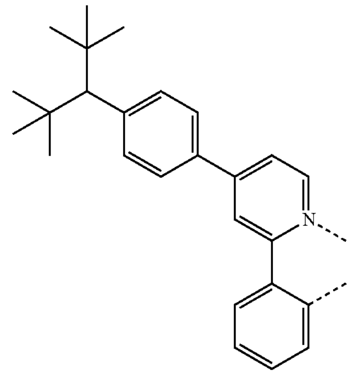
$L_{B120}$
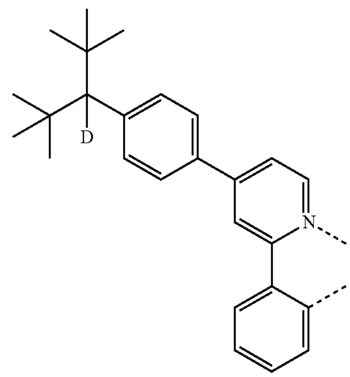
$L_{B121}$
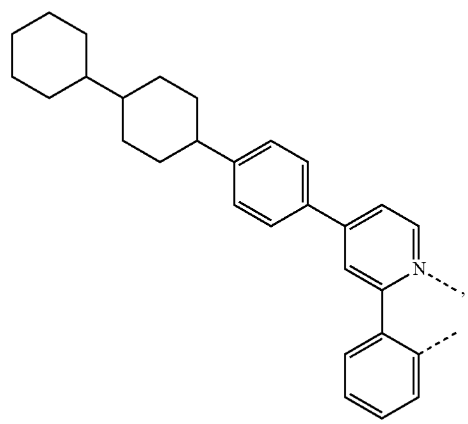
$L_{B122}$
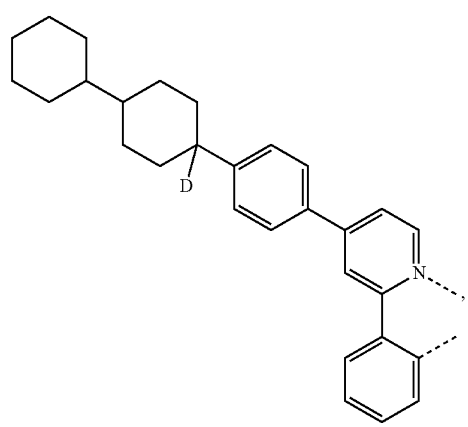

-continued
L$_{B123}$
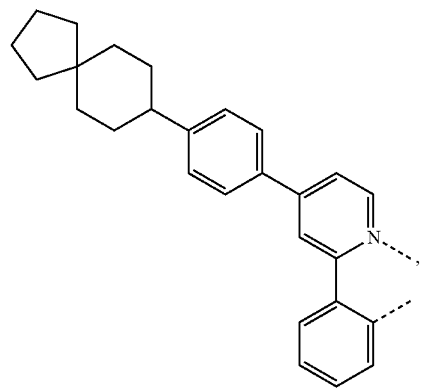
L$_{B124}$
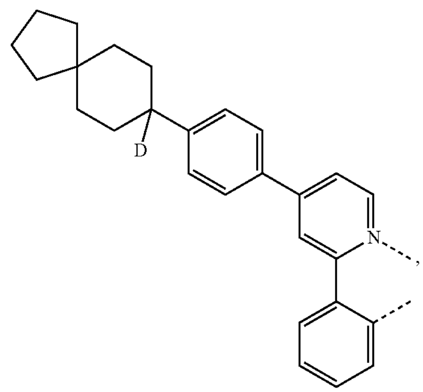
L$_{B125}$
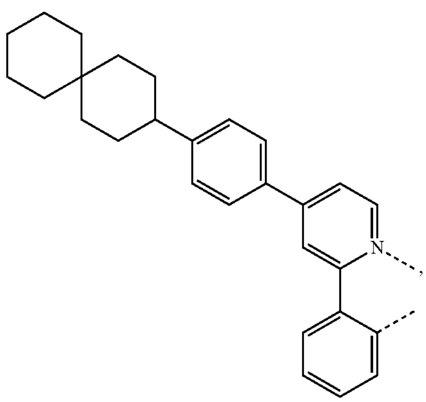
L$_{B126}$
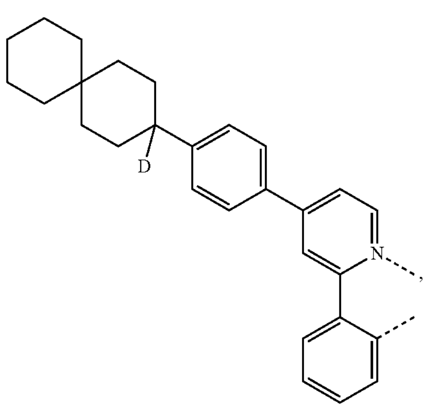
-continued
L$_{B127}$
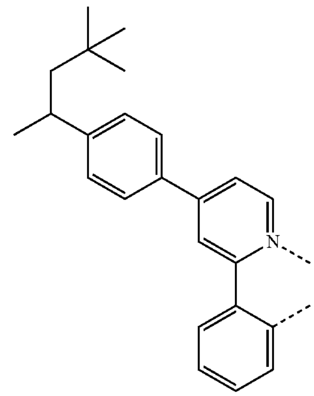
L$_{B128}$
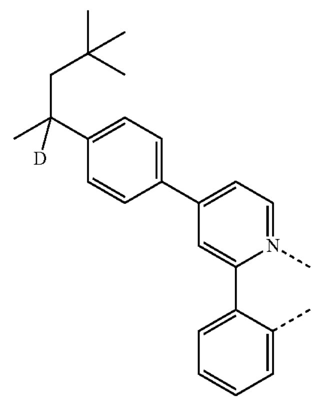
L$_{B132}$
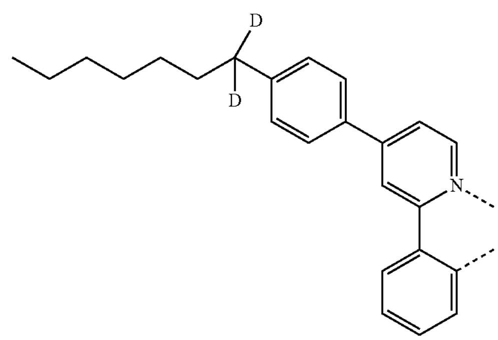
L$_{B133}$
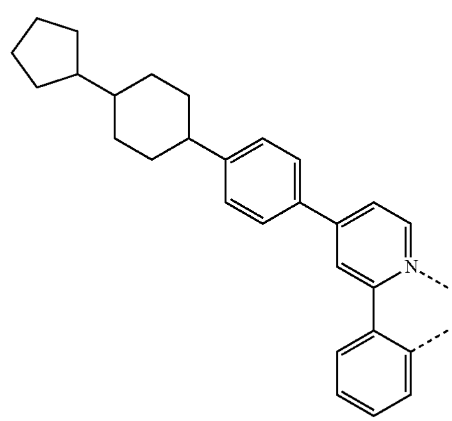

-continued $L_{B134}$

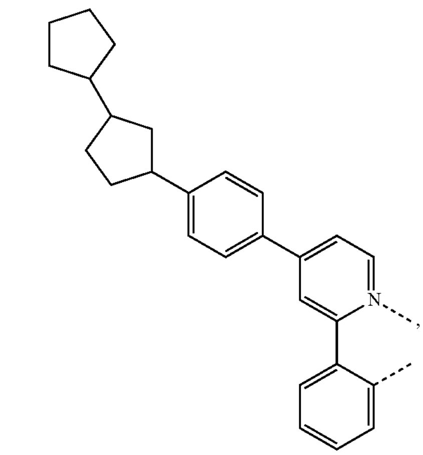

$L_{B135}$

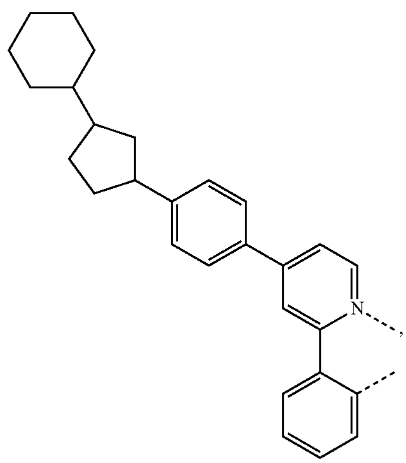

$L_{B136}$

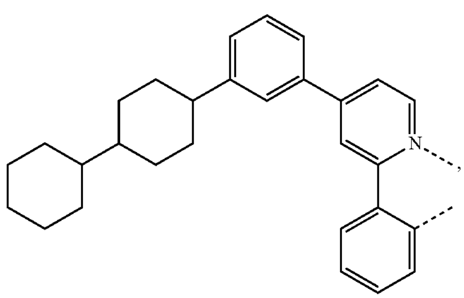

$L_{B137}$

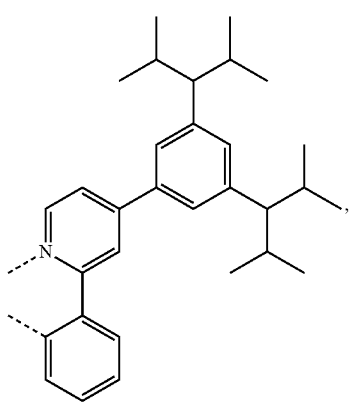

-continued $L_{B138}$

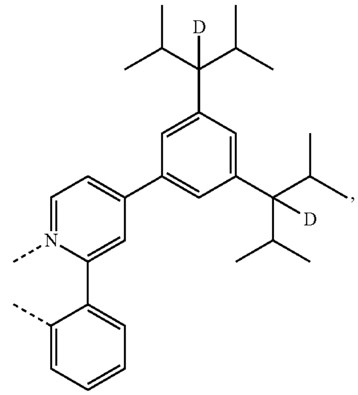

$L_{B177}$

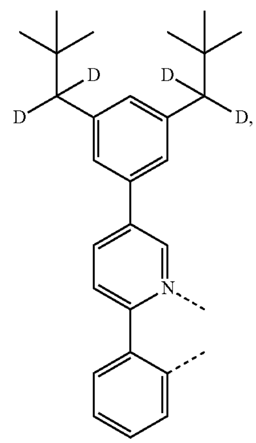

$L_{B223}$

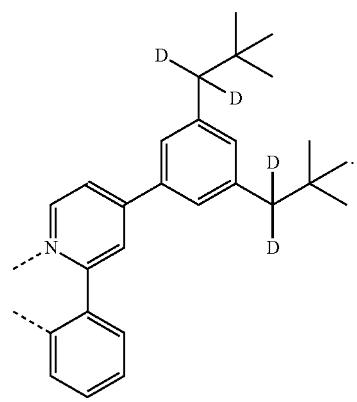

15. The consumer product of claim 14, wherein the consumer product is selected from a flat panel display, a computer monitor, a medical monitor, a television, a billboard, lights for interior or exterior illumination and/or signaling, a heads-up display, a fully or partially transparent display, a flexible display, a laser printer, a telephone, a cell phone, a tablet, a phablet, a personal digital assistant (PDAs), a wearable device, a laptop computer, a digital camera, a camcorder, a viewfinder, a 3-D display, a vehicle, a wall, theater or stadium screen, or a sign.

* * * * *